US007028281B1

(12) United States Patent
Agrawal et al.

(10) Patent No.: US 7,028,281 B1
(45) Date of Patent: Apr. 11, 2006

(54) FPGA WITH REGISTER-INTENSIVE ARCHITECTURE

(75) Inventors: Om P. Agrawal, Los Altos, CA (US); Bradley A. Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 627 days.

(21) Appl. No.: 10/194,771

(22) Filed: Jul. 12, 2002

(51) Int. Cl.
*G06F 17/50* (2006.01)

(52) U.S. Cl. .............................. 716/12; 716/1; 716/17; 716/18

(58) Field of Classification Search .................... 716/1, 716/6, 12, 17, 18; 326/41
See application file for complete search history.

(56) References Cited

U.S. PATENT DOCUMENTS 5,349,250 A 9/1994 New .......................... 307/465
5,914,616 A 6/1999 Young et al. ................. 326/41
5,920,202 A 7/1999 Young et al. ................. 326/39
6,097,212 A * 8/2000 Agrawal et al. .............. 326/41
6,150,842 A 11/2000 Agrawal et al. .............. 326/41
6,211,695 B1 4/2001 Agrawal et al. .............. 326/40
6,380,759 B1 4/2002 Agrawal et al. .............. 326/41
6,470,485 B1 10/2002 Cote et al. .................... 716/16
6,759,869 B1 * 7/2004 Young et al. ................ 326/41

* cited by examiner

*Primary Examiner*—Thuan Do

(57) ABSTRACT

Field programmable gate arrays (FPGA's) may be structured in accordance with the disclosure to have a register-intensive architecture that provides, for each of plural function-spawning LookUp Tables (e.g. a 4-input, base LUT's) within a logic block, a plurality of in-block accessible registers. A register-feeding multiplexer means may be provided for allowing each of the plural registers to equivalently capture and store a result signal output by the corresponding, base LUT of the plural registers. Registerable, primary and secondary feedthroughs may be provided for each base LUT so that locally-acquired input signals of the LUT may be fed-through to the corresponding, in-block registers for register-recovery purposes without fully consuming (wasting) the lookup resources of the associated, base LUT. A multi-stage, input switch matrix (ISM) may be further provided for acquiring and routing input signals from adjacent, block-interconnect lines (AIL's) and/or block-intra-connect lines (e.g., FB's) to the base LUT's and/or their respective, registerable feedthroughs. Techniques are disclosed for utilizing the many in-block registers and/or the registerable feedthroughs and/or the multi-stage ISM's for efficiently implementing various circuit designs by appropriately configuring such register-intensive FPGA's.

12 Claims, 32 Drawing Sheets

100

CONVENTIONAL FPGA LAYOUT

200 ggg/LATC/1048.7002.cnv
Tile 4
ver 10/25/01 16:38:31

NIBBLE-WIDE, FRONT END SIGNAL CAPTURE
AND BACK END RESULT CAPTURE

2H90

DIRECT CONNECT PATHS TO GLB-B

500

500e
16-INPUT NAND FUNCTION PER GLB
GLB 504e
590e
594e
COUT= NAND(a0,a1,...,d3)
Cin1 = NAND(d0,d1,d2,d3)
S0= AND(d0,d1,d2,d3)
S3
S2
S1
Ai3
Bi3= 1
Ai0
Bi0= 1
Cin0= 0
Cin3= 0 only if there were all "1" inputs in chain below
CIN (fromCOUT of GLB below, or GND or column fuse)
CYI
506e
591e
592e
593e
595e
596e
597e
580e
581e
582e
583e
584e
585e
586e
587e
F0a
F1a
F2a
F0d
F1d
F2d
F18
F19
f4A
f4D
LUT+ A
LUT+ A*
LUT+ D
505Ae
505De
505E*
a0
a1
a2/FTa2
a3/FTa3
FTa0/Sel0/D0
d0
d1
d2/FTd2
d3/FTd3
FTd0/Sel3/D3
ISM-1
ISM-2
401'
402'

FPGA WITH REGISTER-INTENSIVE ARCHITECTURE

FIELD OF DISCLOSURE

The present disclosure of invention relates generally to circuits having repeated configurable logic and configurable interconnect structures provided therein and methods for configuring the same. Examples of such circuits include Field Programmable Gate Arrays (FPGA's).

The disclosure relates more specifically to problems concerning efficient, programmable implementation of synchronous digital designs while using different types of programmably-selectable interconnect resources and/or logic resources such as those provided within an integrated circuit monolith that contains a programmable logic circuit such as a field programmable gate array (FPGA).

CROSS REFERENCE TO CO-OWNED APPLICATIONS

The following copending U.S. patent applications are owned by the owner of the present application, and their disclosures are incorporated herein by reference:

(A) Ser. No. 09/692,694 filed Oct. 18, 2000 by Richard T. Cote, et al. and originally entitled, "SCALABLE AND PARALLEL PROCESSING METHODS AND STRUCTURES FOR TESTING CONFIGURABLE INTERCONNECT NETWORK IN FPGA DEVICE"; (which application has subsequently hereto issued as U.S. Pat. No. 6,740,485); and (B) Ser. No. 10/090,209 filed Mar. 4, 2002 as a divisional of 09/626,094 which was previously filed Jul. 26, 2000 by Om P. Agrawal et al. and originally entitled, "VARIABLE GRAIN ARCHITECTURE FOR FPGA INTEGRATED CIRCUITS".

CROSS REFERENCE TO PATENTS

The disclosures of the following U.S. patents are incorporated herein by reference:

(A) U.S. Pat. No. 6,097,212 issued Aug. 1, 2000 to Om P. Agrawal et al, (filed as Ser. No. 08/948,306 on Oct. 9, 1997) and entitled, VARIABLE GRAIN ARCHITECTURE FOR FPGA INTEGRATED CIRCUITS;

(B) U.S. Pat. No. 6,127,843 issued Oct. 3, 2000 to Om P. Agrawal et al, (filed as Ser. No. 08/996,049 on Dec. 22, 1997) and entitled, DUAL PORT SRAM FOR RUN TIME USE IN FPGA INTEGRATED CIRCUITS;

(C) U.S. Pat. No. 6,184,713 B1 issued Feb. 6, 2001 to Om P. Agrawal et al, (filed as Ser. No. 09/326,940 on Jun. 6, 1999) and entitled, SCALABLE ARCHITECTURE FOR HIGH DENSITY CPLDS HAVING TWO-LEVEL HIERARCHY OF ROUTING RESOURCES;

(D) U.S. Pat. No. 6,211,695 B1 issued Apr. 3, 2001 to Om P. Agrawal et al, (filed as Ser. No. 09/235,615 on Jun. 21, 1999) and entitled, FPGA INTEGRATED CIRCUIT HAVING EMBEDDED SRAM MEMORY BLOCKS WITH REGISTERED ADDRESS AND DATA INPUT SECTIONS;

(E) U.S. Pat. No. 6,154,051 issued Nov. 28, 2000 to Bai Nguyen et al, (filed as Ser. No. 09/187,689 on Nov. 5, 1998) and entitled, TILEABLE AND COMPACT LAYOUT FOR SUPER VARIABLE GRAIN BLOCKS WITHIN FPGA DEVICE;

(F) U.S. Pat. No. 6,130,551 issued Oct. 10, 2000 to Om Agrawal et al, (filed as Ser. No. 09/008,762 on Jan. 19, 1998) and entitled, SYNTHESIS-FRIENDLY FPGA ARCHITECTURE WITH VARIABLE LENGTH AND VARIABLE TIMING INTERCONNECT;

(G) Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(H) Pat. No. 5,621,650 issued Apr. 15, 1997 to Om Agrawal et al, and entitled, PROGRAMMABLE LOGIC DEVICE WITH INTERNALTIME-CONSTANT MULTIPLEXING OF SIGNALS FROM EXTERNAL INTERCONNECT BUSES; and (I) Pat. No. 5,185,706 issued Feb. 9, 1993 to Om Agrawal et al.

RESERVATION OF EXTRA-PATENT RIGHTS, RESOLUTION OF CONFLICTS, AND INTERPRETATION OF TERMS

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding meanings within the relevant technical arts and within the respective contexts of their presentations herein.

DESCRIPTION OF RELATED ART

Historically speaking, it may be observed that within integrated circuits (IC's) the density of programmably-reconfigurable, digital logic circuitry has continued to increase, and the signal-processing speed and complexity of such logic has also tended to increase with time. In light of these trends, it is becoming ever more important to try and assure that programmable logic sections (e.g., CLB's or Configurable Logic Blocks) within a monolithic IC can acquire and/or deliver respective input and output digital signals from/to each other in timely and accurate fashion so that appropriate communication can take place between these spaced-apart logic sections as may be required for programmably implementing desired logic functions. It is also becoming ever more important, due to circuit density limitations and power constraints, to make efficient usage of configurable resources within such IC's and to minimize circuit and/or power wastage.

More specifically, when it comes to once-programmable or re-programmable logic arrays such as Field Programmable Gate Arrays (FPGA's), practitioners in the art have come to recognize the benefits of using a varied-granularity type of interconnect that has conductors of differing lengths, where the conductors may further be of differing orientations, and where the types of interconnect may have other differing attributes (including differing drive capabilities such as tristateable, or not) in accordance with concepts introduced for example, in U.S. Pat. No. 5,185,706 issued Feb. 9, 1993 to Om Agrawal et al.

Practitioners in the art have also come to recognize the benefits of using variable grain logic in accordance with concepts introduced for example, in U.S. Pat. No. 6,097,212 issued Aug. 1, 2000 to Om P. Agrawal et al. so that efficient usage may be made of the limited, configurable resources within such IC's in view of the functional complexity called for by various parts of a supplied design that is to be programmably implemented.

Despite these advances, there is room for yet further improvements. More specifically, in the specialized area of variable grain logic, a majority, if not all, of previously known architectures provided an average of no more than about one logic-block register per function-spawning lookup table (fs-LUT). Each such logic-block register was available for capturing, and synchronizing to a given clock signal, the result signals output by a corresponding LUT. It is shown here that processing speed may be improved by increasing the average number of logic-block registers provided per function-spawning LUT and by providing configurable couplings for utilizing the additional registers in a variety of ways. (The concept of 'function-spawning' LUT's was described in the above-cited U.S. Pat. No. 6,097,212, and will be briefly re-explained below.)

INTRODUCTORY SUMMARY

Structures and methods may be provided in accordance with the present disclosure of invention for overcoming one or more of the above-described problems.

(A) In accordance with one aspect of the present disclosure, FPGA's are structured to have a register-intensive architecture that includes, for each function-spawning LookUp Table (fs-LUT or base-LUT), a plurality of associated state-storing registers which can each be programmably configured to capture and store a result output of its corresponding fs-LUT for synchronized output relative to a programmably selectable clock signal.

(A.1) In accordance with one detailed aspect of the present disclosure, registerable feedthroughs are provided for each fs-LUT, where the feedthroughs are adaptable for feeding-through to the corresponding, state-storing registers of that fs-LUT, one or more locally-acquired input signals rather than, or in addition to, feeding such input signals through the associated fs-LUT. (In one embodiment, so-called primary and secondary feedthroughs may be used for providing through-the-logic block routing whereby virtually any signal that is selectively acquired by ISM stages of the logic block from one of adjacent interconnect lines or intra-connect lines can be routed in registered or unregistered form to essentially any other of different routing lines that the logic block outputs to directly or indirectly (e.g., 2xRL lines, 10xRL lines, MaxRL lines, FB's and DC's).)

(A.2) In accordance with a second detailed aspect of the present disclosure, a multi-stage, input switch matrix (ISM) is provided for acquiring and routing input signals from adjacent interconnect lines (AIL's) and/or intra-connect lines (e.g., FB's) to the fs-LUT's and/or their respective, registerable feedthroughs.

(B) In accordance with a second aspect of the present disclosure, techniques are provided for utilizing the associated state-storing registers of function spawning LUT's and/or the associated registerable feedthroughs and/or a multi-stage ISM for efficiently implementing various circuit designs by appropriate configurations of such programmably configurable resources.

(B.1) In accordance with one detailed aspect of the present disclosure, feedthroughs are used in combination with associated state-storing registers of fs-LUT's for providing front-end signal registration and back-end signal registration for programmably implementing pipelined circuit structures.

(B.2) In accordance with a second detailed aspect of the present disclosure, otherwise unused inputs of fs-LUT's are used as secondary feedthroughs for forwarding selectively-acquired input signals to the state-storing registers and/or to signal outputting resources of the signal-acquiring logic block.

(B.3) In accordance with a third detailed aspect of the present disclosure, block-dedicated feedback conductors and/or cluster-dedicated direct-connect conductors are used to compactly implement front- and/or back-end registered pipeline sections, dynamic multiplexers, barrel shifters, and/or other circuit functions so that consumption of general interconnect resources for supporting such circuit functions can be minimized.

(B.4) In accordance with a fourth detailed aspect of the present disclosure, the multi-stage ISM's of one or more logic blocks are used for providing replication of selectively-acquired, local signals so that variable grain functions can be supported (more specifically, so that plural LUT's of a given logic block can be folded-together to a full or partial extent). Such in-ISM replication of signals may eliminate or minimize the consumption of general interconnect resources for providing such signal replication. The multi-stage ISM's of one or more logic blocks may alternatively or additionally be used for providing significance-type descrambling of signals so that consumption of general interconnect resources for providing such significance-type of re-scrambling of signals can be eliminated or minimized.

(C) In accordance with a third aspect of the present disclosure, machine-implemented techniques (e.g., software techniques) are provided for generating FPGA configuration data that takes advantage of one or more of the register-intensive aspects, feedthroughs-intensive aspects, multi-stage ISM aspects, and/or other aspects of the FPGA structurings disclosed herein.

Other aspects of the disclosure will become apparent from the below detailed description.

BRIEF DESCRIPTION OF THE DRAWINGS

The below detailed description section makes reference to the accompanying drawings, in which:

FIG. 5C illustrates a possible configuration of the LUT's and carry-chain of FIG. 5A for realizing a wide-input OR function;

RESERVATION OF EXTRA-PATENT RIGHTS, RESOLUTION OF CONFLICTS, AND INTERPRETATION OF TERMS

New technologies often benefit from the coining of new terminology that describes novel characteristics. Such is true for the 'Variable Grain Architecture' (VGA) disclosed in the above-incorporated U.S. Pat. No. 6,097,212 and its progeny. That patent referred to 'Variable Grain Blocks' (VGB's) and to the programmable ability to 'fold together' lookup resources (e.g. 3-input fs-LUT's) and to thereby create lookup means of larger capacity (e.g. 4-input LUT capability, 5-input LUT capability, etc.).

Many such terms will be re-used herein. It should be noted however, that the 'feed-throughs' described herein are not synonymous with the feed-throughs of 6,097,212 unless explicitly stated herein. Reasons for why will become apparent below. Similarly, the 'Generic Logic Blocks' (GLB's for short) described herein are not synonymous with the VGB's of 6,097,212. Reasons for why will become apparent below. Additionally, the Configurable Building Blocks (CBB's) described herein (and also called Macrocells herein) are not synonymous with the CBB's of 6,097,212. The CSE's (Configurable Sequential Elements) described herein are not synonymous with the CSE's of 6,097,212. The double reach length (2xRL) conductors and direct connect (DC) conductors described herein are not respectively synonymous with the 2xL and CD wires of 6,097,212.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

DETAILED DESCRIPTION

Figure 1A:
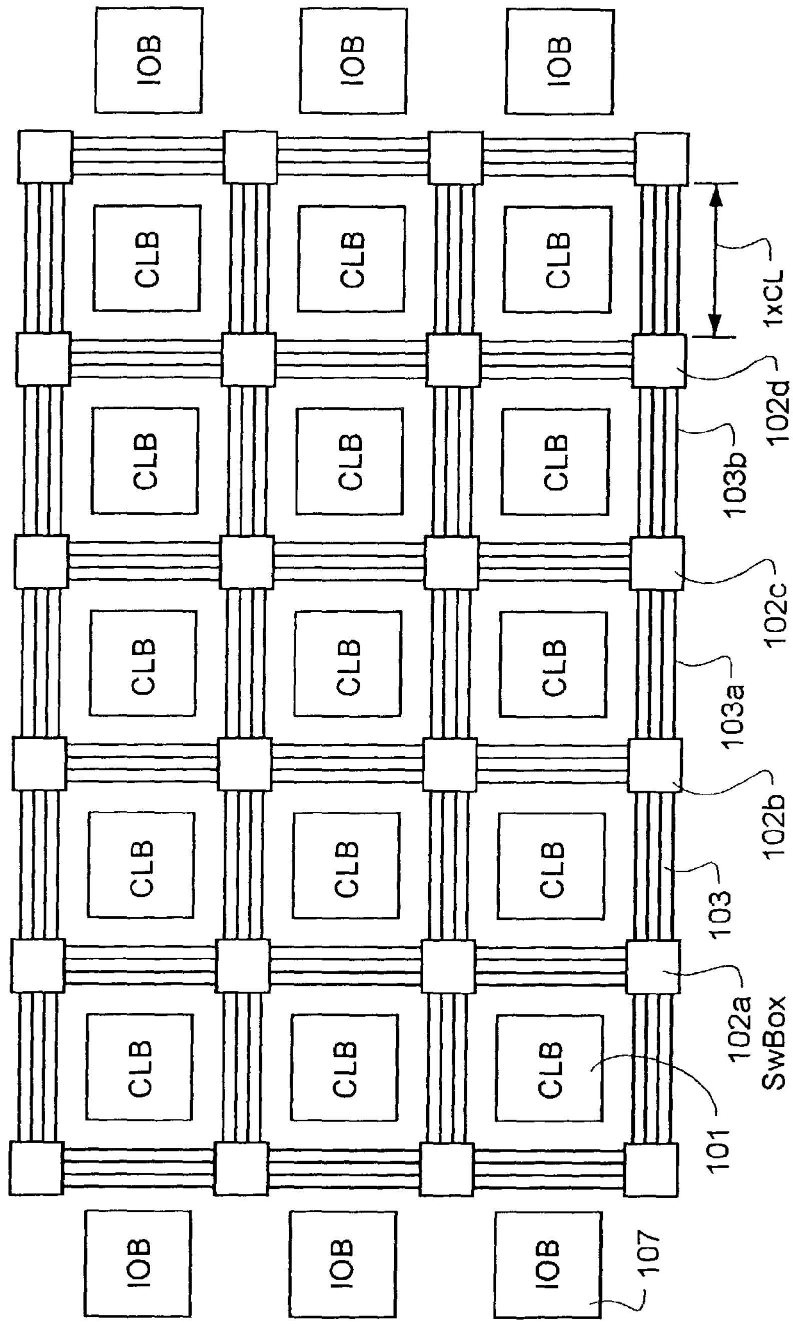
FIG. 1A illustrates in a general way, an FPGA comprised of an array of Configurable Logic Blocks (CLB's) with a general-purpose interconnect network and Input/Output Blocks (10B's) for interfacing to external circuitry.
Figure 1B:
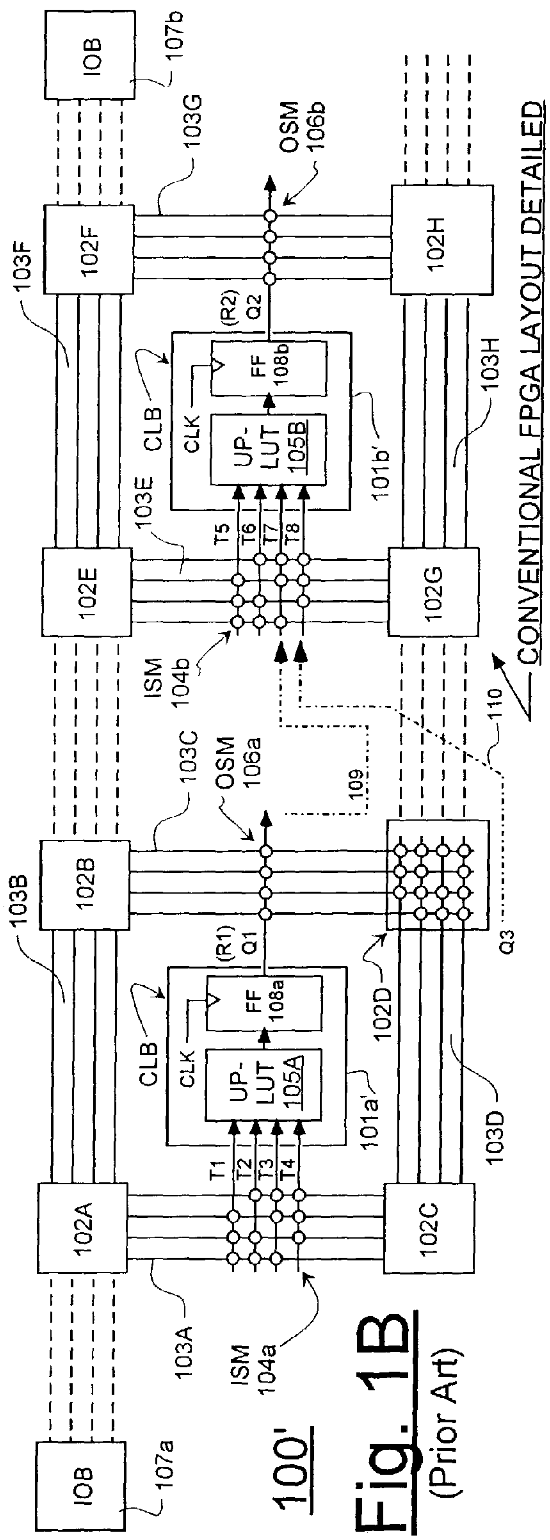
FIG. 1B introduces certain problems that are inherent in prior art architectures by showing a prior art way of configurably coupling, and of synchronizing various signals as such signals are transferred through a general-purpose interconnect network and between user-programmable lookup tables (LUT's) within an exemplary FPGA such as that of FIG. 1A.
Figure 1C:
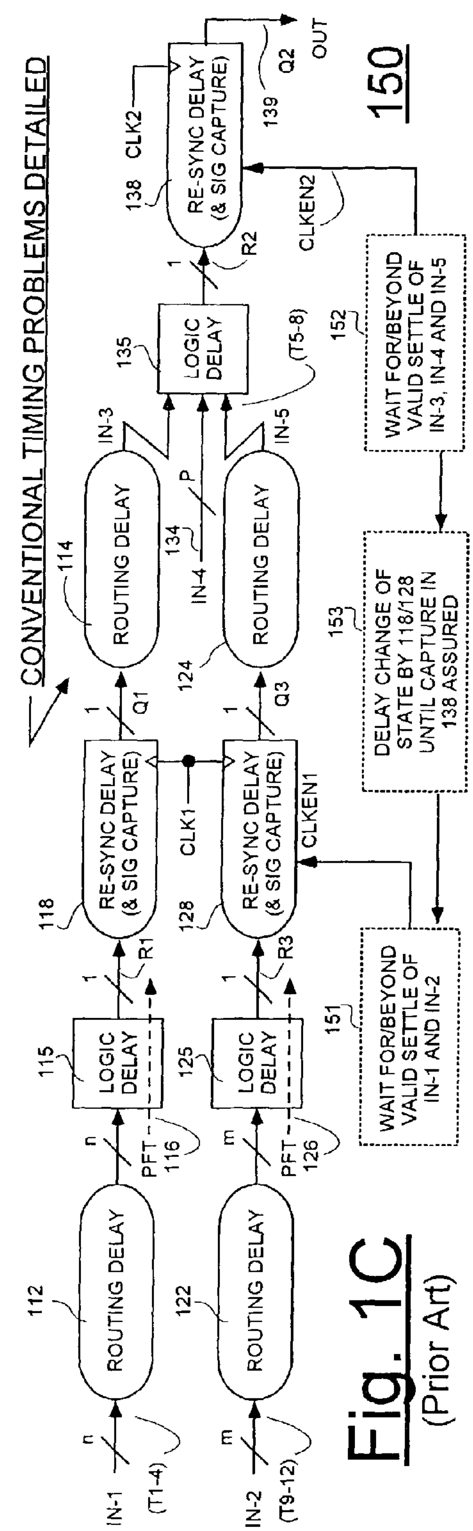
FIG. 1C is a conceptual diagram showing timing problems that may arise from use of the prior art, signal coupling and synchronization approach exemplified by FIG. 1B.

FIGS. 1A–1C are used here to progressively explicate a set of problems that exist in conventional FPGA designs. Referring first to FIG. 1A, a first integrated circuit device 100 having a conventional FPGA layout is shown. This extremely simplistic figure is provided merely for introducing readers who are not familiar with modern FPGA concepts to some of the fundamental problems that have come to be associated with the use of configurable interconnect structures and configurable logic structures. As seen in FIG. 1A, a regular pattern of Configurable Logic Blocks (CLB's) is distributed between intersecting vertical and horizontal interconnect channels. Signal-routing switchboxes are provided at the channel intersections. A plurality of Input/Output Blocks (10B's) is distributed about the periphery of the device 100 as shown.

Furthermore in FIG. 1A, one of the CLB's is denoted as 101. One of the channel-interconnecting switchboxes is denoted as 102a (SwBox). A plurality of horizontal conductor segments that each extends continuously between but not beyond switchbox 102a and the next switchbox (102b) is denoted as 103. Each conductor segment within bus 103 may be referred to as a single-length, general interconnect line (a 1xCL line). One of the IOB's is denoted as 107.

Each of the vertical and horizontal interconnect channels is defined by a respective, linear sequence of switch boxes such as 102a, 102b, and interposed 1xCL interconnect segments such as segments 103a, 103b of bus 103. For the arrangement 100 of FIG. 1A, the notation, 1 xCL indicates that the corresponding line length is about one times a side dimension of the corresponding CLB ('1 xCL'=one CLB length).

Combinatorial result signals that are produced and output by one CLB (e.g., 101) in the illustrated device 100 may need to serve as input signals for one or more of the other CLB's, including those that are spaced relatively far away and those that are nearer to the source CLB (e.g., 101). To get to those other, destination CLB's, the result signals of the source CLB may have to successfully travel without contention through two or more of the 1 xCL interconnect segments (e.g., 103a, 103b) and through two or more interposed switchboxes (e.g., 102c). There are several well-known problems associated with such travel through the general interconnect resources (102,103) of an FPGA 100.

A first of the problems is that the signal-routing, place-and-route software may not be able to complete the desired pathway through the general interconnect because all interconnect resources (e.g., 1xCL segments and intra-switchbox pathways) have already been consumed at a critical juncture by the routing needs of other signals. A second of the known problems has to do with performance. Even if the place-and-route software is able to complete the desired pathway, that pathway may have a time delay that is larger than allowed by the design specifications. The switchboxes (e.g., 102b and 102c) which are disposed at terminal ends of the CLB-to-CLB interconnecting lines, 103a and 103b, tend to increase signal transmission delays between CLB's. Part of the delay of each routed signal corresponds to how many PIP's (Programmable Interconnect Points, not yet shown—see FIG. 1B) capacitively load down internal lines within the switchboxes. The more switchboxes there are in a given route, the more likely it becomes that the routing delay will violate a design timing constraint. Additional PIP's (not yet shown—see FIG. 1B) may be provided along the interconnect lines, in correspondence with the CLB's, for selectively acquiring input signals from and/or selectively outputting result signals to the adjacent interconnect lines (AIL's). These additional PIP's may also add delay to the route taken by a given, CLB result signal. And of course, if there are many switchboxes (e.g., 102*a*–102*d*) and many interconnect lines (e.g., 103*a*–103*b*) interposed in series on a signal-conveying route between communicating CLB's, the associated, total signal transmission delay tends to correspond to the sum of the individual series of RC delays, if not worse. In some cases, the place-and-route software is unable to find an acceptable combination of logic placements and signal routings because: (a) certain CLB-to-CLB delays turn out to be unacceptably large and/or (b) the peak-signal-processing frequencies possible with certain parts of the implementation turn out to be unacceptably small for the design that is to-be-implemented by the given FPGA 100. When these kinds of failures occur, designers may have to consider the option of using an FPGA that is fabricated with faster but albeit more expensive technology (e.g., SiGe bipolar instead of Si CMOS). Alternatively, the design may have to be ported to a high speed but more expensive ASIC (application specific integrated circuit) or to another such, alternate solution device. These outcomes disadvantageously tend to increase one or more of implementation cost, power consumption and time-to-market.

FIG. 1B shows some further details of a conventional architecture 100' such as may be found in an FPGA device like the one introduced in FIG. 1A. Once again, the purpose of this relatively simple diagram is merely to introduce an assortment of problems that have come to be associated with attempts to timely transmit and/or timely acquire certain signals that move through configurable interconnect structures and CLB's of a conventional FPGA 100'. Each CLB (e.g., 101*a*') may be characterized as having at least one, User-Programmable, LookUp Table (e.g., up-LUT 105A) that can receive a given number of independent input term signals (e.g., T1–T4) from adjacent interconnect lines (e.g., 103A) and can output a LUT result signal (e.g., R1) onto one of its AIL's (adjacent interconnect lines; e.g., 103C). The result signal R1 can be any user-defined, Boolean function of the LUT's independent input term signals T1–T4. It can even be a programmably-defined feedthrough function (PFT) wherein R1=T1 and the rest of the input term signals, T2–T4 are don't cares for the so-configured LUT. (If this is done, there is an inherent wastage of the capability of the PFT-configured LUT to implement functions more complex than that of simply a wire with some minor amount of delay.) The ability to store the LUT result signal R1 and later output it as a Q1 signal from a CLB-associated register (e.g., 108*a*) is conventionally provided in FPGA's such as the one shown.

Further in the example of FIG. 1B, there is provided with each CLB, a corresponding inputs-acquiring switch matrix (e.g., ISM 104*a*) for acquiring the independent input term signals T1–T4 for the CLB's LUT 105A from the CLB's AIL's 103A. Each of the illustrated ISM's (Input Switch Matrices) 104*a* and 104*b* (where the latter ISM services CLB 101*b*') is partially-populated and is therefore comprised of less than 16 Programmable Interconnect Points (PIP's—each represented as a white-filled circle) distributed over the corresponding 4×4 array of intersection points formed by the 4-line vertical bus 103A crossing with the 4 horizontal input terminals of LUT 105A. The illustrated ISM 104*a* is organized to allow its respective LUT 105A to obtain each of its respective 4 input term signals from a respective 3 of the 4 lines in the left vertical bus 103A. Note that if one of the input terms, say T4, is a don't-care because the corresponding LUT (105A) is configured to ignore that input term (T4), then the ability of the ISM 104*a* to selectively acquire the T4 signal from adjacent interconnect resources is wasted because the acquirable T4 signal has no useful place to go to within CLB 101*a'*.

A full-width output switching multiplexer (OSM) 106*a* is provided in this example at the output side of CLB 101*a*' for allowing its up-LUT 105A to route its 1-bit, registered or unregistered result signal (Q1 or R1 respectively) to any one of the 4 lines in the right vertical bus 103C. Note that if CLB 101*a*' is configured to bypass FF 108*a* (the bypass means is not shown) and is configured to instead directly supply the R1 result signal of LUT 105A via OSM 106*a* to the general interconnect, then the option of having OSM 106*a* route a stored and output signal of FF 108*a* is lost. (The illustrated example of FIG. 1B is too simplistic to fully express this concept. We point it out here merely to complement the immediately-above description of how part of ISM 104*a* is wasted if T4 is not used.)

Each of the exemplary switchboxes 102A–102H in FIG. 1B contains a partially-populated matrix of PIP's such as represented within box 102D. This switchbox-internal routing-matrix allows a signal on any first line of the switchbox to find at least 3 possible ways of continuing to travel along any crossing other line of the switchbox. (Actually it is the place-and-route software which seeks out the at least one of 3 possible routes. We pretend the signal is the seeker in order to simplify the concept.) The illustrated array of PIP's in box 102D is merely for serving as an example. Those skilled in the art will appreciate that a wide variety of partially-populated and/or fully-populated matrices may be used for respectively varying purposes, including those of providing more or less routing flexibility, of reducing capacitive loading, and/or of reducing signal propagation delay time for signals traveling through the general interconnect structure.

There are a number of different ways in which to appreciate problems associated with the architecture exemplified in FIG. 1B. One viewpoint is taken by reference to FIG. 1C and to the counterpart improvement shown in FIG. 2C. Another viewpoint is taken under the description of FIGS. 1D–1E. Both are valid. Both demonstrate a value to having many accessible registers per LUT. The FIG. 1C viewpoint makes the assumption that there is great flexibility in defining what signal will serve as a clock enable (CLKEN) for each of plural registers and that certain delays are more prominent than others. The viewpoint adopted in the explanation of FIGS. 1D–1E makes the assumption that there is much less flexibility in defining what signal will serve as CLKEN of each of plural registers and that edge-to-edge delay in the main clock signal is a prominent factor.

We startfirstwith the FIG. 1C viewpoint. Let us assume that a first, to-be-implemented design calls for result signal R1 to be a function, $f_A$(T1,T2,T3,T4) of all four of input term signals, T1–T4 and also that R1 is to be captured in register 108*a* at a first clock-defined time point, CLK=CLK1. Let us assume that after the CLK1 strobe occurs, the corresponding Q1 signal is to follow path 109 in FIG. 1B and it is to serve as input term T7 of a next, 4-input LUT, 105B. The other independent inputs of LUT 105B are T5, T6 and T8. Corresponding LUT output R2 is to be captured in register 108*b* at a second clock-defined time point, CLK=CLK2 and is to be correspondingly output from the register as registered result signal, Q2. The to-be-implemented design calls for R2 to be a function, $f_B$(T5,T6,T7,T8) of all four of signals T5–T8. Signal T8 comes in along path 110 from a registered Q3 output of another CLB (not shown) which is below and similar to 101*a*'. The Q1 and Q3 signals travel through switchboxes 102D, 102G; up bus 103E and through ISM 104*b* to reach the respective T7 and T8 input terminals of LUT 105B. Simple as this may seem, there are a set of problematic time delays associated with this scheme.

Referring to the signal-flow analysis graph 150 of FIG. 1C, we study the timing considerations associated with the simple, function cascading operation illustrated in FIG. 1B in more detail. Let us assume that signals T1–T4 of a first input signals set, IN-1 have a combined, first routing delay represented by icon 112 (ROUTING DELAY) and that signals T9–T12 of a second input set, IN-2 have a combined, second routing delay represented by icon 122. Icon 115 represents the function-realizing delay associated with LUT 105A. Square icon 125 similarly represents the function-realizing delay associated with another LUT (not shown) that produces result signal R3 from inputs T9–T12. It is assumed that there is no "front-end" registration of input term sets IN-1 and IN-2 just before they arrive at their respective logic units 115 and 125. Delays 112 and 122 dominate. Icons 118 and 128 respectively represent delays associated with the respective, and post-logic, synchronizing registers (e.g., 108*a*) that capture result signals R1, R2 of respective logic units 115 and 125 and respectively output the Q1 and Q3 signals for subsequent transmittal along respective paths 109 and 110.

Further in FIG. 1C, oval icons 114 and 124 respectively represent the routing delays experienced by the Q1 and Q2 signals as they move through respective paths 109 and 110 and also through ISM 104*b* (FIG. 1B). Square icon 135 represents the function-realizing delay associated with LUT 105B. Semi-oval icon 138 represent a delay associated with synchronizing register 108*b* (which therefore corresponds to 138 of FIG. 1C) as it captures the R2 result signal and outputs the corresponding Q2 signal for subsequent transmittal through OSM 106*b* to further logic or for output from the FPGA 100' by way of 10B 107*b*.

Associated with delay item 128 of FIG. 1C is a conceptual design strategy 151 which indicates that responsiveness to the CLK1 strobe should not be enabled (via CLKEN1) at least until the IN-1 and IN-2 input sets have passed through respective delays 112,122 and settled into valid, stable states at the respective input terminals of their respective LUT's (e.g., 105A). More precisely, the 'wait for' constraint of strategy box 151 may define a waiting period that extends beyond the settle time of the IN-1, IN-2 signals so as to also account for logic delays 115 and 125. Once the 'wait for' condition of box 151 is satisfied, the CLKEN1 enable terminal (or an equivalent) may be enabled and the next presented CLK1 pulse may then be used to trigger respective registers 118 and 128 into capturing the valid R1 and R3 result signals, and into thereby synchronizing the captured signals to one another so that their counterpart output signals, Q1 and Q3 may be forwarded together in time-aligned pipelining fashion to the next stage, namely the stage formed by units 114, 124,135 and 138.

Conceptual strategy box 152 indicates that responsiveness to the CLK2 strobe should not be enabled at least until the IN-3, IN-4 and IN-5 input sets have passed through their respective delays (e.g., 114,124) and settled into valid, stable states at the respective input terminals of LUT 105B. More precisely, the 'wait for' constraint of strategy box 152 may call for a waiting period that extends beyond the settle times of IN-3 to IN-5 so as to also account for logic delay 135. Once the 'wait for' condition of strategy 152 is satisfied, the CLKEN2 enable terminal (or its equivalent) may be enabled and the next presented CLK2 pulse can then capture the valid R2 result signal and allow it to be output (139) as the Q2 signal for synchronous forwarding to yet another pipeline stage.

Because there is only one register per LUT in the implementation of FIG. 1B, conceptual strategy box 153 is further included in FIG. 1C to indicate that responsiveness to the CLK1 strobe should additionally not be enabled (by the CLKEN1 signal or its equivalent) at least until it is assured that the R2 result signal from logic circuit 135 will be safely captured by register 108*b* (step 138) before next transitions at the outputs of registration steps 118 and 128 have a chance to ripple through delays 114, 124 and possibly invalidate the R2 output of LUT 105B. From the combination of conceptual strategy boxes 151–153, it may be seen that there are several problems associated with having only one register immediately available (and useable) for each LUT in cases where one is using the FPGA 100' to implement a synchronous (e.g., pipelined) design. First, the signal transmitting and processing resources represented by icon pairs 112/122, 115/125 and 118/128 may each have to be utilized (consumed) by a given input-set (IN-1, IN-2) for a longer period of time than may otherwise be needed because of the constraints imposed by strategy box 153 interacting with strategy boxes 151 and 152. The delay between having a valid R1 output at LUT 105A and having a corresponding valid set of inputs at LUT105B may be excessively large because of the delays associated with routing paths such as 109 and 110. Moreover, part of the resources of ISM 104*a* and LUT 105A may have to be wasted in cases where R1 needs to be a function of just, say two input terms (T1 and T2) rather than all four of input term signals, T1–T4. On the other hand, if many LUT's such as 105B need a full complement of independent input terms (T5–T8) sent from a preceding lookup table (e.g., 105A), then large portions of the general interconnect resources, such as switchboxes 102D, 102G and bus 103E may have to be consumed for supporting these needs. That disadvantageously reduces the amount of general interconnect resources available for servicing other needs.

While our focus remains on FIGS. 1B–1C, we note that it is possible (although usually not practical) to 'programmably' increase the effective number of registers made available to a given LUT such as 105B. This may be done by 'sacrificing' (wasting) an up-front LUT such as 105A by configuring that first LUT 105A to implement a 'programmable feed-through' (PFT) function, where say, R1=T1. Then, the backend register 108*a* of the first LUT, 105A may be used to perform an up-front capturing function for a second LUT, say, 105B. More specifically, after the first backend register 108*a* captures the programmably fed-through T1 signal (where the PFT operation is represented by dashed line 116 in FIG. 1C), an interconnect path such as 109 (FIG. 1B) may be used to forward the up-front, PFT'd (116) and captured signal Q1 to a corresponding input of the second LUT, 105B. In such a PFT'd (116) case, the second LUT, 105B will have the services both of an up-front, data-capturing register 108*a* and of its own backend register 108*b*. Pipelined operations can then be carried out more naturally. However, such a PFT'ing approach (116, 126) wastes most of the selective, signal-acquiring resources of ISM 104*a* because all or most of them are not being used to develop a multi-input function, R1=f(T1–T4). Such a PFT'ing approach (116, 126) also, of course, wastes essentially all of the signal-processing resources of the sacrificed LUT, 105A. Therefore, even though the PFT'ing option is represented in FIG. 1C, for sake of completeness, by dashed lines 116 and 126; the PFT'ing option is rarely a practical one for realizing pipelined synchronization within an FPGA.

Figure 1D:
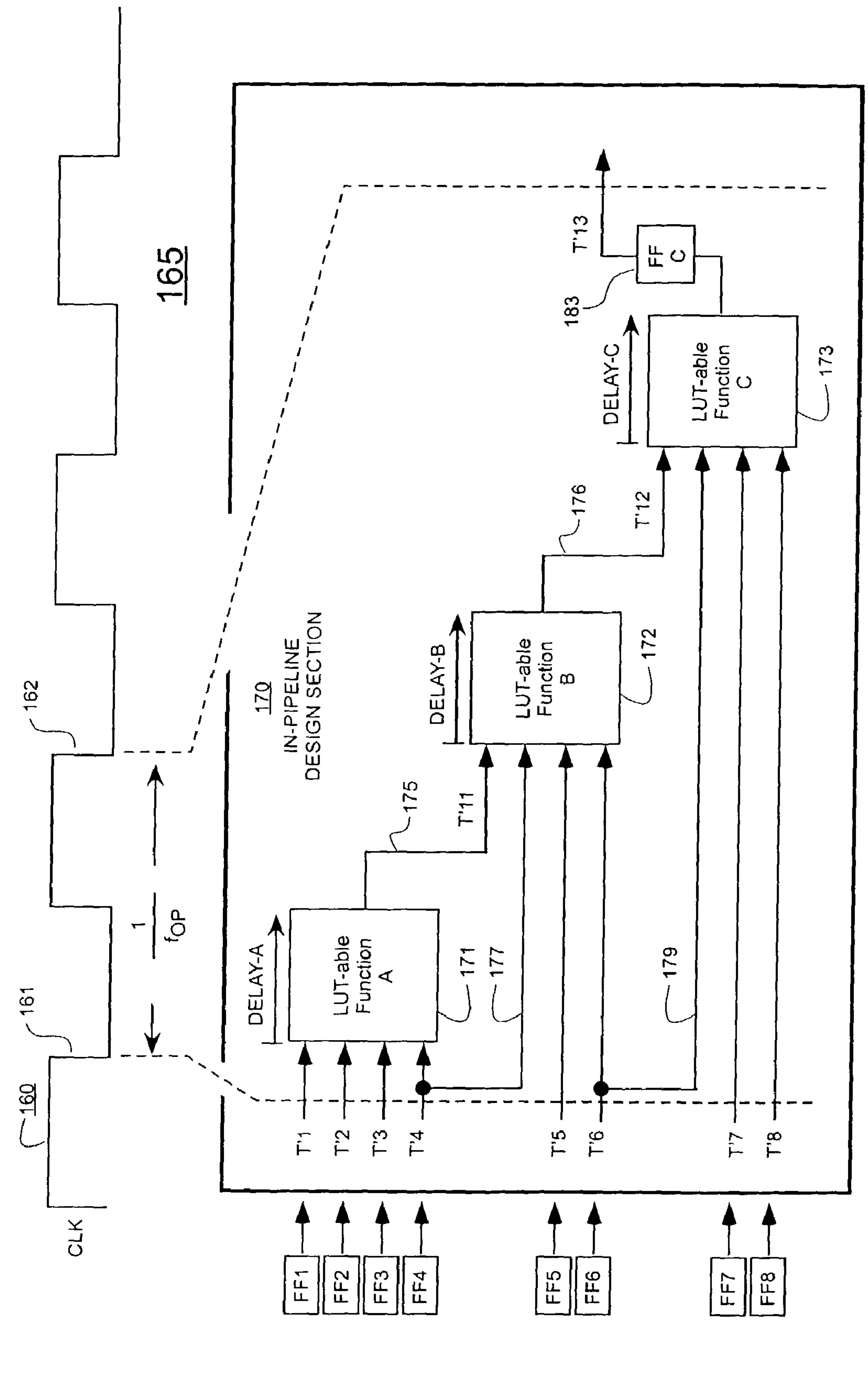
FIG. 1D is a schematic of a one stage, pipelined design section that may be implemented within an FPGA.

FIG. 1D begins the alternate explanation for why more accessible (usable) registers per LUT is a good thing. A to-be-implemented design 165 is assumed to have a main synchronization clock (CLK, 160) whose trailing edges 161, 162 mark off inter-signal synchronization events. At the time of clock edge 161, all of input term signals, T'1 through T'8 of a given design section 170 (part of a pipelined overall design—not shown) are time-aligned to one another. One way such time-alignment could have been assured is if associated flip-flops FF1 through FF8 were all strobed by the first clock edge 161 and they responsively output signals, T'1 through T'8. Flip-flops FF1—FF8 are assumed for now to be outside of design section 170 and therefore their presence is to be momentarily ignored.

By the time that a successive, second trailing clock edge 162 occurs, all of the signal processing operations of functions A, B and C (boxes 171–173) should complete so that pipeline output register 183 (also denoted as flip flop FF-C) outputs the T'13 output signal in synchronism with the second clock edge 162. Since the function-A output signal 175 cascades through function-B and similarly, the function-B output signal 176 cascades through function-C, the cumulative delays of the function-implementing blocks 171, 172 and 173 have to be such that their sum is no more than the clock period ($T=1/(f_{OP})$) defined by the gap between successive clock edges 161 and 162. If the respective propagation delays (DELAY-A through DELAY-C) of units 171–173 are each increased, that increase inherently forces a wider time gap between successive clock edges 161 and 162 and thereby inherently forces the operating frequency, fop of the illustrated design section 170 to decrease commensurately.

There are many applications in which it is desirable to have relatively high operating frequencies (fop) and where slightly increased signal latency is not a major problem. Examples include image processing circuits and/or telecommunication circuits where the resulting outputs are for human consumption. One way of increasing the operating frequency (fop) of a design section such as the one 170 illustrated in FIG. 1D is to simply insert additional registers and thereby increase the number of pipeline sections. The results of a first such register-insertion step are shown in FIG. 1E and those of a second such register insertion step are shown in FIG. 1F.

Before moving to these subsequent figures, we examine FIG. 1D in more detail just to take note of a few important features. Function-A is shown to be "LUT-able", meaning that it may be implemented in a particular kind of lookup table 171, which in this example happens to have only four address input terminals, T'1–T'4, and only one output line 175 (which outputs function result signal T'11). Function-B is similarly LUT-able by way of the illustrated 4-input, configurable lookup table means 172 and function-C is similarly LUT-able by way of the illustrated 4-input, configurable lookup section 173. It is often the case that an input term of one function (e.g., A) can be "shared" because it is also designated as an input for one or more other functions. Accordingly, line 177 shows the sharing of the T'4 input signal amongst the inputs of lookup means 171 and 172. Similarly, line 179 shows the sharing of the T'6 signal by the input lines of lookup means 172 and 173. In FIG. 1D, eight input term signals, T'1 through T'8 are being transformed into a single result signal, T'1 3. Such compressive transformation of 8 input signals into 1 output, or a 16 to 1 compressive transformation, or a 4 to 1 compressive transformation (which is what Function-A is shown to be doing) are relatively common in nibble-based, byte-based, or 16-bit word based designs.

Figure 1E:
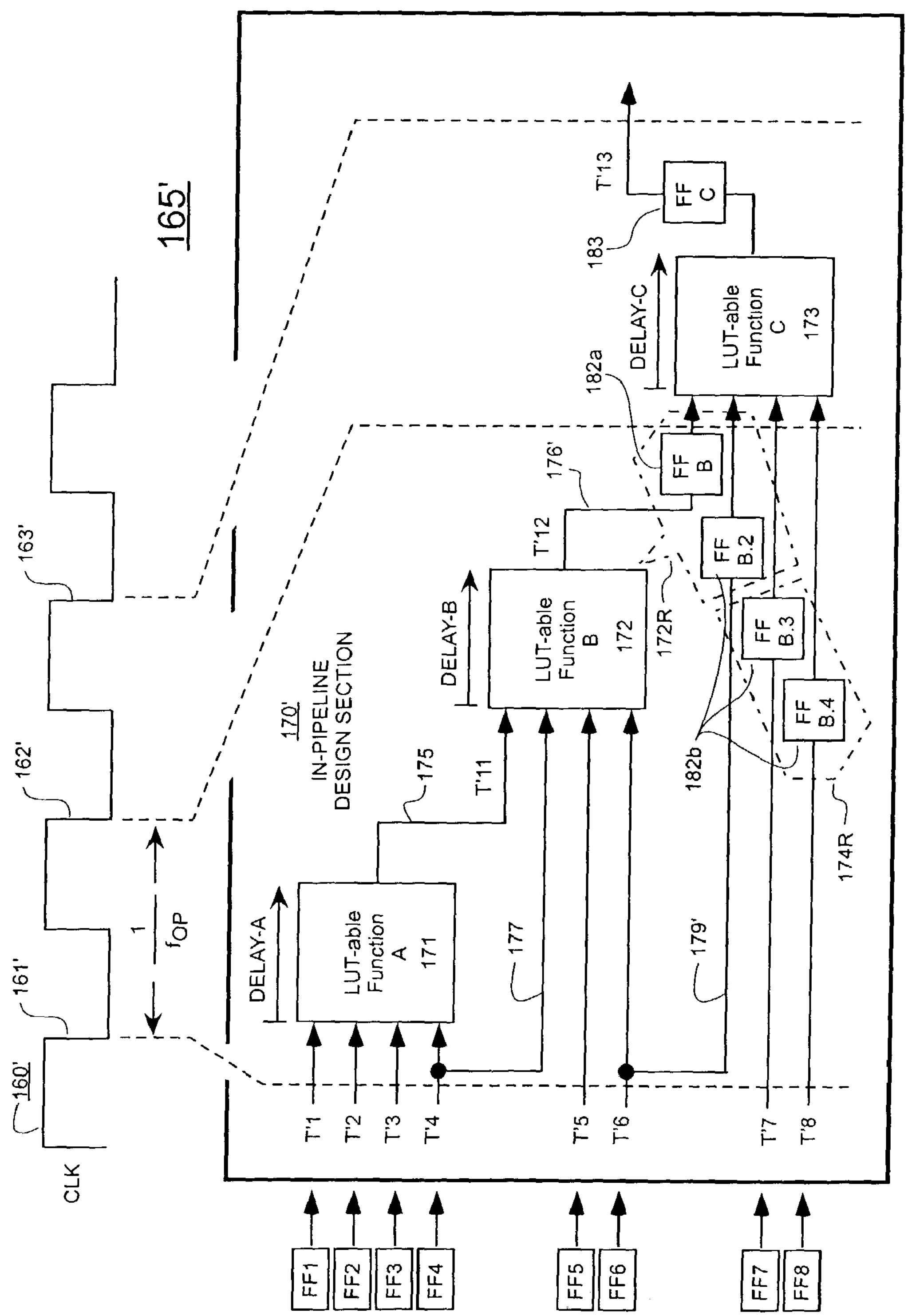
FIG. 1E is a schematic of a revision of the pipelined design section of FIG. 1D wherein a first set of additional registers has been inserted to thereby define two pipeline stages and to thereby allow for a higher operating frequency.
Figure 1F:
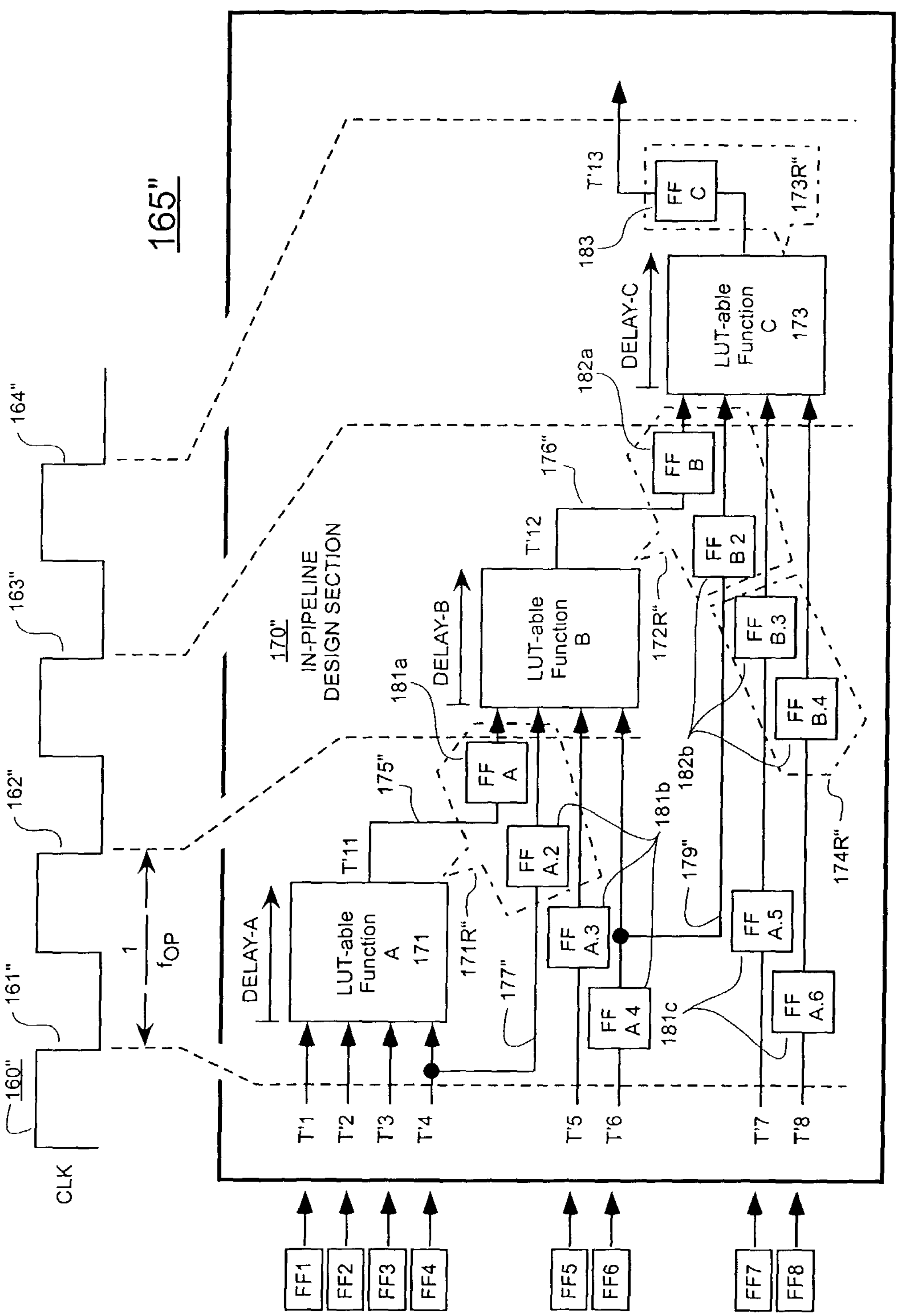
FIG. 1F is a schematic of a further revision of the pipelined design section of FIG. 1E wherein a second set of additional registers has been inserted to thereby define three pipeline stages and to thereby allow for an even higher operating frequency.

In FIG. 1E, a first new register 182*a* (FF-B) has been inserted between the output 176' of lookup means 172 and the corresponding input of lookup means 173. The output of this new FF-B is synchronized to second clock edge 162' while the output of flip flop FF-C is now synchronized to the illustrated third clock edge 163'. In order to keep the T'7 and T'8 input signals, as well as the input signal on line 179' in synchronism with the registered, T' 12 signal; additional registers 182*b* are inserted at locations FF-B.2, FF-B.3, FF-B.4 as shown. (The possible allocation of FF-B and FF-B.2 into a first register group 172R and the possible allocation of FF-B.3 and FF-B.4 into a second register group 174R will be discussed later below.)

The operating frequency (fop) of this revised design section 170' can be increased because the spacing between successive clock edges 161' and 162' needs only to accommodate the DELAY-A and DELAY-B of respective lookup means 171 and 172 rather than all three cascaded delays: DELAY-A, DELAY-B and DELAY-C. The latter DELAY-C is absorbed in the time period between successive clock edges 162' and 163'.

If the arrangement of FIG. 1E is compared to that of FIG. 1D, it may be readily seen that the original arrangement 165 called for only three lookup means (171–173) and only one register (183). By contrast, the more heavily-pipelined arrangement 165' of FIG. 1E calls for the presence of five registers (182*a*, 182*b*, 183) in association with the same three lookup means (171–173). The number of registers per LUT has gone up dramatically, namely, from a ratio of 1/3 to a ratio of 5/3. It is of course possible that not all of the input-term lines will have to be so-registered, particularly if one or more of the input-term lines (e.g., T'7 and T'8) have signals which remain effectively constant during the operations carried out by the in-pipeline design section 170' (FIG. 1E). The illustrated example shows an extreme case.

FIG. 1F similarly shows an extreme case wherein the original single pipeline section design 170 of FIG. 1D has been converted into a three pipelined-sections design 165". A further register has been inserted at position FF-A. The output of this additional register 181*a* (FF-A) is synchronized to clock edge 162"while the output of register 182*a* (FF-B) is synchronized to edge 163" and the output of register 183 (FF-C) is synchronized to clock edge 164". Register set 181*b* (FF-A.2, F-A.3, FF-A.4) and register set 181*c* (FF-A.5, FF-A.6) have been inserted to keep all the relevant signals in time-alignment with one another. Now the ratio of registers to LUT's for the overall design section 170" is 11 to 3 (not counting external registers FF1–FF8). It may be seen from the examples given here that heavily-pipelined designs can benefit from having a relatively large number of registers being accessible for synchronously delaying signals at the "front-end", inputs-side of each lookup table means (e.g., 173 of FIG. 1F) and at the "back-end" output side of such lookup means (e.g., register 183 which may be associated with LUT 173). The question now becomes how to efficiently provide for a large number of accessible registers per lookup table while keeping in mind other aspects of FPGA architectures, particularly that of having a flexible configurable interconnect.

Figure 1G:
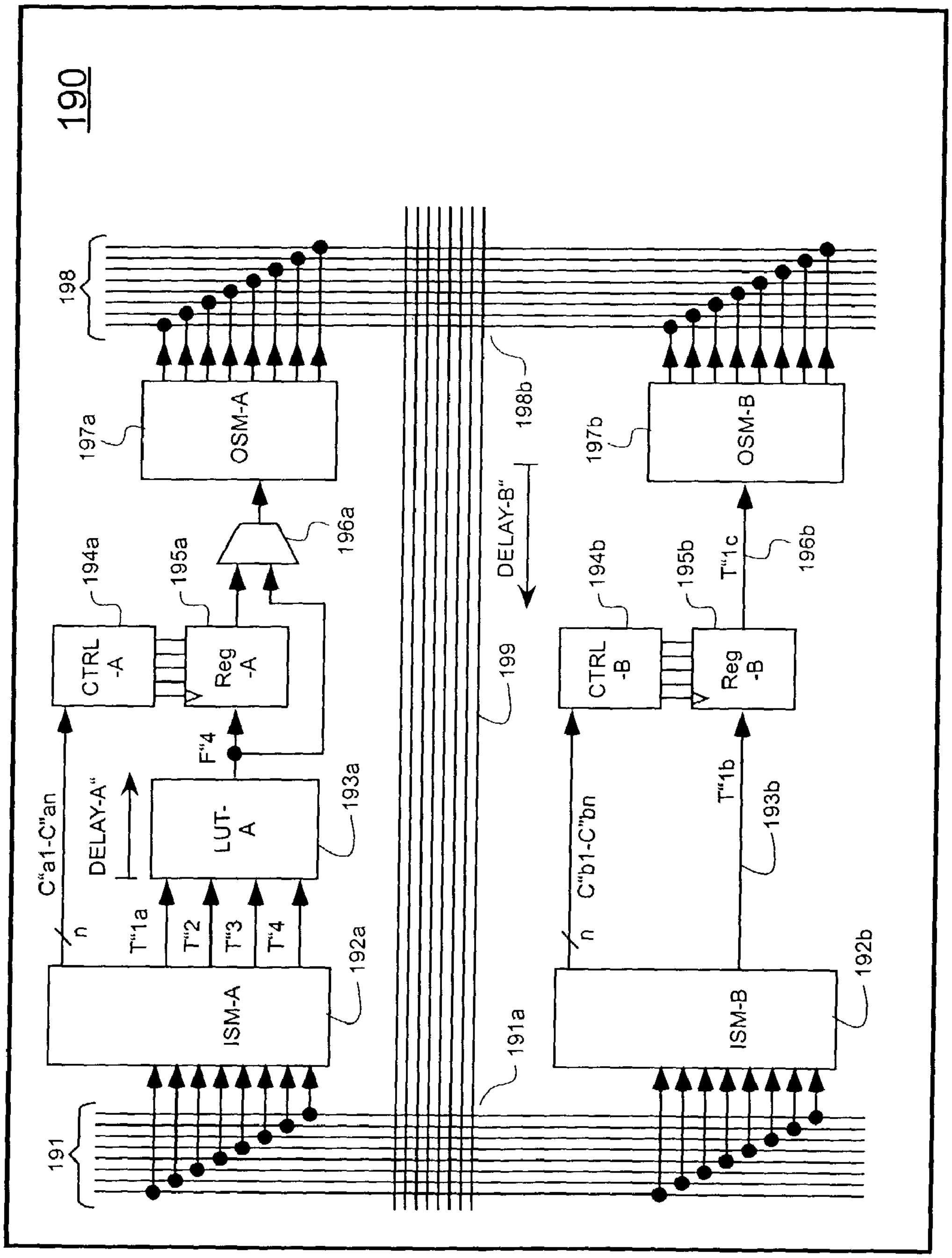
FIG. 1G is a schematic showing one possible way to add more registers to an FPGA, where the purpose of the schematic is to demonstrate the inefficiencies of this one possible way.

FIG. 1G is a schematic showing one possible way 190 (a hypothetical way) to add more registers to an FPGA so as to increase the registers per LUT ratio. The purpose of the schematic is to demonstrate the inefficiencies of this one possible way 190. In the hypothetical FPGA of FIG. 1G, items 191, 198 and 199 represent general interconnect lines. Although not explicitly shown, intersection 191*a* and 198*b* are understood to be occupied by switchboxes that provide for user-configured routing of signals between the there-intersecting ones of interconnect buses 191, 198 and 199. Item 192*a* is a first input switch matrix (ISM-A, which can be single stage) that is user-configurable for selectively acquiring input term signals T"1*a*, T"2, T"3 and T"4 for application to a corresponding LUT-A (item 193*a*) from amongst a larger set of possible signals available on interconnect bus 191. The LUT-A result signal (F"4) may be routed through a first register 195*a* (REG-A) and then through a register-bypass multiplexer 196*a* to a corresponding input of a first output switch matrix 197*a* (OSM-A) or the LUT-A result signal (F"4) may be instead routed directly through the register-bypass multiplexer 196*a* for application to the corresponding input of OSM-A. The latter, first output switch matrix 197*a* can selectively route the output of multiplexer 196*a* to one or more interconnect lines in general interconnect bus 198. Control box 194*a* is for selectively applying register control signals such as clock, clock-enable, set, reset, etc. to REG-A (195*a*). The REG-A control signals may be derived from a corresponding set of n acquired control signals, C"aI—C"an that are selectively acquired from the adjacent interconnect 191 by the first input switch matrix 192*a*.

A brute force way of increasing the number of registers per LUT is simply to copy from the top half of FIG. 1G to its bottom half while replacing LUT-A with a simple feedthrough wire 193*b* and while also replacing register-bypass multiplexer 196*a* with another simple wire 196*b*. This replication can occur more than once to thereby provide many additional registers such as 195*b* (REG-B) per lookup table (e.g., 193*a*). Item 192*b* (ISM-B) serves as an input switch matrix for selectively acquiring the registrable feedthrough signal T"1*b* which is then supplied to register 195*b*. ISM-B also supplies the n control signals, C"b1-C"bn to register control box 194*b* (CTRL-B). The second output switch matrix 197*b* (OSM-B) can selectively route the output signal, T"1*c* of second register 195*b* to one or more interconnect lines in general interconnect bus 198.

Suppose it was desirable to synchronize the T"l b signal to a particular clock edge (e.g., of signal C"b1) before presenting itto an input (e.g., T"1*a*) of LUT-A. This could be accomplished by using ISM-B to acquire the T"1*b* signal and its respective synchronization clock (e.g., C"b1) and by further using the second register 195*b* (REG-B) to produce the correspondingly synchronized output signal T"1*c*. The second output switch matrix 197*b* (OSM-B) would then be used to selectively route the registered T"1*c* signal to a desired one or more interconnect lines in general interconnect bus 198. The general interconnect switchboxes (not shown) at intersections 198*b* and 191 could then be used to selectively route the registered T"1*c* signal via interconnect buses 199 and 191 to ISM-A for subsequent coupling to the T"[1] a input terminal of LUT-A. If one wanted to further have similarly pre-registered signals at the T"2, T"3 and T"4 input terminals, another three copies (not shown) of the circuit defined by items 192*b* through 197*b* could be used.

Some of the inefficiencies in the approach that is proposed immediately above are as follows: Input switch matrices and output switch matrices tend to consume significant amounts of circuit real estate. It would be a poor use of scarce circuit real estate to use ISM-B (192*b*) and OSM-B (197*b*) simply for servicing a relatively small register such as the one shown at 195*b*. If REG-B (195*b*) is not used, then the resources of items 192*b* (ISM-B), 194*b* (CTRL-B) and 197*b* (OSM-B) are wasted. In heavily pipelined designs, the front-end and/or back-end registers often rely on same clock, set and/or reset control signals. It is wasteful to have ISM-B selectively acquire control signals C"b1-C"bn and to have controls-deriving circuit 194*b* (CTRL-B) produce the register control signals for REG-B when the ISM-A (192*a*) and CTRL-A (194*a*) circuits are doing the same thing for REG-A. If register-bypass multiplexer 196*a* is in its register-bypassing mode, then REG-A (195*a*) and its dedicated controls-deriving circuit 194*a* (CTRL-A) are wasted (not usefully employed). If the signals on input terminals T"3 and/or T"4 are not used by LUT-A (193*a*) then those parts of ISM-Athatare or could have been used to generate the corresponding T"3 and T"4 are wasted. Moreover, not only are general interconnect resources consumed in routing the registered T"1*c* through buses 198, 199 and 191 and their switchboxes (not shown) at intersections 191*a* and 198*b* to get to LUT input terminal T"1*a*; the routing-related DELAY-B" disadvantageously adds to the LUT-related DELAY-A" so as to reduce the operating frequency (fop) that could otherwise have been used given the silicon or other technology of the hypothetical FPGA 190.

Figure 2A:
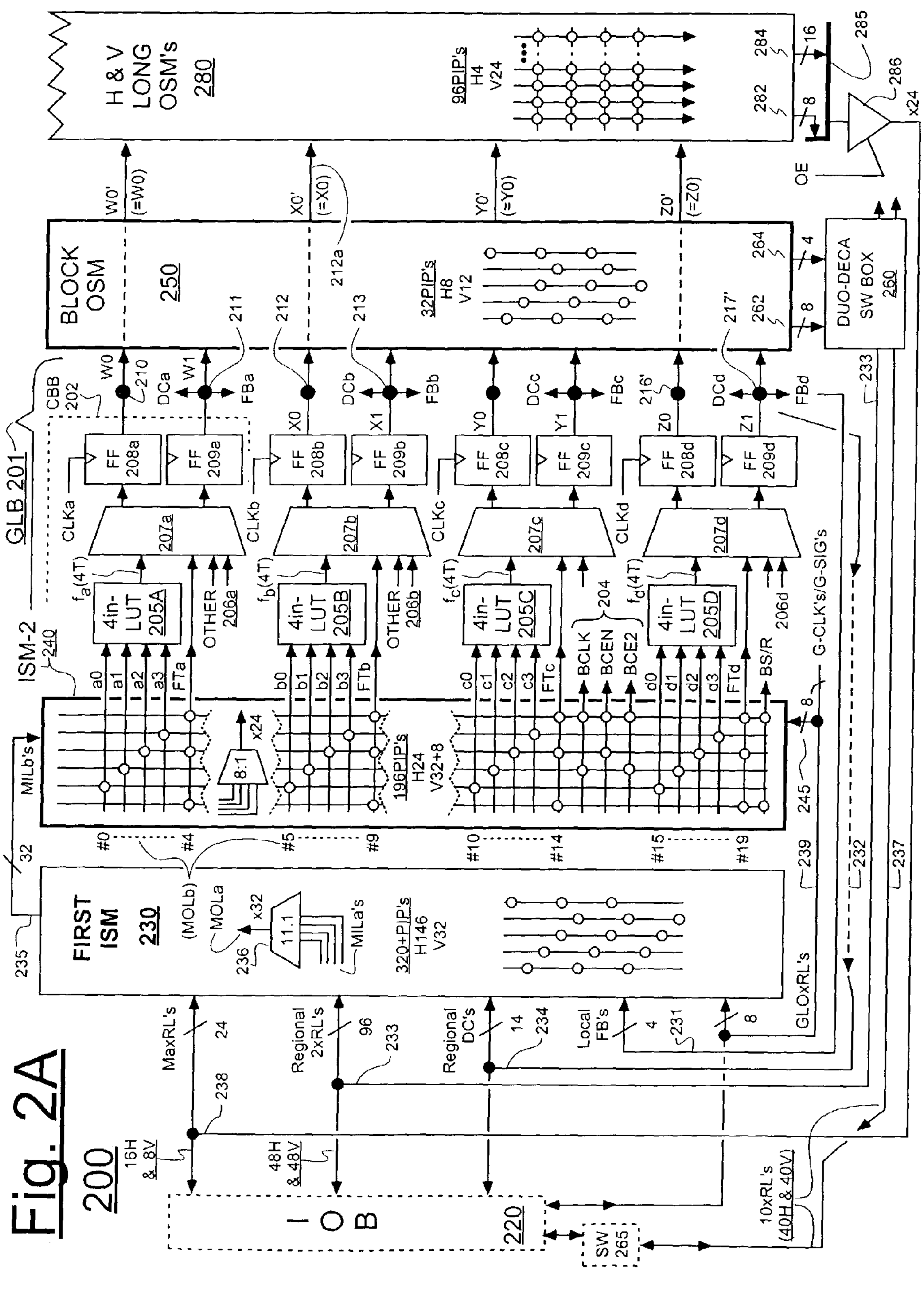
FIG. 2A illustrates a first register-intensive FPGA in accordance with the present disclosure wherein the average number of registers per function-spawning lookup table (fs-LUT) is greater than unity and wherein configurable couplings are provided so that the plural registers may be used in a variety of ways; these configurable couplings including those which can feed-through, locally-acquired signals of the logic block to the logic block registers for storage in the registers, and those which can locally feed-back register outputs for processing by other parts of the logic block.
Figure 2B:
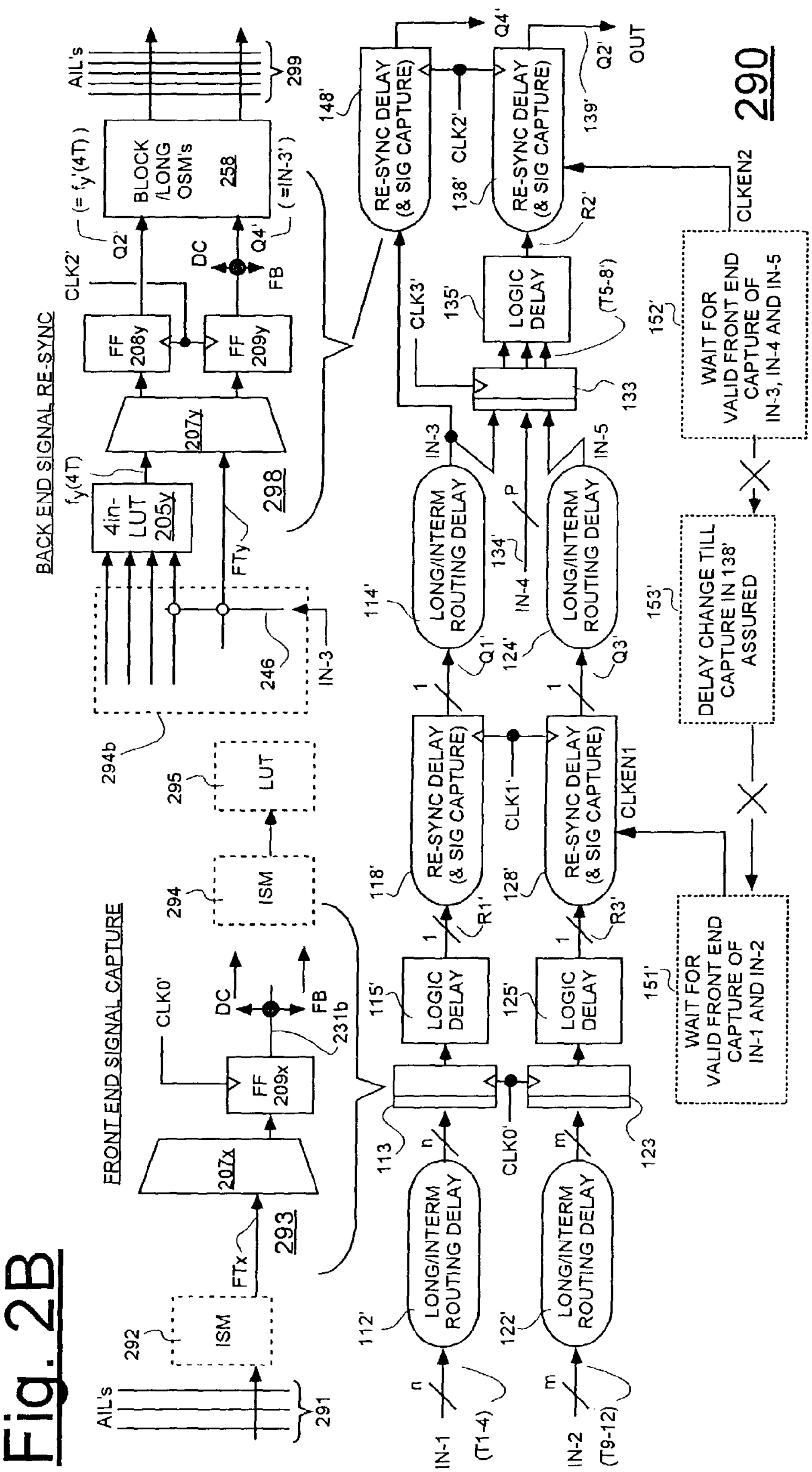
FIG. 2B is a conceptual diagram showing how problems with timing constraints and interconnect wastage may be alleviated by use of signal coupling and synchronization approaches made possible by the FPGA embodiment of FIG. 2A.
Figure 2C:
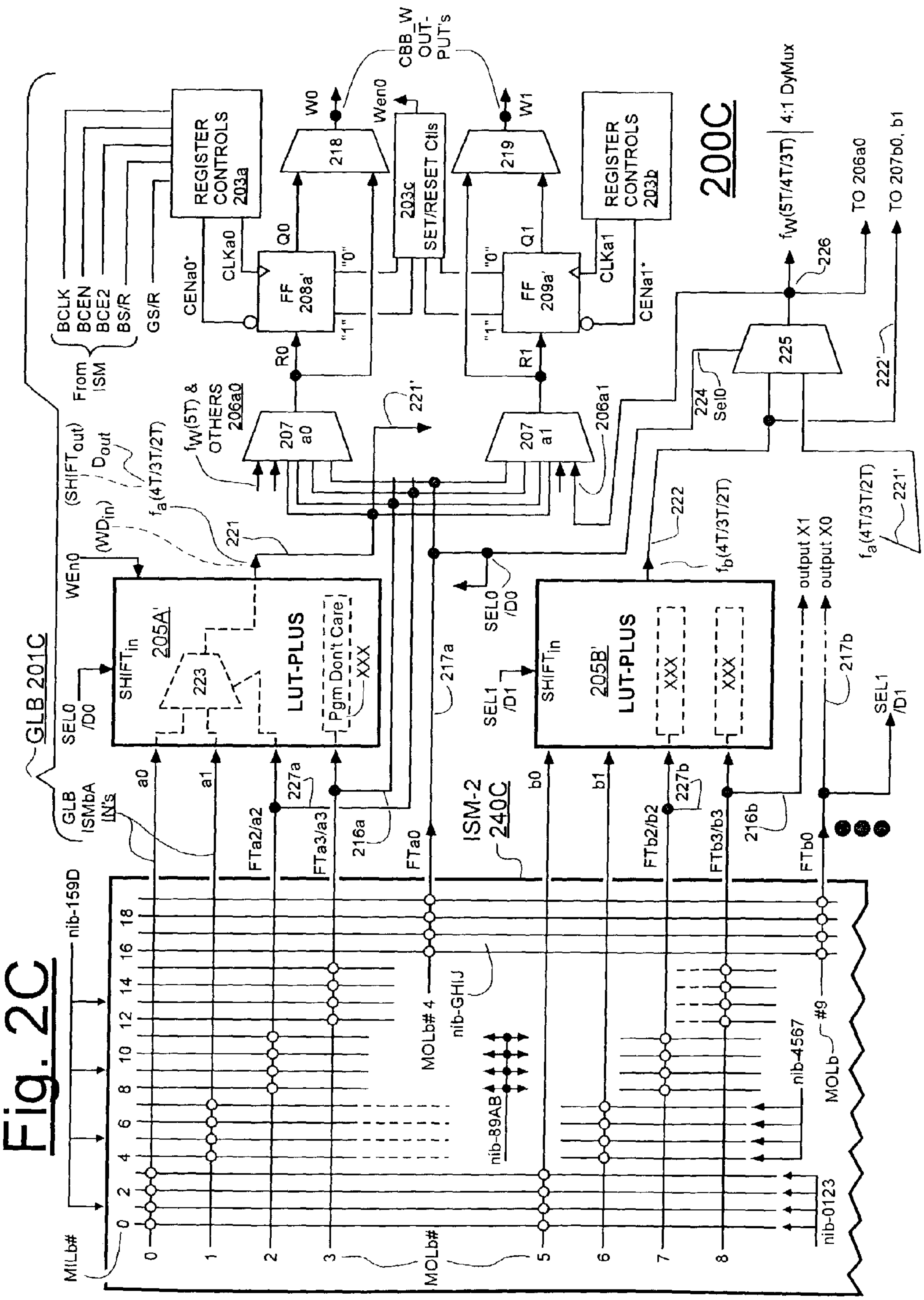
FIG. 2C illustrates in more detail a first (simple) example of how a second-stage of a dual-stage ISM may be structured and how an associated Generic Logic Block (GLB) may be correspondingly structured to provide feedthrough-based register recovery and/or variable-grain function synthesis.
Figure 2D:
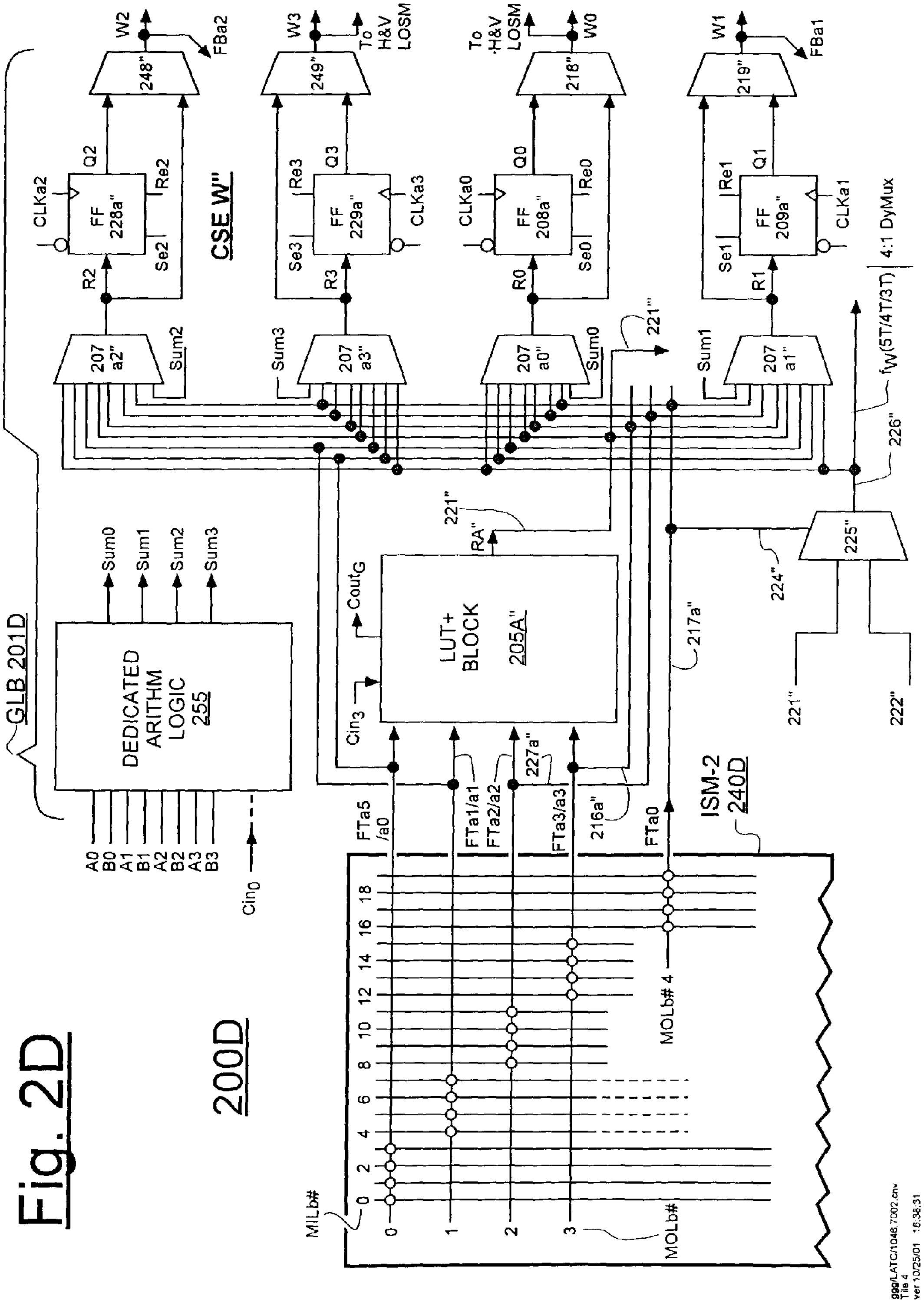
FIG. 2D illustrates in more detail a second (simple) example of how a second-stage of a dual-stage ISM may be structured and how an associated Generic Logic Block (GLB) may be correspondingly structured to provide feedthrough-based register recovery and/or variable-grain function synthesis and how the number of in-GLB registers per fs-LUT can be 2 or more.
Figure 2E:
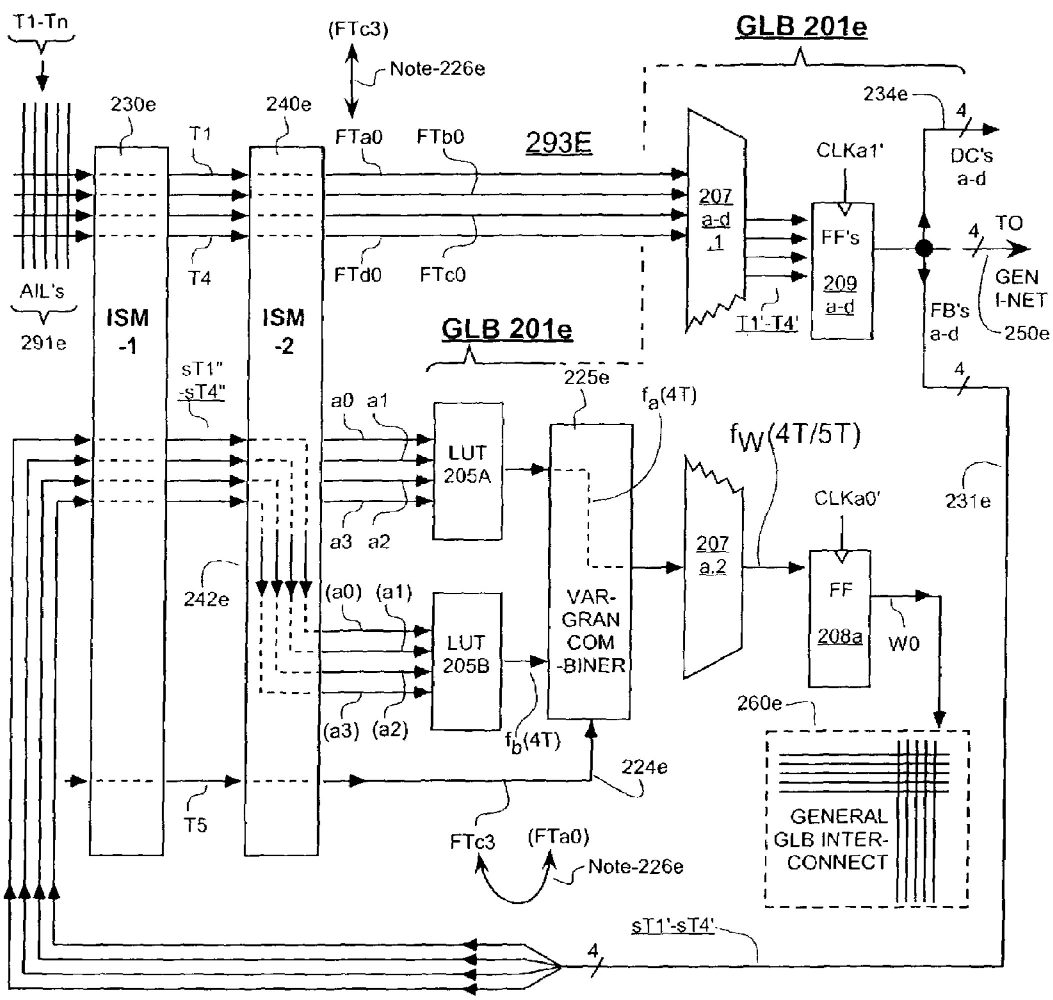
FIG. 2E is a signal flow diagram showing certain uses of features in a register-intensive FPGA that is structured in accordance with FIG. 2A, where the uses take advantage of register intensiveness, local feedback capabilities and/or variable logic granularity features found in the GLB and/or its associated dual-stage ISM.
Figure 2F:
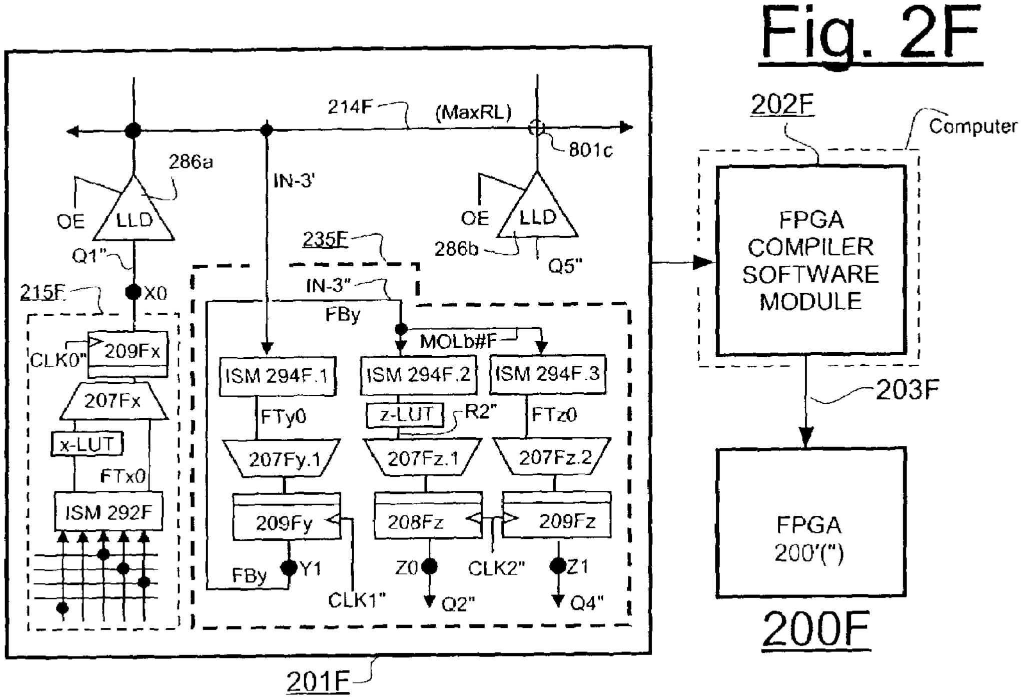
FIG. 2F diagrams a first, machine-implemented (e.g., software implemented) design partitioning and packing operation that seeks to exploit the feedthrough and register-intensive resources of an FPGA that is structured in accordance with the disclosure so as to compactly provide for one or more of front-end registration, back-end registration and signal re-synchronization.
Figure 2G:
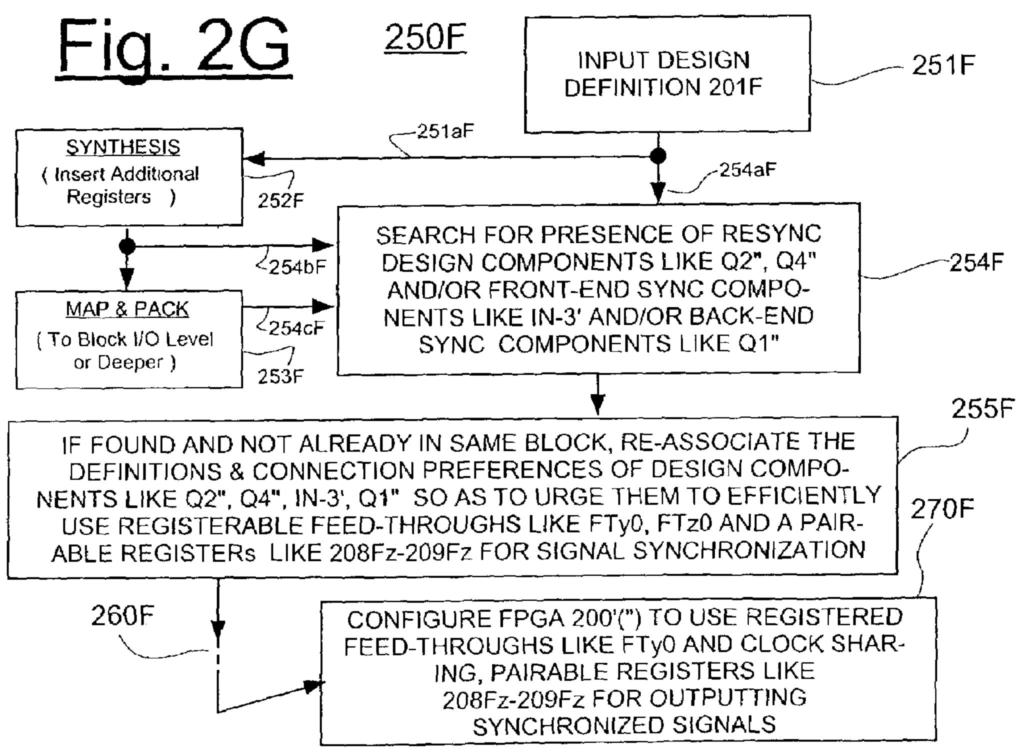
FIG. 2G flow charts a first possible set of synthesis and/or mapping/packing and/or place-and-route software operations that strive to conform with the implementation suggestions shown in FIG. 2F.
Figure 2H:
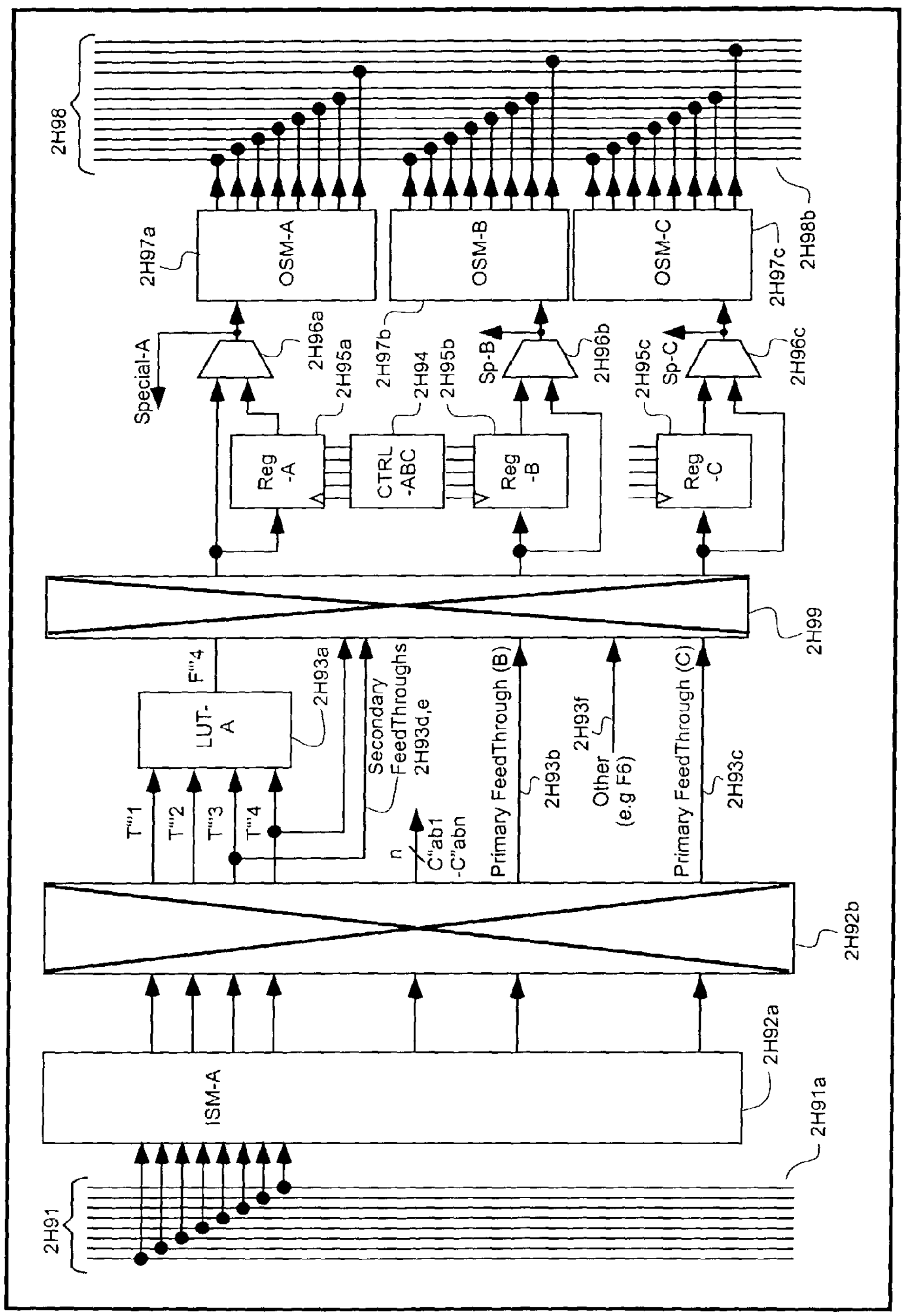
FIG. 2H is a block diagram providing an overview of an FPGA architecture that has plural registers per LUT and that is structured in accordance with the present disclosure to provide programmable sharing of signal-acquiring resources of a first ISM stage and/or to provide programmable sharing of output sequencing resources such as the plural registers and/or such as output line drivers and/or output switch matrices associated with the shareable registers.

FIGS. 2A and 2H illustrate methods for overcoming the above described problems while increasing the average number of accessible registers per LUT. Before going on to discuss some of the improvements represented by FIGS. 2A–2H, it is worthy to mention here that, in modern FPGA's, the interconnect structures are not as simple as suggested by FIGS. 1A and 1B. Once again, FIGS. 1A–1C have been presented for the purpose of introducing certain concepts. In modern FPGA's, many different kinds of conductors, switchboxes, signal boosters, and the like may be provided to try to overcome constraints associated with signal-propagation delays, routability problems and function complexity. For example, practitioners may choose to reduce the delays encountered by signals traveling between neighboring CLB's, by using so-called, direct-connect wires (not shown in FIG. 1B). Such direct-connect wires (DC's) provide dedicated, continuous paths between a signal-sourcing CLB and adjacent CLB's in its neighborhood. Practitioners may further choose to reduce the delays encountered by signals traveling between CLB's that are spaced far apart, by using so-called, longline wires (not shown in FIG. 1B). Such longlines often each extend continuously in the vertical or horizontal direction across the full span of the array of CLB's. Moreover, certain signals such as system clocks may be globally distributed to all CLB's of an FPGA by means of global distribution lines. (Global distribution lines are also not shown in FIGS. 1A–1B.)

The use of direct-connects, longlines, global lines, and/or other such alternate interconnect means does not provide a cure-all solution for problems faced in different design implementations. General, programmable interconnect resources such as line segments 103*a*–103*b* and switchboxes 102*a*–102*d* of FIG. 1A still often need to be included for tackling general-purpose routing problems. One cannot provide a separate direct-connect (DC) wire between each first CLB (which CLB may act as a signal-source) and every other CLB that may potentially need to receive the signal. If that were attempted, the number of DC wires would explode to astronomic values as the size of the FPGA array scales upwardly. Similarly, one cannot depend solely on linear longlines for providing interconnection because routability would be severely limited and excessive delay, resource wastage and/or power wastage may be encountered by signals that need to travel only a relatively short distance but are nonetheless directed by the place-and-route software to consume a full longline. It is therefore common practice to provide a mix of different lengths and of different kinds of interconnect resources within a modern FPGA, including the provision of general routing kinds of interconnect that provide generically flexible signal routing. It is common practice to also include specialized kinds of interconnect resources such as direct-connect lines (DC's) and longlines (LL's).

Similarly, when it comes to the logic-implementing circuit blocks (e.g., CLB's), it is useful to have a mix of general-purpose and special-purpose means for providing generically variable functionality and some fixed functionality (e.g., arithmetic functionality). The question arises however, as to what particular mix (or mixes) of specialized and general-purpose interconnect resources should be provided, and what particular mix (or mixes) of specialized and general-purpose logic resources should be provided, and how can these mixes of specialized and general-purpose resources be used efficiently?

Referring to FIG. 2H as a counterpart to FIG. 1G, it may be seen from a broad overview that signal-acquiring resources of ISM stage H92a are in some sense "shared" by plural registers such as 2H95*a*, 2H95*b*, 2H95*c*, etc. (only 3 registers shown, but the possibility of more is understood). This helps to minimize the circuit overhead that would otherwise be added when adding more registers per LUT. An in-series provided, second ISM stage 2H92*b* enables a programmably configurable allocating of the selective signals-acquiring capabilities of the first ISM stage 2H92*a*. An in-series provided, registers-feeding multiplexer 2H99 enables a programmably configurable allocating of the signal-storing capabilities of the plural registers (Reg-A, Reg-B, Reg-C, etc.) for use by an F'''4 result signal output by LUT 2H93*a* and/or by a Primary Feedthrough signal carried on line 2H93*b* and/or by another signal (e.g., an F6 signal representing a function of 6 input terms) carried on line 2H93*f*.

Moreover, in FIG. 2H, a shared registers-controls circuit 2H94 provides substantially same control signals (e.g., a same clock signal although perhaps slightly different clock-enable signals) to plural registers such as the illustrated Reg-A, Reg-B, and Reg-C. This further helps to minimize the circuit overhead that would otherwise be added when adding more registers per LUT. Moreover, if the signals on input terminals T'''3 and/or T'''4 are not used by LUT-A (2H93*a*) then the selectively-acquired T'''3 and/or T'''4 signals can serve as secondary feedthrough signals 2H93*d,e* that can be routed through the registers-feeding multiplexer 2H99 to desired ones of Reg-A, Reg-B, Reg-C, etc. As a consequence, those parts of ISM-A that are used to generate the corresponding T'''3 and T'''4 signals are not wasted. Note that all of the following, in-logic block resources of FIG. 2H can be used at the same time without wasting one of them: LUT-A, Reg-A, Reg-B, and Reg-C. Reg-A can receive the F'''4 result signal of LUT-A while Reg-A and Reg-B can receive independent input term signals via primary feedthrough lines 2H93*b* and 2H93*c*. On the other hand, if one or more of the input term signals of LUT-A needs re-synchronizing as is the case for example in FIG. 1F for the signal on line 177 (T4), the secondary feedthroughs 2H93*d* and/or 2H93*e* can be used for efficiently providing such re-synchronizing. (This is efficient because a same first part of the ISM-A stage (2H92*a*) and a same second part of the ISM-B stage (2H92*b*) are being re-used: once for supplying a selectively acquired one or more signals to corresponding input terminals (T'''3, T'''4) of LUT-A and a second time for supplying the same selectively acquired one or more signals to corresponding registers such as Reg-B, and Reg-C.

Yet further in embodiment 2H90 of FIG. 2H, each of register-bypassing multiplexers: 2H96*a*, 2H96*b*, 2H96*c*, etc. outputs not only to a respective, and substantially equivalent OSM (2H97*a*, 2H97*b*, 2H97*c*, etc.; note the bottommost output line of each of these OSM's is shown going to a different line in bus 2H98 while the rest go to same lines 2H98), but also each such register-bypassing multiplexer outputs to a special signal-routing resource such as the illustrated Special-A, Sp-B and Sp-C. The special signal-routing resources can be so-called local feedback (FB) lines and/or direct-connect (DC) lines as shall become clearer below.

FIG. 2H illustrates some of the more general aspects of FPGA's that are structured and used in accordance with the present disclosure. However, when increasing the number of simultaneously accessible registers per LUT, the finer question asks how many additional registers should be added per LUT and what are the overhead costs of adding larger numbers of such registers. In the embodiment 2H90 of FIG. 2H, 2 additional registers, Reg-B, and Reg-C have been added beyond the normally-present Reg-A. However, that entails the providing of primary feedthrough lines 2H93*b* and 2H93*c* plus their corresponding parts in ISM stages 2H92*a* and 2H92*b* if independent and simultaneous access to all 3 registers (A,B,C) is to be made available.

A first, more conservative approach might eliminate the "C" feedthrough line 2H93*c* and its corresponding parts in ISM stages 2H92*a* and 2H92*b* to thereby reduce the amount of circuit real estate consumed by each logic block. This first conservative approach may rely on the assumption that at least one of the secondary feedthroughs, 2H93*d* and 2H93*e* will be used for recovering a corresponding one or both of Reg-B, and Reg-C while LUT-A outputs in PFT mode or otherwise to Reg-A.

A second, even more conservative approach might eliminate Reg-C as well as the "C" feedthrough line 2H93*c* and its corresponding parts in ISM stages 2H92*a* and 2H92*b* to thereby reduce the amount of circuit real estate consumed by each logic block. OSM-C (2H97*c*) and register-bypass multiplexer 2H996*c* would also be eliminate in such a very conservative approach. However that may also reduce the signal routing and/or descrambling efficiencies that could otherwise be obtained from the second-stage ISM (2H92*b*).

A third, more liberal approach might add even more independently accessible registers (e.g., Reg-D, Reg-E, etc. not shown) to the repeatable structure 2H90 shown in FIG. 2H while adding yet further secondary-feedthrough lines (not shown) and/or further primary-feedthrough lines (not shown). A common registers-control circuit (e.g., 2H94) might be used for all these further added registers or further, common register-controlling circuits like 2H94 might be added with each serving, say 2 or 3 or 4 of the in-block registers (Reg-A through Reg-N).

A fourth, yet more liberal approach might add more LUT's between circuit sections 2H92*b* and 2H99 of FIG. 2H while giving the output (F'''4) of each such LUT simultaneous access to more than one of the in-block set of registers. One particular embodiment uses a mixture of such conservative and liberal approaches as shall now be seen.

Referring to FIG. 2A, we begin to introduce a first particular embodiment 200 in accordance with the present disclosure of invention and we begin to point out various features that may be included in that first FPGA embodiment 200. The more notable features include one or more of the following:

(a) The provision of plural, simultaneously-accessible registers (e.g., 208_a_, 209_a_) for each function-spawning LUT (e.g., where each fs-LUT such as 205A is also referred to herein on occasion as a base lookup table);

(b) The provision of primary feedthrough lines (e.g., FTa–FTd) that can transmit locally acquired input signals (e.g., 235) to the plural state-storing registers (e.g., registers 208_a_–209_d_) and/or that can transmit such locally acquired input signals from virtually any kind of adjacent interconnect line (e.g., MaxRL, DC) or intra-connect line (e.g., FB) to virtually any kind of other adjacent interconnect line (e.g., 2xRL, DC, MaxRL) or intra-connect line (e.g., FB);

(c) The provision of register-feeding multiplexers (e.g., 207_a_) that can select from amongst LUT output signals (e.g., fa(4T)), and/or the signals of the primary feedthrough lines (e.g., FTa) and/or other signals (e.g., 206_a_) for feeding to data inputs of the plural state-storing registers or, if such registers are bypassed, for feeding to output routing structures (e.g., BOSM, HN-LOSM, DC, FB) of the bypassed registers;

(d) The provision of local feedback lines (231, FBa–FBd) that can feed back registered signals—or unregistered signals, if the particular register is programmably bypassed—where the so-fedback signals (231) may define part of a set of selectable signals which may be locally acquired for further processing by a corresponding Generic Logic Block (GLB) 201 that generates the local feedback signals; and (e) The provision of a secondary input switch matrix stage 240 (ISM-2), where the secondary ISM stage can provide at least one of the functions of:

(e.1) selectively replicating a given address signal for submission to each of corresponding LUT address inputs of the respective fs-LUT's (205A–205D) in the GLB 201, so that, for example, the following sets of input term equalities may be established in FIG. 2A:

(1) a0=b0=c0=d0; (2) a1=b1=c1=d1; (3) a2=b2=c2=d2; and (4) a3=b3=c3=d3;

(e.2) selectively replicating a given address signal for submission to each of corresponding feedthrough lines so that, for example, the following feedthrough equality condition may be established in FIG. 2A: FTa=FTb=FTc=FTd; and (e.3) being able to equivalently route groups of input term signals and feedthroughs to any one or more of the illustrated W, X, Y and Z Configurable Building Blocks (e.g., CBB 202) so that bit significance or other nibble-wide ordering requirements can be accommodated as desired and/or so that special interconnect (e.g., DC) or intra-connect (e.g., FB) reaching aspects of specific ones of the W, X, Y and Z CBB's may be taken advantage of.

It may be seen from a quick look at the exemplary PIP placements within box 240 (ISM-2) how the input term equality conditions of above paragraph (e.1) might be programmably-established. What is not explicitly shown in FIG. 2A, but is nonetheless valuable to understand is that the illustrated, 4-input, fs-LUT's (205A–205D) may be programmably folded-together in accordance with concepts disclosed in above-cited U.S. Pat. No. 6,097,212 so that, for example, the fa(4T) output of LUT 205A is programmably combined with the fb(4T) output of LUT 205B, if so desired, to thereby define any truth table function, fw(5T), of five independent input term signals (e.g., a0–a3 plus FTa). Similarly, the fc(4T) output of LUT 205C may be programmably combined with the fd(4T) output of LUT 205D, if so desired, to thereby define any further truth table function, fy(5T), of five other independent input term signals (e.g., c0–c3 plus FTc).

Introductory FIG. 2A is not sufficiently detailed to show how both of the above-mentioned, $f_W$(5T) and $f_Y$(5T) function signals may be programmably synthesized. A brief, advance reference to item 225 of FIG. 2C is made here for those artisans who want to immediately appreciate how this is done. From the bird's eye vantage point of FIG. 2A, it may be roughly appreciated that the illustrated, secondary Input Switch Matrix 240 (ISM-2) is intended to function, among other things, as an input term replicator that can assure satisfaction of the four conditions: a0=b0, a1=b1, a2=b2, and a3=b3 so that the here-mentioned, 5-input LUT capability, $f_W$(5T), can be realized. Clearer descriptions of possible structures for the secondary input switch matrix 240 will be provided later below. For now, it is to be further understood for FIG. 2A that the illustrated set of four, 4-input, fs-LUT's may be programmably folded-together such that a 6-input LUT capability, $f_Y$(6T), can be realized by the illustrated Generic Logic Block 201 (GLB 201 for short). Moreover, two 6-input LUT capabilities may be programmably folded-together to realize a 7-input LUT capability, $f_{Y'}$(7T), if the illustrated GLB 201 is utilized in combination with an adjacent and like GLB as will be detailed later below. These programmably-selected, folding-togethers of primitive, function spawning units (e.g., base-LUT's 205A–205D) to thereby synthesize more complex, function realizing units follow from concepts disclosed in above-cited U.S. Pat. No. 6,097,212.

The illustrated GLB 201, incidentally, is to be understood as including: (a) a plurality of function-spawning LUT's such as 205A–205D; (b) a plurality of in-logic-block state-storing registers such as 208_a_–208_d_, 209_a_–209_d_; and (c) a plurality of register-feeding multiplexers such as 207_a_–207_d_. The inputs of the register-feeding multiplexers preferably include feedthrough lines such as FTa–FTd, LUT output lines such as the illustrated ones that carry LUT result signals, $f_a$( )-$f_d$( ) and/or other locally-acquired and/or processed signals 206_a_–206_d_. In association with each GLB such as 201, there are preferably provided: a primary input switch matrix 230 (ISM-1), a secondary input switch matrix 240 (ISM-2), a block output switch matrix 250 (BOSM) and an interconnect switchbox 260. See briefly, FIG. 3B. Longline output switch matrices 280 may be associated with respective groups of GLB's. See briefly, FIG. 3A. Although the Longline Output Switch Matrices (H&V LOSM's) 280 are shown to be conceptually separate from the BOSM 250 (Block Output Switch Matrix) in FIG. 2A, it is to be understood that the BOSM and LOSM structures can be physically integrated to define a general OSM (Output Switch Matrix) structure and that slices of such an integrated OSM can be respectively associated with respective GLB's (only one shown in FIG. 2A: GLB 201). Moreover, even though the vertical and horizontal longlines (MaxRL lines) are shown to be merging into a combined, H&V LOSM's structure 280; in one embodiment the HLOSM's are separate from the VLOSM's. The connectivity of each GLB to both the HLOSM's and the VLOSM's remains though.

Careful comparison of the structure 200 shown in FIG. 2A against corresponding structures disclosed in U.S. Pat. No. 6,097,212 will show that there are a number of subtle but important differences. Many of these will be detailed below.

For now we focus on the feedback connections (FBa–FBd), and the direct-connect lines (DCa–DCd) shown in FIG. 2A, and on how the relatively short signal propagating delays of these FB and DC lines may be used for coupling a register-stored signal (e.g., W1) to a next stage of logic and/or to a next register.

Element 211 represents a respective one or a set of buffers for driving a W1 result signal of GLB 201 respectively to a direct connect line, DCa and/or to a local feedback line, FBa, as well as forwarding the W1 signal to the GLB's associated Block Output Switch Matrix (BOSM) 250. (In one embodiment, lines DCa and FBa are parts of a continuous, single conductor that is driven by a single line-driving buffer.) Direct connect lines such as DCa, DCb (at node 213), DCc, and DCd (at node 217') are each often of substantially longer length than the corresponding feedback line portion (e.g., FBa–FBd) and thus each DC line portion tends to have a comparatively larger RC time constant than that of its corresponding FB line. In one embodiment, each direct connect line (e.g., DCa) extends from the signal sourcing GLB to a subset of eight other, neighboring GLB's thereby defining a corresponding "cluster" of 9 DC-interconnected logic blocks. (See the more detailed example of FIG. 3C.) Despite the greater line length of the DC portions, the signal propagation delay associated with a DC line portion may be viewed as being substantially the same as the delay associated with the corresponding FB line portion. In the multi-conductor embodiment(one for DC and a separate one for FB), the same delay feature may be realized by providing the direct-connect driving portion of element 211 with a larger current output capacity than that of the feedback driving portion of element 211.

As seen in FIG. 2A, FB and DC carried signals are not distributed through the associated, general —OSM (250 combined with slice of 280) of GLB 201. Instead, the FB-signal carrying feedback lines, FBa–FBd connect by way of first bus 231 directly to a corresponding four inputs of a first-stage input switch matrix 230 (ISM-1) associated with GLB 201. Fourteen direct connect lines from a neighboring set of other GLB's connect by way of bus 234 to a corresponding fourteen other inputs of the first-stage input switch matrix 230. Direct connect output lines DCa–DCd of GLB 201 do not connect back to its own ISM-1 (230), but rather they each extend to corresponding ones of the neighboring, other GLB's. (See FIGS. 3B–3D.) Accordingly, connection symbol 232 is drawn as a dashed line to indicate that DCd is not coupling the Z1 signal (node 215) of GLB 201 directly back to its own first ISM-1230 but rather that a corresponding buffer element 217" in another GLB 201" (not shown—see FIG. 3B) is supplying its respective Z1' signal by way of bus 234 to ISM-1.

There is much more to describe in FIG. 2A and such additional description will be provided shortly below. The reader may grow impatient in trying to comprehend how the register-intensive architecture of FIG. 2A relates to the problems illustrated by FIGS. 1B–1F. For that reason, we will soon skip forward to FIG. 2E and we will demonstrate in some detail how a register-intensive logic-block may be used to carry out nibble-wide, synchronous data capture for implementing a front-end of a pipelined design section (e.g., elements 118, 128 of FIG. 1C) and how the same register-intensive logic-block (GLB 201*e*) may be used to carry out synchronous result-capture for implementing the back end of the pipelined design section (e.g., element 138 of FIG. 1C). The description of FIG. 2A will resume after FIG. 2E is explored. First however, we return to FIG. 1E and note the following. Given the 2 registers per LUT ratio shown in the embodiment of FIG. 2A, it can be seen that flip flop FF-C (FIG. 1E) can be readily associated with a LUT 173 implementing Function-C; flip flops FF-B and FF-B.2 (group 172R) can be readily associated with a LUT 172 implementing Function-B; and flip flops FF-B.3 and FF-B.4 (group 174R) can be readily associated with a fourth LUT 174 (not shown) that is not implementing any of Functions—A,B,C. Thus, the 8-to-1 compressive transformation of design section 170' (FIG. 1E) can be mapped into a single GLB such as the one 201 represented by FIG. 2A. We will see later below how the combination of line 179' and FF-B.2 can be efficiently implemented with a so-called, secondary feedthrough.

We briefly also return to FIG. 1F and note the following. Given the 2 registers per LUT ratio shown in the embodiment of FIG. 2A, it may be seen that in addition to the respective register-pair groups 172R", 173R" and 174R" covered by our discussion of FIG. 1E, there is shown an additional register-pair group, 171R" that associates FFA and FFA.2 with a LUT 171 implementing Function-A. LUT's 171–173 as well as their associated register groups: 171R", 172R", 173R" and 174R", can be mapped into a single GLB such as the one 201 represented by FIG. 2A. We will see later below how the combination of line 177" and FF-A.2 can be efficiently implemented with a so-called, secondary feedthrough connection of LUT 171.

The above allocation of the registers of FIG. 1F still leaves open the question of how to map registers FFA.3, FFA.4, FFA.5, FFA.6, and FF1–FF8. In one embodiment, FF5–FF8 as well as FFA.3–FFA.6 are mapped to a second GLB like 201 while FF1–FF4 are mapped to a third GLB like 201. If an additional 1 through 8 LUT's are needed for generating one or more of input term signals T'1 through T'8, such an additional 1 through 8 LUT's may also be mapped into the second and third GLB's (not shown) that have FF1–FF8 and FFA.3–FFA.6 mapped to them. So-called, 2xRL general interconnect lines and/or other forms of GLB interconnect may be used for coupling the T'1 through T'4 signals and the registered versions of the T'5 through T'8 signals from the second and third GLB's (not shown) to the first GLB which contains LUT's 171–173. Thus a fairly efficient mapping and packing arrangement is possible for the design 170" shown in FIG. 1F when using an FPGA structure 200 such as shown in FIG. 2A. In one embodiment, if relatively large and/or variable latencies are needed for certain, very heavily pipelined design sections, one or more GLB's are placed into shift-register implementing modes wherein their respective LUT's each implements a variable-latency shift-register. Note for example, the $\text{SHIFT}_{in}$ nodes of LUT's 205A' and 205B' in FIG. 2C. That figure will be detailed later. First we turn out attention to FIG. 2E.

In FIG. 2E, the encompassing FPGA 293E is shown to have been programmably configured such that four or more input term signals, T1, . . . , T4, . . . , Tn are being routed next to GLB 201*e* and over a corresponding set of four or more four AIL's (adjacent interconnect lines) 291*e*. AIL's 291*e* run adjacent to a particular ISM-1 stage, 230*e* associated with GLB 201*e*. (The "e" or "E" suffixes used in connection with elements of FIG. 2E, incidentally, are there to uniquely identify those elements relative to similarly referenced elements in FIGS. 2A–2D, which will be discussed below.) The ISM-1 stage of FIG. 2E selectively acquires the T1–T4 signals from AIL's 291*e* and forwards the acquired signals through ISM-2 stage, 240*e* towards multiplexer set 207*a*–*d*.1. (This multiplexer set 207*a*–*d*. 1 is constituted by parts of multiplexers 207*a*–207*d* of FIG. 2A as shall become clearer.) Logic-block feedthrough-lines, FTa0–FTd0 provide the coupling between the ISM-2 stage and multiplexer set 207*a–d*. 1 The latter multiplexer set routes the fed-through four signals, T1'–T4' to a corresponding set of four state-storing registers, 209*a–d* of logic-block 201*e*. Registers 209*a–d* capture the fed-through signals, T1'–T4' and output the stored versions, sT1'–sT4' of these signals onto feedback lines 231*e* (FB's a–d) in synchronism with a supplied, CLKa1' clock signal. Alternatively or additionally, registers 209*a–d* can output the synchronized sT1'–sT4' signals onto direct-connect lines 234*e* (DC's a–d) for coupling to a dedicated set (cluster) of other GLB's. A possible DC organization will be described in conjunction with FIGS. 3B–3D. For now, we will follow the simpler, local feedback routings.

The now-synchronized, input term signals, sT1'–sT4' can feed back into the ISM-1 stage via lines 231*e* without further consuming available resources 250*e* of the general GLB-to-GLB interconnect (260*e*). (If however, it were desirable to route the synchronized, input term signals, sT1'–sT4' out onto the general interconnect (260*e*), that could be simultaneously accomplished by way of path 250*e*.) The ISM-1 stage (230*e*) associated with the signal-capturing GLB (201*e*) then forwards the fedback term signals, as routed signals sT1"–sT4" through the ISM-2 stage (240*e*) and into the first LUT, 205A. Connection lines a0–a3 carry the sT1 "–sT4" signals from ISM-2 into LUT 205A. The lookup function output, $f_a$(4T) of the latter LUT can then pass through unit 225*e* for subsequent routing through multiplexer part 207*a*.2 and subsequent capture in a fifth register 208*a* of logic block 201*e*. (Four registers, 209*a–d* were mentioned earlier.)

A W0 terminal of the back-end synchronizing register 208*a* can then output the so-routed $f_a$(4T) result signal to the general GLB-interconnect structure 260*e* of the FPGA in synchronism with a supplied, CLKa0' clock signal. (In one embodiment, CLKa0' and CLKa1'can be a same clock signal.) As its name implies, the general GLB-interconnect 260*e* provides general-purpose interconnection between different GLB's (Generic Logic Blocks) and also between GLB's and 10B's (Input/Output Blocks). What is important to note here is that, between the point where the original, input term signals, T1–T4 arrived on AIL's 291*e* of logic block 201*e* and the point where a synchronous result signal went out on line W0, it was not necessary to use the general GLB-interconnect resources (250*e*, 260*e*, 291*e*) for registering the input and output signals (in registers 209*a–d* and 208*a*). Efficient pipelining can therefore take place because of the register-intensive nature of the GLB 201*e* and because of the GLB internal-feedback option 231*e*. The advantages will be further elaborated on further when FIG. 2B is discussed below.

Another aspect of FIG. 2E is worth mentioning here. The lookup functions of first LUT 205A and second LUT 205B can be simultaneously combined (folded-together) to emulate a 5-input lookup table within GLB 201*e* even as the above registration of input term signals, T1–Tn and the above registration of the result signal W0 are taking place within the same logic block 201*e*. A signal replicating structure 242*e* within the ISM-2 stage 240*e* can copy the respective signals of lines a0–a3 and forward the copies to the second LUT 205B as is implied by parenthetical notations, (a0)-(a3). The $f_b$(4T) output of LUT 205B can be mixed within the illustrated, variable grain combiner unit 225*e* with the $f_a$(4T) output of LUT 205A and also with an acquired, fifth input term signal, T5 to produce a modified result signal, $f_W$(5T). This $f_W$(5T) signal that can be any Boolean function of input signals T1–T5.

FIG. 2E shows that a further (a secondary) feedthrough line, FTc3 is being used for conveying the T5 signal (that was acquired from AIL's 291*e*, and thereafter passed through ISM stages 230*e* and 240*e*) into terminal 224*e* of the variable grain combiner unit 225*e*. Actually, for the specific embodiment later described in FIG. 2C it is primary feedthrough line, FTa0 (also called Sel0) that will carry the T5 signal. In such a case, the conductor that is denoted as FTaO and shown driving multiplexer set 207*a–d*.1 will have to be swapped with a 'secondary' feedthrough such as FTc3 and vice versa. Notation 226*e* represents this minor change of tactics regarding which specific feedthrough lines will be used for carrying specific and corresponding signals. Also, if the T5 signal is to be synchronized to the CLKa1' clock before entering combiner 225*e*, yet another feedthrough, and another register may have to be consumed, perhaps in combination with one short, general interconnect line (a 2xRL line) in order to provide such complete, synchronization of the T1–T5 input signals. That minor variation distracts us from the main point being made here, which is that, between the signal-flow point where the original, input term signals, T1–T5 arrived on AIL's 291*e* and the signal-flow point where a synchronous result signal went out on line W0, it was for the most-part, unnecessary to use the general GLB-interconnect resources (250*e*, 260*e*, 291 *e*) for registering the input and output signals (in registers 209*a–d* and 208*a*). And because the functionalities of LUT's 205A and 205B were folded-together (225*e*) internally within a single GLB (201*e*), rather than being merged by cascading signals via general GLB-interconnect resources, that in-GLB folding-operation further saved on interconnect resources and signal propagation delay. As such, a relatively efficient form of pipelining can take place with this kind of arrangement in contrast to an arrangement (e.g., FIG. 1B) where all or most of the outputs of the front-end registers (e.g., 108*a*) have to consume general interconnect resources (e.g., 109) in order to deliver their synchronized signals to the signal processing logic (e.g., LUT 105B) of a given logic block (e.g., CLB 101*b*' of FIG. 1B). Note also that general interconnect resources (e.g., 109 of FIG. 1B) tend to consume more AC power than do intra-GLB feedback lines (e.g., 231*e*) because the general interconnect resources tend to have more switch points (e.g., PIP's, pass gates, etc.) strung along their relatively longer lengths, because each such switch point (PIP) tends to have a significant amount of capacitance, and the repeated charging and discharging of such electrical capacitances tends to draw more current during AC operation and hence tends to consume more power. Also, in cases where the general interconnect lines are comparatively longer than the block-dedicated feedback lines, the general lines tend to have larger RLC parameters, and thus often call for wider-channel transistors and/or larger drive amplifiers to drive them, hence again drawing more current and consuming more power. In a particular embodiment, discussed below, the last statement is not accurate. In that particular embodiment, the intra-GLB feedback lines are simultaneously driven by same line drivers that drive the GLB-to-GLB direct-connect lines (DC's). The capacitive loads of the combined FB and DC lines are about the same as the average capacitive loads of some general lines (2xRL lines, discussed below) and thus relatively same sized, line drivers are used for driving the combined FB and DC lines and for driving so-called 2xRL lines. However, even in such a case, the use of diagonal DC lines (discussed in conjunction with FIG. 3E) tends to save power for programmably implementing barrel shifters and/or multiplier circuits because an alternative approach would consume two 2xRL lines and that would entail consuming more power to drive the capacitive loads of their associated switch points (PIP's).

Referring again to FIG. 2A, we are now in a position (after having discussed FIG. 2E) to continue with details of FIG. 2A under better appreciation of some of the advantages that can be derived from a register-intensive architecture. Once again, we note that there are at least two state-storing registers (e.g., 208*a* and 209*a*) for each lookup unit (e.g., 205A) and/or for the associated input term acquiring means (e.g., MOLb's #0–#3 of ISM-2, to be detailed below) of that lookup unit, and that there is a programmably configurable, registers-feeding means (e.g., 207*a*) for routing a result signal (e.g., $f_a$(4T)) of that lookup unit to any one or more (or all) of the state-storing registers (e.g., 208*a*, 209*a*) associated with that lookup unit. It shall be seen shortly (in FIG. 2C) that the register-feeding outputs of each LUT-associated registers-feeding means (e.g., 207*a*) can each be structured to programmably bypass its corresponding, state-storing register (e.g., 208*a*, 209*a*). This inclusion of a configurable bypassing structure (e.g., 218, 219 in FIG. 2C) gives place-and-route software (not shown) the flexibility of being able to output either a registered, or an unregistered (combinatorial) result signal, symmetrically, from any one or all of the output terminals (e.g., 210, 211) associated with the given lookup unit (e.g., 205A).

It may be seen from the foregoing that a highly-flexible, building block (a CBB or Configurable Building Block 202) can be provided by the combination of each lookup unit (e.g., 205A) and its associated plurality of state-storing registers (e.g., 208*a*, 209*a*) and the interposed, registers-feeding means (e.g., 207*a*). That CBB structure 202 may be augmented with the inclusion therein of a primary feedthrough line (FTa) feeding into the registers-feeding means and/or with the inclusion therein of other signal lines (e.g., 206*a*) feeding into the registers-feeding means (e.g., 207*a*). The functionality of that CBB structure 202 may also be augmented with the provision of a multi-stage, input-signals acquiring means (e.g., 230–240) which selectively supplies the CBB structure 202 with corresponding input term signals (e.g., a0–a3 and FTa).

Having already introduced the multi-stage input-signals acquiring means (e.g., 230–240) associated with GLB 201, we now proceed to focus on some details of the first-stage input switch matrix 230 (ISM-1) of this multi-stage acquiring means. We note that the stage-1 switch matrix (230) may be thought of as being a set of intersections defined by 146 horizontal lines crossing with 32 vertical lines (H146xV32) where the intersections are partially populated by PIP's. In one embodiment, approximately 320 PIP's are uniformly distributed across the intersections of the H146 and V32 lines in a partially populating manner so as to define a set of thirty-two 10+: 1 (ten-plus to one) multiplexers where each such 10+:1 multiplexer (236) can select one of ten of the input signals supplied to ISM-1 and where each such multiplexer (236) can further output that programmably selected signal onto a corresponding one of the 32 Matrix Output Lines (MOL's—or MOLa's for case of ISM-1). The 32 MOLa's extend to define an output bus 235 of ISM-1. An eleventh PIP is preferably added to each of the 10+:1 multiplexers 236 for causing that multiplexer (MOLa and its PIP's) to output a ground or a like, valid-state signal when none of the ten input signals are being selected from the respective, 10 matrix input lines (MILa's). This is done to avoid the output of transient noise and to thereby save power. Each such eleventh one of the PIP's is not counted in the given total of 320 signal-routing PIP's. The average number of signal-routing PIP's for each of the 146 possible input signals of ISM-1 should be at least two, and in the illustrated embodiment it is slightly greater than two (320/146=2.19). The ability of ISM-1 (230) to provide at least two possible, signal acquiring points (PIP's) on each of its matrix input lines (MILa's) is a valuable one because that increases the likelihood that place-and-route software will be able to acquire necessary input term signals (e.g., T1–Tn of FIG. 2E) from adjacent interconnect lines (e.g., AIL's 291*e* of FIG. 2E) and/or from the local feedback signals (e.g., 231*e* of FIG. 2E). The selectively acquired, input term signals (e.g., T1–Tn) may be used for synchronously spawning and/or synthesizing desired, output functions (e.g., $f_W$(4T/5T) of FIG. 2E) by means of the associated CBB structure 202.

Output bus 235 of the first input switch matrix 230 (ISM-1) defines at least one of one or more vertical input buses that enter the second-stage input switch matrix 240 (ISM-2). In one embodiment, another of the vertical input buses is defined by an additional eight vertical input lines that come in (from the bottom in the schematic) byway of connection 245. The combination of buses 235 and 245 defines a total of forty vertical, Matrix Input Lines (or MILb's) in ISM-2. There are twenty-four horizontal, matrix output lines (MOLb's) in ISM-2. These H24 lines are divided into four groups of five data output nodes each (e.g., a0–a3, plus FTa; b0–b3, plus FTb; etc.). As seen, the respective MOLb's (matrix output lines of stage 2 or stage b) are also denoted in sets, of five MOLb's per set, as #0–#4, #5–#9, #10–#14 and #15–#19.

The remaining four of the H24 output lines (MOLb's #20–#23) in the secondary switch matrix 240 selectively output a corresponding four control signals, which are identified in FIG. 2A as: a block clock signal (BCLK), a block clock enable signal (BCEN), a secondary block clock enable signal (BCE2) and a block set or reset signal (BS/R). Some of these control signals are shown in region 204 of FIG. 2A. In one embodiment there are approximately 196 PIP's distributed in a generally uniform manner across the H24 and V(32+8) intersecting lines of ISM-2. These are used to implement a set of twenty-four multiplexers with each such multiplexer having a selection capability of at least 8:1, if not more.

The ability of each MOLb in ISM-2 (each 8+:1 multiplexer output) to selectively output one of at least 8 acquired signals is a valuable one. The 8 acquired signals can represent 8 bits of a single byte. Each bit in the byte may have a positional significance attached to it, and that positional significance may be relevant for certain types of in-GLB processing; —meaning that it in certain situations it will matter which LUT (and ancillary circuitry, e.g. carry-chain) will receive and process that bit. The at least 8-to-1, selectivity of each MOLb in ISM-2 allows the 8 bit positions of a given byte to be descrambled (position-wise sorted) in any desired way. In one embodiment, each of MOLb's #0, #5, #10 and #15 have at least 8 PIP's covering a same 8 MILb lines (MILb lines #0–#7 in the case of FIG. 4A). That means that any first one of the 8 bits on the 8 MILb lines (e.g., #0–#7) can be routed to LUT terminal a0, while any second of the remaining 7 bits can be routed to LUT terminal b0, while any third of the remaining 6 bits can be routed to LUT terminal c0, and so on. LUT terminals a0, b0, c0, and d0 can alternatively all receive a same any first one of 8 bits on an associated 8 MILb lines while LUT terminals a1, b1, c1, and d1 all receive a same any second one of the associated 8 bits, and so on. Note that there are at least 16 input-term receiving terminals (a0, a1, . . . , d2, d3) on the illustrated LUT's 205A–D of GLB 201. Each such input-term receiving terminal (a0–d3) has access to one of a respective set of 8 input signals because of the 8+:1 multiplexers provided in ISM-2.

In the exemplary PIP placement that is illustrated in FIG. 2A, a same one MILb (a vertical line extending down out of bus 235 and into the interior of ISM-2 stage 240) can be used to route its signal to a programmably selectable, one or more of LUT inputs a0, b0, c0 and d0. Another such MILb (vertically-extending, matrix-input line in stage "b") can be used to route its respective signal to a programmably selectable, one or more of LUT inputs a1, b1, c1 and d1. The pattern repeats for the a2–d2 and a3–d3 input terminals as well as the FTa–FTd input nodes of GLB 201. It may be seen from this that a signal duplication function may be selectively provided by the ISM-2 stage (240). In other words, a same, first input signal can be simultaneously routed by ISM-2 stage 240 to GLB input nodes a0, b0, c0 and d0;

while a same, second input signal can be simultaneously routed by ISM-2 stage 240 to GLB input nodes a1, b1, c1 and d1; and so forth. Stated yet otherwise, after the ISM-1 stage does the work of selectively acquiring a particular signal and placing the acquired signal on a respective MOLa/MILb line (in bus 235), the signal on that respective MILb line can be simultaneously routed programmably by the ISM-2 stage (240) to plural MOLb lines (e.g., those which feed a0, b0, c0 and d0 or those that feed FTa, FTb, FTc, FTd) so that the selective signal-acquiring work done by the ISM-1 stage is efficiently re-used or multiplied due to the selective, signal-multicasting abilities of the ISM-2 stage (240). Each given ISM-1 output is programmably routable (in one embodiment) simultaneously to plural ISM-2 outputs.

It may now be understood from the disclosure that one or more general input signals may be acquired by the ISM-1 stage associated with a particular GLB from the Adjacent Interconnect Lines (AIL's) of that GLB. The AIL's of each GLB/ISM combination may include lines such as those of a first illustrated bus 233 (horizontal and vertical duo-reach lines or 2xRL's), a second illustrated bus 238 (horizontal and vertical, maximum-unidirectional-reach lines with tristate capability, or MaxRL's) and a third illustrated bus 239 (global clock and/or signal lines, GLOxRL's). It is to be understood from FIG. 2A that the illustrated ISM/GLB/OSM combination (more specifically the combination of ISM stages 230/240, GLB 201 and OSM 250/280) constitutes part of a repeatable arrangement 200 that may be repeated in tiled form (see also FIG. 3A) within an FPGA provided on a monolithically integrated circuit chip or another such circuit support means.

Selected ones of the acquirable first-stage signals (231–239) may be fed by way of the inter-stage bus 235 into ISM-2 (240), and from there, by way of any of feedthrough lines FTa–FTd, and thereafter by way of corresponding registers-feeding multiplexers 207*a*–207*d* to one or more of the state-storing registers {208*a*, 209*a*} through {208*d*, 209*d*} associated with the feedthrough lines FTa–FTd. If the so-fedthrough signals (e.g., FTA, FTb, etc.) are stored in respective ones of FB-driving registers 209*a*–209*d*, then the corresponding feedback lines, FBa–FBd may be used to quickly (and/or low-power wise) couple the registered signals back, by way of bus 231 into ISM-1 (230) and from there, by way of the ISM interstage bus 235 to serve as one or more respective inputs, a0–d3 of the function-spawning LUT's 205A–205D. The corresponding, LUT result signal (e.g., $f_a$(4T)) may then be programmably passed through a registers-feeding multiplexer (e.g., 207*a*) to an unconsumed register (e.g., 208*a*—if available) for storage therein. Some implications of this intra-GLB signal-flow have already been discussed above with reference to FIG. 2E. Others will be further explicated below, in discussions about FIG. 2B.

Referring still to FIG. 2A, the so-formed and optionally stored result signal (e.g., the signal, $f_{a\text{-}d}$(4T), that is ultimately generated on terminal W0, which signal may be output from register 208*a* or from multiplexer means 207*a* if a register-bypass mode is used) can then be coupled to the general, GLB/IOB interconnect of the FPGA by way of the logic block's general OSM—where the latter is defined by one or both of the illustrated, Block Output Switch Matrix (BOSM 250) and the horizontal and vertical Longlines Output Switch Matrices (HLOSM, VLOSM—collectively shown as 280). Line WO', incidentally, is equivalent to node W0. The outputs from either one or both of the W0/W0' terminal (210) and the W1 terminal (211) can be applied equivalently to the BOSM 250 for subsequent coupling to the general interconnect of the FPGA. (The latter, general interconnect includes the "duo"-bus 233 and the "deca"-bus 237, both of which have already been mentioned).

Stated otherwise, a particular result signal (e.g., a registered version of the $f_a$(4T) signal) can be made to appear just as easily on either one or both of the W0/AW0' terminal (210) and the W1 terminal (211) for subsequent routing by the BOSM 250 to other parts of the FPGA. The same equivalency of presentation on either or both terminals applies to result signals directed to the X0–X1 terminal-pair (212, 213), to the Y0–Y1 terminal-pair, and to the Z0–Z1 terminal-pair (216', 217'). These symmetrical presentation capabilities give the FPGA's place-and-route software the flexibility of moving LUT-processed result signals and/or signals registered in state-storing registers 208*a*/209*a*–208*d*/209*d* equivalently through any one of the GLB output terminals, 210–217' (W0–Z1) for subsequent coupling by the block OSM 250 to the general interconnect. Such symmetrical presentation capabilities within each GLB/ISM combination include corresponding symmetry in the respective, registers-feeding multiplexers, 207*a*–207*d*, corresponding equivalency of LUT's 205A–205D and corresponding equivalency of ISM-2 sections serviced by MOLb groups: #0–4, #5–9, #10–14 and #15–19. If during routing, the place-and-route software finds that it cannot route a given result signal through the W1 node (because, say, the BOSM is overly-congested with already-routed traffic), then the place-and-route software may elect to swap the placements of the primitives that have been designated for using element pairs 208*a*-W0 and 209*a*-W1 and the software may test the available interconnect resources to see if the same given result signal can instead be successfully routed via the W0 node to its desired destination. This swapping option is made possible by the above-described, symmetrical presentation capabilities within each GLB/ISM combination.

In the illustrated embodiment, the Block OSM 250 (BOSM) feeds into a so-called, duo-deca switchbox 260. The latter switchbox 260 can be user-programmed to route the BOSM's output signals 262 and 264 respectively onto duo-reach general interconnect lines (2xRL's) 233 and onto deca-reach general interconnect lines (10xRL's) 237. Additionally, the duo-deca switchbox 260 can programmably route signals between various ones of the 2xRL and 10xRL lines passing through that switchbox 260. For the given embodiment 200, the 1 xRL lines (237) do not directly connect to the multi-stage input-signals acquiring means (e.g., 230–240). Instead, signals that are to travel intermediate-length distances by way of the 10xRL lines, must use the duo-reach lines (2xRL's) of certain ones of adjacent logic tiles (see 390*a*–390*c* of FIG. 3B) essentially as entrance ramps and exit ramps for correspondingly getting onto and exiting from the deca-reach highway lines, where this entering and exiting occurs within duo-deca switchboxes such as 260. (In one embodiment, 3 out of the 11 logic tiles spanned by a 10xRL line serve as the entrance and exit ramp points as further detailed elsewhere herein.)

A first plurality of 48 'taps' are provided on the first-stage ISM 230 for accessing adjacent and horizontal ones of the 2xRL's. A second plurality of 48 more 'taps' are provided on the first-stage ISM 230 for accessing adjacent and vertical ones of the 2xRL's. These 96 taps allow the first-stage ISM 230 to selectively acquire signals from a respective 96 duo-reach access wires associated with bus 233 (and with duo-deca switchbox 260). The selected subset of the 96 tap-able signals (233) that may be acquired by ISM-1 can then be routed to ISM-2 (240) via the inter-stage bus 235. It will be seen below for the embodiments of FIGS. 3A–3B that there are only 32 horizontal 2xRL lines and 32 vertical 2xRL lines provided across adjacent interconnect channels of each GLB (e.g., 201). The reason why this arrangement nonetheless effectively translates into 96 unique signal taps at the ISM-1 stage is because the bundles of 2xRL lines passing through each switchbox (see FIGS. 3A–3B) can be designated as belonging to one of three groups: those 2xRL lines whose middles are passing-through the box; those 2xRL lines whose top or left side is terminating in the box; and those 2xRL lines whose bottom or right side is terminating in the box. Each group has 16 vertical or 16 horizontal 2xRL lines in it. There are 3 vertical groups of this type and 3 horizontal groups of this type extending into each switchbox. Hence we have 48 horizontal lines plus 48 vertical lines, thereby defining a total of 96 tap-able 2xRL lines extending into each corresponding switchbox.

While substantially equivalent coupling into the associated BOSM 250 is provided for all eight (8) of the respective GLB result signals W0, W1, . . . , Z1 that are output pair-wise and respectively from the four Configurable Building Blocks (CBB's, e.g., 202) shown in FIG. 2A, namely, from the W, X, Y and Z CBB's of GLB 201; by contrast, in the illustrated embodiment only the W0, X0, Y0 and Z0 output signals (4 signals) of the respective W-Z CBB's couple to the H— and to the V-longline OSM's 280. The latter couplings are denoted as W0', X0', Y0' and Z0' in FIG. 2A and dashed lines are used to schematically used to represent their direct connections from the W0, X0, Y0 and Z0 output terminals. (The Y0–Y0' dashed line connection is implicit even though not shown.) It is therefore understood that W0' equals W0, X0' equals X0, and so on. Also, as already explained, the illustrated BOSM and LOSM structures of FIG. 2A can be physically integrated to define a general OSM (Output Switch Matrix) structure and that slices of such an integrated OSM can be respectively associated with respective GLB's.

The illustrated, Longline OSM's 280 (LOSM) may be collectively thought of as comprising an intersecting set of four horizontal, matrix input lines (H4) and twenty-four vertical, matrix output lines (V24) whose intersections are fully populated by a set of ninety-six PIP's. As a result, any of the W0, X0, Y0 and Z0 signals may be routed to any one of twenty-four tristateable buffers associated with GLB 201. The latter tristateable buffers (286) receive their respective inputs from output lines 282 and 284 of the H&V longline OSM's 280. Symbols 285–286 represent the set of twenty-four (x24) tristateable longline drivers and their respective output enable terminals (OE). In one embodiment, 16 of the twenty-four MaxRL's that can be driven by the HVOSM 280 extend horizontally along the corresponding horizontal interconnect channel (HIC) adjacent to GLB 201 while the remaining 8 extend vertically along the corresponding vertical interconnect channel (VIC) adjacent to GLB 201. See also, FIG. 3A.

Due to their substantially longer lengths, larger electrical capacitances, and/or their respective needs for passing signals through OSM structures 250/280 and/or through the duo-deca switchbox 260, the MaxRL's, and the 10xRL's tend to exhibit comparatively long or intermediate signal propagation times (and/or higher AC power consumptions) as compared to the relatively shorter signal propagation times (and/or lesser AC power consumptions) exhibited by the GLB-local feedback lines (FBa–FBd) and the direct-connect lines (DCa–DCd). This differentiation of signal propagation times tends to occur despite the generally larger line drivers that may be provided for driving signals respectively onto higher-RLC, long-haul lines such as the MaxRL's and the 10xRL's. (In one embodiment, signal propagation time for outputting a signal through a 2xRL line and its associated line driver is about the same as outputting the same signal through a combined, FB-DC conductor and its associated line driver.) Arbitrarily large line drivers cannot be used for long-haul lines such as the 10xRL lines because of die size limitations, power consumption limitations, and the large number of times that the GLB structure is tile-wise repeated (see for example tile 390*a* of FIG. 3B) or otherwise replicated in the FPGA.

The general GLB-interconnect lines (e.g., GLOxRL's, MaxRL's, 10xRL's, 2xRL's) and the dedicated GLB-interconnect lines (e.g., DC's 234) which are shown in FIG. 2A to the left of ISM-1 (230) generally extend to and through neighboring GLB tiles and/or neighboring 10B tiles so as to provide interconnect functions between GLB's and/or 10B's. Input/Output Block (10B) 220 is drawn as a dashed box in FIG. 2A to generally represent the interconnectability of GLB 201 to other GLB's and/or 10B's. A variety of different interconnect structures may be used for providing selective interconnection between GLB's and/or 10B's. See for example the regularly tiled arrangement 300 shown in FIG. 3A. In one embodiment, 10xRL lines such as those of bus 237 (FIG. 2A) couple to associated IOB's 220 by way of duo-deca switchboxes such as the illustrated SWbox 265. The schematic depiction in FIG. 2A of the interconnectability of GLB 201 to other GLB's and/or 10B's is not intended to limit the internal structure of GLB 201 or the internal structure of IOB 220 or to limit the ways in which GLB 201 may be coupled to other circuitry. It merely provides an exemplary context for showing why FB lines (231) and/or DC lines (234) and/or like, short-haul dedicated constructs (with fewer numbers of capacitive switch points) can have associated with them, shorter signal propagation times than those of corresponding other lines such as the 2xRL lines, the 10xRL lines, the MaxRL lines, or like connection constructs that are not dedicated to a specific one or a few GLB's and/or 10B's, where in order to provide their general-interconnect services on a non-dedicated basis, the 2xRL or other such lines rely on switch points that have detrimental electrical capacitances.

Given the above introductions (via FIGS. 2A and 2E) of how an FPGA having a register-intensive architecture may be built and used in accordance with the present disclosure, we now refer to FIG. 2B and explain in more detail how the register-intensive aspect of the architecture, and the provision of registerable feedthrough lines, and the provision of dedicated feedback lines (FB's) and/or dedicated direct-connect lines (DC's) can advantageously impact FPGA-implementation of synchronous (e.g., pipelined) designs. The signal flow diagram 290 of FIG. 2B corresponds to the flow diagram 150 of FIG. 1C. Where practical, primed reference numbers corresponding to same ones as used in FIG. 1C are used in FIG. 2B for corresponding elements.

As may be seen in the bottom half of FIG. 2B, a set of respective, front-end registers 113 and 123 (which have no counterpart in FIG. 1C) have been interposed between logic delays 115' and 125', and their respective long (or intermediate) routing delays 112' and 122'. This may be done using a front-end signal-capture structure such as shown at 293. (Note that CBB unit 293 of FIG. 2B corresponds to unit 293E of the already-discussed FIG. 2E.) Feedthrough lines such as the one denoted FTx in FIG. 2B may be used to acquire the input term signals (T1 –Tn) from adjacent interconnect lines (AIL's) 291 of the CBB by way of ISM structure 292. A registers-feeding multiplexer such as 207$x$ may then route the locally-acquired, feedthrough signals to one or more of plural, state-storing registers in the CBB unit 293 such as the one register shown at 209$x$. The so-acquired and fedthrough signals can therefore be captured in the state-storing registers (e.g., 209$x$) when the registers are strobed at a first synchronous time point (which time point is represented by CLK=CLK0'). The outputs of the state-storing registers (e.g., 209$x$) may then be forwarded via ISM structure 294 to the subsequent lookup logic 295 in relatively short time (and/or while using relatively small amounts of AC power) by using dedicated couplings such as one or both of the illustrated, direct-connect linkages (DC) and a feedback lines (FB) of FIG. 2B. ISM structure 294 may be an integral part of ISM structure 292 or it may be an independent input switch matrix structure in a different GLB. More specifically, the front-end captured signal(s) 231$b$ move through a corresponding multi-stage input-signals acquiring means (ISM part) 294 of the destination LUT 295. Box 294 may represent part of an ISM means 292 in the same GLB (in the case where FB lines are used) and/or the schematically drawn ISM box 294 may define a different multi-stage input-signals acquiring means of a different GLB (in the case where DC lines are used). Further state-storing registers (e.g., 208$y$, 209$y$ of FIG. 2B), which are associated with the destination LUT 295, may be used for continuing pipelined progression of the front-end captured signal 231$b$ and/or of derivatives of that signal 231$b$.

Because the front-end input capture capability (e.g., of CBB 293) is used at signal insertion points 113 and 123 in the schematic of FIG. 2B, concept box 151' is modified over that (151) of FIG. 1C to require merely waiting for a valid, front-end capture of the input term signals by the front end registers (113 and 123). The CLK1' pulse may be applied to the LUTs' back-end registers (represented by elements 118', 128') shortly after the CLK' signal is applied to the LUTs' front-end registers (which registers are represented by symbols 113 and 123). The interim delay between activation of the CLK0' and CLK1' signals may need to only account for the logic-related delays 115', 125' (also represented by symbols 294 and 295) and for the longer (if it is longer) of the applicable DC and/or FB lines delay which is encountered in forwarding the captured front-end signal(s) 231$b$ from registers 113 and 123 to the respective ISM portion 294 of the next stage of lookup logic, 295 (also represented by 115' and 125'). Once valid instances of the 1 N-1 and 1 N-2 signal sets are captured in front-end registers 113 and 123, routing resources represented by symbols 112' and 122' (which resources have corresponding long and/or intermediate-delays) can be freed for use by other signals. This feature can be particularly useful when the routing resources represented by 112' and 122' are tristateable, as is the case with the MaxRL lines 238 of FIG. 2A. (See also example 214F of FIG. 2F.)

Besides the just-described, front-end capture operation(s), a given to-be-implemented design may also benefit from back-end re-synchronization. There can be many instances within FPGA-implemented designs where one or more of the input term signals (e.g., IN-3 of FIG. 2B) that are applied to a LUT may need to be re-synchronized with the output signal (e.g., R2') of the LUT. Such re-synchronization may be used to insure that both of the input and LUT result signals are forwarded in time alignment to a subsequent pipeline stage. An example of such a situation is shown in FIG. 2B. The IN-3 signal is shown as not only constituting an input for logic circuit 135', but also as being used to form re-synchronized signal Q4', where the latter signal is to be time-wise synchronized with the Q2' output that is captured from the result, R2' output by logic circuit 135'. For this situation, a back-end resynchronization arrangement such as shown at 298 (right top area of FIG. 2B) may be useful. In order to replicate the 1 N-3 signal for its dual uses (as an input to register means 133 and as an input to register means 148'), a vertically-extending matrix output line such as the one shown at 246 (and understood to be located inside the illustrated, ISM-2 portion 294$b$) may be used to co-transmit the IN-3 signal both onto feedthrough line FTy and also into an input terminal of LUT 205$y$. Register-feeding multiplexer 207$y$ is configured to forward the LUT result signal, $f_y$(4T) to register 208$y$. Multiplexer 207$y$ is simultaneously configured to supply the FTy signal (which equals IN-3) to register 209$y$. (It is contemplated here to allow multiplexer 207$y$ to alternatively, or through different configuration, swap the routing, thereby sending the FTy signal to 208$y$ and sending the $f_y$(4T) signal to 209$y$.) Activation of the CLK2' signals at the CLK inputs of registers 208$y$ and 209$y$ provides the function of re-synchronizing the input term signal (IN-3) and its dependant, logic result signal $f_y$(4T). These re-synchronized signals, Q2' and Q4' (which in the example equal registered signals, $f_y$'(4T) and IN-3') may then be passed through the block and/or long OSM's 258 for subsequent forwarding through other parts (e.g., AIL's 299) of the interconnect to output pads and/or further logic.

In FIG. 2B, concept box 153' is no longer applicable (as was box 153 of FIG. 1C) because of the illustrated insertion of the front-end capturing mechanism, 293 (or 113,123 as shown in the signal flow diagram). One no longer needs to delay the effective clocking of the back-end registers 118', 128' until capture in the next back-end register 138' is assured. As a result, concept box 153'is indicated to be X'd out (crossed out) from consideration. Moreover, in FIG. 2B, concept box 152' is modified over that (152) of FIG. 1C to merely call for a valid front-end capture of the IN-3, IN-4 and IN-5 signals in register means 133. Concept box 152' no longer constrains registers 118' and 128' from changing at a time after the capture in register means 133 occurs. As a result, the long and/or intermediate-haul, routing resources represented by symbols 114' and 124' (which deliver IN-3 and IN-5 respectively) can be freed for use by other signals once IN-3 and IN-5 have been acquired by register 133. This early freeing-up of the long/intermediate-haul, routing resources (114', 124') is particularly useful when such routing resources (114', 124') are tristateable, as may be the case with the MaxRL lines 238 of FIG. 2A. (See also example 214F of soon-to-be discussed FIG. 2F.)

Another difference which is worthy to note between the implementations of FIGS. 2B and 1C is that the programmable feed-through (PFT) option, which is represented in FIG. 1C by dashed lines 116 and 126, may often be dispensed with because of the availability of registerable feedthroughs in the register-intensive embodiments contemplated by FIG. 2B. The associated wastage of resources and the delays through LUT's (e.g., 115) that are programmed to implement the PFT function (116) may therefore be avoided in the register-intensive embodiments contemplated by FIG. 2B. As a result, design implementations may be made more compact and FPGA resources (e.g., LUT's, and various types of interconnect) may be more efficiently utilized as opposed to being wasted simply for providing PFT functions.

In summary, it has been shown in our above explanations of FIGS. 2A, 2B and 2E that the provision of means such as register-able feedthroughs, FTa–FTd, and of intensive densities of registers (FF's) such as 208*a*, 209*a*, . . . , 208*d*, 209*d* (FIG. 2A), enable efficient front-end capture and/or back-end capture of lookup function signals, efficient usage of the available lookup resources, all while imposing no more than relatively small delays (e.g., by use of the dedicated FB or DC couplings) between the front-end capture registers (209x) and the interposed logic elements (295, 115', 125'). As a result, the signal flow 290 of an FPGA 200 that is structured in accordance with the present disclosure can be much improved over the signal flow 150 (FIG. 1C) of an FPGA 100' that does not have register-able feedthroughs and/or intensive densities of state-storing registers.

Skipping next to FIG. 2F, (FIGS. 2C–2D show details that will be visited later below) there is provided a schematic diagram 200F of an FPGA configuring process that may be carried out in accordance with the disclosure. A predefined design definition 201F is supplied to an FPGA compiling software module 202F where the latter module is implemented in an instructable machine (e.g., a computer). Module 202F processes the supplied information 201F by way of one or more (and typically all) of: (a) behavior-descriptor language-to-netlist synthesis operations, (b) gate-level, map-and-pack operations, (c) gate-level partitioning operations, (d) placement operations, (e) routing operations, (f) performance verification operations, and (g) if simulated performance is sub-par, modified re-execution of one or more of the preceding operations. If the performance evaluation operations (f) demonstrate that the derived place-and-route decisions will provide an FPGA implementation that meets design specifications, the software-driven computer (202F) produces an FPGA-configuring bitstream 203F. The produced bitstream signal 203F (or an equivalent thereof) is supplied to an FPGA such as 200'. The latter FPGA 200' has a register-intensive architecture corresponding to FIGS. 2A and 2B (and 2C which is discussed below). After being programmed by bitstream 203F, the blank FPGA 200' is referred to as a programmed FPGA 200". For more details about how the partitioning, placement and/or routing operations of a design synthesizing module (e.g., 202F) may be affected by FPGA architecture considerations, see for example FIGS. 1A–1C of our above-cited U.S. Pat. No. 6,130,551, "Synthesis-friendly FPGA Architecture with Variable Length and Variable Timing Interconnect". (It is noted here that the word "synthesis" can have different meanings based on context. The synthesis within a computer of a gate-level netlist (or other primitives netlist) from a behavioral description is one thing; while the synthesis of a complex function within an FPGA due to the "folding-together" of the FPGA's base-LUT's (function spawning lookups) and/or the folding-together of other FPGA resources is usually a different thing. The two should not be confused with one another.)

In regard to further specifics of synthesis/place-and-route software, it should be understood by those skilled in the art that pre-partitioning operations may include the receipt of high-level design definitions such as those coded in the Verilog™, VHDL or other descriptor languages and the decomposition (e.g., compiling) of such input files into meta representations that may include the representation of primitive, 2, 3 or 4-input logic gates and/or other primitive design components. The partitioning operations may further include a mapping and packing or fitting of the primitive design components into corresponding logic blocks or into block subcomponents such as LUT's, registers and/or other logic block resources. The "packing" of the mapped block resources typically occurs before such mapped-and-packed objects are specifically "placed" into virtual CLB's (or VGB's or GLB's). During solution derivation, operations may include a re-mapping or re-fitting of primitive design components into corresponding logic blocks and/or a "re-packing" of such mapped/re-mapped objects into corresponding, virtual logic blocks. The placement operations then assign actual locations to the virtual logic blocks, thereby making them placed (and optionally, re-locateable) logic blocks. After logic blocks are placed, virtual interconnect between them is typically configured to thereby try to establish desired routing of signals between the placed logic blocks. This general description does not exclude the options of having pre-mapped, pre-fitted, pre-packed and/or partially-preplaced and partially-pre-routed solutions on hand for automated insertion into the ultimate, partition, place, and route solution that the software arrives at for a given FPGA.

By way of a more specific example, a supplied, design definition file 201F (e.g., a VHDL file) may include a specification that leads to synthesis of a gate level structure such as schematically shown by various symbols within box 201F of FIG. 2F. Realization of the synthesis-generated, gate level structure may call for the provision of an interconnect line 214F (corresponding to 114' of FIG. 2B), where the synthesis may further specify that line 214F is being driven on a time multiplexed basis by one or more line drivers, such as the illustrated, LongLine Drivers (LLD's) 286*a* and 286*b*. Line drivers 286*a* and 286*b* (where the latter driver is optional and where the driving of MaxRL lines as opposed to shorter lines is also optional) may be tristate drivers (see 286 of FIG. 2A) or other kinds of drivers. The tristate versions of these one or more line drivers will of course, include output enable terminals such as the illustrated OE's that are controlled by yet further circuitry (not shown). The OE's indicate when the output signals of their respective tristate drivers should be actively driven onto line 214F on the time-shared basis and when, at appropriate other times the respective tristate drivers should switch the to Hi-Z output states.

In the exemplary design definition 201F, there are two, pipelined circuit sections, 215F and 235F. The first pipelined circuit section, 215F is defined as one which is supplying a respective, registered first signal, Q1" (synchronized to a CLK0" signal) through node X0 and to LLD 286*a* for output onto line 214F during a first of clock-defined time slots. There is typically no specification in the synthesized (or otherwise supplied) design definition 201F which recognizes beforehand, and therefore indicates, that the first pipelined circuit section 215F will be implemented as is illustrated, by an in-CBB register like that shown at 209Fx, or by a corresponding registers-feeding multiplexer like 207Fx, or by an associated, in-CBB lookup unit (e.g., the LUT of an X-CBB, in other words, an x-LUT); or alternatively, by an associated, in-CBB feedthrough (FTx0); and by a corresponding ISM 292F. Nonetheless, we are foresightedly showing in box 215F that such may ultimately happen. (It does not have to happen exactly as shown. Other FPGA resources might be used achieve the design-specified results. Also, even though previous generations of gate-level, design definitions may not have included suggestive recognitions and/or indications of how particular design primitives should be mapped, fitted and/or packed, it is within the contemplation of this disclosure to have such suggestive recognitions and/or indications embedded in a synthesized or otherwise supplied design definition in accordance with certain efficient packings as shall be detailed below. Given our forward-seeing prediction, as shown in box 215F (FIG. 2F), we refer briefly back to FIG. 2B in order to note that the first pipelined circuit section 215F can be thought of as corresponding to items 115' and 118' of FIG. 2B, where the latter generates the Q1' signal for forwarding by interconnect 114' to logic circuit 135' and register 148' of FIG. 2B.

Looking again at FIG. 2F, it can be seen that the there-illustrated and corresponding version of the Q1 "signal is to be output by LDD 286*a* onto MaxRL line 214F (or onto a 10xRL line or onto another kind of interconnect line) and, when picked off from the general interconnect, the relayed Q1" signal is to define an IN-3' signal entering a second pipelined circuit section, 235F. Once again, there is usually no specification in the synthesized (or otherwise supplied) design definition file, 201F indicating that the second pipelined circuit section, 235F will be implemented as is illustrated in FIG. 2F, so as to produce synchronized result signals Q2" and Q4" respectively at nodes Z0 and Z1 of a Z-CBB. Other FPGA resources might be used achieve the design-specified result of having Q2" and Q4" emerge in synchronized relation to one another at respective nodes. Nonetheless, we foresightedly show in box 235F that ultimately what may happen is the following: Result signals Q2" and Q4" will be output in synchronism with one another onto CBB nodes Z0 and Z1. This will occur after the precursors of the Q2" and Q4" signals have been synchronized to a CLK2" clock signal that had been supplied to a pair-able set of registers, namely, 208Fz–209Fz. The latter registers are found in a Z-CBB of a given GLB. Before this happens (we are navigating upstream against the signal flow), a first portion, 207Fz.1 of a registers-feeding multiplexer 207Fz in the relevant CBB will have fed to register 208Fz, an R2" result signal which had been output from the z-LUT. A second portion, 207Fz.2 of the registers-feeding multiplexer 207Fz will have fed to register 209Fz, a copy, IN-3" of one of the input term signals that are being supplied to the z-LUT in order to generate R2". The copied input term signal, IN-3" will have been acquired from a local feedback line, FBy by ISM section 294F.2 and will have been supplied to the z-LUT for causing the R2" result signal to be generated. A stage-2 multiplexer output line, MOLb #F, that extends through ISM section 294F.3 will have copied (replicated) the IN-3" signal from a signal-supplying MILb line (e.g., MILB#19) and will have supplied that copy via the registrable feedthrough line, FTz0 to the second portion, 207Fz.2 of the registers-feeding multiplexer. Thus, resynchronization of a LUT input term (IN-3") and a corresponding, LUT result-signal (R2") may be made to occur within the resources of a single CBB (e.g., the "Z" one) of a single GLB while avoiding, if desired, use of general interconnect resources. See again FIG. 2B and note the correspondence between elements shown thereat in region 298 to elements shown in region 235F of FIG. 2F.

We can see moreover, within the GLB-representing box 235F of FIG. 2F, that the LUT input term signal (IN-3") may have been pre-captured in front-end register 209Fy at a time point defined by a CLK1" signal. This occurred while the corresponding IN-3' signal was being acquired by ISM section 294F.1 from AIL214F. After being selectively so-acquired, the IN-3' signal will have passed to register 209Fy by further way of feedthrough line FTy0 and registers-feeding multiplexer section, 207Fy.1. Local feedback line, FBy was used to couple the front-end-captured, and thereafter registered, IN-3" signal to the processing resources (e.g., z-LUT) of the Z-CBB. This use of dedicated, local feedback lines corresponds to what we demonstrated in FIG. 2E and also roughly to section 293 of FIG. 2B. A slightly more sophisticated form of signal routing is being shown in FIG. 2F. Once the IN-3" signal is safely captured in register 209Fy, the OE of LLD 286*a* can be immediately deactivated, and mastery over the shared interconnect line 214F (if it is indeed shared) can be immediately handed over to another LLD such as 286*b*.

This register-based transfer of a signal (e.g., Q1"/IN-3') over a shared line (e.g., 214F) allows for more efficient use of that shared line. Details about such register-based transfer of signals within an FPGA and over a shared line were provided in our above-cited, U.S. Pat. No. U.S. Pat. No. 6,211,695 B1 ("FPGA Integrated Circuit Having Embedded SRAM Memory Blocks with Registered Address and Data Input Sections") which is incorporated herein by reference. Those details do not therefore have to be explained again here. See more specifically the description of FIG. 10 in our said '695 patent. The registers-intensive GLB architecture being disclosed here, in combination with the registrable feedthroughs allows such, more-efficient use of MaxRL lines and other shareable interconnect lines (e.g., 10xRL lines, global-reach lines) to be carried out because of internal structures in the repeated GLB's.

It should now becoming clearer (in view of the above disclosure) that logic resources and/or general-interconnect resources within an FPGA may be conserved and/or used more efficiently if the signal synchronizing functions of feedthrough-reachable registers such as 209Fx, 209Fy, 208Fz and 209Fz of FIG. 2F can be accessed efficiently by use of feedthrough lines and/or local feedback lines (and/or direct-connect lines as shall be elaborated on later below). Also, interconnect resources in the FPGA may be conserved if common clock signals (e.g., CLK2" of FIG. 2F) can be commonly-acquired and shared among pair-able registers such as 208Fz–209Fz of FIG. 2F. Of course, none of that may actually happen in the ultimately-programmed FPGA 200" unless the map-and-pack, place-and-route software (202F) is made aware of such possibilities and is urged to take advantage of them.

FIG. 2G illustrates a flow chart 250F of a process that attempts to obtain such logic-space-saving and/or interconnect resource-saving results. A design definition such as 201F is input at step 251F into the FPGA compiler software module (logic synthesizing module) 202F. Numerous processing steps may take place within software module 202F. Paths 251*a*F and 254*a*F depict alternate or commingled options. Depending on the abstraction level(s) used to define the whole or various parts of the supplied design definition 201F, it may be desirable to include a circuit synthesis step 252F and/or a map-and-pack step 253F within process 250F. The circuit synthesis step 252F can be one wherein behavioral descriptions (e.g., ones that are provided byway of a hardware behavior descriptor language such as VHDL) are converted into gate-level definitions which detail certain types of logic gates or other logic units (e.g., AND, OR, REGISTER, RAM, etc.), their inputs, outputs and interconnections. The synthesis step 252F may optionally include the insertion of additional registers beyond those needed for carrying a specified behavior, where the additionally inserted registers are so-inserted for enhancing the operating frequency limits of the to-be-implemented circuit. (See again FIGS. 1D–1F.)

A mapping and packing step 253F may follow the circuit synthesis step 252F. In the mapping and packing step 253F, the logic-implementing capabilities of logic blocks (e.g., GLB's) and/or subunits (e.g., LUT's) of such blocks are mapped against the synthesized circuit definition so as to partition the synthesized circuit definition into corresponding chunks that can be packed, each into a respective logic block of the target FPGA. (Packing typically does not entail placement and routing. The latter, more detailed operations usually occur after it is verified that the FPGA can be packed so as to accommodate the entirety of the to-be-implemented design.) The mapping part of step 253F usually adjusts partitioning so that the number of input signals being associated with each partitioning slice comes close to, but does not exceed the signals inputting capabilities of a corresponding logic block. Thus, in the case of a 24-inputs GLB such as illustrated in FIG. 2A each partition slice will have no more than 24 unique input signals, and often less if resource-folding operations are being contemplated by the synthesis software, such as merging of variable grain LUT's (e.g., 205A and 205B) to define an effectively larger-sized LUT (see item 225 of FIG. 2C) or other such variable grain entity.

The mapping part of step 253F will usually adjust partitioning so that the number of output signals being associated with each partitioning slice comes close to, but does not exceed the signals outputting capabilities of a corresponding logic block. Thus, in the case of a 8-outputs GLB such as illustrated in FIG. 2A each partition slice will have no more than 8 unique output signals.

Ideally, the mapping and packing step 253F will have partitioned the synthesized design (output of module 252F) so that packing density is maximized and resource wastage is minimized within each logic block. The mapping and packing step 253F may not have, however, optimized its output for reducing routing delay through the general interconnect of the FPGA device. For example, if both front-end registration and back-end registration and/or back-end signal re-synchronization is taking place in a design section that is mappable into a single logic block, it may be advantageous to have the software automatically see to it that all these activities do take place within a same logic block rather than allowing such activities to extend through the general interconnect of the FPGA device and take place in spaced-apart logic blocks. (See again, items 112,122,114, 124 of FIG. 1C.)

A step such as 254F should therefore be included among the various steps of software module 202F. In step 254F, the computer is instructed to search through one or more of: (a) the input design definition (e.g., 201F by way of path 254aF), (b) the post-synthesis design definition (e.g., by way of path 254bF), and (c) the post-packing design definition (e.g., by way of path 254cF) to look for the presence of unique types of signal relationships (or for embedded software flags in the definitions that flag out such unique types of signal relationships). Note that a relatively, non-abstract whole of an input design definition 201F or relatively, non-abstracted parts of such an input design definition can be supplied directly to search step 254F for scanning (path 254aF) rather than being supplied indirectly by way of synthesis step 252F and/or map & pack step 253F.

One of the unique signal relationships which step 254F searches for can be a signal and/or circuit flow which calls for resynchronization of identifiable signals to a given clock, for example, the resynchronization of the illustrated Q2" and Q4" signals of FIG. 2F to the CLK2" clock signal. (The search in step 254F should also cover the slightly different resynchronization situation of signals Q2' and Q4' in FIG. 2B.) The search criteria in step 254F may optionally require the searched-for, signal-relationship specifications to specify that the Q2" signal is to be an immediate function of the Q4" signal (or more correctly speaking, that R2" is to be an immediate function of IN-3", where, after resynchronization, the latter two signals become Q2" and Q4"). The search criteria in step 254F may optionally require the searched-for design requirements to specify that the IN-3' to R2" transform function can be implemented by a single LUT (e.g., the z-LUT in box 235F of FIG. 2F) in a given CBB or that such a transform function can be implemented by a limited number of LUT's in a same GLB. (We will shortly explain how plural LUT's can be folded together within a given GLB, or even across neighboring GLB's. For now, note briefly the dynamic multiplexer 225 shown in FIG. 200C).

At a subsequent, machine-implemented step 255F, if design specifications for two or more, to-be-synchronized signals like Q2" and Q4" are found to satisfy the search criteria of step 254F, and the primitives (e.g., 208Fz, 209Fz) which are to produce them are not already packed for implementation in a same logic block (e.g., 235F of FIG. 2F), then the definitions of those production primitives (e.g., 208Fz, 209Fz) are remapped, and/or repacked or otherwise associated with attributes (and/or with pre-defined pack and place IP solutions) which will force or urge those production primitives (e.g., 208Fz, 209Fz) towards ultimately being placed in a same logic block and being constituted by in-GLB register pairs such as 208Fz–209Fz The design component alterations (e.g., re-packings) should also inherently or otherwise insure that the to-be-synchronized signals like Q2" and Q4" are synchronized to a shared clock signal such as the illustrated CLK2" signal. (It will be seen below in the embodiment of FIG. 4B how such sharing of clock signals amongst register pairs may be carried out.) If these urged packings and in-GLB configurations are ultimately realized, then one or more of the advantages discussed for region 235F of FIG. 2F may be obtained.

A word is in order about the "urging" aspect mentioned here. It is understood by those skilled in the art of formulating FPGA map-&-pack and place-&-route software that many implementation-controlling factors may come into play during a solution "annealing" phase. In a solution annealing phase the various, in-play factors may work to pull a given two design components (like the nodes of signals Q2" and Q4" of FIG. 2F) towards realization in a shared region (e.g., a same CBB or a same GLB) of a given FPGA. It is also understood by such artisans, that other in-play factors may push the ultimate packings and/or placements of the given design primitives apart from one another. The urging factors produced in step 255F are just one of such primitives-pulling-together factors. If forced packing and/or placement is not allowed to take overriding control, different urging factors may compete with one another, and ultimately after several re-runs of one or more of the partitioning, placement and routing operations of the software, some urging factors will triumph while others may not be realized. It is difficult to predict in advance which urging factors will win (unless, of course, a fixed, partial or full floor plan is used). Thus the best we can say in the general case of FIG. 2G is that the urging factors generated in step 255F strive to create in the ultimately programmed FPGA 200", the efficient implementations shown in box 201F of FIG. 2F.

Dashed path 260F of FIG. 2G represents many other processes within the software module 202F wherein the original design definition 201F is being transformed by steps such as mapping, packing, design-repartitioning, partition-placements and inter-placement routings to create a configuration file for the target FPGA 200'. Step 270F assumes that at least one set of the to-be-cross-synchronized design elements like the Q2" signal and/or the Q4" signal and/or the IN-3" and/or Q1 "signals were found and had their corresponding production elements were ultimately placed so as to allow for the use of a feedthrough line like FTz0, alone or in combination with an in-GLB lookup block like the z-LUT of section 235F so as to thereby generate synchronous signals at respective back-ends and/or front-ends of pipelines circuit sections like 235F and/or 215F. In that case, at step 270F the target FPGA 200' is configured to use registerable feedthroughs like FTy0 (FIG. 2F) and/or pairable, clock-sharing registers like 208Fz–209Fz for producing and outputting synchronized signals like Q2" and/or Q4". The place-and-route software may additionally be forced or urged at step 254F to use in-ISM, signal duplicating resources such as the illustrated, MOLb#F (FIG. 2F) for duplicating input term signals that are to be used as inputs for lookup units and also as re-synchronized outputs.

The place-and-route software may additionally be forced or urged at step 254F (or elsewhere in its automated deliberations) to explore the options of swapping-wise outputting the Q2" and Q4" signals respectively on the Z1 and Z0 nodes (or W1–W0 nodes, or other CBB nodes) instead of respectively on the Z0 and Z1 nodes as is shown in box 235F of FIG. 2F. This GLB-internal routing flexibility arises from the fact that registers-feeding sections 207Fz.1 and 207Fz.2 are substantially equivalent and thus interchangeable, and from the fact that the same type of interchange equivalency may be true for most signals that route through ISM sections 294F.2 and 294F.3. Thus, if during routing or re-routing of signals for the example of FIG. 2F, the place-and-route software finds that it is preferable to broadcast the Q4" signal (which signal is shown to be initially placed on the Z1 node in FIG. 2F) over a long-haul interconnect line (e.g., a MaxRL line) and the software further determines that there is no benefit to broadcasting the Q2" signal (which signal is shown to be initially placed on the Z0 node in FIG. 2F) over a long-haul interconnect line, then the software may elect to swap the GLB-internal placements of the Q2" and Q4" signals to instead be respectively on the Z1 and Z0 nodes—the reason being that only the Z0 node couples to the longlines OSM (LOSM 280) in one embodiment of FIG. 2A. Such software-initiated swapping of GLB-internal placements may, of course, be carried out for other reasons, such as a finding that there are more routing options available at a given analysis time through one part of the block's short-haul OSM (BOSM 250) than through another part of the BOSM 250.

The place-and-route software may additionally be forced or urged at step 254F (or elsewhere in its automated deliberations) to explore the option of using a local feedback line like FBy (or a local, direct-connect line) instead of a general interconnect line for routing the IN-3" signal from register 209Fy to ISM sections 294F2 and 294F.3. The place-and-route software may additionally be forced or urged at step 254F (or elsewhere in its automated deliberations) to explore the option of using registration both before (209Fx) and after (209Fy) a given signal (e.g., Q"/IN-3') is conveyed over a time-multiplexed, interconnect line (e.g., 214F) so that time slots of the time-shared line may be minimized and used efficiently. (For example, Q1 "sets up in register 209Fx before the OE of LDD 286*a* is activated. As soon as IN-3' is securely captured in register 209Fy, the OE of LDD 286*a* may be safely deactivated, thus freeing line 214F for use by another signal source like LLD 286*b*.) The place-and-route software may additionally be forced or urged at step 254F (or elsewhere in its automated deliberations) to explore the option of using one or more exploitable feedthrough lines (be they primary feedthroughs or secondary ones—secondary feedthroughs are described later below) in order to feed an ISM-acquirable signal to an in-GLB register or to another in-GLB resource. Examples in FIG. 2F of such use of feedthroughs are shown by the FTx0, FTy0 and FTz0 lines.

Having explicated some further advantageous utilizations of the here disclosed FPGA architecture, we refer again to FIG. 2A and continue our comparison of such a register-intensive architecture versus the Variable Grain Architecture which is described in the above-cited U.S. Pat. No. 6,097,212. The newer, register-intensive organization is, in some ways similar to the VGA architecture in that register-intensive approach preferably does not include any single-length general interconnect conductors (1xCL conductors, see FIG. 1A). Instead, the within-GLB intra-connect structure and the GLB-to-GLB (or, -to-IOB) interconnect structure of FIG. 2A may include a panoply of different kinds of conductors such as, but not limited to: (a) the local feedback (FB) intra-connect lines 231; (b) the dedicated, direct connect (DC) interconnect lines 234 {which in one embodiment are each contiguous with a corresponding one of the FB lines}; (c) the duo-reach length (2xRL) general interconnect lines 233; (d) the deca-reach length (10xRL) general interconnect lines 237; (e) the tristateable, and geometrically unidirectional, maximum-reach length (MaxRL) lines 238; and (f) the omni-directional, global-reach length (GLOxRL) lines 239. Some of these have already been introduced above. The various GLB interconnect and intra-connect lines will be further described in conjunction with FIGS. 3A–3D.

One notable difference between the VGA architecture of U.S. Pat. No. 6,097,212 and the present, register-intensive structure is that the function-spawning layer shown in FIG. 2A consists of, or alternatively includes, four, 4-input lookup table units such as 205A–205D whereas the function-spawning layer of the earlier VGA architecture preferably used a greater number of fs-LUT's that were each a 3-input lookup table. Another notable difference is that the pre-LUT decoder layer of the earlier VGA architecture preferably relied on programmable-opening points (POP's—not shown) for decoupling feedthrough signals (the non-register-able kind) and/or for decoupling dynamic-selection signals (used in function synthesis) from LUT input terminals at times when those POPpable input terminals were to be otherwise supplied with signals duplicated from like input terminals of other LUT's. By contrast, in the register-intensive structure of FIG. 2A, the second-stage ISM (240) preferably has separate, primary feedthrough lines, FTa–FTd, which do not require dedicated programmable-opening points (POP's) for providing their somewhat-different (because, for one thing, they are register-able) feedthrough functions. It will be seen shortly in FIG. 2C that so-called, secondary feedthrough functions may additionally be made available. When using these secondary feedthrough functions (e.g., FTa2, FTa3 of FIG. 2C), LUT input terminals may be programmably decoupled from the ISM-2 stage, if desired, by implementing a non-dedicated, Don't-Care function (XXX) at those terminals. The so-freed, ISM-2 multiplexer output lines (MOLb's) may then be used as additional feedthroughs (secondary feedthroughs) that can forward locally-acquired signals to the in-GLB registers and/or other GLB-internal resources. Six MOL's (matrix output lines, not shown) were consumed in the input switch matrix of the prior VGA architecture to implement a four-input lookup capability (which 4-LUT capability called for a folding-together of two 3-input, fs-LUT's).

By contrast, in the illustrated register-intensive structure 200 of FIG. 2A, only four MOLb's (e.g., #0–#3 which respectively feed LUT terminals a0–a3) are sufficient for providing a four-input lookup capability. The FTa–FTd, primary feedthrough lines may be each separately and simultaneously used to provide a respective, register-able feedthrough function—which function is also referred to herein at times as a 'register recovery' function. 'Register recovery' may refer to the storing of fedthrough signals (e.g., via FTa of FIG. 2A and/or by FTa3 of FIG. 2C) in a corresponding one or more GLB-internal registers (e.g., 208*a*, 209*a*) particularly when the GLB-internal registers are not being used for storing the result signals of their corresponding fs-LUT's or more complex signals synthesized therefrom. In other words, the GLB-internal registers (208*a*–209*d*) do not have to be wasted even if the place-and-route software (see 202F of FIG. 2F) does not decide to store a local-LUT, result signal (or a derivative thereof) in such registers. The signal-storing functionality of the registers may be 'recovered' by instead feeding through another signal (or otherwise routing another signal, as is implied by couplings 206*a*–206*d*) to the in-GLB registers (208*a*–209*d*). It will be seen that the use of 4-input function-spawning LUT's, and of multiple registers (e.g., 208*a*, 209*a*) per each such fs-LUT (e.g., 205A), and the use of the register recovery function (e.g., FTa or others of 206*a*), is a more efficient way of supporting nibble-based and/or synchronous designs. (In the art, a 'nibble' is commonly understood to refer to four bits while a 'byte' commonly refers to eight (8) bits, and a 'word' may be used to refer to sixteen bits or other whole numbers of nibbles. Synchronous designs may include those in which multi-nibble data signals are time-aligned to one or more edges of corresponding clock pulses.)

In one embodiment, the ISM-2 stage 240 (of FIG. 2A, but see also 240C of FIG. 2C) is structured so as to be able to route a set of four, respective and nibble-wide signals—where each of the four, nibble-signals is 4 bits wide—from bus 235 equivalently to any ordered, counter-respective combination of the quad-input fs-LUT's, 205A–205D. Alternatively, a single, nibble-wide signal may be simultaneously routed by the ISM-2 stage 240 to two or more of the four, quad-input fs-LUT's, 205A–205D while remaining ones of fs-LUT's 205A–205D can receive other signals. In other words, each GLB (201) may be viewed as having at least four, 4-input LUT's (205A–205D) which are freely-interchangeable, one with the other in so far as an incoming nibble-wide signal is concerned. Also, an incoming nibble-wide signal can be replicatively distributed by the ISM-2 stage 240 to two or more of the GLB-internal fs-LUT's. The programmable routing options (of stage 240) enable each such GLB (see FIG. 3A which shows plural GLB's) to efficiently acquire and process with its respective four LUT's, a respective four nibbles' worth of input data. The programmable routing options (of stage 240) alternatively enable each such GLB to efficiently acquire and process with its respective four LUT's, a respective, two bytes' worth of input data, or a respective one, 16-bit input word. When such single or multi-nibble based processing occurs, bit significance may be programmably preserved at the nibble level, or byte level, or word level as may be appropriate because of the programmable interchangeability of the respective four fs-LUT's (205A–205D) and their corresponding, downstream resources (e.g., registers-feeding multiplexer 207*a*; multiple-registers like 208*a*, 209*a*; and BOSM inputs like W0 and W1).

The substantial interchangeability of the lookup blocks (205A–205D) in each GLB also gives the place-and-route software flexibility in deciding where, within each GLB, to place, or re-place a given design primitive (e.g., 135' of FIG. 2B). This flexibility can be useful in cases where certain input and/or output routing paths have already been consumed by other place-and-route operations and the software therefore has to find alternate solutions in order to create a complete and operative FPGA configuration.

Each GLB 201 can output a corresponding nibble of result data. The result nibble can have for its respective 4 bits; signals on nodes W0,X0,Y0,Z0 or signals on nodes W1,X1, Y1,Z1. Such result bits may then be forwarded, as may be appropriate, to the GLB-adjacent longlines 238, and/or to the regional direct-connects (DCa–DCd) and/or to the local feedback lines (FB's) 231 and/or, through a local, duo-deca switchbox (260), to the corresponding 10xRL lines 237, and/or 2xRL lines 233.

Also, because there are at least 8 registers (208*a*–209*d*) in each GLB, each GLB 201 may be used to capture and output as much as two nibbles' worth of data, or one byte's worth of data, provided the appropriate feedthrough and register recovery options are selected. There is more than one way that feedthrough can occur. One feedthrough option can be seen just by considering FIG. 2A taken alone. In that, relatively undesirable option, each of LUT's 205A–205D can be programmed to implement the programmable feedthrough (PFT) function. In such a case, LUT 205A can feed a locally-acquired first signal (e.g., a0) to local register 208*a* while the primary FTa line can feed a second such input signal to local register 209*a*, or vice versa. (Multiplexer 207*a* preferably provides substantially symmetrical routing so that each of registers 208*a* and 209*a* can capture and store whatever signal the other one can. Exceptions to this rule may include arithmetic bits whose order needs to be preserved to maintain appropriate bit significance within a data word.) Other, more-preferred feedthrough options will be elucidated on shortly, in conjunction with our below discussion of FIG. 2C.

Sticking with FIG. 2A just a bit longer with FIG. 2A, we note that even though 4-input fs-LUT's are provided in each GLB 200, there are many times when the map-and-pack software needs to pack a primitive having only three independent input terms (e.g., a 2:1 dynamic multiplexer, or a 3-input NAND gate) or for just two independent input terms (e.g., a 2-input XOR gate) rather than 4 such terms. In such cases, the 4-inputs processing power of the corresponding, quad-input LUT's (205A–205D) is more than what is needed. Some wasting of GLB-internal resources therefore occurs. However, the in-GLB resources that are downstream of the so-wasted LUT-input and the in-ISM resources that are upstream of that input do not have to be simultaneously wasted (go unused). The signal-acquiring functionality of the upstream MOLb's (in element 240) of the partially-wasted LUT may be programmably combined with the register-recovery option (where the latter option may include programmable bypassing of the register proper!) so that useful, in-GLB operations nonetheless take place. These operations may include different forms of signal routing through the partially-wasted GLB and/or signal registration within the affected GLB.

Forsake of a concrete example, suppose that a particular 4-input LUT in FIG. 2A (e.g., 205A) is to be programmed to implement just a 2-input NOR function. In this case, 2 of the LUT's input terminals (e.g., a2, a3) will be configured to operate as Don't Cares (XXX's). Remaining resources within the GLB 201, which are associated with the XXX-operated LUT terminals (e.g., a2, a3) may nonetheless be usefully employed. As a consequence, the upstream signal-acquiring/selecting capabilities of the first-stage ISM 230 and/or the upstream signal-selecting/routing capabilities of the second-stage ISM 240 do not have to be wasted. The corresponding ISM-2 MOLb's (e.g., of a2, a3) can be viewed as having the useful job of selectively supplying input term signals to the now, XXX-operated LUT terminals (e.g., a2, a3; see also lookup block 205B' of FIG. 2C). Moreover, the (programmably by-passable) signal capturing, and signal storing and forwarding capabilities of registers in the sets 208*a*–208*d* and 209*a*–209*d* do not need to be wasted given that the registrable feedthroughs are present.

In this regard, we now refer with more specificity to FIG. 2C. This figure shows one possible, detailed implementation 200C for the more generalized embodiment 200 shown in FIG. 2A. Second-stage ISM 240C is shown to include at least twenty vertical, Matrix Input Lines (MI Lb's) which may be respectively identified as MILb #0 through MILb #19. ISM 240C is further shown to include at least ten horizontal Matrix Output Lines (MOLb's) which are denoted as MOLb #0 through MOLb #9. In this simplified example, at least four PIP's populate MOLb #0 at the vertical intersection positions of MILb#0-MILb#3. (Other PIP's, not shown, may partially populate further parts of MOLb#0.) Similarly, four additional PIP's are shown to populate MOLb #1 at the intersection positions of MILb#4–MILb#7, and so on. (Other PIP's, not shown, may partially populate further parts of MOLb#1.) The horizontally staggered pattern continues on MOLb's #2, #3 and #4. Then on MOLb#5, four additional PIP's populate that horizontal matrix output line at intersection positions of MILb#0–MILb#3. Similarly, four more PIP's populate MOLb #6 at intersection positions of MILb#3–#7, and so on.

If the PIP populating pattern is expanded according to this paradigm, not only through to MOLb #9 (shown in FIG. 2C) but also further for MOLb #10 through MOLb #19 (not shown in FIG. 2C, see instead FIG. 2A), the illustrated arrangement of PIP's of FIG. 2C will be seen to include a first, full population of PIP's on the 4×4 intersections subset constituted by MOLb's #0, #5, #10, #15 (see also the MOLb's of FIG. 2A) and MILb's #0, #1, #2 and #3 (FIG. 2C). The PIP's arrangement of FIG. 2C will further be seen to include a second, full population of PIP's on the 4×4 intersections subset constituted by MOLb's #1, #6, #11, #16 (see also FIG. 2A) and MILb's#4–#7. Yet a third, fully-populated, 4×4 intersections subset will be constituted by MOLb's #2, #7, #12, #17 (see also FIG. 2A) and MILb's #8–#11. A fourth fully-populated, 4×4 intersections subset will be constituted by MOLb's #3, #8, #13, #18 (see also FIG. 2A) and MILb's #12–#15. Moreover, a fifth fully-populated, 4×4 intersections subset will be constituted by MOLb's #4, #9, #14, #19 (see also FIG. 2A) and MILb's #16–#19 (FIG. 2C).

This arrangement of PIP's for the second-stage ISM, 240C, as represented in FIG. 2C, enables the second-stage ISM to intermingle the bits of up to four unique nibbles (including for example, nib-0123 and nib-4567 shown at the bottom of box 240C) as desired so as to apply the intermingled bits to corresponding terminals of the four, 4-input, LUT blocks 205A'–205D' (last two not shown) of GLB 201C. More specifically, bit 0 of nib-0123 can be routed to a0, while bit 1 goes to b0, bit 3 to c0 and bit4 to d0 (see also FIG. 2A). Similarly, the bit denoted as "4" in nibble, nib-4567 can be simultaneously routed to terminal a1, while bit 5 goes to terminal b1, bit 6 to c1 and bit 7 to d1 (see also FIG. 2A). The respective 4 bits of yet another nibble, nib-89AB can be simultaneously routed distributively to LUT terminals: a2, b2, c2, and d2. And although not shown, the respective 4 bits of a fourth nibble, nib-CDEF can be simultaneously routed distributively to LUT terminals a3, b3, c3, and d3. These routings let a first LUT block like 205A' process corresponding first bits (0,4, 8, C) of respective nibbles, nib-0123, nib-4567, nib-89AB, nib-CDEF (last one not shown) while a second LUT block like 205B' can simultaneously process corresponding second bits (1, 5, 9, D) of the same nibbles and while respective third and fourth LUT blocks (205C', 205D', not shown—see instead FIG. 2A) respectively process corresponding third bits (2, 6, A, E) and fourth bits (3, 7, B, F) of the same nibbles. Bit significance in each of nibbles: nib-0123, nib-4567, nib-89AB, nib-CDEF can be shuffled as desired. So alternatively, the first LUT block 205A' might be asked to process corresponding bits (1, 6, 9, F) of the respectively described four nibbles instead of first bits (0, 4, 8, C). The bit significances can be scrambled as desired.

Incidentally, in FIG. 2C, the illustrated LUT blocks 205A'–205D' are designated as having LUT-plus functionalities. One of the additional functionalities that each of the "LUT+" blocks 205A'–205D' has—as a programmable alternative to that of acting as a run-time lookup table—is that of each acting as a run-time, variable-length shift register where data to be shifted comes in on a $SHIFT_{in}$ line and comes out on the $D_{out}$ ($SHIFT_{out}$) terminal 221. The variable shift latency may be adjusted in one embodiment, between 1 to 8 stages in accordance with a 4-bit delay code supplied on the a3–a0, address input terminals of the LUT+ block. (For example, a3:a0=$0_{hex}$ may define an 8 stage, shift delay, while a3:a0=$E_{hex}$ may define a one stage, shift delay).

Another functionality that each of the LUT+ blocks 205A'–205D' may have—as a programmable alternative to being a run-time shift register—is that of acting as a run-time programmable memory block with its write-data coming in on terminal 221 (as WDin or write-in data). Such writing of data (WDin) may occur when a supplied, write-enable control signal (e.g., WEn0) is active. When the write-enable control signal is inactive, terminal 221 acts as an output instead of as an input. The address bits for the run-time programmable memory block come in on the a0–a3 terminals, and the read data (Dout) comes out on the same terminal 221 as does the function output ($f_a$(4T)) of the LUT when WEn0 is at logic "0". Write-enable signals, such as the illustrated WEn0 can come from a GLB controls block, such as the illustrated block 203*c*. Further descriptions of the LUT+functionalities will be given below. This preliminary introduction is provided for explaining why the FTa0, primary feedthrough line of LUT+205A' is also labeled as a D0/Sel0 line and why the illustrated FTb0, primary feedthrough line of LUT+205B' is also labeled as a D1/Sel1 line. The D0, D1, etc. descriptors are used when the corresponding, feedthrough data streams are to serve as shift-input data. The Sel0, Sel1, etc., descriptors are used when the corresponding, feedthrough data signals are to serve as dynamic selection signals. (For example the Sel0 signal can drive selection terminal 224 of DyMux 225.)

In more general terms, the signals which are selectively acquired by the ISM-2 stage (240C) and forwarded to the corresponding GLB (201C) will occasionally be referred to collectively to herein as "ISMb-Acquired signals". They may also be referred to as "GLB ISMbA inputs", or "GLB-inputs" for short. The use of such collective names may be useful here because more than one name may be given within this disclosure here to each of the various signals (e.g., FTa0/Sel0/D0) that are selectively acquired by the ISM-2 stage, 240C and then fed into the Generically-variable Logic Block (GLB) 201C. It is to be understood that GLB 201C may have other input signals (e.g., global reset) beyond those that are selectively supplied to the GLB 201C by way of the ISM-2 stage, 240C.

In addition to the ability of the illustrated second-stage ISM, 240C to distributively route the bits of four unique nibbles (nib-0123 through nib-CDEF) in scrambled or orderly form respectively to the LUT+ blocks 205A'–205D' of the corresponding GLB, the ISM, 240C can distributively route the bits of a fifth unique nibble (nib-GHIJ) in scrambled or orderly form respectively to MOLb's #4, #9, #14, #19 (see also FIG. 2A) such that bits of nib-GHIJ can be fedthrough for registered or unregistered output via the GLB output terminals (W0, W1, . . . , Z0, Z1) and/or can be used for dynamic selection control (e.g., Sel0, Sel1) functions or other overlapped functions (e.g., WDin0, WDin1) of the primary feedthrough lines, FTa0–FTd0).

Furthermore, the illustrated second-stage ISM, 240C can replicatively route the bits of a single nibble to corresponding terminals of two or more of the LUT+ blocks 205A'–205D'. By way of example, consider the illustrated nibble, nib-159D (shown at top of box 240C) whose bits are presented, for purpose of example, on respective MILb lines #1, #5, #9, and #13 so that they can be programmably routed to the respective four input terminals of any two, three or all of LUT+ blocks 205A'–205D'. This replicative routability of the bits of nibble nib-159D can be used to support the synthesis of functions of five independent terms, $f_W(5T)$ or of functions of higher or of lower complexity, where such function implementation requires input duplication (e.g., b0=a0, b1=a1, etc.) for the involved LUT+ blocks.

It should be apparent from the illustrated PIP placements in the second-stage ISM, 240C that, the bits of an alternate or additional nibble that is to be replicatively routed, can be positioned on respective MILb conductors #0, #4, #8, and #12 (not shown but could be labeled as "nib-048C"). There is room for variation. The alternate or additional nibble that is to be replicatively routed, can be instead positioned on respective MILb conductors #0, #7, #10, and #15 or other such permutations in the respective ranges of #0–3, #4–7, #8–11 and #12–15. Thus, place-and-route software can find a variety of ways to replicatively route the bits of a given one or more nibbles to respective pairs, triplets or all of the function-spawning, LUT+blocks (205A'–205D') of GLB 201C.

Of course, if the number of PIP's per MOLb (matrix output line in stage "b") is increased within ISM 240C, the place-and-route software may be given even more flexibility in finding a workable routing solutions. But this would come at the cost of increased loading to the horizontal and vertical matrix lines in the switch matrix, and possibly increased delays to signals propagated through ISM 240C. As such, a balance should be struck between how friendly the FPGA architecture is to the routing needs of place-and-route software, and how much additional delay might be incurred by providing additional PIP's. The illustrated combination of a partially-populated ISM stage 240C and fully-populated, 4×4 intersection subsets such as constituted by: MOLb's #0, #5, #10, #15 and MILb's #0, #1, #2 and #3 and such as constituted by: MOLb's #1, #6, #11, #16 (see also FIG. 2A) and MILb's #4–#7 (FIG. 2C); and so forth; provides such a judicious balance between functional flexibility and signal propagation delays. Another judicious distribution of PIP'swill be presented later below for FIG. 4A.

We now explore the efficiency with which each 4-input LUT+ block 205A' can implement a function of less than 4 input terms. Consider a case where LUT+ block 205A' is to implement a 3-input lookup function, say for example, the 2:1 dynamic multiplexer function, 223 which is schematically illustrated in dashed form in FIG. 2C. Such a 3-input lookup function may use respective, address-input terminals a0, a1 and a2 for receiving corresponding input term signals; where a2 is to operate in the 2:1 DyMux example as the selection control for dynamically choosing either the signal on a0 or on a1 for output onto LUT result line 221. In such a case, the a3 input terminal is not needed, and the LUT+ block 205A' is accordingly programmed to cause that a3 terminal to operate as a don't-care input (a3=XXX). That however, does not mean that the signal acquisition and routing capabilities associated with the multiplexer defined along MOLb#3 of ISM 240C are inherently wasted. Line 216*a* may be used to route a secondary feedthrough signal, FTa3, to either one or both of register-feeding multiplexers 207*a*0 and 207*a*1. As shown, these static multiplexers, 207*a*0, 207*a*1 respectively feed registerable-data signals R0 and R1 to registers 208*a*' and 209*a*' as well as to respective register-bypass multiplexers 218 and 219. The outputs of static multiplexers 218 and 219 may respectively form the W0 and W1 output signals of the W-CBB in GLB 201C. Note that from the perspective of routing a given feedthrough signal (e.g., FTa0, FTa3 or FTa2) for output, that CBB terminals W0 and W1 are substantially interchangeable. Either one or both of W0 and W1 can operate in registered or combinatorial (unregistered) mode. Either one or both of W0 and W1 can supply can supply their respective output signals to the BOSM 250 ('FIG. 2A) for subsequent and substantially equivalent routing through the general interconnect. These substantial interchangeabilities of capabilities gives the place-and-route software flexibility in choosing how to route a given signal. Of course, there may be some capabilities that are not interchangeable between W0 and W1. In the embodiment of FIG. 2A it is seen that W0 couples to the H&V LOSM's 280 while W1 does not. W1 couples to the FBa/DCa line(s) while W0 does not. (Incidentally, with respect to schematic showings herein of multiplexers, it is to be understood that unless a dynamically-variable, selection control line such as 224 of DyMux 225 is explicitly shown or described, illustrated multiplexers are understood to be 'static', meaning their selection is defined at FPGA configuring time by programming of the relatively static configuration memory of the FPGA rather than dynamically during FPGA run time.)

Given the above-described Don't-care (XXX) situation at the a3 terminal of LUT+ block 205A', and the ability to nonetheless feedthrough the corresponding FTa3 signal by way of one or both of the static, register-input multiplexers, 207*a*0 and 207*a*1; it may be appreciated that one or both of registers 208*a*' and 209*a*' can be used to capture the secondary feedthrough signal, FTa3 in respective synchronism with respective ones of the illustrated clock signals, CLKa0 and CLKa1. (In one embodiment, CLKa1=CLKa0. See for example FIG. 4B.) The register-bypass multiplexers, 218, 219 may be each used for selectively forwarding either a non-registered version (R0 or R1) of the fedthrough, FTa3 signal or a registered version (or latched version, Q0 or Q1) to a respective one of the W0 and W1 output terminals as desired.

A registers' control circuit 203-*a*–*b*–*c* is shown in FIG. 2C to be supplying register control signals such as clock (CLKa0 or CLKa1), clock-enable-not (CENa0* or CENa1*), respective sets ("1") and respective resets ("0") to the respective state-storing registers, 208*a*' and 209*a*'. In one embodiment (see FIG. 4B), not only is CLKa0 is the same as CLKa1, but CENa0*=CENa1*, the respective sets ("1") are the same, and the respective resets ("0") are the same. The write-enable controls (Wen0, Wen1, etc.—only first one is shown) can be overlappingly supplied from the set/reset controls block 203*c*. For an alternate embodiment, the control signals of respective registers in a register pair such as 208*a*'–209*a*' can be made to be independent and different from one another. The registers' control circuit 203-*a*- *b*-*c* may develop its respective, register control signals (CLKa0, . . . , R1) from locally-acquired control signals (GLB-IN's) output by ISM-2 and/or form globally-distributed control signals. In the illustrated example, block control signals, BCLK, BCEN, BCE2 and BS/R may be routed by ISM-2 (over MOLb conductors #20–#23, see 204 in FIG. 2A) and used to define a respective one or more of the register clock, enable, and set/reset signals. A globally-distributed, GS/R signal may be further used for defining the register set/reset signals. More detailed examples will be provided below.

Let us continue with our first example, where the 2:1 DyMux (dynamic multiplexer) 223 is being implemented in LUT+ block 205A' as shown. Let us assume that another 2:1 DyMux (not shown) is being simultaneously implemented in a substantially same way within the other illustrated LUT+ block, 205B'. Inputs of the second 2:1 DyMux (not shown) are understood to be defined by the b0, b1 and b2 terminals. Here again, the b3 input terminal is not needed, and LUT 205B' will accordingly be programmed to cause that b3 terminal to operate as a don't-care input (b3=XXX). That of course, does not inherently mean that the signal acquisition and routing capabilities associated with the corresponding multiplexer which is defined along the MOLb #8 conductor of ISM 240C need to be wasted. Line 216*b* may be used to route a secondary feedthrough signal, FTb3, to either one or both of corresponding, register-feeding multiplexers 207*b*0 and 207*b*1 (not shown in FIG. 2C, but understood to be structured and coupled in a manner similar to corresponding register-feeding multiplexers 207*a*0 and 207*a*1—see also FIG. 2A). The corresponding registers of those will by-passably feed the X0 and X1 output terminals of the GLB, and so on. See again FIG. 2A.

As an alternative to, or in addition to, using line 217*a* and multiplexers 207*a*0 and/or 207*a*1 for feeding-through the FTa0 signal to FF's 208*a*', 209*a*' or beyond, the same line 217*a* may be used to route the ISM-2 selected, primary feedthrough signal, FTa0 for use as a dynamic selection signal, Sel0 at control terminal 224 of DyMux 225. Output 221 of LUT+ block 205A' couples to input 221' of dynamic multiplexer 225. Output 222 of LUT+ block 205B' couples to the other input of DyMux 225. If the secondary-stage ISM, 240C is configured to create the input-duplication condition: b2=a2, then the a2 signal can function as a less significant selection bit; and the FTa0/Sel0 signal (of lines 217*a*, 224) can function as a more significant selection bit (or vice versa) of a 4:1 dynamic multiplexer circuit formed by the combination of the two, 2:1 DyMux's (e.g., 223) implemented by LUT's 205A', 205B' and by further DyMux 225. The output 226 of this synthesized, 4:1 dynamic multiplexer circuit can be passed through input 206*a*1 of register-feeding multiplexer 207*a*1 to become a registered or unregistered W1 signal (if 207*a*1 is not being otherwise consumed).

Alternatively or additionally, the 4:1 DyMux output signal 226 can be passed through input 206*a*0 of register-feeding multiplexer 207*a*0 (if 207*a*0 is not being otherwise consumed) to become a registered or unregistered W0 signal. If its corresponding feed-selecting multiplexer, 207*a*0 or 207*a*1 is not being used for selecting the 4:1 DyMux output signal, the otherwise unused one of the W1 and W0 output terminals can be used to produce a registered or unregistered version of the LUT-unused, secondary feedthrough signal, FTa3 (line 216*a*). At the same time, the FTb0 and FTb3 feedthrough signals can propagate along respective lines 216*b* and 217*b* to become registered or unregistered signals, X0 and X1 (or vice versa in order) of the same illustrated GLB, 201C. Although not fully shown, the couplings of the FTb0 and FTb3 signals to X0, X1 can occur in manners similar to how FTa0 and FTa3 respectively can/could-have been routed through multiplexers 207*a*0 and 207*a*1 to respectively define the W0 and W1 outputs. Similar structures should be provided for the primary and secondary feedthroughs of LUT+ blocks 205C'–205D' (not shown).

In summary, what we have shown thus far for the GLB output lines: W0, W1, X0, and X1 is that alternate programmings (configurations) of GLB 201C (FIG. 2C) may be used to productively employ all four of state-storing registers, 208*a*', 209*a*' 208*b*', 209*b*' (the latter two are not shown—see instead FIG. 2A) and/or the respective bypass-multiplexers (e.g., 218, 219) that drive the GLB output lines: W0, W1, X0, X1 for forming not only: (a) an optionally-registerable 4:1 DyMux function at W1 (or W0)—which DyMux function consumes terminals: a0–a2, b0–b2 and FTa0/Sel0, but also to: (b) optionally-pass one or more of the three remaining feedthrough signals—FTa3, FTb3 and FTbO for registered or unregistered output from correspondingly available ones of W0 (or W1), X0 and X1 (see also FIG. 2A for the latter two). The only resource wastage experienced in this exemplary implementation of the 4:1 DyMux (or two independent 2:1 DyMux's such as 223, the other being in 205B') is that there are programmed, Don't Cares (XXX's) at LUT inputs a3 and b3. The ability to gainfully employ the 4:1 static multiplexers formed along MOLb conductors #3, #4, #8 and #9 is a significant improvement over the capabilities of the VGA architecture disclosed in U.S. Pat. No. 6,097, 212.

It should be understood with respect to FIG. 2C that, aside from forming the 2:1 DyMux 223 in LUT 205A' and/or the 4:1 DyMux function at output 226, LUT inputs a0, a1, a2 and b0, b1, b2 could have been used for respectively implementing any 3-input functions, and that the latter could have been 'folded-together' (using the input replicating abilities of ISM 240C) to provide a corresponding 4-input function, $f_W(4T)$ at DyMux output 226. Similarly, LUT inputs a0–a3 and b0–b3 could have been used for respectively implementing any 4-input functions at outputs 221, 222, and the latter could have been 'folded-together' (using the input replicating abilities of ISM 240C) to provide a corresponding 5-input function, $f_W(5T)$ at DyMux output 226.

Let us consider next, what may be done if the complexity of function development in the first LUT+ block, 205A' is reduced to say, only a 2-input function that employs only signals a0 and a1 for its inputs (to implement an XOR function for example). In such a case, the a2 and a3 input terminals are not needed, and lookup block (LUT+ block) 205A' is accordingly programmed to cause those a2 and a3 terminals to both operate as don't-care inputs (a2=a3=XXX). That does not inherently mean that the signal acquisition and routing capabilities associated with the multiplexers defined along the corresponding MOLb #3 and MOLb #2 conductors of ISM 240C need to be wasted. Lines 216*a* and 227*a* may be used to route respective ones of the secondary and tertiary feedthrough signals, FTa3 and FTa2 to corresponding ones of the register-feeding multiplexers 207*a*0 and 207*a*1. The fedthrough, secondary and tertiary signals (each by itself, or together as a route-swappable pair) may then propagate from there to registers 208*a*' and 209*a*'; or through bypasses 218 and 219 to respective outputs W0 and W1. At the same time, line 221 may be used to feed the $f_a$(2T) function output signal (e.g., the XOR result) of LUT+ block 205A' to DyMux 225 (and/or elsewhere as shall be seen below). At DyMux 225, the $f_a$(2T) function signal may be folded-together with a like $f_b$(2T) function signal from LUT 205B' to thereby define a 3-input function, $f_W$(3T) at output 226. This $f_W$(3T) signal, for which FTa0 serves as the third input term, may be folded with a like-developed $f_x$(3T) signal (having FTb0 serving as its third input term) in a yet a further part of GLB 201C to thereby define a $f_A$(4T) signal, as may be appreciated from the more elaborate embodiments of GLB's that are detailed below.

To summarize thus far: we have shown that even though the function-spawning LUT's, 205A'–205D' of GLB 201C each have at least 4+ address-input terminals (a0–a3), it is possible to implement with each such 4+ inputs LUT, a function of less than 4 input terms while minimizing resource wastage because those acquired signals which are routed to the unused address terminals (XXX) of the lookup block (205A') nonetheless can be fedthrough to one of the plural registers (e.g., 208*a*', 209*a*') associated with the corresponding lookup block (e.g., 205A') and/or can be output to local feedback (FBa–FBd) and/or to general GLB-interconnect (W0, W1) and/or to dedicated GLB-interconnect (DCa–DCd).

Although only registers 208*a*' and 209*a*' are shown in FIG. 2C, it is within the contemplation of this disclosure to provide more than two such state-storing registers per lookup block (e.g., perfunction-spawning LUT such as 205A'). In FIG. 2D we show another embodiment 200D wherein each of the four ISM-acquired signals produced by the multiplexers of MOLb conductors #0–#3 can serve not only as a respective address-input for the 4-input lookup block (LUT+ block) 205A" but also alternatively or additionally as a selectively capturable input of one or more of state-storing registers 208*a*", 209*a*", 228*a*" and 229*a*". Any one of these state-storing registers 208*a*", 209*a*", 228*a*" and 229*a*" may alternatively capture and forward to respective GLB outputs W0, W1, W2, W3, one or more of: the $f_a$(4T) result signal output on line 221", the $f_W$(5T) or 4:1 DyMux signal output on line 226", and the FTa0, primary feedthrough signal supplied on feedthrough line 217*a*". It is possible to include dedicated arithmetic logic 255 in GLB 201D for providing predefined arithmetic functions such as adding, subtracting, multiplying, and so forth. The significance-wise, ordered result bits (e.g., Sum0–Sum3) of arithmetic logic circuit 255 may be selectively coupled to respective ones of registers 208*a*", 209*a*", 228*a*" and 229*a*" as shown by way of register-feeding multiplexers 207*a*0", 207*a*1", 207*a*2" and 207*a*3". Each of multiplexers 207*a*0"–207*a*3" may accordingly have as many as 8 inputs (or more or less) for selectively routing position sensitive bits (e.g., Sum bits) or position insensitive bits (e.g., $f_W$(5T)) to desired ones of the four registers and/or for direct output through the register-bypass multiplexers (218", 219", 248", 249") of such registerable result signals (R0–R3) to respective GLB output lines W0–W3.

In keeping with our progressive disclosure of the various additional functions that each lookup-plus block (e.g., LUT+ block 205A") may have, we show block 205A" as participating at the tail-end of a carry-bit calculating chain and outputting the GLB's (201D's) carry-out bit, $Cout_G$ in response to having received a $Cin_3$, carry-propagated bit from LUT+ block 205B" (not shown) and in response to other inputs provided on terminals a0–a3. Alternatively or additionally to being configurable to function as part of a carry chain ($Cin_0$ through $Cout_G$), the illustrated LUT+ block 205A" may function as single-port, 16 cell SRAM and/or as an 8-bit shift register that is cascadable within the GLB (201D) with shift registers implemented likewise by the other lookup blocks 205B"–205D" (not shown, see 2A). Alternatively or additionally, the illustrated LUT+ block 205A" may function as part of a dual-port, 32 cell SRAM implemented in the GLB with concurrent use of the other lookup blocks 205B"–205D".

Although not shown in FIG. 2D, it is to be understood that GLB 201D further has output lines X0–X3, Y0–Y3, Z0–Z3, for its respective, further lookup blocks (LUT+ blocks) 205B", 205C" and 205D" (all not shown). It is further indicated in FIG. 2D at terminals W1 and W2 that the number of feedback lines per lookup block (LUT+ block) has been doubled relative to FIG. 2A such that in FIG. 2D, either or both of the W1 and W2 output signals may be fedback to the first-stage ISM of GLB 201D byway of feedback lines FBa1 and FBa2. Also the number of inputs to the longlines OSM has been doubled as shown so that either of both of W0 and W3 may be fed to the horizontal and vertical longlines OSM (see 280 of FIG. 2A). The number of direct-connects in the embodiment of FIG. 2D has not been increased however. It is to be understood that all of W0–W3 further feed into the block OSM (see 250 of FIG. 2A) and that the same is true for X0–X3, Y0–Y3, and Z0–Z3 (not shown). Thus the number of MIL's in the BOSM and in the LOSM have been doubled. This of course can disadvantageously increase die size and routing delays.

Figure 3A:
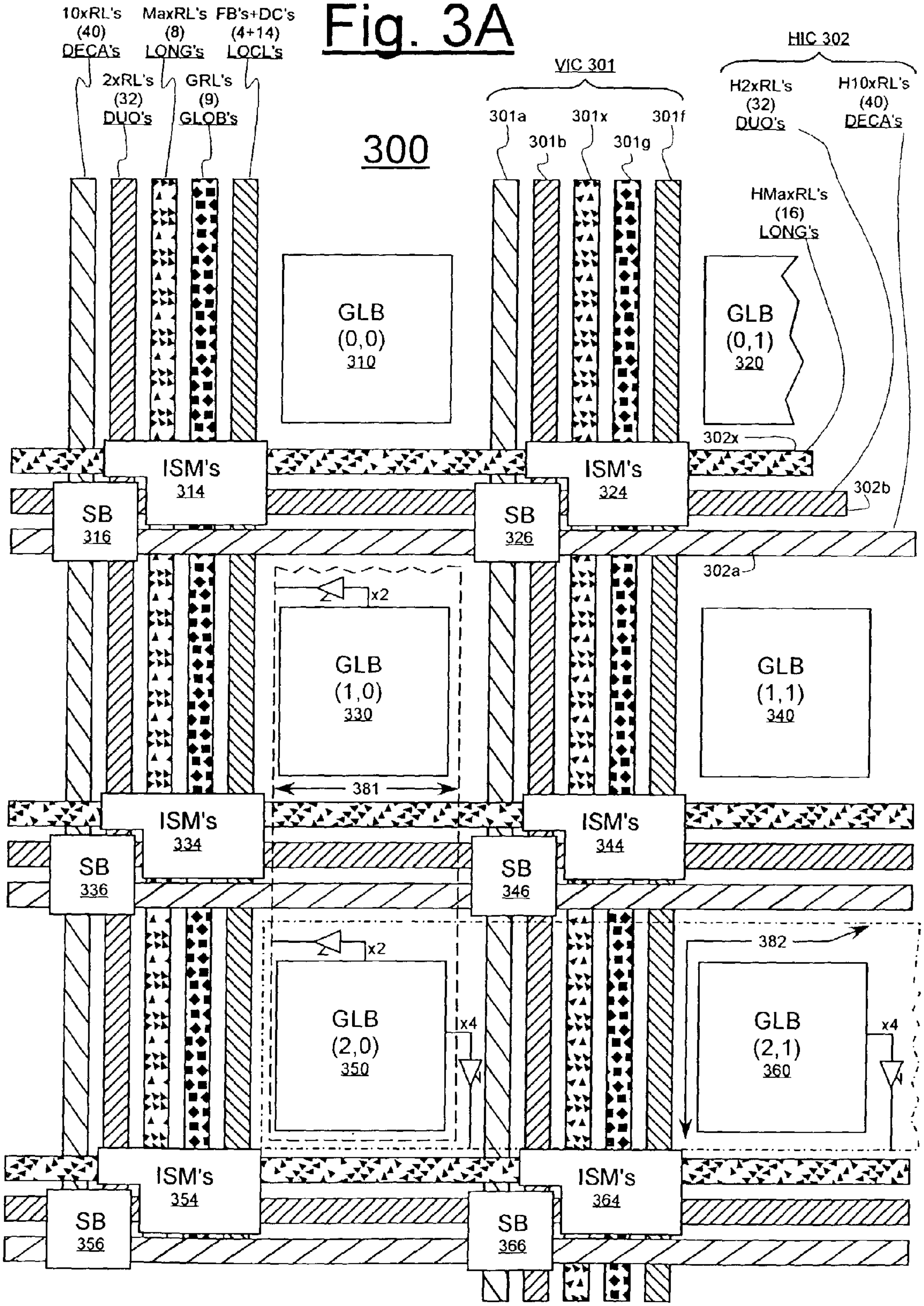
FIG. 3A illustrates a possible tiling arrangement for GLB's, ISM's, switchboxes (SwB's) and interconnect conductors structured in accordance with the disclosure.

Referring to FIG. 3A, there is shown a tiling arrangement 300 which may be used in accordance with the disclosure for arranging Generically-variable Logic Blocks (GLB's) such as the illustrated blocks 310–360 relative to one another and relative to corresponding ISM blocks 314–364 and relative to corresponding switchboxes (SB's) 316–366 of the neighboring interconnect. The tiling arrangement 300 of FIG. 3A is taken at a macroscopic level of view and is to be understood as not being to scale. In one embodiment, the circuits of the ISM's (e.g., 314) and SB's (e.g., 316) are intermingled in an L-shaped region overlapping with the intersecting vertical and horizontal interconnect lines and this L-shaped region (not shown) is substantially larger in circuit area than the area occupied by the circuitry of the corresponding GLB (e.g., 310). It is to be understood that many variations may be possible for: (1) what constitutes the respective GLB's 310, 320, etc.; (2) what constitutes the respective ISM blocks 314, 324, etc.; (3) what constitutes the respective SB's 316, 326, etc., and (4) what constitutes the respective neighboring interconnect (e.g., Vertical Interconnect Channel {VIC} 301 and Horizontal Interconnect Channel {HIC} 302 of neighboring GLB 320). As such, the tiled layout 300 of FIG. 3A is to be taken as nonlimiting with respect to constituent components shown therein and descriptions herein of examples of such constituent components are to be taken as nonlimiting with respect to the illustrated tiling arrangement 300 of FIG. 3A.

Within the illustrated VIC 301, elements 301*a*, 301*b*, 301×, 301*g* and 301*f* respectively refer to: (a) corresponding 10xRL lines (deca-reach length lines), (b) corresponding 2xRL lines (duo-reach length lines), (x) corresponding MaxRL lines (maximum-reach length unidirectional lines), (g) global reach lines, and (f) local, intra-GLB feedback lines (FB's) and dedicated, inter-GLB direct-connect lines (DC's). Elements 302*a*, 302*b*, and 3021*x* of the illustrated HIC 302 respectively refer according to their suffixes to same kinds of lines that instead extend horizontally. As can be seen, the horizontal duo's and longs (302*b* and 302*x*) have conductors that define adjacent interconnect lines (AIL's) of ISM blocks such as 324. The vertical duo's and longs (301*b* and 301*x*) also have conductors that define AIL's of respective ISM blocks such as 324. Horizontal and vertical deca's (10xRL lines in groups 301*a* and 302*a*) do not participate in this embodiment 300 as AIL's of any ISM block such as 324. Instead, the switchboxes (e.g., SB 324) must be used in this embodiment as highway entrance and exit ramps (metaphorically speaking) for moving signals into and out of the 10xRL lines by way of local roads (metaphorically speaking) that are defined by corresponding 2xRL lines (e.g., 301*b*, 302*b*) extending into same ones of the duo-deca switchboxes (e.g., 326). See also the duo-deca switchbox 260 of FIG. 2A.

As can be further seen in FIG. 3A, besides the 2xRL lines and the MaxRL lines, the local FB's and DC's (301*f* as well as the global-reach conductors (301*g*) define additional, adjacent interconnect lines (AIL's) of ISM blocks such as 324. Signals from the various AIL's of a given ISM block can be selectively acquired by the ISM block (e.g., 324) and fed into the corresponding GLB (e.g., 320) for processing therein. GLB outputs may then returned to the AIL's for local continuation (e.g., via the FB's and/or DC's) and/or for general continuation (e.g., via the local duo-deca switchbox, and then through the 2xRL and/or 10xRL lines) and/or long distance continuation (e.g., via the MaxRL lines). The horizontal and vertical, longlines output switch matrices (LOSM's) are organized to service respective horizontal and vertical sequences of four GLB's each. Part of a vertical one of such sequences of GLB's is shown in FIG. 3A as dashed box 381. Part of a horizontal one of such sequences of 4 GLB's is shown in FIG. 3A as dashed box 382. Longline drive capability per GLB is asymmetrical in the illustrated embodiment 300, with each vertical LOSM (381) contributing just two outputs (e.g., WO' and YO' of FIG. 2A) from each of its corresponding 4 GLB's to the adjacent, vertical MaxRL lines, and with each horizontal LOSM (382) contributing four outputs (e.g., W0', X0', Y0' and Z' of FIG. 2A) from each of its corresponding 4 GLB's to the adjacent, horizontal MaxRL lines. Thus each vertical LOSM (381) has 8 tristate drivers (only 4 indicated in FIG. 3A) driving a corresponding 8 longlines in the adjacent vertical channel while each horizontal LOSM (382) has 16 tristate drivers (only 8 indicated in FIG. 3A) driving a corresponding 16 longlines in the adjacent horizontal channel. The less numerous, vertical MaxRL lines (301*x*) are preferably used for broadcasting control signals along columns of GLB's while the more numerous, horizontal MaxRL lines (302*x*) are preferably used for broadcasting data-word signals along rows of GLB's. However, although it may, this bias does not have be used to guide decisions of the place-and-route software (e.g., 202F of FIG. 2F).

Figure 3B:
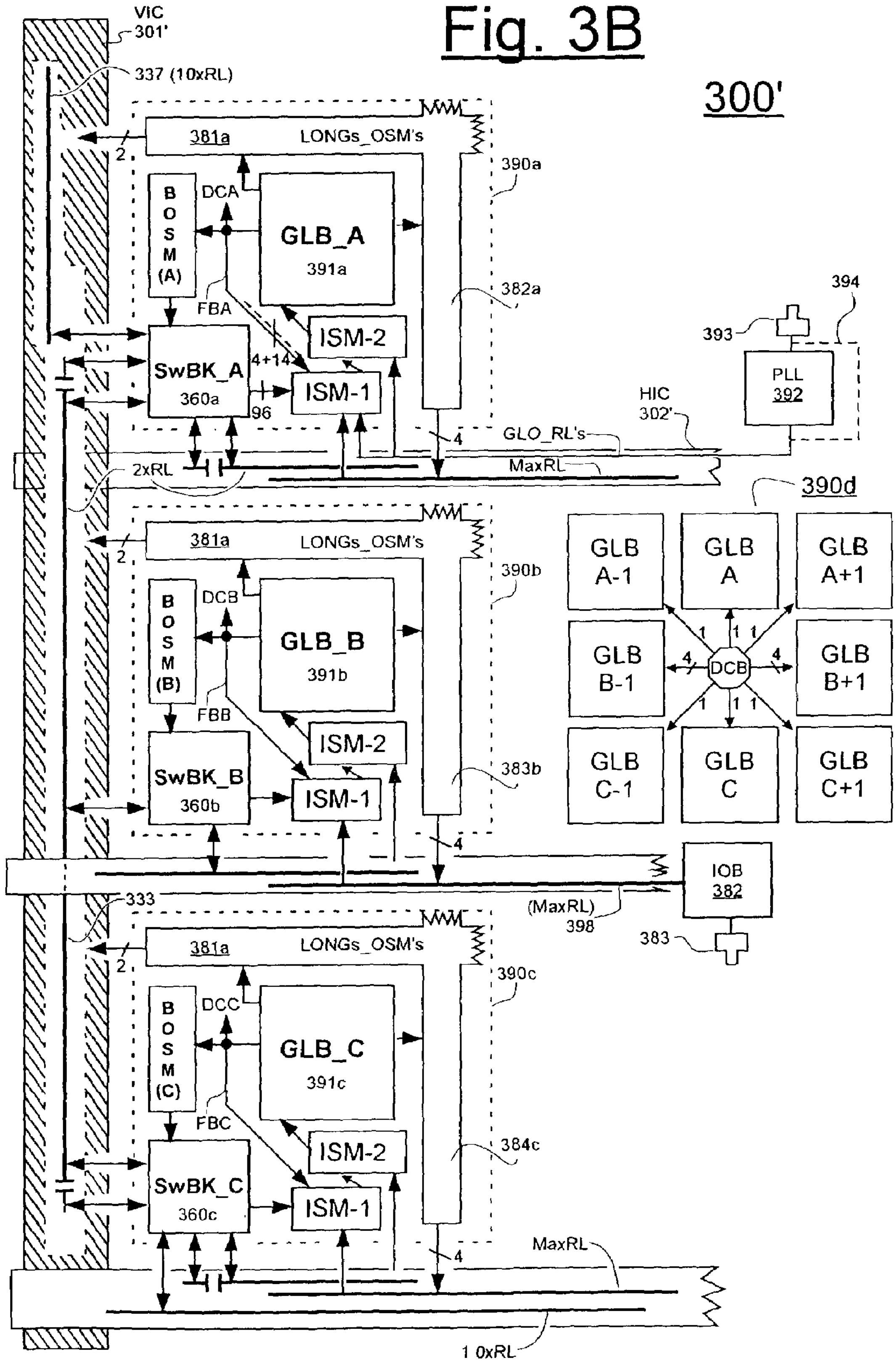
FIG. 3B illustrates in more detail how various parts of the embodiment of FIG. 3A may coupled.

FIG. 3B shows further details of an embodiment 300' corresponding to that of FIG. 3A. A vertical 2xRL line (333) is shown within VIC 301' as being a continuous conductor that extends a sufficient length to just reach from switchbox 360*b* (SwBK-B) to two closest ones and vertically adjacent switchboxes, 360*a* (SwBK-A) and 360*c* (SwBK-C). The 2xRL line can be used to reach with continuity from one switchbox to two to other switchboxes; hence the name, double-reach length. Because of the placement of the switchboxes in corners of their respective, GLB logic tiles, the 2xRL lines need not be longer than about the sum of two times the vertical side dimension of a given GLB tile (390*a*, 390*b*, etc.) plus the widths of two channels. The three GLB's (e.g., 391*a*, 391*b*, 391*c*) serviced by a given 2xRL line may lie adjacent to one another in a same row of GLB's or a same column of GLB's. It is seen from FIG. 3B that each corresponding 2xRL line (e.g., 333) allows any GLB (e.g., 391*a*) to talk, through its respective switch block (e.g., 360*a*) to any two other GLB's (e.g., 391*b*, 391*c*) that lie adjacent to the given 2xRL line. The term 'logic tile' refers to the programmable parts of a full tile, in other words it does not include the nonprogrammable conductors of the tile-to-tile interconnect mesh. The reason, 'logic tile' is used is so that its aspects can be discussed separately from a 'full tile', where the latter does include hypothetically-sliced parts of the tile-to-tile interconnect mesh which extends through the full tiles.

The term 'deca-reach length' (10xRL), refers herein to a continuous conductor that has a length continuously extending along eleven (11) adjacently situated switchboxes (e.g., 11 linearly and successively organized switchboxes). In one embodiment, each 10xRL line may be analogized to a peculiar automobile freeway that is divided into connecting segments where each freeway segment has a first number of exit ramps and a smaller number of entrance ramps. A signal trying to enter into (be input into) a 10xRL line segment generally must do so from either a switchbox (e.g., 360*c*) at one extreme end of the 10xRL line segment or one at the other extreme end. On the other hand, a signal trying to exit from (be output from) a 10xRL line segment and arrive at a any of the 11 GLB's the 10xRL line adjoins may do so by exiting through the 2xRL lines of corresponding switchboxes at the middle and ends of the 10xRL line segment. A respective GLB at one end of a 10xRL line segment may broadcast a respective result signal via that line segment to at least 10 other GLB's; hence the name, deca-reach. (In one embodiment, a 2xRL line driver of a middle one of the 11 GLB's may also output a result signal of somewhat reduced strength through an adjacent 10xRL line for receipt by the other GLB's along that 10xRL line segment via the 2xRL lines.)

There is not enough room in FIG. 3B to show a full 10xRL line. Assume nonetheless that the illustrated part, 337 of the 1xRL line shown within VIC 301' is a tail end of a deca-reach length that extends well above the GLB-A tile (390*a*) to the switchboxes of 10 further and successive GLB's. It can be understood from FIG. 3B that switchbox 360*a* and just one 2xRL line (333) can be used to extend the communicative "reach" of deca-line 337 by two additional tiles (390*b*,390*c*) below the terminal end of deca-line 337. Likewise, at the upper terminal end of the 1 xRL line there will be another extended reach to two more GLB's. Accordingly, a 10xRL line such as 337 can spread a signal being broadcast over the 10xRL line to not only its associated line of eleven (11) GLB's, but also to two (2) more GLB's on each end thereby providing a broadcast ability to a line of 15 GLB's that is parallel with the 10xRL line. The switchbox at the terminal end of one 10xRL line segment can replicate a signal traveling on the one 10xRL line and forward the same at full signal strength (repowered) to a second 10xRL line also terminating in that same switchbox. If the place-and-route software decides to broadcast a signal from a source GLB (or a source 10B) to many spaced-away destination GLB's (or one or more destination IOB's), it may do so by way of a corresponding 10xRL line and its associated 2xRL lines. Aside from consuming that one deca-reach line, the routing decision will often consume just a few 2xRL lines (each reaches 3 GLB's). The various duo-deca routing combinations allow the software to route a deca-carried signal to a fairly large number of GLB's and/or 10B's.

Referring briefly again to FIG. 2A, although it is notfully shown therein, each of the registered, or register-bypassing, W0', X0', Y0' and Z0' signal may be coupled by way of the corresponding H&V longline OSM's 280 to any one or more of eight (8) vertical, MaxRL lines and/or any one or more of sixteen (16) horizontal, MaxRL lines. In FIG. 3B, the vertical (V) longline OSM is understood to be formed by conjoined sections 381*a* of the three illustrated tiles, 390*a*–390*c* as well as by one further conjoined section (381*a*, not shown) of 1 further tile which is vertically aligned to tiles 390*a*–390*c*. Each of the 4 conjoined sections 381*a* will each be coupled via tristate drivers (not shown) to two respective ones of a total of 8 MaxRL lines in VIC 301'. Any GLB (e.g., 391*a*) can output up to two of its result signals to any two of the 8 vertical MaxRL lines associated with conjoined sections 381*a*.

For the horizontal row in which illustrated tile 390*a* (GLB-A) resides, there will again be four conjoined versions of the, illustrated horizontal (H) longline OSM section 382*a*, each coupled via 4 respective tristate drivers (not shown) to four respective ones of a total of 16 MaxRL lines in HIC 302'. Any GLB (e.g., 391*a*) can output up to four of its result signals to any desired four of the 16 horizontal MaxRL lines associated with conjoined, horizontal-longlines OSM sections 382*a*. Each MaxRL line (e.g., 398) may couple bidirectionally and on a tristated-basis, via an associated Input/Output Block (e.g., 10B 382) with a package terminal or pin 383. A package-external signal may therefore be imported into the FPGA from pin 383 and along MaxRL line 398 to any one or more of the GLB's (e.g., 391*b*) lying adjacent to that longline. The externally-sourced signal may then be fedthrough the ISM-1 and ISM-2 stages of the one or more longline-adjacent GLB's to state-storing registers (e.g., 208*a* of FIG. 2A) of those GLB's. From there, the externally-sourced, and internally-synchronized signal may be forwarded by way of a vertical MaxRL line in VIC 301' and/or a 10xRL line and/or a 2xRL line for further processing.

The illustrated longlines (MaxRL lines, 301*x*, 320*x* in FIG. 3A), double-lines (2xRL lines 301*b*, 320*b* in FIG. 3A), along with other kinds of illustrated lines: Local FB's 301*f*, Regional DC's—also 301*f*, and global-reach length lines (GRL's 301*g* in FIG. 3A), feed into the user-programmable, first Input Switch Matrix stage (ISM-1) or second Input Switch Matrix stage (ISM-2) as shown in FIGS. 2A and 3B. It is seen in FIG. 3B, that a global-reach-carried signal can be a phase-loop-locked clock signal produced by PLL 392 and derived from an external signal input on package terminal 393 or a direct clock or another kind of signal input by way of the illustrated, programmably-activated, PLL-bypass path 394. Note that the global-reach length lines (GRL's) can feed directly into the ISM-2 stages while the other lines (except deca-lines) generally feed first into the ISM-1 stages for initial selection of their respective signals before those signals are forwarded through the ISM-2 stages of their corresponding GLB's. In one embodiment, each vertical inter/intra-connect channel (e.g., VIC 301 of FIG. 3A) comprises 40 10xRL lines, 32 2xRL lines, 8 MaxRL lines, 4 local feedback lines, 14 direct-connect lines, and 9 global-reach lines. Each horizontal interconnect channel (e.g., HIC 302 of FIG. 3A) comprises 40 10xRL lines, 32 2xRL lines, and 16 MaxRL lines. Neither of VIC 301 and HIC 302 contains any single-length reach lines which are limited to coupling together just two adjacent switchboxes (see by rough analogy, the 1xCL lines of FIG. 1A).

In FIG. 3B it is seen that each GLB tile (e.g., 390*b*) includes a Block Output Switch Matrix (BOSM) for selectively routing the GLB output signals to the local switchbox (e.g., 360*b*) for further routing to the adjacent interconnect lines (AIL's such as 2xRL lines, 10xRL lines, and MaxRL lines). Each GLB tile (e.g., 390*b*) further includes a direct-connect sourcing node (e.g., DCB) which directly connects to 14 nodes in the ISM-1 stages of 8 neighboring GLB-tiles. One specific, DC sourcing pattern which may be used is shown at 390*d* in FIG. 3B. GLB tile 390*b* is understood to lie in a row, "B" of GLB-tiles that further has at least one other GLB-tile (B−1) to the left of the DC sourcing tile (B+0) and that further has at least one other GLB-tile (B+1) to the right of the DC sourcing tile (B+0). GLB tile "A" (or "A+0", as it may alternatively be named) is situated directly above the DC sourcing tile (B+0). GLB tile "C" is situated directly below the DC sourcing tile (B+0) in the same column with GLB tile "A". GLB tiles "A−1" and "A+1" straddle to the left and right of tile "A". GLB tiles "C−1" and "C+1" straddle to the left and right of GLB tile "C". DC sourcing region, DCB extends by way of the illustrated, 14 conductors to 14, DC-receiving nodes in the 8 tiles surrounding the sourcing tile. Because of symmetry, the illustrated pattern 390*d* may also be used to schematically represent the pattern of DC inputs that each central GLB-tile sees, with an exception to the latter being that the 14 conductors are presented individually to the ISM-1 stage of the corresponding central GLB-tile for selective acquisition and forwarding into the corresponding ISM-2 stage.

Figure 3C:
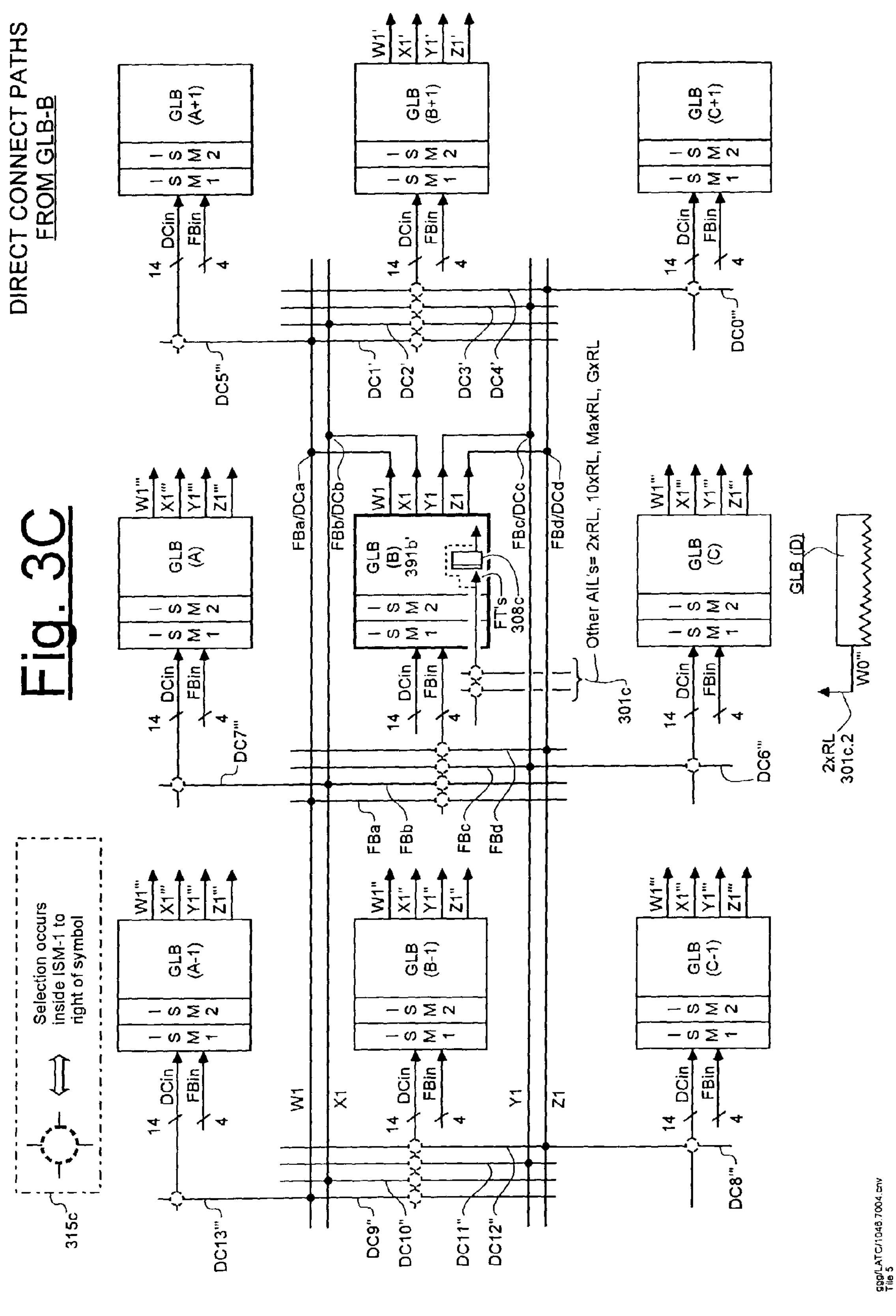
FIG. 3C is a signal flow schematic showing how, in one embodiment, the direct-connect output signals of a central GLB (B) flow to neighboring GLB's.

FIG. 3C is a more detailed connection graph for the direct-connect scheme introduced at 390*d* of FIG. 3B. Legend 315*c* indicates that hollow circles with dashed-borders represent signal acquisition carried out in the ISM-1 stage to the right of the symbol. The central GLB, 391*b'* (also denoted as GLB-B) is shown to have its respective W1, X1, Y1 and Z1 outputs fanning out to its immediately neighboring, 8 GLB's which are identified in left-to-right, top to bottom order as GLB's (A−1) through (C+1).

The W1, X1, Y1 and Z1 output terminals of GLB-B also carry feedback signals, which signals may fan out by separate conductors to the local feedback lines, FBa, FBb, FBc and FBd of the local GLB-B. Although not shown, it is understood for the case of the separate conductors that larger line-driving buffers may be used for driving the longer direct-connect conductors (which have higher capacitance) than the drivers which drive the FB lines, if similar signal propagation delays are to be maintained both for local feedback signals and direct-connect signals. In an alternate embodiment, each corresponding FB conductor (e.g., FBa) can be continuous with its respective DC conductor (e.g., DCa) and a same line-driving buffer is used for driving such a combined, FB/DC conductor. Output signals from the given GLB's terminals, W1–Z1 may include those which have been fed through that given GLB (391*b'*, also referred to as the centrally-illustrated GLB) and have been registered (by bypassable means 308*c*) or not within that GLB 391*b'*.

It is indicated by bracing symbol 301_c_ that the registered or unregistered feedthrough signals (FT's) of GLB-B may be acquired from various AIL's of that GLB including the 2xRL lines, 10xRL lines, MaxRL lines or global-reach (GXRL) lines that run adjacent to GLB-B. More specifically, a not-immediately-neighboring, Generic Logic Block such as GLB-D (not fully shown) may supply its output result signal, W0'''(e.g., a cluster-controlling signal) by way of a nearby 2xRL line, 301_c_.2 such that the latter double-reach line carries the W0'''signal continuously into the AIL set 301_c_ running adjacent to GLB-B. This allows the W0'''signal of GLB-D to be fedthrough (as an FT signal) into one or more of the state-storing registers, 308_c_ of the centrally-illustrated GLB, and to thereafter be distributed by the illustrated direct-connect lines which emanate from the W1–Z1 terminals of the centrally-illustrated GLB-B to its immediately neighboring GLB's, namely, (A−1) through (C+1). Thus, it is seen that a 2xRL line (301_c_.2, or another general interconnect line for that matter) can be used to inject a first signal (e.g., W0''') into the center of a direct-connect cluster (GLB's (A−1) through (C+1)) and that feedthrough resources (FT's) within the central GLB of that cluster may be used to further distribute the injected first signal (e.g., W0''') by way of direct-connect lines (DC's) and/or feedback lines (FB's) to logic resources within that direct-connect cluster: (A−1) through (C+1).

If the direct-connect cluster: (A−1)—(C+1) "happens" to implement a tightly-packed circuit design, where the tightly-packed circuit design uses a common control signal (e.g., W0''') for its operations, then the just described steps of injecting a given signal (e.g., W0''') into the center (B) of the cluster and of using the direct-connect lines and/or feedback lines for distributing the centrally-injected signal about the cluster may help to reduce the amount of general interconnect resources consumed for implementing such a tightly-packed circuit design. Those skilled in the art will recognize that close "placement" of the implemented parts of a tightly-packable circuit design in a correspondingly, tightly-packed set of GLB's often doesn't just "happen" by accident. Often, the place-and-route software is instructed to strive for such tightly-packed placements. When this occurs, the place-and-route software should be further instructed, in accordance with the disclosure, to identify one or more common control signals (e.g., W0''') of the tightly-packed circuit design and to strive to inject those one or more common control signals (by appropriate routing with a 2xRL line such as 301_c_.2 or with another means), substantially into the cluster-central GLB of a DC cluster of GLB's that implement the tightly-packed circuit design. The place-and-route software should be further instructed, in accordance with the disclosure, to strive to use the direct-connect lines and/or feedback lines of the GLB cluster for distributing the centrally-injected signal about the cluster.

Figure 3D:
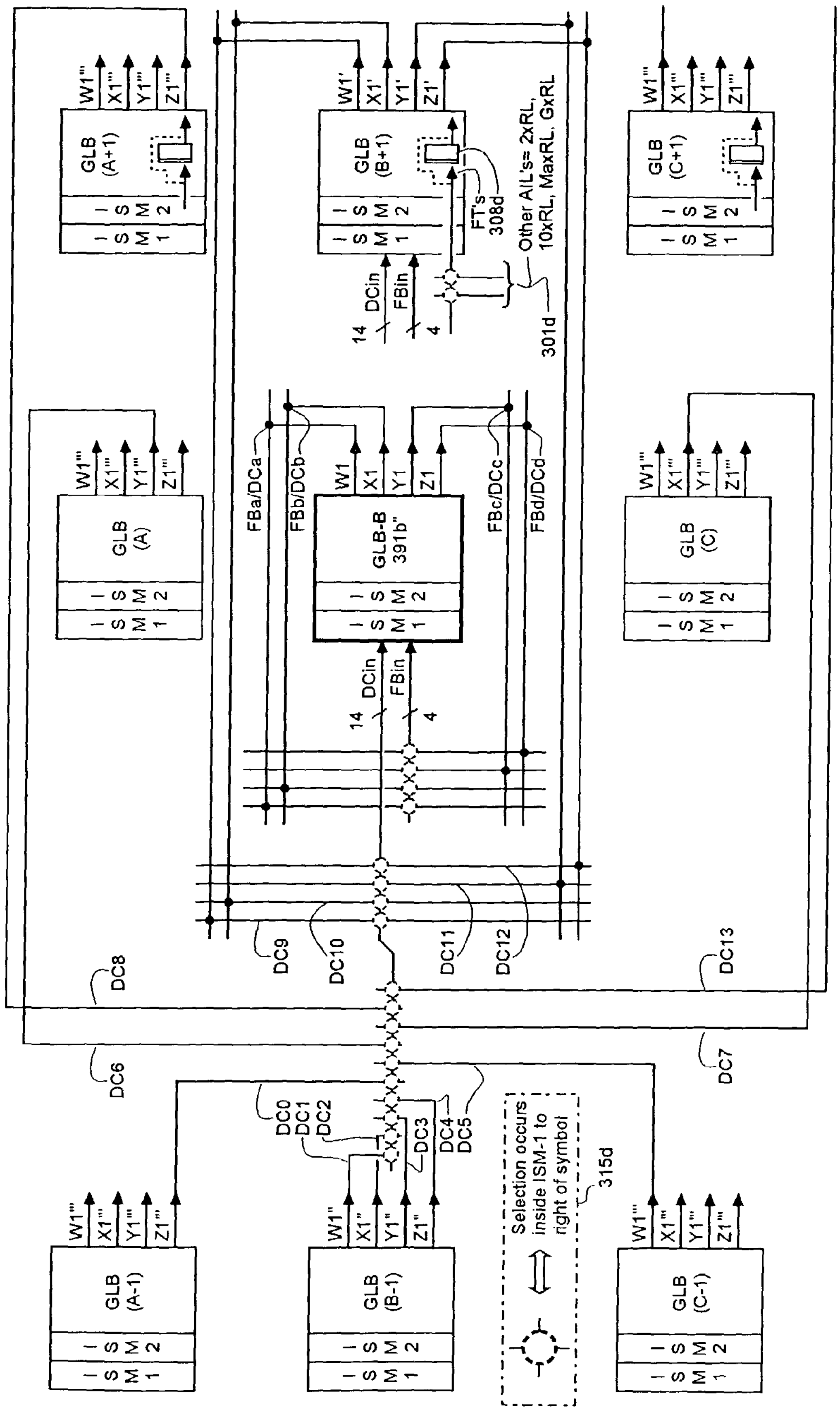
FIG. 3D is a signal flow schematic showing how the direct-connect input signals of a central GLB (B) flow in from neighboring GLB's for the embodiment of FIG. 3C.
Figure 3E:
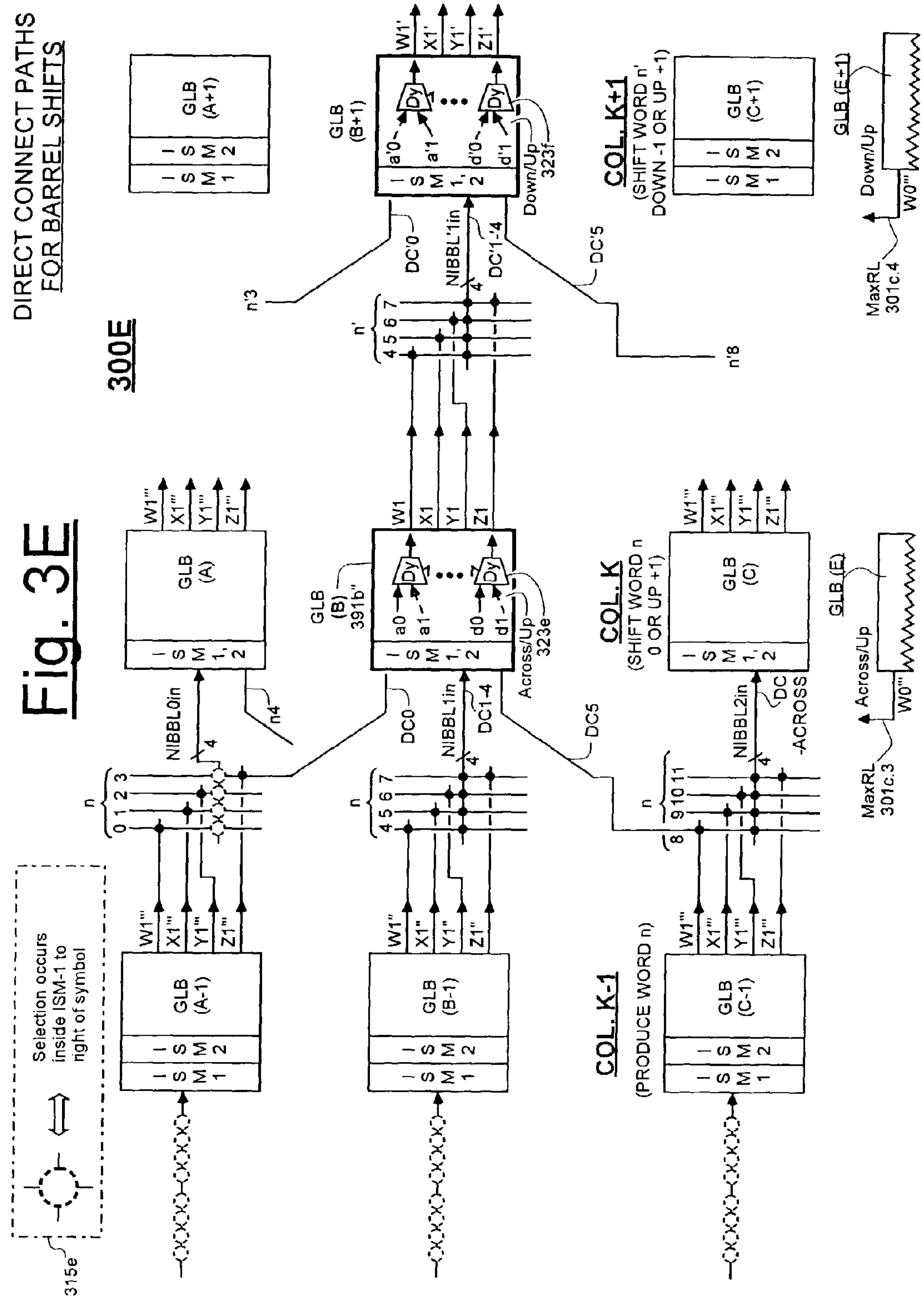
FIG. 3E is a signal flow schematic showing how the embodiment of FIG. 3C may be programmably configured to implement variable barrel shifters.
Figure 3F:
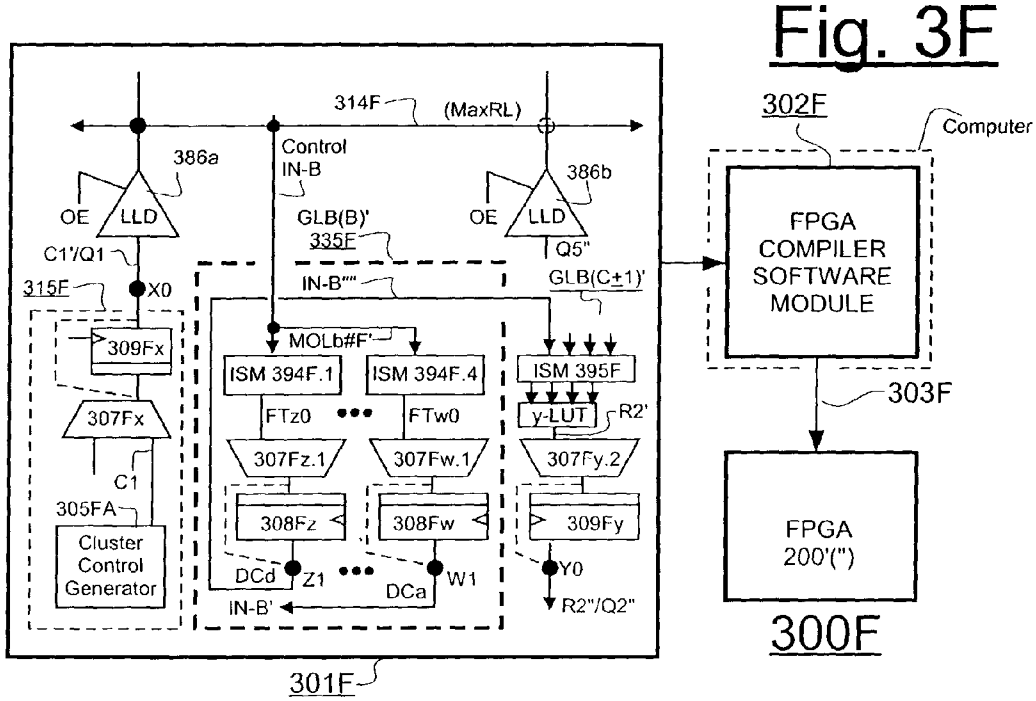
FIG. 3F diagrams a second possible design partitioning and implementing operation that seeks to exploit all or parts of the feedthrough resources, register-intensive resources, direct-connect cluster resources, and/or tristateable MaxRL line resources of an FPGA that is structured in accordance with the disclosure.
Figure 3G:
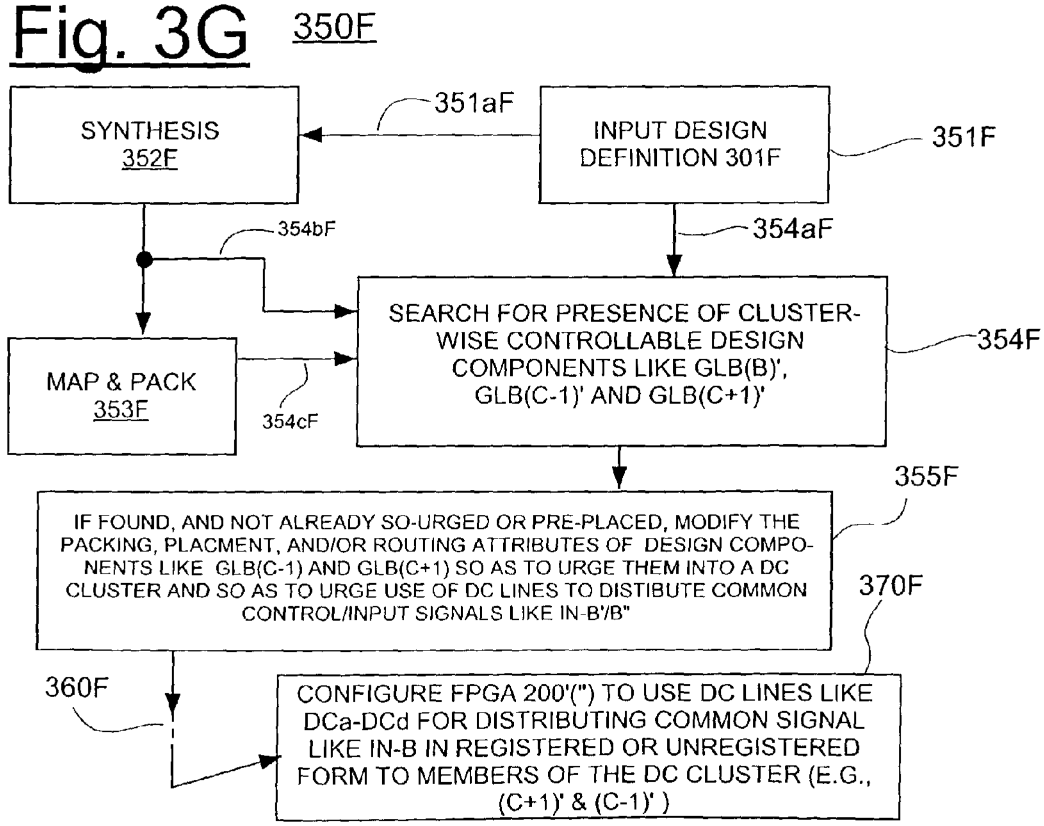
FIG. 3G flow charts a second possible set of place-and-route software operations that strive to conform with the implementation suggestions shown in FIG. 3F.

FIGS. 3F–3G correspond to the above described, design-opportunity and urging actions of respective FIGS. 2F–2G. Like reference symbols in the "300F" century series are used where practical in FIGS. 3F–3G so that extensive explanation of the underpinnings will not be needed here again. As in the case of FIGS. 2F–2G, the input design specification 301F of FIG. 3F does not generally include the pictorial suggestions as to how the design will be mapped and packed and as to where each design component will be placed and how signals will ultimately be routed inside and/or outside of respective GLB's. We are nonetheless predicting (perhaps with more assurance than is deserved at this point) that a "cluster-able" design section will be partitioned, packed and relatively placed in one or more GLB's of a given DC cluster, (A−1) through (C+1) and that there will be at least one common control or common input term signal that is to be distributed to various parts of the "cluster-able" design section. In the bottom left corner of box 301F, element 305FA represents a source of the at least one, common control/input signal, C1. That C1 signal moves through registers-feeding multiplexer 307Fx either as a feedthrough or as a LUT output. If the C1 signal is synchronously stored in register 309Fx, it is transformed into signal Q1. Otherwise when output from node X0 of the GLB implementing circuit 315F, the signal is called C1'. Passage of the C1'/Q1 signal over the general interconnect is represented by line driver 386_a_ and interconnect line 314F. In one embodiment, line 314F is a MaxRL line and line driver 386_a_ is a tristate-able longline driver. Other types of general interconnect resources could be used instead (including for example the 2xRL line 301_c_.2 alluded to in FIG. 3C).

Box 335F (shown in the middle of design representation 301F) represents a central GLB, B' within a given cluster: (A−1)' through (C+1)' and its application ISM stages. The received common signal, C1'/Q1 is now denoted as IN-B. Within box 335F, element MOLb#F' represents an optional duplication of the received common signal, IN-B within the ISM-2 stages of input acquiring sections 394F.1 through 394F.4. Such signal duplication may be desired so that the common signal, IN-B can be output distributively from all four of the W1–Z1 output terminals of GLB-B' (335F). As can be seen inside box 335F, feedthrough lines such as FTz–FTw0 may be used to respectively convey the optionally duplicated, IN-B signal through registers-feeding multiplexers 307Fz.1–307Fw.1, and asynchronously or synchronously-through, or bypassably-around, the in-GLB registers 308Fz–308Fw. The so-conveyed and optionally synchronized versions of the common control/input signal are now present at the DC (direct-connect) output nodes of the central GLB, B' (335F) and these signals are now denoted as IN-B', IN-B'', IN-B''', and IN-B'41 (not all shown).

The IN-B' through IN-B''' signals may be transmitted by respective direct-connect lines (DCa–DCd) and also optionally by way of corresponding feedback lines (not shown) to members of the DC cluster: (A−1) through (C+1). For purpose of example, the IN-B'''' signal is schematically shown as being transmitted by the DCd line to one or both of GLB(C−1)' and GLB(C+1)' in the DC cluster that has GLB(B)' at its center. Within the transmission-receiving one(s) of GLB(C−1)' and GLB(C+1)', the IN-B''' signal is selectively acquired by a respective ISM section 395F (shown at right side, middle of box 301F), and passed into a lookup block (e.g., y-LUT), optionally with other input term signals. The responsive result signal, R2' of the GLB (C+1)' LUT passes through the illustrated, registers-feeding multiplexer 307Fy.2 and then moves asynchronously-through, or synchronously-through, or bypassably-around, the respective, in-GLB register 309Fy (shown at right side, bottom of box 301F) for subsequent output as the R2"/Q2" signal on the Y0 or another output terminal of the in-cluster GLB (e.g., (C−1)' or (C+0)'). It has been shown therefore, in box 301F how one or more control signals (IN-B' through IN-B''') may be synchronously (or not) generated within a cluster-central GLB and then distributed via direct-connect lines (DCa–DCd) to surrounding GLB's of the DC cluster.

FIG. 3G illustrates a flow chart 350F of a process that attempts to obtain some or all of the logic-space-saving and/or interconnect resource-saving results suggested in box 301F of FIG. 3F. A design definition such as 301F is input at step 351F into the FPGA compiler software module (logic synthesizing module) 302F. (Module 302F may encompass some or all of other urging steps described for module 202F of FIGS. 2F–2G.) Numerous processing steps may take place within software module 302F. Paths 351*a*F and 354*a*F depict alternate or commingled options. Depending on the abstraction level(s) used to define the whole or various parts of the supplied design definition 301F, it may be desirable to include a circuit synthesis step 352F and/or a map-and-pack step 353F within process 350F. The circuit synthesis step 352F can be one like above-described 252F wherein behavioral descriptions are converted into gate-level definitions which detail certain types of logic gates or other logic units, their inputs, outputs and interconnections. The synthesis step 352F may optionally include the insertion of additional registers beyond those needed for carrying a specified behavior, where the additionally inserted registers are so-inserted for enhancing the operating frequency limits of the to-be-implemented circuit, including additional registers which assure timing correctness of control signals.

A mapping and packing step 353F may follow the circuit synthesis step 352F. In the mapping and packing step 353F, the logic-implementing capabilities of logic blocks (e.g., GLB's) and/or subunits (e.g., LUT's) of such blocks are mapped against the synthesized circuit definition so as to partition the synthesized circuit definition into corresponding chunks that can be packed, each into a respective logic block of the target FPGA. (Although packing typically does not normally entail placement and routing, for the cluster level optimization being discussed here, there may be some activities directed toward "relative placement" and/or "relative routing", where the latter items are not as specific as, more detailed, "absolute" place and route operations which occur further downstream in the machine-implemented process.)

Ideally, the mapping and packing step 353F will have partitioned the synthesized design (output of module 352F) so that packing density is maximized and resource wastage is minimized not only within each logic block but also for groups (e.g., clusters) of such GLB's. The mapping and packing step 353F may not have, however, optimized its output solution for reducing interconnect consumption in the generation and distribution of control signals (like IN-B' through IN-B'41 of FIG. 3F). For example, if a common control signal needs to be synchronously delivered in a homogenous way to a plurality of GLB's, it may be advantageous to have the software automatically see to it that such control distribution makes use of a DC cluster rather than allowing such a control signal distributing function to take place haphazardly and thus consume more of the general interconnect of the FPGA device than is truly necessary.

A step such as 354F should therefore be included among the various steps of software module 302F. In step 354F, the computer is instructed to search through one or more of: (a) the input design definition (e.g., 301F by way of path 354*a*F), (b) the post-synthesis design definition (e.g., by way of path 354*b*F), and (c) the post-packing design definition (e.g., by way of path 354*c*F) to look for the presence of unique types of signal relationships (or for embedded software flags in the definitions that flag out such unique types of signal relationships). Note that a relatively, non-abstract whole of an input design definition 301F or relatively, non-abstracted parts of such an input design definition can be supplied directly to search step 354F for scanning (by path 354*a*F) rather than being supplied indirectly by way of synthesis step 352F and/or map & pack step 353F.

One of the unique signal relationships which step 354F searches for can be that which calls for synchronized distribution of a common control/input signal like C1 (shown at left side, bottom of FIG. 3F) to various parts of a "cluster-able" design partition (e.g., the design partition whose parts are "place-able" in GLB's B', (C+1)' and (C−1)' of box 301F). The search criteria in step 354F may optionally require the searched-for, signal-usage relationship specifications to specify that the C1 control/input signal is to be an immediate function of an input supplied to the C1-sourcing GLB (315F) and/or that the C1-sourcing GLB (315F) should be connectable to the cluster-central GLB (33F) by way of a specified one or more types and/or numbers of general interconnect lines in the group comprising: short-haul lines such as a 2xRL lines, intermediate haul lines such as 1 xRL lines, and long-haul lines such as MaxRL lines. (In one embodiment, interim-length conductors, i.e. 10xRL's; should be at least 3 times as long as counterpart short-length conductors, i.e. 2xRL's; and long-length conductors i.e. MaxRL's should be at least 3 times as long as the counterpart interim-length conductors so that, an at least three-fold broadcast gain is obtained by using the comparatively longer one of the diversified conductors as opposed to the shorter type of conductor. The at least three-fold length gain bypasses use of PI P's in at least two switchboxes (which would otherwise be used if the shorter length lines were employed) and thereby reduces signal propagation delay.)

The search criteria in step 354F may optionally require the searched-for design requirements to specify that one or more of the IN-B' through IN-B'41 signals should be synchronized to a particular clock signal (via actions of registers 308Fz–308Fw). The search criteria in step 354F may optionally require the searched-for design parts to specify that one or more of the IN-B""-to-R2' transform function can be implemented by a single LUT (e.g., the y-LUT driven by ISM 395F) in a given CBB or that such a transform function can be implemented by a limited number of LUT's in a same GLB (e.g., C+1' or C−1'). (We will shortly explain how plural LUT's can be folded together within a given GLB, or even across neighboring GLB's.)

At machine-implemented step 355F, if design specifications for one or more, cluster-able functions like those implemented by GLB's (C−1)' and (C+1)' are found to satisfy the search criteria of step 354F, and the primitives (e.g., 308Fz–308Fw, 309Fz) which are to produce them are not already packed and/or urged for implementation in a same cluster of logic blocks (e.g., where 335F of FIG. 2F is the center of the cluster), then the definitions of those primitives (e.g., 308Fz, 309Fz) are remapped, and/or repacked and/or otherwise associated with attributes (and/or with pre-defined pack and place IP solutions) which will force or urge those primitives (e.g., 308Fz–308Fw, 309Fz) towards ultimately being relatively and/or absolutely placed in appropriate relative and/or absolute locations of a given DC cluster. Besides placement in such a DC cluster, the placeable and route-able definitions of such primitives may be modified so as to assure or increase the probability that one or more of their common signals (e.g., C1) will be distributed by DC lines of the DC cluster in to which they are likely to be placed. Dashed path 360F of FIG. 3G represents many other processes within the software module 302F wherein the original design definition 301F is transformed by steps such as design-partitioning, partition-placements and inter-placement routings to create a configuration file for the target FPGA 200'. Step 370F assumes that at least one, clusterizable design partition like the one represented by GLB's (B)', (C-1)' and (C+1)', or other such DC cluster members, were found and had their corresponding parts ultimately placed in a same DC cluster so as to allow for the use of direct-connect lines for distribution of common input and/or control signals like C1. In that case, if routing options permit, at step 370F the target FPGA 200' is configured to use DC lines for so-distributing the common input and/or control signals like C1.

The place-and-route software (350F) may additionally be urged at step 354F to strive to use in-ISM, signal duplicating resources such as the illustrated, MOLb#F' (FIG. 3F) for duplicating input/control signals that are to be distributed by way of different DC lines. The place-and-route software may additionally be urged at step 354F to strive to exploit the options of outputting the C1'/Q1'and R2"/Q2" signals respectively on specific ones of the W0, W1, . . . Z0, Z1 nodes of their respective GLB's so that such signals may be further transmitted by way of long-haul or intermediate-haul general interconnect or by way of further direct-connect lines (DC's) of feedback lines (FB's) as may be appropriate. The place-and-route software may additionally be urged at step 354F to strive to exploit the option of using a local feedback line (not shown) instead of a general interconnect line such as 314F for routing the initial IN-B common signal from a given lookup block (e.g., 305FA) of the cluster-central GLB (335F) to available DC lines of that same cluster-central GLB so that the centrally-produced IN-B common signal can be further distributed to other GLB's in the DC cluster: which cluster includes (A−1)' through (C+1)'—not all shown. The place-and-route software may additionally be urged at step 354F to strive to exploit the option of using registration both before (309Fx) and after (308Fz) a given cluster-common signal (e.g., Q1'/IN-B"") is conveyed over a time-multiplexed, interconnect line (e.g., 314F) so that time slots of the time-shared line may be minimized and used efficiently.

At this juncture, it is once again beneficial to explain the term "strive" as it applies to what place-and-route software does. It is understood by those skilled in the art of FPGA configuration and of place-and-route software that many design factors may work in unison with, or in opposition to each other while place-and-route software is executing (run time) so as to pull the placement of two or more design components (e.g., where each design component, in the case of the present disclosure, may consume a GLB or a building block inside a GLB) either together toward a shared region of the FPGA (e.g., the region shown in FIG. 3C) or apart. The same concepts apply to routing operations. Because the placements of various design components get shuffled and their routings are re-done as place-and-route operations "anneal" into a convergent place-and-route solution, it is often the case that placement-directed and/or routing-directed "urging factors" are brought into competitive play with one another for urging respective design components to be placed in certain relations to one another and connected in one way or another. It is difficult to know in advance which urging factors will win and which will lose. Thus, the best that could be said in this regard is that certain urging factors should be "attached" to the placement and routing rules that might affect the re-partitionable components of a tightly-packed, and therefore-clusterizable, circuit design so as cause the place-and-route software to "strive" to partition the design appropriately and pack the components, and adjust their relative placements in close together GLB's so as to try to exploit the direct-connect (DC) options described herein. There is no guarantee that such will ultimately happen in a given run of the place-and-route software and for a given design implementation problem. Among the many other processes that may take place within a place-and-route software module, including those wherein an original design definition (not shown) is transformed by steps such as design-partitioning, partition-placements and inter-placement routings to ultimately create a configuration file for the target FPGA (e.g., 300 of FIG. 3A) there may be steps that seek out two or more design components for close placement in neighboring GLB's (e.g., (A−1) through (C+1) of FIG. 3C). If that succeeds in the placement phase of operations, then further urging factors should be brought into play to cause the ultimately partitioned and placed together components to use direct-connect lines for shared receipt of a common control signal (e.g., W0'''of FIG. 3C). In such a case, the to-be-configured FPGA 200' will be configured to use such DC routing for the cluster-shared control signal and the configuration file produced for configuring such an FPGA will reflect that.

With respect to the specific DC connections pattern shown in FIG. 3C, it can be seen in FIG. 3C, that the W1 output terminal of central GLB 391*b*' extends by way of the local FBa line back to its own feedback inputs (FBin), and additionally to four other ones of the neighboring GLB's, namely (A−1), (B−1), (B+1) and (A+1). The Z1 output terminal has similar fan out to its own feedback (FBd) and to 4 others of the neighboring GLB's, namely. (C−1), (B−1), (B+1) and (C+1). Each of the illustrated X1 and Y1 output terminals may have a slightly smaller fan out to its own respective feedback (FBb or FBc) and to 3 others of the neighboring GLB's by way of their respective direct-connect conductors. For convenience, the destination-end name associated with each of the direct-connect lines is shown to the left of the DC-signal receiving GLB. GLB-(B+1) for example, may therefore receive the W1 output signal of the central GLB on a direct-connect line denoted as DC1' from the perspective of GLB-(B+1) while, contrastingly, GLB-(B−1) may receive the same W1 output signal on a local direct-connect line that is denoted as DC9" from the perspective of GLB-(B−1).

In addition or as an alternative to having the W0'''signal of the non-neighboring GLB-D being injected into the heart of the cluster for synchronized capture by register(s) 308*c* and/or for subsequent distribution by the DC lines of the central GLB 391*b*' to its neighbors, signals from other kinds of AIL's may be similarly injected into the cluster-central GLB (B), optionally-processed by that cluster-central GLB (B) or fed-through the central GLB (B), and thereafter distributed to the neighboring GLB's (A−1) through (C+1) by way of the cluster's direct-connect lines. The primary and/or secondary feedthroughs (FT's) of the cluster-central GLB (B) may therefore be viewed as metaphoric bridges that are capable of respectively conveying signals (e.g., W0''') from a given one or more of the 2xRL, 10xRL, MaxRL or GxRL lines (301*c*) adjacent to the cluster-central GLB (B), through the cluster-central GLB (B), and for registered (308*c*) or unregistered transfer to the immediate neighbors ((A−1) through (C+1)) of the given GLB-B (391*b*') by way of the DC lines. See again, FIG. 3F.

In one embodiment, there are no bridges other than the FT's for transferring signals from MaxRL lines to other interconnect conductors (e.g., 2xRL lines, DC lines, 10xRL lines—if passed through a switchbox, and orthogonal MaxRL lines) within the FPGA. Accordingly, the feedthroughs (FT's) must be used in that embodiment if a signal that is being broadcast on a given MaxRL line (e.g., 314F of FIG. 3F) is to be further distributed orthogonally or otherwise by other GLB-interconnect lines. The DC lines may be used for such distribution of a given signal from a MaxRL line to a cluster of GLB's.

With respect to using DC lines for distribution of a given signal to a cluster of GLB's, it may be understood that a signal on a GxRLi line is, by definition, already globally distributed to all the GLB's when presented on a given GxRL line. However, if a copy of that GxRL signal is to be stored and later used, or to be further processed before being distributed to a set of (e.g., a cluster of GLB's, the bypassable registration means 308*c* (FIG. 3C) within a cluster-central GLB (391*b*') may be used on a feedthrough basis or in conjunction with further lookup-plus functionalities (not shown) of the central GLB prior to distribution of the further-processed, GxRL signal to immediate neighbors (A−1) through (C+1) of the given, cluster-central GLB 391*b*'. Thus, even for GxRL-carried signals, one or both of the feedthroughs (FT's) and direct-connect lines (DC's) may be seen as function-extending bridges for allowing GxRL-carried signals to-be-further-processed (e.g., further processed in one part of GLB 391*b*' and then locally fedback for DC distribution) and then efficiently distributed to part or all of a cluster of GLB's.

FIG. 3D shows the direct connection paths from a given GLB (referred to as the cluster-central GLB 391*b*") to its surrounding neighbors (A−1) through (C+1). Similar to the case of FIG. 3C, legend 315*d* indicates that dashed hollow circles imply that actual selection occurs inside the ISM-1 stage to the right of the given symbol. (An exception to this exists for the GxRL lines whose signals may also be directly selected within ISM-2.) Much of what has been described for FIG. 3C is also applicable to FIG. 3D. Accordingly, those portions of the discussion are not repeated here. The DC line numbers shown in FIG. 3D are those which are seen from the perspective of the ISM block of the centrally-illustrated GLB (391*b*") when the ISM block is programmably configured to selectively acquire signals from one or more of the 14 direct-connect lines (DC's) that extend continuously to the cluster-central GLB just from its neighboring GLB's (A−1) through (C+1).

It is worthy to note in FIG. 3D that four direct-connect signals (DC9–DC12) can loop back from the respective W1', X1', Y1' and Z1' output terminals of GLB-(B+1) to the DCin bus of the central GLB (B) in a manner similar to the way that the four local feedback signals (FBa–FBd) feed back to the FBin bus of the cluster-central GLB 391*b*". Referring briefly back to FIG. 2E, it may now be seen that signals from the registrable feedthroughs of GLB-(B+1) may be routed by way of direct-connection lines DC9–DC12 to serve as inputs of GLB-B in substantially the same way that feedback signals 231*e* of FIG. 2E were locally fedback. Thus, either one or mixed combinations of the local feedbacks and the direct-connect loopbacks may be used as appropriate to carry out the variable-grain pipelining concepts first introduced in our discussion of FIG. 2E. Note in FIG. 3D that the selective acquisition and feeding-through of signals (e.g., the FT's illustrated in GLB-(B+1)) in noncentral GLB's of the illustrated cluster may be carried out in combination with the DC looping-back of those optionally-registered (308*d*) not only for signals moving along the AIL's (301*d*) of GLB-(B+1), but also in similar fashion from the AIL's of the other neighboring GLB's of the cluster-central GLB 391*b*". Thus, it is possible through the combination of the four local feedback inputs (FBin) and the fourteen direct-connect inputs (DCin) of the ISM stages of central GLB-B to have the option of selectively routing to the internal logic resources of GLB-B, any where between one to eighteen (4+14=18) quickly-propagated, and optionally pre-registered, input signals. Place-and-route software therefore has a relatively large number of different pathways to chose amongst for realizing front-end, registration of input signals (see 113, 123, 209×of FIG. 2B) and for quickly and efficiently routing (see 231*e*, 234*e* of FIG. 2E) the front-end registered signals to internal logic resources (see 205A, 205B, 225*e* of FIG. 2E) within a given GLB 391*b*" (FIG. 3D).

It is, of course, understood that the direct-connect routing paths shown in FIGS. 3C and 3D are tiled by stepping distance of one GLB tile (see 390*b* of FIG. 3B). Accordingly, when such a tiling step is taken, GLB-A may serve as a next given, cluster-central GLB for its surrounding GLB neighbors, and so forth. Slightly different direct-connection paths may have to be used for GLB's that are situated at the periphery of the FPGA array, where some of the neighbors of a given GLB are IOB's (Input/Output Blocks, e.g. 220 of FIG. 2A) rather than GLB's. In one embodiment (not shown) each IOB has only two direct-connect outputs for supplying direct-connect signals to its immediately neighboring GLB's.

Figure 3H:
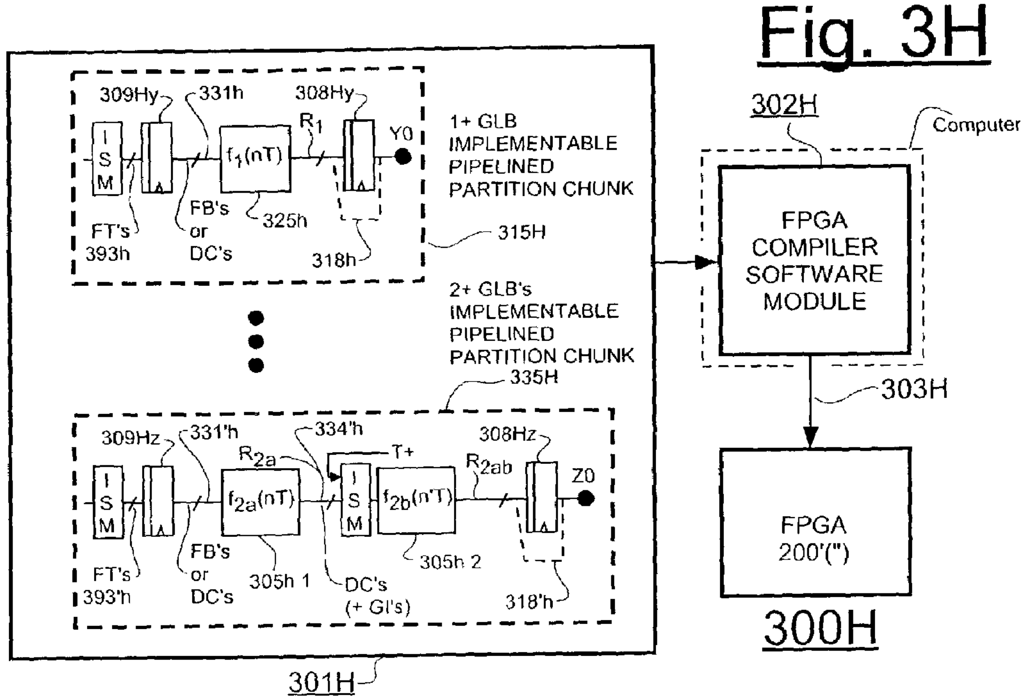
FIG. 3H diagrams a third possible design partitioning and implementing operation that seeks to exploit all or parts of the feedthrough resources, register-intensive resources, and/or direct-connect cluster resources of an FPGA that is structured in accordance with the disclosure in order to compactly realize pipelined design sections.
Figure 3I:
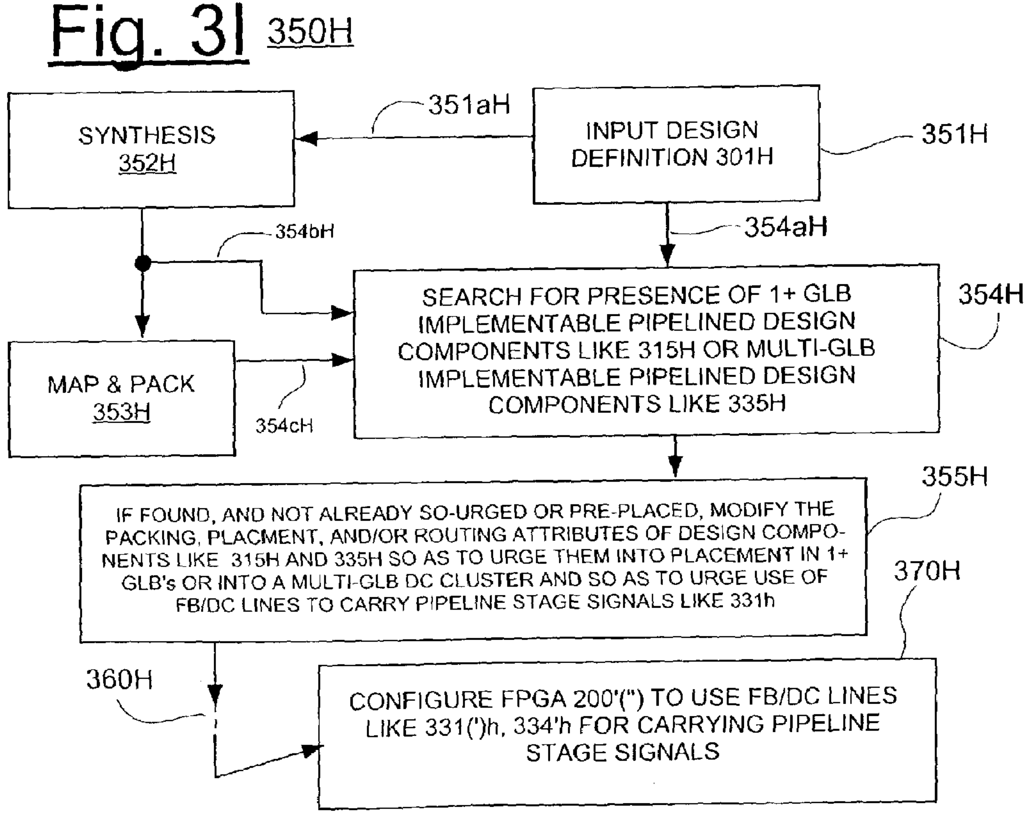
FIG. 3I flow charts a third possible set of place-and-route software operations that strive to conform with the implementation suggestions shown in FIG. 3H.

FIGS. 3H–3I correspond to the above described, design-opportunity and urging actions of respective FIGS. 2F–2G and 3F–3G. Like reference symbols in the "300H" century series are used where practical in FIGS. 3H–3I so that extensive explanation of the underpinnings will not be needed here again. As in the case of FIGS. 3F–3G, the input design specification 301H of FIG. 3H does not generally include the pictorial suggestions as to where each design component will be placed and how signals will ultimately be routed. We are optimistically predicting that pipeline stage sections of the design will be partitioned, packed, and relatively as well as absolutely placed in one or more GLB's while using feedthroughs (FT's) for register recovery and while using feedback lines (FB's) and/or direct-connect lines (DC's) for carrying registered signals of the given pipeline stage.

More specifically, it is seen in box 315H that post-partitioning chunks of the input design specification 301H may be urged towards including pipeline stage chunks that have at least a front-end registration part (e.g., 309Hy, 309Hz) for capturing input signals of the pipeline stage. Each such pipeline-stage chunk can be implemented either within a single GLB or within resources corresponding to that of a single logic block (1+GLB) but crossing between GLB's by way of direct-connect lines (331*h*, 331'*h*) or within resources corresponding to that of two or more logic blocks (2+GLB's) but crossing between such 2+GLB's by way of at least some direct-connect lines (334'*h*) while perhaps also using a few other kinds of general interconnect lines (GI's). We have already shown in FIG. 2E the case where a single GLB implements a pipelined partition chunk. The same concept is covered again with slightly broader scope in the depiction of box 315H within FIG. 3H. In the pictorially-suggestive box 315H, feedthroughs (FT's) 393*h* are shown supplying front-end input signals from the ISM stages to FT-recoverable registers such as 309Hy. In the case of the single-GLB implementation, only feedback lines (FB's) are used for carrying signals over connection 331*h* to the in-GLB logic processing unit 325*h*. In the case of the 1+GLB implementation, at least one DC line is used, perhaps with additional use of feedback lines (FB's), for carrying signals over connection 331*h* to the in-GLB logic processing unit 325*h* for processing those input signals (331*h*) in accordance with the GLB-implemented function, $f_1$ (nT), where n represents here the number of independent input terms (T's) of the function. The corresponding result bit or bits, $R_1$ of the function unit 325*h* may then be registered in output registers such as 308Hy, or they may instead bypass (318*h*) the back-end registration as they are output to pipeline output terminals such as the illustrated terminal, Y0.

While not fully shown in FIG. 2E, it should now be understood what is implied by connection 234*e* of FIG. 2E. The implication is that connection 331*h* of box 315H may be constituted by direct-connect lines (DC's) alone or by a combination of DC's and FB's. In other words, some of the front-end input signals may be captured in one or more feedthrough-recoverable registers (309Hy) of different GLB's and thereafter carried by DC lines in connection 331*h* to the GLB which contains the $f_1$ (nT) logic function unit, 325*h*. That $f_1$ (nT) logic function unit then processes the front-end registered signals (331*h*) and outputs result signal $R_1$ with optional (318*h*) back-end registration (308Hy). This DC-based version therefore contemplates the use of front-end registers wherever they can be recovered within the DC cluster neighborhood of the function-implementing GLB (the one that contains logic block 325*h*).

The pictorial suggestions in box 335H of FIG. 3H takes the concept of what partitioning and placement should be urged towards, one step further. In box 335H, two or more GLB's are to be used to implement a pipelined partition chunk. Feedthroughs (FT's) 393'*h* are to be used to recover use of whatever registers 309 Hz may be available in the cluster neighborhood of a first partial-function implementing GLB, where this first GLB contains function-realizing box 305*h*.1 (realizing the partial pipeline stage function, $f_{2a}$(nT)). A corresponding partial result signal, $R_{2a}$ is to be produced by first function block 305*h*.1 and then carried by connection 334'*h* to a second function-implementing block 305*h*.2 for completing the transform function of the given pipeline stage. Connection 334'*h* preferably consists only of direct-connect lines (DC's) but may also include one or a few 2xRL lines. The ISM which feeds the second function box 305*h*.2 may obtain additional pre-registered signals (T+) by way of appropriate interconnect lines or DC's. The pipeline stage result signal $R_{2ab}$ which is to be produced from the output of the second logic function block 305*h*.2 (where the latter in-GLB block, programmably implements the function, $f_2$b(n'T)) may then be further registered in a back-end register set including register 308 Hz, or it may bypass the registers for output on corresponding output terminals of the pipeline stage such as the illustrated terminal, Z0.

FIG. 3I shows a software flow 350H that may be used for urging the realization of the pictorial suggestions of FIG. 3H in much the same manner as was explained for corresponding FIGS. 3G and 2G. It is understood that the machine-implemented operations of process 350H may encompass those of respective FIGS. 3G and 2G. The input design definition obtained in step 351H, and optionally, wholly or partly, synthesized in step 352H and/or mapped and packed in step 353H, is analyzed in step 354H and partitioning operations of the FPGA compiler 302H are then responsively urged, if conditions are appropriate, to form GLB-implementable pipeline partitions such as represented by boxes 315H and 335H. Where possible, the simpler form of box 315H is preferentially urged over that of box 335H. After synthesis, mapping and/or partitioning occurs, step 354H searches the partitioned design definition for the presence of 1+GLB implementable design components like 315H or multi-GLB implementable pipeline stage components like 335H. In step 355H, the place-and-route definitions of partitioned design components like 315H and 335H may be re-mapped and/or re-packed or otherwise associated with appropriate attributes for urging those partitions which are not already so-urged or prepacked or pre-placed, into respective relative and/or absolute placements within the 1+ GLB's or across the multi-GLB DC clusters in accordance with what is pictorially represented in boxes 315H and 335H. The routing control factors of these closely-placed partitions (315H, 335H) are then urged to rely on feedthrough lines (FT's) for register recovery and to rely on FB and/or DC lines for carrying post-registration signals of the pipeline stage via connections such as 331*h* and 331'*h*. In the case of the 2+GLB-implementing chunks represented by box 335H, the routings for connection 334'*h* are encouraged to rely first on 2xRL lines, if available, or if not, on DC lines before trying to make the connections of couplings 334'*h* instead with longer-haul general interconnect lines.

Competing urging factors are understood to come into play within the intervening operations represented by program execution steps 360H. If the urging factors developed in step 335H are successful, then in step 370H the blank FPGA 200' will be programmably configured so that the post configuration FPGA (200") uses FB and/or DC lines such as suggested by 331(')*h* and 334'*h* for carrying already-registered ones of the signals flowing through the corresponding pipeline stage section. It is therefore seen that the register recovery concepts introduced in FIG. 2E have been expanded upon in FIGS. 3H–3I by further encompassing the use of direct-connect patterns such as those shown in FIGS. 3C and 3D for forwarding registered signals to respective logic blocks such as 325*h* or 305*h*.1 or 305*h*.2.

Referring now to FIG. 3E, we explain yet another aspect of the DC connection patterns (including diagonal DC connections) shown in FIGS. 3C and 3D. In FIG. 3E we show a particular configuration 300E wherein direct-connects are used for implementing barrel shifters having dynamically variable shift amounts. It is to be understood that "barrel shifting" is a term of art for simultaneously gang-switching a plurality of dynamically changeable signals each at least between two respective nodes. While the term, "barrel shifting" may be used for such gang-switching in the context of arithmetic operations, other terms referring to the gang-switching of a plurality of dynamically changeable and interrelated signals may be used in the respective contexts of other applications, such as calling it dynamic re-routing of parallel message bits in the context of digital telecommunications applications. Such simultaneous gang-switching of a plurality of dynamically changeable signals has broad applicability and it is therefore advantageous to be able to compactly implement the same in an FPGA.

The left-side column (K−1) of logic blocks in FIG. 3E includes a successive plurality of GLB's: (A−1), (B−1), (C−1), etc., which are used for producing respective bits n0–n3, n4–n7, n8–n11, etc., of a digital word, n, which is to be variably shifted (gang-switched) by the barrel shifter (columns K, K+1, etc.).

The middle column (K) of FIG. 3E includes the immediately adjacent logic blocks of column K−1, namely GLB's: (A), (B), (C), etc. Each GLB of the middle column K and its associated ISM stages are configured in substantially the same way. The interior of the central GLB (B) is illustrated in more detail to show that four 2:1 dynamic multiplexers (e.g., 323*e* being one of them) are implemented for either transporting an input nibble (e.g., NIBBL1 in) across to respective output terminals W1–Z1, or for shifting the less significant bits n5–n7 up one-notch for output through respective terminals W1, X1 and Y1 while shifting the yet lesser significant bit, n8 also up one-notch for output on respective terminal Z1. It is seen in the illustration that the last bit, n8, is routed to the d1 input terminal of multiplexer 323*e* by way of direct-connect line DC5. Bits n4–n7 are routed respectively to the a0, b0, c0 and d0 inputs (not all shown) of the lookup blocks in GLB 391*b*" by way of respective direct-connect lines DC1–DC4. The signals on lines DC2–DC4 are also routed respectively to input terminals a1, b1 and c1 (latter 2 not shown). The dynamic selection control terminals (e.g., a2–d2) of the respective 2:1 DyMUX's (e.g., 323*e*) may be driven by a common control signal that is delivered, for example by way of MaxRL line 301*c*.3 and sourced from either an 10B or another logic block such as the illustrated GLB (E). This control signal 301*c*.3 in essence instructs each of the barrel-shifting GLB's in column K to either transfer their corresponding nibble across or to shift the lower three bits of the corresponding nibble up one-bit-position for output through respective terminals W1, X1, Y1; while also translating the highest nibble from the next lower row, up one-bit-position for output through the Z1 terminal.

The next column, K+1 of GLB's implements a slightly different type of variable shift operation. Instead of providing an Up or Across bit-position translation, column K+1 provides a Down or Up bit position translation, where the Down or Up choice is mediated by a control signal provided on common control line 301*c*.4. Shown in the interior of exemplary GLB (B+1) are another set of 2:1 dynamic multiplexers (e.g., 323*f* being one of them) whose respective input terminals receive either the one-notch-higher bit from the output word, n', of the previous column (e.g., K) or the one-notch-lower bit from the previous column. Thus, in the example of GLB (B+1), terminal a'0 receives the n'3 bit by way of its left-side, top diagonal input, direct-connect line, DC'0. Multiplexer terminal a'1 receives the n'5 bit by way of direct-connect line DC'2 (not separately shown). Similarly, multiplexer terminal d'1 of dynamic multiplexer 323*f* receives the n'8 bit by way of its left-side, bottom diagonal input, direct-connect line DC'5. The other terminal of DyMUX 323*f*, d'0 receives the n'6 bit by way of direct-connect line DC'3 (not separately shown).

When columns K and K+1 are considered in combination, it is seen that the respective two, variable control bits provided on control lines 301*c*.3 and 301*c*.4, can control the barrel shifter defined by these respective columns, K and K+1 to specify a variable shift amount defined by the set consisting of: −1, 0, +1, +2; where −1 indicates a down shift by one notch and +2 indicates an upshift by two notches. Although not shown, it is to be understood that a fourth column K+2 can be configured in the same way as is column K⁺ I and coupled to K+1 so that the shift-range of such a three-column barrel shifter will then be extended to the set consisting of shift amounts: −2, −1, 0, +1, +2, and +3. Yet another such column will expand the shifting operations to: −3, −2, −1, 0, +1, +2, +3 and +4; and so on.

It may be noted that the above-described barrel shifting operations (FIG. 3E) can be implemented primarily with the use of direct-connect lines rather than by consuming general interconnect lines (one exception being the use of control lines such as 301*c*.3 and 301*c*.4 for carrying the shift-amount selecting bits). It may also be noted that only three of the four inputs (e.g., a0–a3) on each LUT+ block are being consumed for realizing the 2:1 dynamic-shifting operations (e.g., 323*e* and 323*f*). The fourth terminal of each LUT (e.g., a3, b3, etc.) may be used for simultaneously implementing an intervening logic operation such as inverting or not inverting (e.g., an XOR gate) an output or one of the inputs of each 2:1 DyMUX (323*e* and/or 323*f*. Alternatively, the fourth input (e.g., FTa3) of each LUT may be used as a secondary feedthrough line for registering one of the input signals of each 2:1 DyMUX while the primary feedthrough (e.g., FTa0) is used for front-end registration of the other of the input signals. Because multiplication and other DSP algorithms often rely on variable shift operations, the FPGA configuring pattern illustrated in FIG. 3E may be expeditiously used for carrying out such multiplication or other DSP algorithms. In view of the above, it should now be apparent that place-and-route software (e.g., 302H of FIG. 3H) may be urged to use at least part, if not all, of the illustrated DC routing paths discussed above for realizing either fixed (non-variable) or variable shifting operations as may be appropriate for a supplied design definition (e.g., 301H).

Figure 4A:
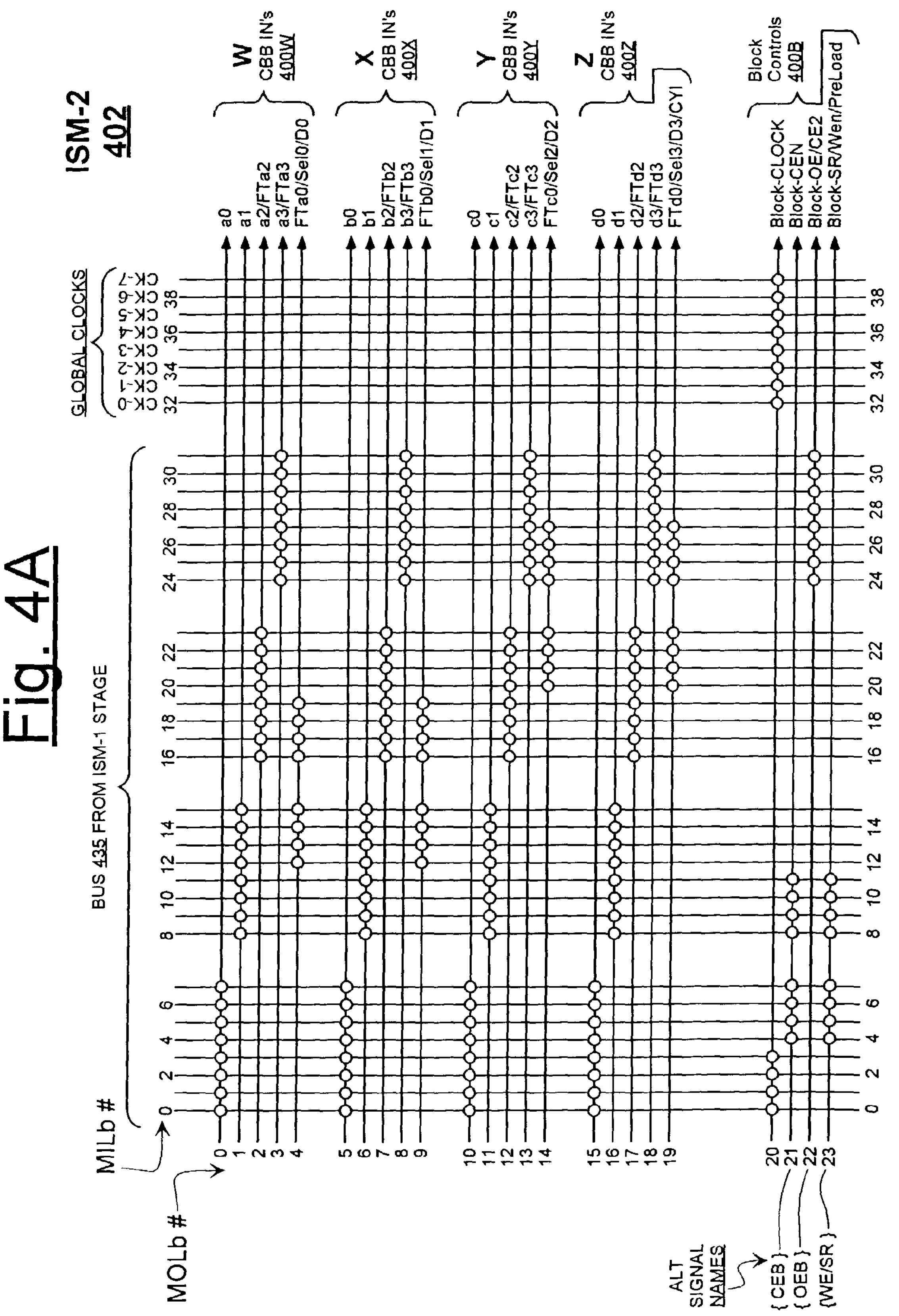
FIG. 4A illustrates a possible PIP populating scheme fora stage-2 input switch matrix (ISM-2) that may be used with embodiments of FIGS. 2A, 2C, 3A, and 3B.

FIG. 4A shows details of a specific ISM-2 stage that may be used in accordance with the present disclosure. The illustrated second-stage, 402 is fairly similar to the second-stage matrix (240C) described in FIG. 2C. One of the easily discernable differences is that stage 402 of FIG. 4A is byte-based rather than nibble-based. More specifically, MOLb #0 (matrix output line #0 of stage b) has eight successive PIP's at the corresponding intersections of MILb's #0–7. MOLb #1 similarly has eight successive PIP's for the intersections of MILb's #8–15, and so on. In one embodiment, the 2xRL lines are braided from tile to tile (as if they were on a tubular bus that is given a slightly deforming twist as it extends from one tile to the next). The provision on MOLb #0 of eight successive PIP's helps to assure that contributions from at least a plurality of the braided 2xRL lines will be accessible despite the braiding. The intersections subset defined by the intersections of MOLb's #0, 5, 10 and 15 with MILb's #0–7 therefore defines a fully-populated 4-by-8 switching matrix (as contrasted with the 4×4 subset in FIG. 2C). Similarly, the intersections subset defined by the intersections of MOLb's #1, 6, 11, 16 with MILb's#8–15 defines a mutually exclusive further 4-by-8 switching matrix, and soon.

In contrast to FIG. 2E, the primary feedthrough, signal acquirers defined by the PIP's along MOLb's #4, 9, 14 and 19 of FIG. 4A are not mutually exclusive, when considered along the direction of the vertical lines of input bus 435, from the further PIP's which define the stage-2 signal acquirers serving address-input terminals a0:a3, b0:b3, c0:c3 and d0:d3 of the corresponding GLB (see also FIGS. 2A, 2C). However, as can be seen in FIG. 4A, from a byte-based perspective, the ISM-2 signal acquirers of primary feedthroughs FTc0 and FTd0 (MOLb's #14 and #19 respectively) still replicatively overlap with one another in the vertical direction. Also, the PIP's of the MOLb's #14 and #19 are vertically independent from the PIP's associated with the ISM-2 acquirers of a0:a1, b0:b1, c0:c1 and d0:d1 (where the latter PIP's lie along MOLb's #0, 1, 5, 6, 10, 11, 15, 16). Similarly, from the byte-wide perspective, the ISM-2 signal acquirers of primary feedthroughs FTa0 and FTb0 replicatively overlap with one another and are mutually exclusive from the signal acquirers associated with: a0 and a3, b0 and b3, c0 and c3, and d0 and d3 (where the PIP's of the latter lie along MOLb's #0, 3, 5, 8, 10, 13, 15, 18). If a nibble-wide perspective is instead considered, it may be seen that each of respective nibble-wide PIP's subsets of the primary feedthroughs (FTa0–FTd0) may be organized to be mutually exclusive from at least four, nibble-wide signal acquirers of the corresponding address input terminals, a0:a3, b0:b3, c0:c3 and d0:d3.

MOLb's #0–#4 are collectively referred to in FIG. 4A as the W-CBB input lines (400W) because they can be used to respectively service the a0–a3 input terminals of the W-lookup block (e.g., 205A' of FIG. 2C) and its associated, primary feedthrough line, FTa0 (217*a*). MOLb's #5–#9 are similarly, collectively referred to in FIG. 4A as the X-CBB input lines (400X) because they can be used to respectively service the b0–b3 input terminals of the X-lookup block (e.g., 205B' of FIG. 2C) and its associated, primary feedthrough line, FTb0 (217*b*). In similar fashion, MOLb's #10–#14 are collectively referred to in FIG. 4A as the Y-CBB input lines (400Y) because they can be used to respectively service the c0–c3 input terminals of the Y-lookup block (e.g., 205C of FIG. 2A) and its associated, primary feedthrough line, FTC0 (where the latter is represented as FTc in FIG. 2A). MOLb's #15–#19 are collectively referred to in FIG. 4A as the Z-CBB input lines (400Z) because they can be used to respectively service the d0–d3 input terminals of the Z-lookup block (e.g., 205D of FIG. 2A) and its associated, primary feedthrough line, FTd0. Note that besides also serving overlappingly as the carrier for the Sel3, dynamic selection signal and the D3, shift-in signal, MOLb #19 is indicated in FIG. 4A to overlappingly serve as the carrier for a CYI, block carry-input signal. In one embodiment, the Z-lookup block (205D in FIG. 2A) cooperates operatively with a carry-chain circuit that receives the CYI signal as a least significant carry bit. In that same embodiment, the W-lookup block (205A in FIG. 2A) cooperates operatively with another portion of the carry-chain circuit that outputs the most significant carry bit for that part of the carry chain.

MOLb's #20–#23 are collectively referred to in FIG. 4A as the block control inputs 400B for the corresponding GLB (not shown). As seen, along MOLb #20, any one of the eight global-reach lines (also labeled as CK-0 through CK-7) may be programmably selected to serve as the Block-CLOCK signal. Alternatively, any one of the signals supplied on MILb's #0–#3 may instead be programmably selected to serve as the Block-CLOCK signal. The inverted clock enable signal that is output via MOLb #21 is referred to herein either as the Block-CEN signal or alternatively as a {CEB} signal (clock-enable bar signal). As seen in the illustrated embodiment, any one of the signals supplied on MILb's #4–#11 may be programmably selected to serve as the Block-CEN signal. The MOLb #22 line outputs a so-called Block-OE/CE2 signal which is alternatively also referred to as the {OEB} signal. This signal can have different functions as will be seen for the embodiment further explicated in FIG. 4B. As seen in FIG. 4A, the Block-OE/CE2 signal may be programmably selected from any one of the signals supplied on MILb's #24–#31. The MOLb #23 line of FIG. 4A also has multiple functions. Accordingly, its output signal is denoted as a Block-SR/Wen/PreLoad signal. This signal is alternatively referred to herein as the {WE/SR} signal. As seen, any of the bus 435 signals supplied along MILb's #4–#11 (the same ones serving Block-CEN) may be programmably selected to serve as the {WE/SR} signal.

Figure 4B:
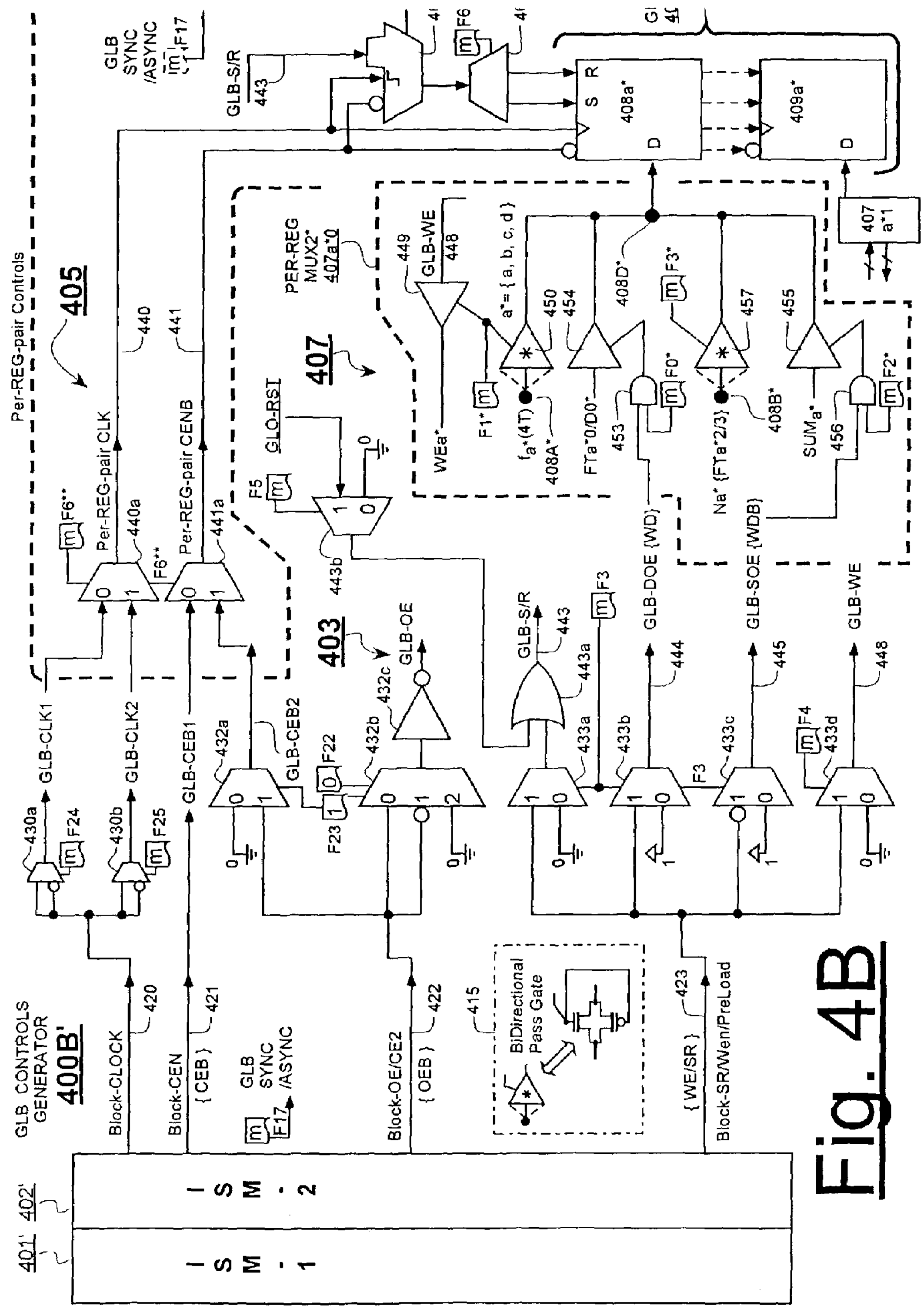
FIG. 4B shows how GLB-internal controls in one embodiment may be generated and how per-register multiplexing may be carried out.

Referring to FIG. 4B, we now describe one particular embodiment 400B' of a GLB control-signals generating circuit that may be used to service a corresponding GLB 404'. Note that only one of the four register pairs in GLB 404' is representatively shown in FIG. 4B to be constituted by registers 408*a and 409*a. The a* designations of FIG. 4B are to be understood to be replaceable by any one of the: a, b, c and d designations when a specific logic-block state-storing register or register pair is being considered. Thus, the illustrated register pair, 408*a–409*a may be considered in one embodiment to be representative of any one of register pairs 208*a*–209*a*, 208*b*–209*b*, 208*c*–209*c* and 208*d*–209*d* of FIG. 2A.

For purposes of continuity, ISM stages −1 and −2 are schematically represented as 401' and 402', respectively. The illustrated ISM-2 stage, 402' may be the same as the 402 embodiment shown in FIG. 4A or a different embodiment that conforms with the principles of the present disclosure. Similarly, the illustrated ISM-1 stage shown at 401' in FIG. 4B may be the same as the specific stage-1 embodiment 401 shown in FIG. 4C or another embodiment which conforms with the principles of the present disclosure.

For the specific GLB controls generator 400B' shown in FIG. 4B, some of the generated control signals such as generally identified by 403 are common to the associated GLB 404'. Some others of the control signals such as generally identified by 405 are common to a given register pair (e.g., 408*a–409*a) of the associated GLB 404'. Yet other control signals such as generally identified by 407 are specific to the operations of a specific state-storing register (e.g., 408*a) within the associated GLB 404'. In other words, each logic-block state-storing register gets its own, programmably selected, per-register signals. Similarly, each register pair gets its own, programmably selected, per-pair control signals. And each GLB generates its respectively own, programmably selected, GLB-common control signals at least from the Block-controls (400B in FIG. 4**A) output by the corresponding ISM-2 stage. This hierarchy of programmable selectivity should be kept note of as we delve into the details.

Referring to the Block-CLOCK signal output from the ISM-2 stage on line 420 of FIG. 4B, we see that two GLB-common versions of this clock signal are produced respectively by configurable multiplexers 430*a* and 430*b*. A first configuration memory bit, which is denoted as fuse F24, controls multiplexer 430*a* and is used for defining whether the multiplexer's respective output signal, GLB-CLK1 is the same polarity as, or is of opposite polarity to the Block-CLOCK signal, 420. Another fuse, F25 controls the selection made by corresponding multiplexer 430*b* and thereby specifies whether the multiplexer's respective output, GLB-CLK2, will be of the same polarity as, or of opposite polarity to, the supplied Block-CLOCK signal, 420. Given this structure, it may be seen that either one or both of the GLB-CLOCK1 and GLB-CLOCK2 signals can be of the same, or of opposite polarity to the Block-CLOCK signal 420. Both of the GLB-CLOCK1 and GLB-CLOCK2 signals are supplied to each per-register-pair controls section 405 of each respective register pair (only 408*a–409*a is shown) in the associated GLB, 404'.

Within each respective, per-register-pair controls section 405 (only a representative one is shown), a corresponding first static multiplexer, 440*a* is provided for selecting one or the other of GLB-CLOCK1 or GLB-CLOCK2 signals as a pair-common clock signal, 440 that is to be supplied to the clock terminals of corresponding register pair 408*a–409*a. The first multiplexer, 440*a* is controlled by a configuration bit supplied from fuse F6. (The double asterisk {} indicates the fuse is unique to a given, register pair controlling section 405.) A second static multiplexer, 441*a* is further provided and made responsive to the same F6 fuse for defining the per-register-pair control-enable bar signal (CENB) 441 that is applied to the clock enable terminals of both of registers 408*a and 409*a in the corresponding register pair. One input of the second multiplexer 441***a* comes directly from the Block-CEN output 421 of the corresponding ISM-2 stage. The latter signal (421) is renamed in FIG. 4B as the GLB-CEB1 signal to indicate that it serves as a first GLB-common clock-enable-bar signal. An alternate GLB-common clock-enable-bar signal (GLB- CEB2) is supplied to multiplexer 441a from a third multiplexer, 432a. The selection options of this third multiplexer 432a are controlled by fuse F23. If its logic "0" input (e.g., ground) is selected by the third multiplexer 432a, then its corresponding output, GLB-CEB2 will represent an always-enabled control signal, CENB (441) which may be then forwarded by way of multiplexer 441a to the clock-enable-not terminals of the corresponding register-pair, 408a*-409a*. On the other hand, if multiplexer 432a is controlled by fuse F23 to instead select the Block-OE/CE2 signal which is output from line 422 of the ISM-2 stage, then the GLB-CEB2 signal can change dynamically and in accordance with the signal presented to the GLB (404') on line 422. Given the combination of multiplexers 441a and 432a, the FPGA's place-and-route software (e.g., 302H of FIG. 3H) has the flexibility of configuring the corresponding FPGA to pick, on a per-register-pair basis for defining the clock-enable function, either the block's primary CEB1 signal (421), or the block's secondary CEB2 signal (422), or an always-active state (logic "0").

The F23 fuse which controls multiplexer 432a, also defines a selection-control combination, F22/F23 for controlling the selection made by further multiplexer 432b of the illustrated GLB controls generator 400B'. The 3-input multiplexer, 432b responsively defines a GLB-OE signal output by inverter 432c. GLB-OE may be defined as being always active (by selecting the logic "0" input of multiplexer 432b), or as being of the same polarity as the Block-OE signal (422), or as being of opposite polarity to signal 422. The GLB-OE signal is supplied to the H&V LOSM's of the associated GLB 404' (see 280 of FIG. 2A) such that the GLB-OE signal may be used to control a corresponding OE terminal of a tristate longline driver (286 in FIG. 2A) associated with that GLB 404'.

A GLB-common, Set or Reset signal, 443 is produced by OR gate 443a of the illustrated controls generator 400B'. One input of OR gate 443a is coupled to the output of multiplexer 443b. A per-GLB fuse, F5 controls the latter multiplexer 443b and causes the multiplexer 443b to output either a logic "0" or the global-reset signal, GLO-RST where the latter signal is globally distributed throughout the GLB's of the FPGA. Another input of OR gate 443a receives an alternate Set or Reset signal supplied from multiplexer 433a under control of per-GLB fuse F3. This alternate Set or Reset signal can either be a logic "0" or the Block-SR signal 423 output by the corresponding ISM-2 stage. The combination of multiplexers 433a, 433b and OR gate 443a gives the associated place-and-route software (e.g., 302H of FIG. 3H) the flexibility of defining the GLB-S/R signal 443 of the corresponding GLB as being always at logic "0", or being equal to only the global reset signal GLO-RST, or being equal to only the Block-SR signal 423, or of being the Boolean sum (OR) of the global and block Set/Reset signals.

Within the per-register-pair control section 405 there is a GLB-S/R pass-through unit 460 that has two modes of operation. When a per-GLB fuse F17 is in a so-called, "asynchronous registration" mode (ASYNC), the GLB-S/R signal 443 passes directly through unit 460 into demultiplexer 462. A corresponding per-pair fuse, F6 directs the asynchronously passed-through GLB-S/R signal either to the S (set) or R (reset) control terminals of register pair 408**a*–409a*. The other of the S and R terminals receives a logic "0". When fuse F17 is instead in the SYNCH mode, the GLB-S/R signal 443 passes through the per-pair SYNCH/ASYNC unit 460 only if line 441 (CENB) is low and at the same time, a rising edge of the per-register pair clock signal, 440 arrives. Otherwise, the pass-through unit 460 outputs a logic "0". The latter SYNC mode allows the pass-through unit 460 to supply a clock-sensitive version of the GLB Set or Reset signal to the corresponding register pair 408a*–409a*.

The output of configuration fuse F3 is applied not only to the selection control terminal of multiplexer 433a but also to those of multiplexers 433b and 433c. Multiplexer 433b outputs a GLB-common, data-output enabling signal (GLB-DOE) which signal 444 is alternatively referred to in FIG. 4B as the {WD} signal. For each register such as 408a* or 409a* of the corresponding GLB 404', there is a per-register signal-feeding multiplexer such as the one represented by dashed box 407a*0. See corresponding multiplexer 207a0 of FIG. 2C. The illustrated multiplexer 407a*0 is understood to be matched by another similarly structured multiplexer 407a*1 (details not shown) which is associated with the D input of register 409a* as is shown in FIG. 4B.

Within the per-register multiplexer element 407a*0, the GLB-DOE signal 444 may be coupled through a per-register AND gate 453 to thereby control an output-enable terminal of tristate driver 454 if a corresponding fuse, F0* is activated. If the F0* fuse is not activated, the output of tristate driver 454 is in the Hi-Z (high impedance output) mode. The input terminal of tristate driver 454 receives the primary feedthrough signal, FTa*0/D0* associated with its register-pair 408a*–409a*. Accordingly, depending on the states of the per-GLB fuse F3 and of the per-register fuse F0*, the FTa*0 signal may be statically or tristate-wise coupled to node 408D* for passage therefrom to at least one of the D input of register 408a*, a further node 408A* shown within multiplexer means 407a*0, and a yet further node 408B* shown within the same multiplexer means 407a*0.

Each of elements 450 and 457 represents a bi-directional transmission gate which can be selectively switched between a high-impedance open mode and a low-impedance conductive mode. Legend 415 shows that one embodiment of such a bi-directional transmission gate element may be comprised of back-to-back P- and N-channel MOSFET's where their gates are tied together to define the mode-selection terminal. Other embodiments of such bidirectional transmission gates are known within the art and need not be elaborated on here. It may be appreciated from FIG. 4B that if a corresponding per-register fuse F1* is active and the output-enable signal of driver 454 is also active, then the FTa*0, primary feedthrough signal may be routed to node 408A* for presentation as write-data (WDin) to the corresponding LUT+ block (see 205A' of FIG. 2C) when an active GLB-WE signal (448) is simultaneously passed through tristate driver 449 for presentation to the WEa* terminal of the LUT+ block (e.g., the WEn0 terminal of block 205A' in FIG. 2C). In the illustrated embodiment the per-GLB write-enable signal (448) is produced by multiplexer 433d under the control of fuse F4. In one state, fuse F4 forces the GLB-WE to be constantly at logic "0", thereby disabling the writing of data into terminal 221 (see FIG. 2C) of the corresponding LUT+ block (205A'). When fuse F4 is in an opposite state, multiplexer 433d passes through the Block-Wen signal 423 {WE/SR} to thereby define the GLB-WE signal 448.

If fuse F3* is active, an alternate "node"-signal, Na* (which signal could be constituted by either one of the secondary feedthrough signals FTa*2 or FTa*3) may be passed from node 408B* to one or both of the D input of register 408a* and node 408A*. Thus, bidirectional gate 457 may be used to transfer one of the secondary feedthrough signals to either one or both of register 408*a and the write-data terminal of the corresponding LUT+ block (205**A').

An arithmetic bit ($SUM_a$*—which may be generated from the carry-chain circuitry) may be further passed through tristate driver 455 for application to one or more of nodes 408A*, 408B* and the D input of register 408*a. The output-enable terminal of tristate driver 455 is controlled by AND gate 456. If fuse F2* is logic "0", then driver 455 is switched into a high-Z state. Otherwise, a GLB-SOE signal 445 (alternatively denoted as the {WDB} signal) drives the OE terminal of element 455. The GLB-SOE signal 445 is produced by multiplexer 433***c* in accordance with the state of per-GLB fuse F3. If F3 is in the logic "0" state, signal 445 is kept constantly activated (logic "1"). If the F3 fuse is in the "1" state, then the inverse of the Block-Wen signal 423 ({WE/SR}) is provided as the GLB-SOE signal 445. In the latter case, the {WDB} signal 445 is persistently the opposite of the {WD} signal 444 and thus the $SUM_a$* signal and FTa*0 signal may be alternatively applied in time-multiplexed fashion to node 408D*. Given this, it is seen that the {WE/SR} signal 423 may be used to selectively steer either the primary feedthrough signal, FTa*0 or another signal (e.g., the $SUM_a$* signal) for sequential registration by corresponding register 408*a and/or for sequential output, in accordance with the order established by the {WE/SR} signal 423**, onto the FPGA intra/interconnect. In one embodiment, this real-time alternatable feed aspect is used for run-time pre-loading of an initial count or of other pre-load data into the registers from one of the SUMa* and FTa*0 circuits before saving a post-load result into the registers from the other of the SUMa* and FTa*0 circuits. Although the SUMa* signal is shown as the other, sequentially insertable signal, it is to be understood that the present disclosure contemplates use of other signals as the alternate insertable to the FTa*0 signal. The SUMa* signal, incidentally, may generated by carry-chaining circuits such as those depicted in the above-cited U.S. Pat. No. 6,097,212 with a minor adjustment being made that dynamic switching between the Ai XOR Bi result and the Ai AND Bi result (e.g., FIGS. 19A–19B of 6,097,212) is carried out in the 4-input LUT's and the am:v signal (from gate 1986 of 6,097,212) is provided by a primary or second feedthrough terminal. See also FIGS. 5A–5B herein.

Figure 4C:
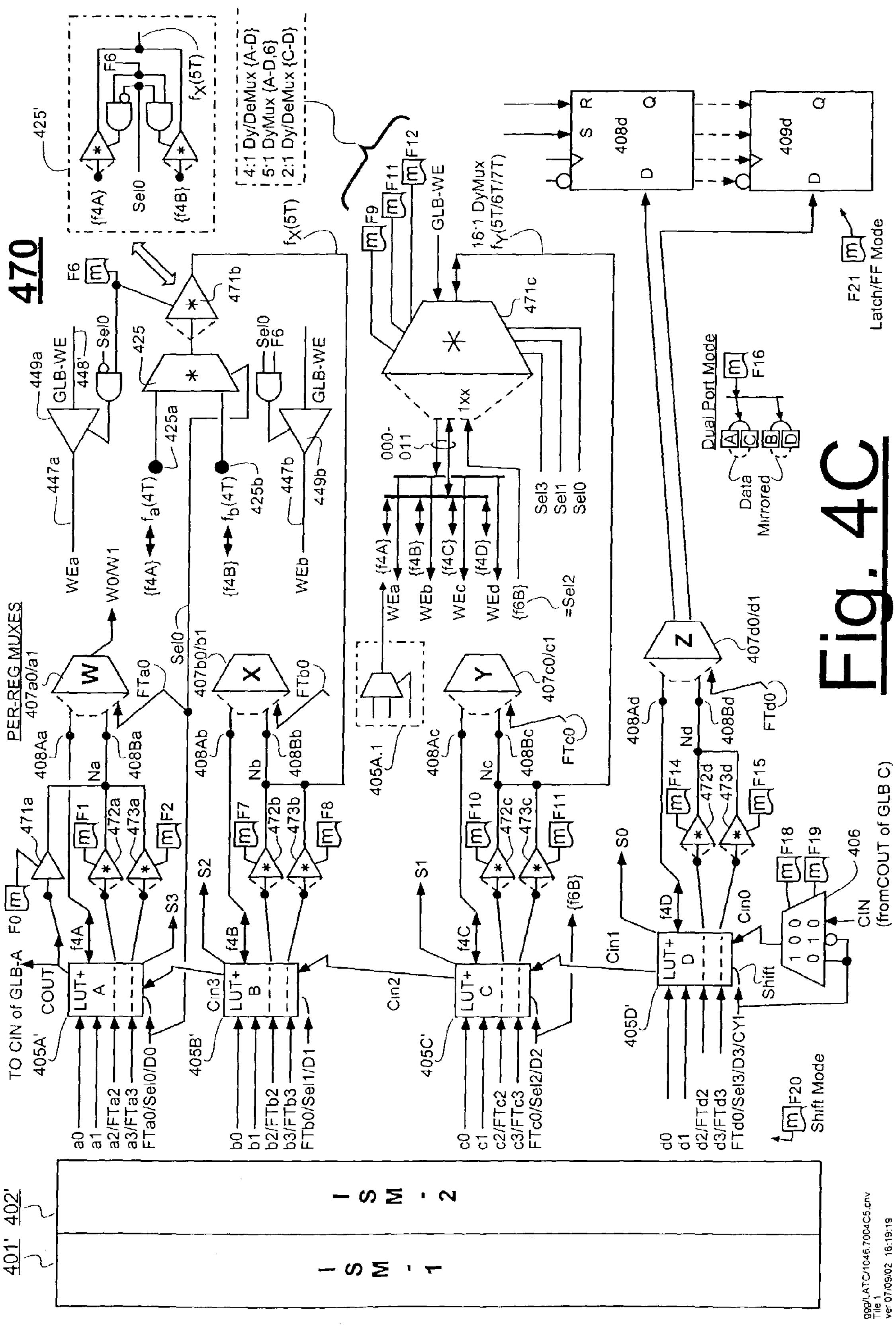
FIG. 4C shows how GLB-internal signal routing in one embodiment may be carried out.

Referring to FIG. 4C, an embodiment is shown of a coupling circuit 470 that can bidirectionally couple signals between per-register multiplexers such as 407*a*0 and 407*a*1 (shown as a combined structure, 407*a*0/*a*1) and corresponding LUT+ blocks such as 405A'. The LUT+ block 405A' of the illustrated GLB (let's assume it is GLB B as per FIG. 3B) has a respective, GLB carry-bit outputting terminal (COUT) from which a look-ahead-type carry signal of the GLB (corresponding to most-significant sum bit, S3) may be output directly to a corresponding CIN terminal of the GLB-A above it. The illustrated, GLB-B likewise has a CIN terminal (see input of multiplexer 406, shown below LUT+ block 405D') which can receive a look-ahead-type carry signal from the GLB-A located directly below it (or from a bottom side 10B if it is the lowest GLB in its column). This allows for high-speed carry propagation along a given column of GLB's.

There can be situations, however, where it is desirable to jump the carry propagation form a first column to a selectable other column. It may be seen from the connections about LUT+ block 405A' of FIG. 4C that a first tristateable driver 471*a* is provided for selectively coupling the COUT signal to a corresponding node Na (408Ba) of the per-register multiplexers 407*a*0/a1 associated with LUT+ block 405A'. The COUT signal may be propagated via this path and through one or more of the W output terminals of multiplexers 407*a*0/a1 (see FIG. 2C) to become a CYI input of another GLB in another column (or even in the same column if a break in the COUT chain is needed for some reason). Multiplexer 406 can acquire the CYI signal from the ISM (410'/402') and optionally invert it if desired. Referring again to the COUT signal, a first user-configurable fuse, F0 controls the output-enable (OE) terminal of driver 471*a* to thereby determine if COUT will be coupled to node Na or not. Aside from the COUT driver 471*a*, node Na has coupled to it, a first bi-directional transmission gate 472*a* which can be used to couple the FTa2, secondary feedthrough signal also to node Na or vice versa (the signal on node Na can be transmitted by way of first transmission gate 472*a* to the a2/FTa2 terminal, so that, for example the COUT signal might become an input of the LUT part of block 405A'). Another fuse, F 1 controls the OE terminal of the first transmission gate 472*a*. Another bidirectional transmission gate, 473*a* provides selectable and bidirectional coupling between the a3/FTa3 terminal and node Na. Fuse F2 controls the OE terminal of this further transmission gate 473*a*.

It is to be understood that node Na of FIG. 4C (also denoted as node 408Ba) corresponds to node Na* (408B*) of FIG. 4B. Node 408Aa of FIG. 4C (also denoted as the f4A node) corresponds to node 408A* of FIG. 4B. The f4A signal terminal shown in FIG. 4C is understood to carry the fa*(4T) signal which is also shown at node 408A* of FIG. 4B. The latter node also corresponds to terminal 221 of FIG. 2C. As should now be appreciated from the combination of FIGS. 4B and 4C, a signal on node 408Aa (also f4A in FIG. 4C) can be reflected via either one of the per-register multiplexers 407*a*0/a1 to node 408Ba (the Na node) or vice versa. The FTa0, primary feedthrough signal can also be selectively routed to nodes Na and/or f4A. Given the above description of the LUT-to-Per/Reg/Pair/Muxes coupling circuitry (471*a*–473*a*), it may be seen that place-and-route software may be configured to take advantage of a wide range of choices for routing signals, including using the bi-directional transmission gate means (472*a*–473*a*) associated with the LUT+ block 405A' and the bi-directional transmission gate means within the per-register multiplexers 407*a*0/a1 (see FIG. 4B) to route selectable ones of the second feedthrough signals, FTa2, FTa3 and the primary feedthrough signal, FTa0 for output through the W0/W1 terminals of the GLB or for input as write-data (WDin) into the f4A terminal of the LUT+ block, 405A'. Although not fully shown in FIG. 4C, it is understood that the "W" multiplexers 407*a*0/a1 can couple their input signals to respective ones of the selectively-bypassable, W registers (see 208*a*'/218 and 209*a*'/219 of FIG. 2C).

Referring to the next lower LUT+ block in FIG. 4C, 405B', it may be seen that similar and programmably-configurable routing means are provided for the signals that appear on respective nodes 408Ab and 408Bb of the here-referred-to as "X", per-register multiplexers 407*b*0/b1. The OE terminals of bidirectional transmission gates 472*b* and 473*b* are respectively controlled by fuses F7 and F8. Another fuse F6 controls the OE terminal of bidirectional transmission means 471*b*. The output of the latter means 471*b* can represent a $f_X$(5T) signal which is transferable to node Nb (408Bb) of the illustrated arrangement. Element 425 represents a bidirectional and dynamically-controllable multiplexer/demultiplexer whose signal routing operations are controlled by the dynamic selection signal Sel0 as well as static fuse F6. Respective nodes 425*a* and 425*b* couple the respective signals of the f4A and f4B terminals to/from the multiplexer/demultiplexer means 425. One specific implementation of elements 425 and 471*b* is illustrated in dashed box 425'. As can be seen in box 425', the same pair of AND gates that control the OE terminals of drivers 449*a* and 449*b* may be further coupled to two transmission gates (the ones shown in dashed box 425') and that is sufficient for providing the multiplexer/demultiplexer functions associated with unit 425. The dynamic multiplexer functionality of unit 425 (or 425') may be used to fold together the $f_a$(4T) and $f_b$(4T) signals of nodes 425*a* and 425*b*, where the latter signals may be respectively generated at terminals f4A and f4B of respective LUT+ blocks 405A' and 405B'. Such a fold-together operation (which typically includes input signal replication in the ISM-2 stage) can synthesize a more-complex signal which can be a function of five independent input terms, $f_X$(5T). The latter $f_X$(5T) signal can then be presented to the Nb node (408Bb) for output via the "X" multiplexers 407*b*0/b1. Given this arrangement, the place-and-route software may use the resources of dynamic multiplexer unit 425 (or embodiment 425') to route either one of the signals on terminals f4A and f4B to node Nb (if Sel0 is static and F6 is true) or to route the dynamically-selected one of the f4A and f4B signals to node Nb (if Sel0 is dynamically changing and F6 is true).

When the LUT+ blocks (405A'–405D') of the illustrated GLB (B) are used in memory mode (see fuse F16), the Sel0 signal may be used as an additional address bit for routing a write-input data-bit from node Nb to the f4A or f4B write-data inputting terminals (WDin) of LUT+ blocks 405A' and 405B', respectively. The GLB-WE enabling signal 448' is simultaneously routed to the WEa or WEb terminal of the respective LUT+ block by respective tristate drivers 449*a* and 449*b* so as to enable the write operation into the correct block when GLB-WE becomes true (logic "1"). If fuse F16 is set to logic "1", a dual-port memory mode is activated wherein data written into LUT+ block 405A' is mirrored into LUT+ block 405C' and vice versa; and wherein data written into LUT+ block 405B' is mirrored into LUT+ block 405D' and vice versa. Thus, A and C become one data-sharing pair while B and D become another data-sharing pair. However, the address bits supplied to each member of the A/C pair and/or B/D pair do not need to be the same; and generally are different. That is why it is important to steer the GLB-WE signal to the correct LUT+ block even if data-mirroring (F16) is active. The written-to location could be wrong if the GLB-WE signal is steered to the wrong LUT+ block in the dual-port pair (A/C or B/D).

Referring next to the third, LUT+ block 405C', it can be seen that bi-directional transmission gate means 472*c* and 473*c* provide coupling between node Nc (408Bc) and respective terminals c2/FTc2 and c3/FTc3 of that lookup block. Fuses F10 and F11 respectively control the OE terminals of transmission gate means 472*c* and 473*c*. The f4C terminal of LUT+ block 405C' couples to node 408Ac of the associated per-register multiplexers 407*c*0/*c*1. The primary feedthrough signal, FTc0 may be selectively coupled into the associated per-register multiplexers 407*c*0/*c*1.

A bi-directional multiplexer/demultiplexer 471*c* (Bi-Dy De/Mux 471*c*) provides further coupling between dynamically selectable ones of the f4A, f4B, f4C and f4D terminals as well as unidirectional coupling from a so-called, {f6B} terminal. The latter terminal is the same as the FTc0/Sel2/D2 terminal but is renamed here to indicate its further function of allowing the folding-together of two six-term functions to thereby synthesize a function $f_Y$( . . . 7T) of up to seven independent input terms. The {f6B} signal may be acquired from adjacent interconnect lines of the illustrated GLB (B) including from direct-connect inputs. Fuses F9, F11 and F12 may be programmed to selectively place the Bi-Dy De/Mux 471*c* at least into one of the following four modes: (a) a 4:1 bidirectional and dynamic multiplexing and de-multiplexing mode which couples node Nc with a dynamically selected one of signals f4A, f4B, f4C, f4D (picked by the Sel0 and Sel1 control signals); and also correspondingly steers the GLB-WE signal unidirectionally to the corresponding LUT+ block; (b) a 5:1 unidirectional and dynamic multiplexing mode which couples to node Nc, a dynamically selected one of signals f4A, f4B, f4C, f4D and {6B} (where 6B is selected if Sel3 is true); (c) a 2:1 bidirectional and dynamic multiplexing and de-multiplexing mode which couples node Nc with a dynamically selected one of signals f4C and f4D (picked by the Sel1 control signal) and also correspondingly steers the GLB-WE signal to the corresponding LUT+ block; and (d) an all Hi-Z mode in which node Nc has essentially no coupling by way of the Bi-Dy De/Mux 471*c* to the f4A–f4D and {6B} terminals. Although not shown in detail, the internal structure of the Bi-Dy De/Mux unit, 471*c* may employ circuitry similar to that associated with unit 471*b* (425' and tristate drivers 449*a*, 449*b*) and some additional Boolean logic coupled to fuses F9, F11 and F12 for realizing the functions described here. Those skilled in the art should have no trouble determining how to do so in view of this disclosure.

We first examine the 4:1 Bi-Dy De/Mux mode of unit 471*c* in more detail. As should now be appreciated from FIG. 4C, the dynamically-controllable signals, Sel0 and Sel1 may be used for dynamically establishing a coupling between node Nc and a dynamically-selectable one of the signals on terminals f4A, f4B, f4C, and f4D. At the same time, the {6B} terminal sees unit 471*c* as a Hi-Z load. Also at the same time, if memory-mode is being used for the lookup blocks, the same dynamic selection signals, Sel0 and Sel1 will be used for routing the GLB-WE signal to a corresponding one of the WEa, WEb, WEc or WEd write-enable terminals of the respective lookup blocks A–D. If the dynamically selectable f4A, f4B, f4C, and f4D signals are moving towards the Nc node, then an $f_Y$(5T) or $f_Y$(6T) function signal may be synthesized from the input signals f4A–f4D when input replication is being carried out in the ISM-2 stage. Even if such input replication is not being carried out, unit 471*c* can be used simply to implement a 4:1 DyMux function if that is called for by the to-be-implemented design (see 301H of FIG. 3H). Moreover, because a 2:1 DyMux function (see 223 of FIG. 2C) can be implemented in each of LUT+ blocks 405A'–405D' without consuming the primary feedthrough terminals (Sel0–Sel3), a single GLB may be used to implement an 8:1 DyMux without consuming general interconnect. FIG. 4C shows one 2:1 dynamic multiplexer in dashed box 405A. 1 as an example for showing how the in-GLB, 8:1 DyMux can be implemented by configuring each of the LUT+ blocks 405A'–405D' to provide a 2:1 DyMux function (which DyMux function could include optional signal inverting plus, because FTa3 is free in FIG. 2C, some additional, front-end function that is dependent on one more input signal—the FTa3 input). If two or more GLB's each implements at least the in-GLB, 8:1 DyMux function and one of those GLB's has its Bi-Dy De/Mux 471*c* in the 5:1 DyMux mode, then a 16:1 dynamic multiplexer function can be provided by the pair by routing the 8:1 multiplexer output of a second of the GLB's into the FTc0/Sel2 terminal of the first GLB to serve as the {6B} signal. Larger dynamic multiplexers can be implemented by chaining together via the {6B} connection, a plurality of GLB's operating in the 5:1 Bi-Dy De/Mux mode.

We now examine the 5:1 Dy/Mux mode of unit 471c in more detail. As should now be appreciated from FIG. 4C, in the 5:1 mode, the dynamically-controllable, Sel3 signal can be used to pick the unidirectional {6B} signal (which is the same as the Sel2 signal) for output in place of the f4A–f4D signals. If Sel3 is true, the {6B} signal is coupled to node Nc. If Sel3 is false, one of the f4A–f4D signals—as selected by the Sel1 and Sel0 signals—is coupled to node Nc. Aside from enabling the above described, 16:1 or greater dynamic multiplexer functions, the 5:1 Bi-Dy De/Mux mode may be used more generically, simply for implementing a 5:1 DyMux if such is called for by the to-be-implemented design (see 301H of FIG. 3H). Moreover, because a second GLB from which the {6B} can be acquired—via the ISM-2 stage—can itself implement any Boolean function, $f_{\gamma'}$(6T) of up to 6 independent input term signals, the $f_{\gamma'}$(6T) of the second GLB can be folded-together with the f4A–f4D signals of the illustrated GLB to thereby synthesize any Boolean function, $f_{\gamma}$(7T) of up to 7 independent input term signals for presentation to the Nc node. Of course, input term signal replication should be carried out not only in each of the ISM-2 stages of the two GLB's but also as between those two GLB's in order to generate the $f_{\gamma}$(7T) function signal. Referring to the embodiment of FIG. 3A, it may be appreciated that the 7 independent input term signals may be easily carried to the respective two GLB's by various ones of the general interconnect lines, particularly if the two GLB's reside in a same column or same row. Moreover, for the embodiment of FIG. 3C, if GLB-B (391b') serves as the source of up to 4 of those 7 independent input term signals, and the {6B}-wise chained GLB's are defined by GLB-(B−1) and GLB-(B+1), then the W1, X1, Y1, Z1 outputs of GLB-B may be replicatively conveyed by their respective DCa–DCd direct-connect lines to GLB-(B−1) and GLB-(B+1). The Z1''' output of GLB-A may serve as the source of yet another replicatively conveyable and DC-carried input term signal to GLB-B. The W1''' output of GLB-A may serve as the source of yet another replicatively conveyable and DC-carried input term signal to GLB-B. 2xRL lines that each extend into or through the switchboxes of the 3 GLB's may be used in addition to and/or in place of the here mentioned, DC lines for providing the input-signal copying functions. Place-and-route software may be configured to firstly urge the use of such DC-based replicative conveying of input term signals so as to preserve use of the general interconnect for carrying other kinds of signals. Place-and-route software may be configured to secondly urge the supplemental or alternative use of the above described, 2xRL-based replicative conveying of input term signals so as to preserve use of longer general interconnect for carrying other kinds of signals. This of course, does not preclude the urged use of other GLB interconnect (e.g., 10xRL lines, MaxRL lines) when the place-and-route software detects that a same signal is to be conveyed to more than just the 3 here-described GLB's.

Referring still to FIG. 4C, we now examine the 2:1 Bi-Dy De/Mux mode of unit 471c in more detail. In this mode, the Sel0 and Sel3 controls are don't cares and only the Sel1 control terminal is operative to dynamically select which of the f4C and f4D signals will be bi-directionally coupled to the Nc node. In other words, in the 2:1 Bi-Dy De/Mux mode, unit 471c is functioning in essentially the same way as does the f4A/f4B steering unit (471b/425'/449a,449b) of per-register multiplexers 407b0/b1 except that it is the Sel1 signal rather than the Sel0 signal that is doing the steering and the steered signals are f4C and f4D rather than f4A and f4B. In the 2:1 Bi-Dy De/Mux mode, the {6B} terminal as well as the f4A and f4B terminals see unit 471c as a Hi-Z load. Also, if memory-mode is being used for the lookup blocks, dynamic selection signal, Sel1 will be used for routing the GLB-WE signal to a corresponding one of the WEc and WEd write-enable terminals of respective lookup blocks C and D. If unit 471b is also being used for dynamic steering of the GLB-WE signal, the latter unit will rely on Sel0 for routing the GLB-WE signal to a corresponding one of the WEa and WEb write-enable terminals of respective lookup blocks A and B as has already been described. Accordingly, if the dual-port mode is active (see fuse F16), the Sel0 and Sel1 signals will be usable for independently steering between the non-mirrored pairs: A/B and C/D. (Recall that A and C form one data-mirroring pair in dual-port mode while blocks B and D form another data-mirroring pair.) This enables independent read and write addressing to each of the LUT+ block 405A' –405D' in the dual-port mode.

Referring to the bottom LUT+ block in FIG. 4C, 405D', it may be seen that a similar and programmably-configurable routing means to that of block 405A' is provided for the signals that appear on respective nodes 408Ad and 408Bd of the here-referred-to as the "Z", per-register multiplexers 407d0/d1. The OE terminals of bi-directional transmission gates 472d and 473d are respectively controlled by fuses F14 and F15. For sake of example, the Z register-pair, 408d and 409d is shown coupled to the output of the Z, per-register multiplexers 407d0/d1. It is to be understood that the respective Z0 and Z1 outputs of the latter units may programmably bypass the illustrated registers. See for example, items 218 and 219 of FIG. 2C.

Figure 4D:
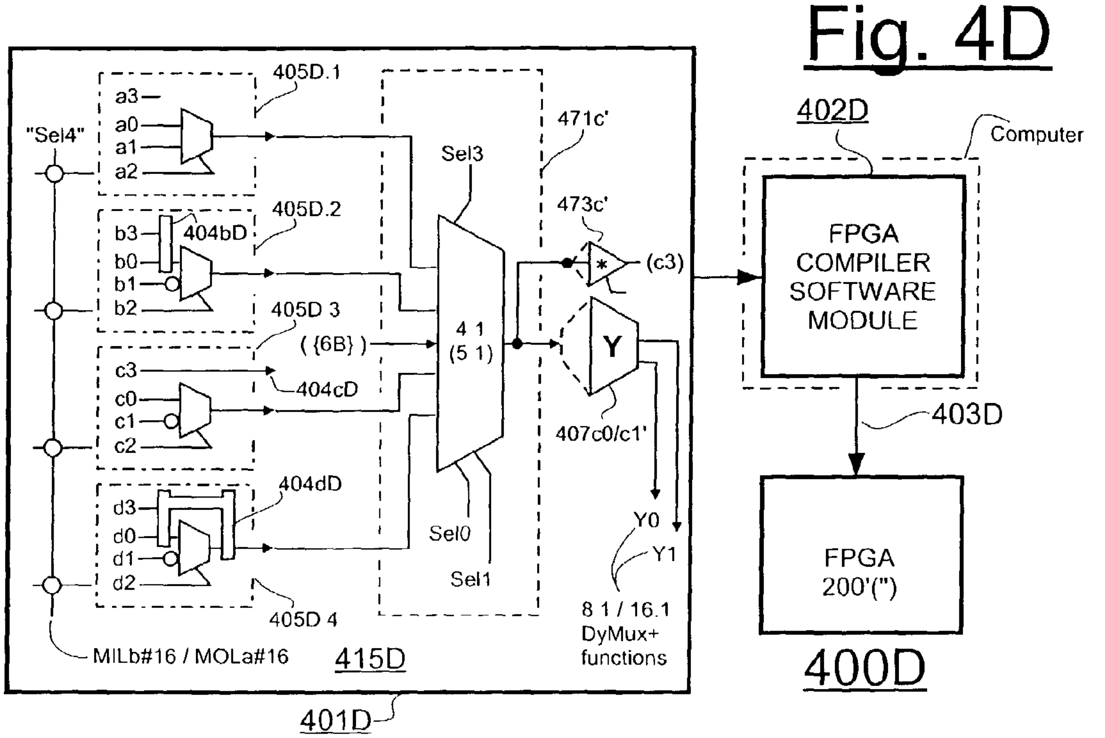
FIG. 4D diagrams a fourth possible design partitioning and implementing operation that seeks to exploit all or parts of the LUT resources and/or in-GLB dynamic multiplexing resources of an FPGA that is structured in accordance with the disclosure in order to compactly realize dynamic multiplexing design sections.
Figure 4E:
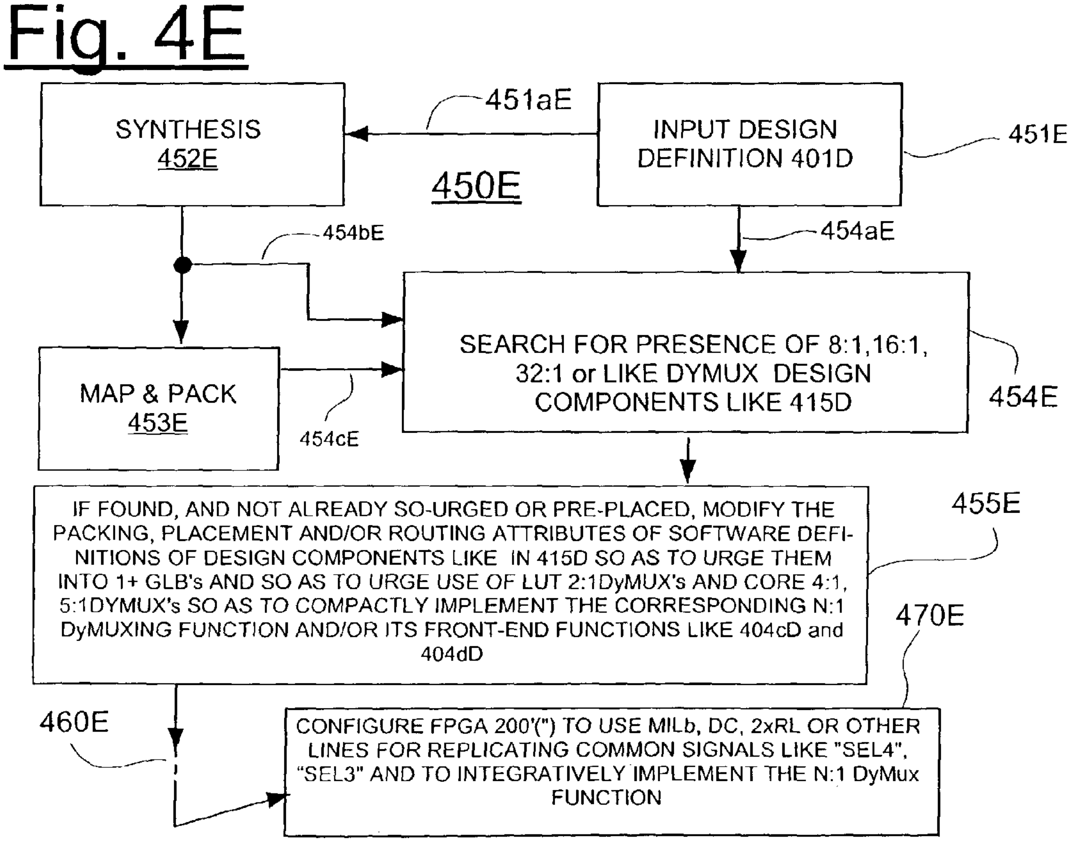
FIG. 4E flow charts a fourth possible set of place-and-route software operations that strive to conform with the implementation suggestions shown in FIG. 4D.

FIGS. 4D–4E correspond to the above described, design-opportunity and urging actions of respective FIGS. 2F–2G and 3F–3G and 3H–3I. Like reference symbols in the "400D/E" century series are used where practical in FIGS. 4D–4E so that extensive explanation of the underpinnings will not be needed here again. As in the case of FIGS. 3H–3I, the input design specification 401D of FIG. 4D does not generally include the pictorial suggestions as to where each design component will be placed and how signals will ultimately be routed. We are once more, optimistically predicting that dynamic-multiplexing sections of the design will be synthesized, mapped, partitioned and/or compactly placed in one or more GLB's while using GLB-internal, multiplexing resources such as Bi-Dy De/Mux471c of FIG. 4C and while also using feedthroughs (FT's) for carrying dynamic selection signals of the given dynamic-multiplexing section. More specifically, it is seen in region 415D that post-partitioning chunks of the input design specification 401D may be forced or urged towards including LUT-implemented, first dynamic-multiplexing sections 405D.1–405D.4 that each provide a 2:1 dynamic multiplexing function within a same GLB while outputs of such sections 405D.1–405D.4 are routed within the same GLB to an in-block, dynamic-multiplexing unit 471c' for further multiplexing. Because each of sections 405D.1–405D.4 can implement a 2:1 dynamic multiplexing function independently of the 4:1 or 5:1 dynamic multiplexing function implemented in section 471c', it is possible to compactly provide an 8:1 dynamic multiplexer function with just one GLB or a 16:1 dynamic multiplexer function with just two GLB's. In the latter case (16:1 DyMux), a second GLB (other than that represented by 415D) is to be configured in substantially a same way to carry out an 8:1 DyMux function whose output enters through the ISM stages of illustrated GLB 415D to become the {6B} input of section 471*c*' of that GLB415D, where section 471*c*' is configured to operate as a 5:1 DyMux.

Figure 4F:
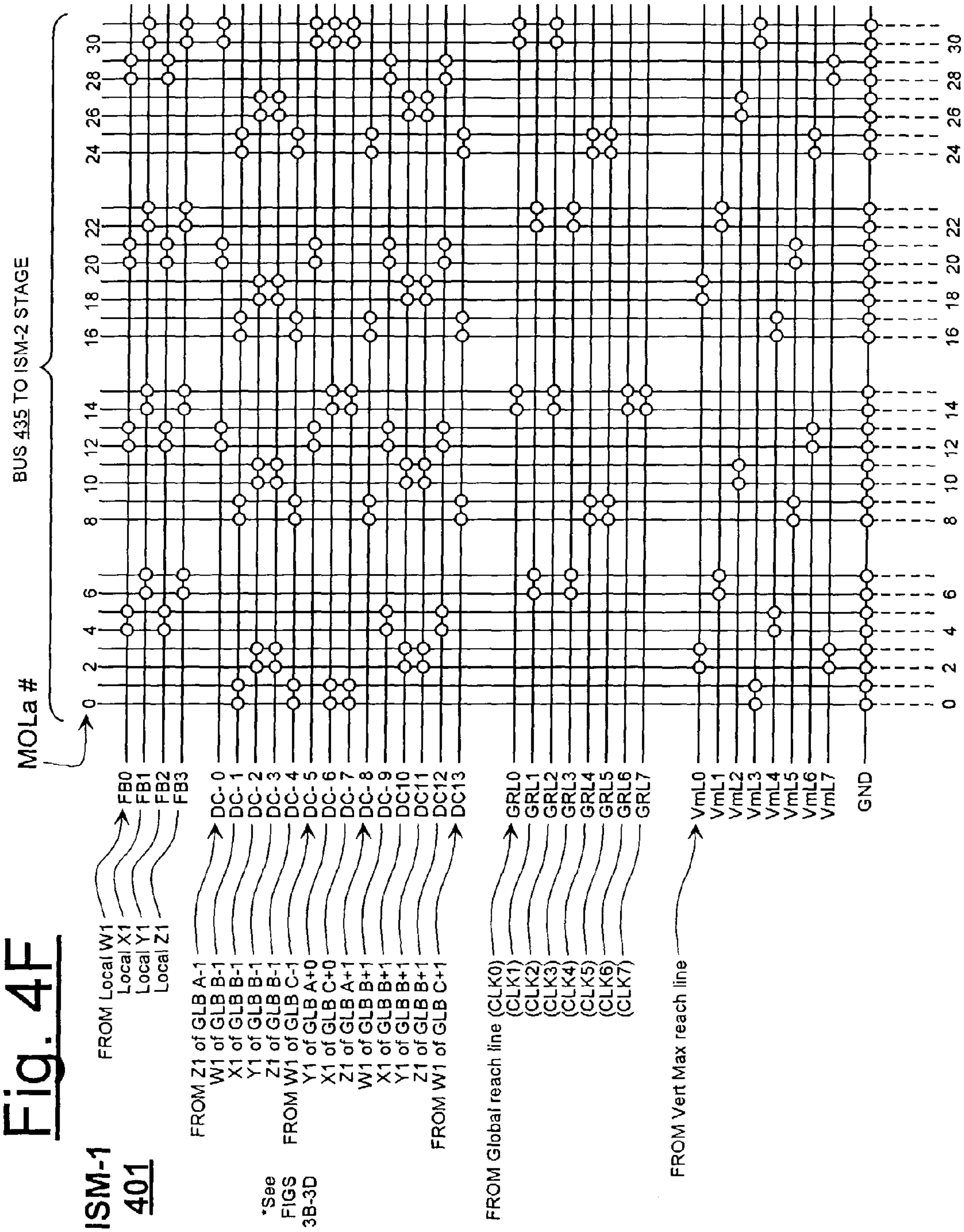
FIG. 4F illustrates a possible PIP populating scheme for a stage-1 input switch matrix (ISM-1) that may be used with embodiments of FIGS. 2A, 2C, 3A, 3B and 4A.

For either or both GLB's (the 8:1 case or the 16:1 case), the corresponding ISM-1 and ISM-2 stages are to be configured according to the illustration to provide a common, fifth selection signal (Sel4) in addition to the Sel0–Sel3 signals. In one embodiment, an ISM-2 line such as MILb#16 (of FIG. 4A, which same line extends in the embodiment from MOLa#16 of FIG. 4F) is used to transfer the Sel4 dynamic selection signal to respective terminals a2, b2, c2 and d2 of the respective four LUT+ blocks 405A'–405D' in the GLB. As seen in FIG. 4F, the corresponding MOLa#16 line can acquire the Sel4 signal from a direct-connect such as DC-1, DC-4, DC-8 and DC13 or from a MaxRL line such as VmL4.

In the case of the 2-GLB implementation of the 16:1 DyMux, the {6B} signal may be conveniently carried between the GLB's by a 2xRL line, or if otherwise appropriate, by a DC line or by another kind of interconnect line. The Sel3 signal (the one that determines whether the 5:1 multiplexer in section 471*c*' will select the {6B} signal for output or not) may similarly be carried between, and shared by, the GLB's by being transmitted along a 2xRL line or a DC line or by another kind of interconnect line.

In section 405D.1 of the illustrated example, the dynamically-changeable input-term signals on respective terminals a0 and a1 may be alternatingly switched between by flipping the state of Sel4 control signal. The a3 terminal is shown to be free for use as a secondary feedthrough to the W registers or their bypasses (218, 219 of FIG. 2C). In section 405D.2, a slightly more complex, 2:1 DyMux functionality is shown wherein b1 is additionally inverted and b0 is optionally transformed by function box 404bD (e.g., an XOR function) which is responsive to input signal b3. In a further variation, function box 404bD (e.g., an XOR function) can be also copied onto input b1 so that a two-bit, multiplexed compare operation may be carried out where b3 is XORred (for example) with b0 and thereafter, in a next clock cycle, b3 is XORred (for example) with b1. The GLB's feedback lines and state-storing registers may be used to facilitate such a multi-clock operation. Although not shown, the LUT-internal subfunction, 404bD may alternatively or additionally operate on the b2 signal prior to delivery of a b2-derivative signal to the selection control of the LUT-internal, 2:1 DyMUX in section 405D.2.

In exemplary section 405D.3 of FIG. 4D, the option is shown wherein the c3 terminal functions as a secondary feedthrough (404cD) that forwards its ISM-acquired signal through bidirectional gate 473*c*' to serve as one of the Y0 and Y1 outputs. This is why the illustrated GLB 415D may be though of as having a 8:1/16:1 DyMux "plus" capability. Not only can it compactly implement an 8:1 dynamic multiplexer by itself, or 16:1 dynamic multiplexer with the help of one more GLB (or a larger DyMux: 24:1, 32:1, etc.; if the {6B} cascading chain is continued to yet more GLB's), the illustrated GLB 415D can at the same time use its free secondary feedthroughs such as a3 and c3 for register recovery. In section 405D.4, the option is shown wherein the d3 terminal controls a function 404dD that is operative on either one or both of input d0 and the 2:1 multiplexer output. These and other like, variations may be scanned for and urged to occur by the map-and-pack, place-and-route software module 402D and then integratively included in the single or multi-GLB implementations together with the illustrated 8:1,16:1, etc. DyMux implementations represented by box 471*c*'. Of course, smaller DyMux implementations (e.g., 6:1, 14:1, etc.) may be implemented by using a fewer number of LUT+ blocks 405D.1 405D.4 as may be appropriate. Also, free primary or secondary (or tertiary, etc.) feedthroughs may be used for providing front-end signal registration in accordance with FIGS. 2F–2G.

The pictorial suggestions in box 415D of FIG. 4D are to be seen as suggesting what the partitioning and placement phases of software module 402D should be urged towards doing, namely, integratively compacting an 8:1 or 16:1 dynamic multiplexer (or a slightly smaller, 6:1, 14:1, etc. dynamic multiplexer function; or a larger DyMux function such as 24:1, 32:1, etc.; if the {6B} cascading chain is continued to more than 2 GLB's) into one or a few GLB's while optionally also integrating front-end functions such as inversion, 404bD and/or 404dD into the same GLB's where possible. The cascaded, {6B} signal connection preferably relies on use of 2xRL lines, but may also include use of one or a few direct-connect lines (DC's) in order to minimize signal propagation time through the implemented, N:1 DyMux and in order to minimize consumption of other, longer kinds of general interconnect lines. Although FIG. 4D shows an example that makes use of four 2:1 DyMUX's being implemented in respective LUT's 405D.1–405D.4 and it shows the in-block 4:1/5:1 multiplexer section 471*c*' providing dynamic selection among outputs of all four, DyMUX implementing LUT's 405D. 1–405D.4, it is possible to obtain benefit of the in-block 4:1/5:1 multiplexer section 471*c*' even if a fewer number the LUT's 405D.1–405D.4 internally implement 2:1 DyMUX's and/or if some of the respective f4A–D signals (see FIG. 4C) applied to in-block 4:1/5:1 multiplexer section 471*c* originate from in-block circuits other than the LUT's (see section 407*a**0 of FIG. 4B). It is also possible to provide inverted or otherwise transformed selection signals to some of the selection terminals of the 2:1 DyMUX's rather than supplying them all with the illustrated Sel4 signal.

FIG. 4E shows a software flow 450E which may be used for forcing or urging the realization of the pictorial suggestions of FIG. 4D in much the same manner as was explained for corresponding FIGS. 3G,I and 2G. It is understood that the machine-implemented operations of process 450E may encompass those of respective FIGS. 3G, 3I and 2G. The input design definition obtained in step 451E, and optionally, wholly or partly, synthesized in step 452E and/or mapped and packed in step 453E, is analyzed in step 454E and partitioning operations of the FPGA compiler 402D are then responsively urged, if conditions are appropriate, to form GLB-implementable multiplexing, registering and/or data-processing partitions such as represented by boxes 405D.1–405D.4 and 471*c*' in FIG. 4D. Where possible, the denser 16:1 or higher form of multiplexing that uses one or a cascaded chain of {6B} signals is preferentially urged over the option of having two or more GLB's, each implementing an 8:1 DyMux (or smaller approximation thereof) feeding into yet a third GLB (not shown) where the third GLB implements a 2:1, or higher, DyMux. The latter approach of using 3 or more GLB's tends to consume more ISM resources and/or general interconnect resources. In contrast, the {6B} cascade approach tends to consume fewer ISM and/or general interconnect resources (e.g., 2xRL lines). Although optimal benefits of using the in-GLB, Bi-Dy De/Mux 471*c*' are seen when implementing an 8:1 or higher form of dynamic multiplexing, the benefits can be seen even when implementing a 5:1 or higher form (e.g., 6:1) of dynamic multiplexing because the alternative of cascading through general interconnect is less attractive. After synthesis, mapping and/or partitioning occurs, step 454E searches the post-synthesis, post-mapping and/or initially-partitioned design definition for the presence of 1+ GLB implementable design components like 415D. In step 455E, those partitions which are not already so-urged or prepacked or pre-placed, into respective relative and/or absolute placements within the 1+ GLB's as suggested by the schematic of 415D may be re-mapped and/or re-packed or otherwise associated with appropriate attributes for urging their corresponding software objects towards respective packings and/or placements and/or in-GLB routings within the corresponding 1+ GLB's and/or within the corresponding multi-GLB DC clusters in accordance with what is pictorially represented in boxes 415D and described above. The routing control factors of these placed partitions (415D) may be preferentially urged to rely on secondary/tertiary feedthrough lines (e.g., a3, c3) for register recovery and to rely on FB and/or DC lines for carrying post-registration signals so that the primary feedthrough lines (Sel0–Sel3) are available for controlling the dynamic selection operations of unit 471*c*' (FIG. 4D).

In the case of the 2+GLB-implementing chunks, the routings for the {6*b*} signal, the Sel3, and/or the Sel4 signals may be encouraged to rely first on 2xRL lines, if available, or if not, on DC lines, before trying to make the connections of such inter-GLB couplings instead with longer-haul general interconnect lines.

Competing urging factors are understood to come into play within the intervening operations represented by program execution steps 460E. If the urging factors developed in step 455E are successful, then in step 470E the blank FPGA 200' will be programmably configured so that the post configuration FPGA (200'') uses 4:1 or 5:1 dynamic multiplexing units within the GLB's, such as suggested by 415D for carrying out wide-input dynamic multiplexing (e.g., 8:1, 16:1, 24:1 etc.).

Referring to FIG. 4F, one specific way of implementing the ISM-1 stage 401 is shown. Possible PIP placements for more relevant ones of the adjacent interconnect and intraconnect lines (e.g., feedbacks, direct-connects and global reach lines) are shown. It is to be understood that a wide variety of alternate PIP placements may be used while conforming with the principles of the present disclosure. In general, the PIP's should be distributed in a partially populating manner across ISM-1 stage 401 so as to substantially equalize capacitive loading on each of the multiplexer output lines (MOLa's) and multiplexer input lines (MILa's) of the first stage.

In the illustrated embodiment 401, the FB0 signal comes from the local W1 terminal and is selectively distributable to at least a desired one of MOLa's #4, #5, #12, #13, #20, #21, #28 and #29. As further seen, the FB1 signal is acquired from the local X1 terminal and is distributable at least to one of MOLa's #6, #7, #14, #15, #22, #23, #30 and #31. Thus, FB0 and FB1 may be simultaneously passed through bus 435 to the associated ISM-2 stage, and more specifically to corresponding terminals A0, A1, FTa0; B0, B1, FTbO; . . . of the W, X, Y and Z CBB's. A similar arrangement is provided for respectively acquiring the FB2 and FB3 signals from the local and respective Y1 and Z1 terminals of the local GLB. Each FB signal of the illustrated ISM-1 stage 401 has at least 8 ways of being programmably routed to bus 435 and thereby into the ISM-2 stage. Note that the banded distribution of PIP's in FIG. 4F combines with that of FIG. 4A to enable the routing of a same control signal to any two or more of the Sel0, Sel1, Sel2 and Sel3 lines (primary feedthrough lines). The banded distribution of PIP's additionally (or alternatively) with that of FIG. 4A to enable the routing of a same input term signal to any two or more of the four LUT+blocks 405A'–405D'.

FIG. 4F further shows possible PIP distributions for the 14 direct-connect inputs (DC0–DC13). As can be seen, each DC signal of the illustrated ISM-1 stage 401 has at least 6 ways of being programmably routed to bus 435 and thereby into the ISM-2 stage. Also, the PIP distributions for DC-1 through DC-4 (which carry respective signals from GLB (B−1)) are such that all 4 signals can be concentrated into any one of at least three of the 4 bands defined by MOLa's #0–7, #8–15, #16–23 and #24–31 or distribute across those bands.

FIG. 4F further shows possible PIP distributions for the 8 global-reach inputs (GRL0–GRL7). As can be seen, each GRL signal (also referred to as a global CLK signal) of the illustrated ISM-1 stage 401 has at least 4 ways of being programmably routed through the ISM-1 stage and onto bus 435 and thereby into the ISM-2 stage. For sake of example, FIG. 4F further shows possible PIP distributions for some of the vertical MaxRL line inputs, denoted as VmL0–VmL7. As can be seen, each vertical MaxRL signal (also referred to as a VmL signal) of the illustrated ISM-1 stage 401 has at least 4 ways of being programmably routed onto bus 435 and thereby into the ISM-2 stage. Similar accessibilities of at least 4:1 are provided for others of the MaxRL lines (not shown) and the 2xRL lines (not shown). It may be appreciated from FIG. 4 that the PIP placement are distributed in a partially-populating and substantially uniform manner so that signal propagation delay through the ISM-1 stage for the FB, DC, GRL, VmL and other signals (HmL's, 2xRL's, not shown) will be generally about the same but not excessive as it might be if a fully-populated PIP scheme were used. Because various ones of the input signals respectively have at least 8, 6 or 4 ways to each be routed to inter-stage bus 435, the place-and-route software has a fairly good degree of flexibility in trying to acquire a locally-desired subset of the signals on the adjacent intra/interconnect lines (FB's, DC's, 2xRL lines, etc.) and to route the acquired signals onto the inter-stage bus 435. If a given MOLa line of the ISM-1 stage is not carrying a valid signal, the corresponding PIP on the GND line of FIG. 4F should be activated to thereby ground that MOLa line and prevent propagation of transient noise.

Figure 5A:
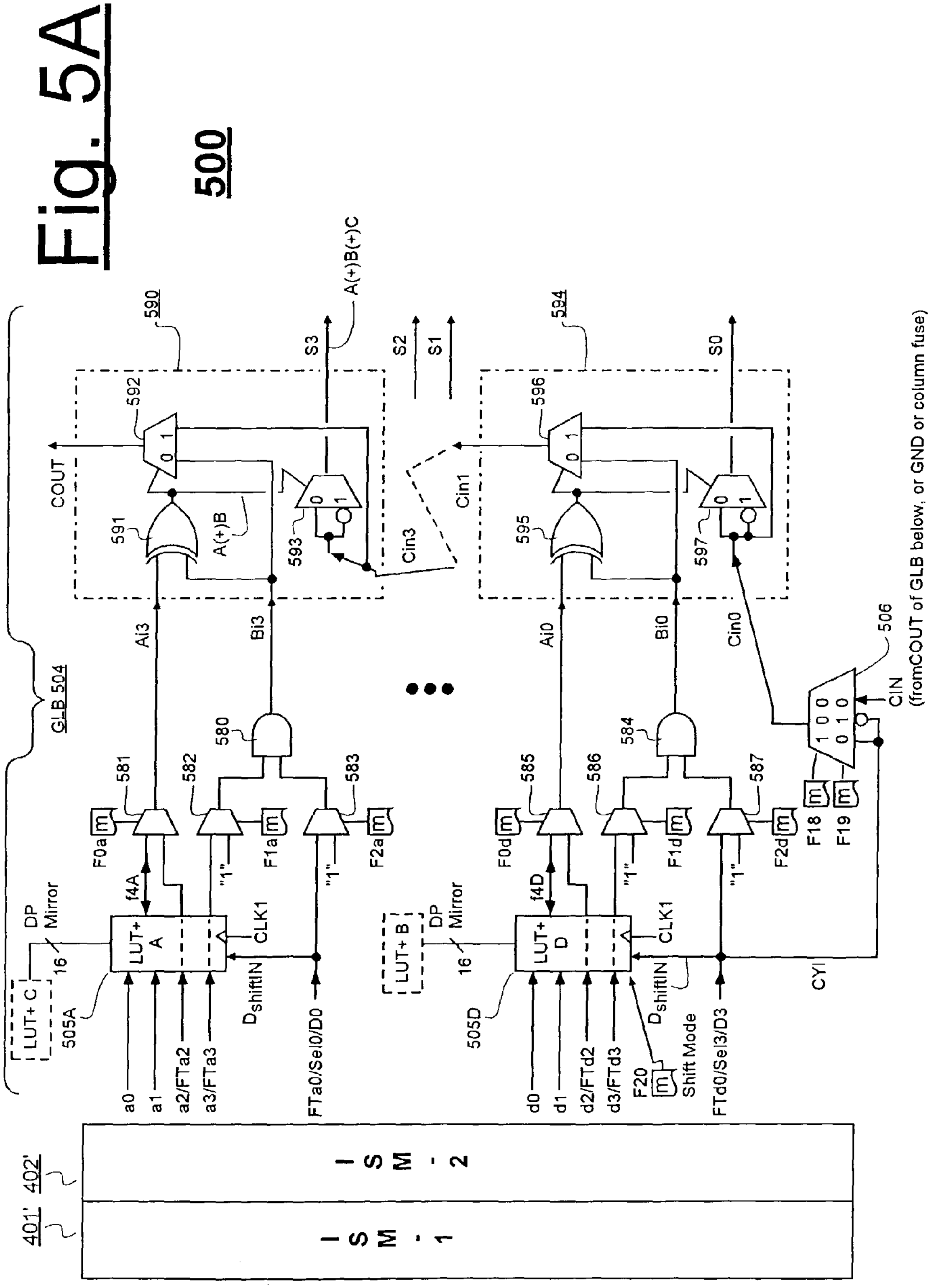
FIG. 5A shows how GLB-internal, sum and carry generation in one embodiment may be carried out.

Referring to FIG. 5A, one possible implementation 500 of a carry propagating and sum-forming chain is shown. Where practical, like reference symbols in the "500" century series are used for elements having corresponding references within the "400" century series in FIG. 4C. All GLB resources are not shown so as to avoid illustrative clutter. It may be seen from the illustration that a first multiplexer, 581 can couple either one of the f4A signal or FTa2 feedthrough signal to input Ai3 of carry-chain block 590 in response to appropriate setting of fuse F0*a*. An in-GLB AND gate 580 can couple either one of the FTa3 feedthrough signal or the FTa0 primary feedthrough signal, or the Boolean product of the latter two signals or a logic "1" to input Bi3 of the carry-chain block 590 depending on the settings of respective fuses F1*a* and F2*a*, where the latter are respectively coupled to illustrated multiplexers 582 and 583.

Within the top carry-chain block 590 of the illustrated GLB 504, gate 591 generates the exclusive-OR (XOR) of the Ai3 and Bi3 signals and supplies that XOR result to the selection control terminals of dynamic multiplexers 592 and 593. If A(+)B=1, then multiplexer 592 outputs the Cin3 signal as the COUT signal. If A(+)B=0, then multiplexer 592 instead outputs the Bi3 signal as the COUT signal. Because of the way the inverting and non-inverting inputs are arranged on dynamic multiplexer 593, its corresponding output S3 represents the exclusive OR of the Ai3, Bi3 and Cin3 signals (S3=A(+)B(+)C ). It may be shown that the illustrated carry-chain block 590 therefore correctly outputs the corresponding sum bit S3 and carry output bit COUT for the supplied summation input terms Ai3, Bi3 and Cin3.

Other carry-chain blocks of the represented GLB 504 are similarly organized. The bottom-most LUT block in the GLB, 505D' is shown for completion with its corresponding carry-chain block 594. As can be seen, the in-GLB, carry-inputting multiplexer, 506 provides the $Cin_0$ signal to the inverting and non-inverting inputs of dynamic multiplexer 597 as well as to the "select-on-1" input of dynamic multiplexer 596. XOR gate 595 drives the selection terminals of multiplexers 596 and 597. Multiplexer 585 provides the Ai0 signal to one input of XOR gate 595 while AND gate 584 supplies the Bi0 signal to the other input of gate 595. Two inputs of AND gate 584 are respectively selected by multiplexers 586 and 587 in response to the setting of respective fuses F1*d* and F2*d*. Fuse F0*d* controls multiplexer 585. For further sake of completion, the 16-bit data-mirroring coupling which is used for dual-port memory mode is shown between LUT blocks A and C as well as between blocks B and D. It is also shown that the primary feedthrough line of each respective LUT+ block supplies the corresponding data-shift-input signal to that LUT+ block for shifting in synchronism with the GLB's CLK1 clock signal.

From the broad overview of FIG. 5A, it should be apparent that the illustrated combination of input switching matrices (ISM's) 401'–402', lookup tables (LUT's) 505A–505D and carry-chain blocks 590–594 may be programmably configured to provide a number of different functions including those which involve the addition or subtraction of binary numbers (where subtraction also contemplates comparison). If the latter subtraction operation is desired, polarity reversal may be carried out in the lookup tables and the appropriate polarity of the carry input may be provided through programming of multiplexer 506 or otherwise. The CIN bit of the lowest GLB in a column of such GLB's may be grounded or driven by a corresponding column fuse or driven by the top COUT line of another column or programmably defined to include two or more such options.

Figure 5B:
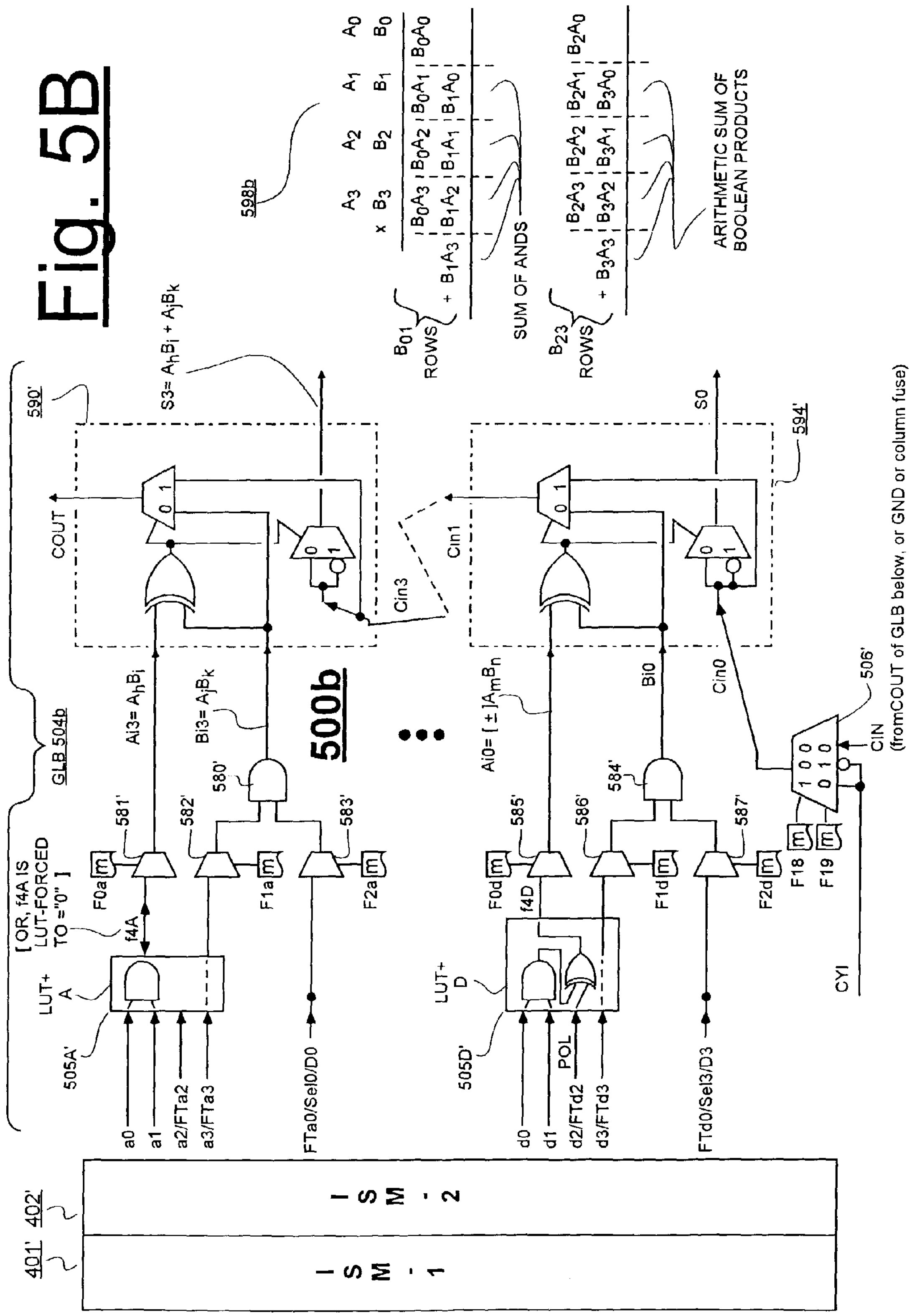
FIG. 5B illustrates a possible configuration of the LUT's and carry-chain of FIG. 5A for realizing an arithmetic sum of Boolean products.

Referring to FIG. 5B, there is shown one particular configuration 500*b* which is useful in the processing of array multiplication algorithms and the like. An example of an array multiplication operation is shown at 598*b*. A first 4-bit binary number is shown as $A_3A_2A_1$ A0 where $A_3$ is the most significant bit. A second 4-bit binary number is similarly represented by $B_3$ $B_2$ $B_1$ B0. As can be seen, a first pair of rows (designated as the $B_{01}$ rows) may be generated in accordance with conventional multiplication techniques where the members of these $B_{01}$ rows represent the Boolean AND's of the $B_0$ and $B_1$ terms multiplied against the bits of the multiplicand row, $A_0$–$A_3$. The generation of the final arithmetic product ($A_{0-3}$ times $B_{0-3}$)may be seen to include the generation of an arithmetic sum of Boolean products. For example, in the case of the illustrated $B_{01}$ rows, the Boolean product terms in the more significant (left) four columns need to be subjected to an arithmetic summation operation. The $B_0$ $A_0$ product term in the rightmost column does not receive a carry in this example from a less significant column and therefore does not need to be included in the arithmetic summation operation. The $B_1A_3$ term in the leftmost column, on the other hand, may receive a carry bit from the column to its right, it may then generate a carry bit of its own, and therefore the $B_1A_3$ term should be included in the arithmetic summation process.

GLB 504*b* is shown to be configured in FIG. 5B for providing simultaneous generation of the Boolean product terms and the subsequent arithmetic summing of these Boolean combinatorial terms. Accordingly, LUT+ block 505A' is shown to be configured to implement a 2-input AND operation whose results are passed through multiplexer 581' so that summation input term Ai3 represents a first Boolean product such as, in the example shown at 598*b*, the $B_1$ $A_3$ term. Accordingly, the MSB input term, Ai3 is shown as representing the Boolean product, $A_h \cdot B_i$, where the input terms Ah and B1 are appropriately acquired via ISM stages 401', 402' and respectively presented to terminals a0, a1 of LUT 505A'. In similar fashion, two further input terms, $A_j$ and $B_k$ are supplied through ISM stages 401'–402' for presentation to the FTa3 and FTa0 feedthrough terminals and for subsequent passage through respective multiplexers 582', 583' and for Boolean multiplication in AND gate 580'. The S3 output signal of the illustrated, top carry-chain block 590' may accordingly be considered as representing the combinatorial and arithmetic result, $S3=A_h \cdot B_i + A_j \cdot B_k$.

In one variation, the virtual AND gate that is shown to be simply implemented within LUT 505A' may be replaced by a NAND gate or its Boolean equivalent so that the Ai3 term is in 2's complements format and subtraction is carried out instead of addition. Despite what is shown in block 505D', the internal configuration shown within block 505A' may be similarly copied to the other three LUT's of GLB 504*b* together with the corresponding fuse programmings for multiplexers such as 585', 586' and 587'. The corresponding sum bits of decreasing significance, namely, S2, S1 and S0 will therefore represent the arithmetic sum results for their respective and progressively less significant bit positions. Given that the most significant Boolean product, $B_1A_3$ of the exemplary $B_{01}$ rows shown at 598*b* is not arithmetically summed with another such Boolean product, in one further variation the top LUT block (505A') corresponding to the most significant result bit S3 may be programmed to output the fixed result signal of f4A="0" rather than a Boolean product. The carry input, Cin3 may nonetheless be added to the $A_j \cdot B_k$ output of AND gate 580' to thereby generate the correct S3 and COUT signals from the most significant carry-chain block 590'.

Another possible configuration for one or more of the LUT blocks in GLB 504*b* is illustrated within the representation of LUT block 505D'. Here, the d2/FTd2 terminal is being used to carry a dynamic, polarity-selecting signal (POL) to a virtual exclusive OR gate (XOR) that is implemented within block 505D' where the other input of the XOR receives the Boolean product of the signals carried on terminals d0 and d1. As a result of this variation, the signal output by multiplexer 585' may be dynamically inverted or not, in accordance with the state of the POL signal. The polarity of the CIN signal coming through multiplexer 506' may be dynamically or fixedly controlled as desired by bringing that CIN signal from the COUT terminal of a preceding GLB (e.g., the GLB immediately below), where that preceding COUT signal may be dynamically controlled, for example, in accordance with the below-described FIGS. 5D and 5E. The dynamic polarity controlling configuration that is illustrated within box 505D' of FIG. 5B may of course be also copied to one or more of the other LUT's in GLB 504*b* as desired.

Those skilled in the art will recognize from the disclosure herein that the LUT blocks 505A'–505D' may be further configured in a variety of other ways to provide for the compact production of the arithmetic sum (addition or subtraction) of binary signals whose bits are the results of Boolean combinatorial operations such as AND, NAND, NOR, XOR, etc. Accordingly, the configuration 500*b* represented in FIG. 5B may be usefully employed to provide a compact implementation of circuit designs that are to provide arithmetic sums of combinatorially-generated binary signals.

Figure 5C:
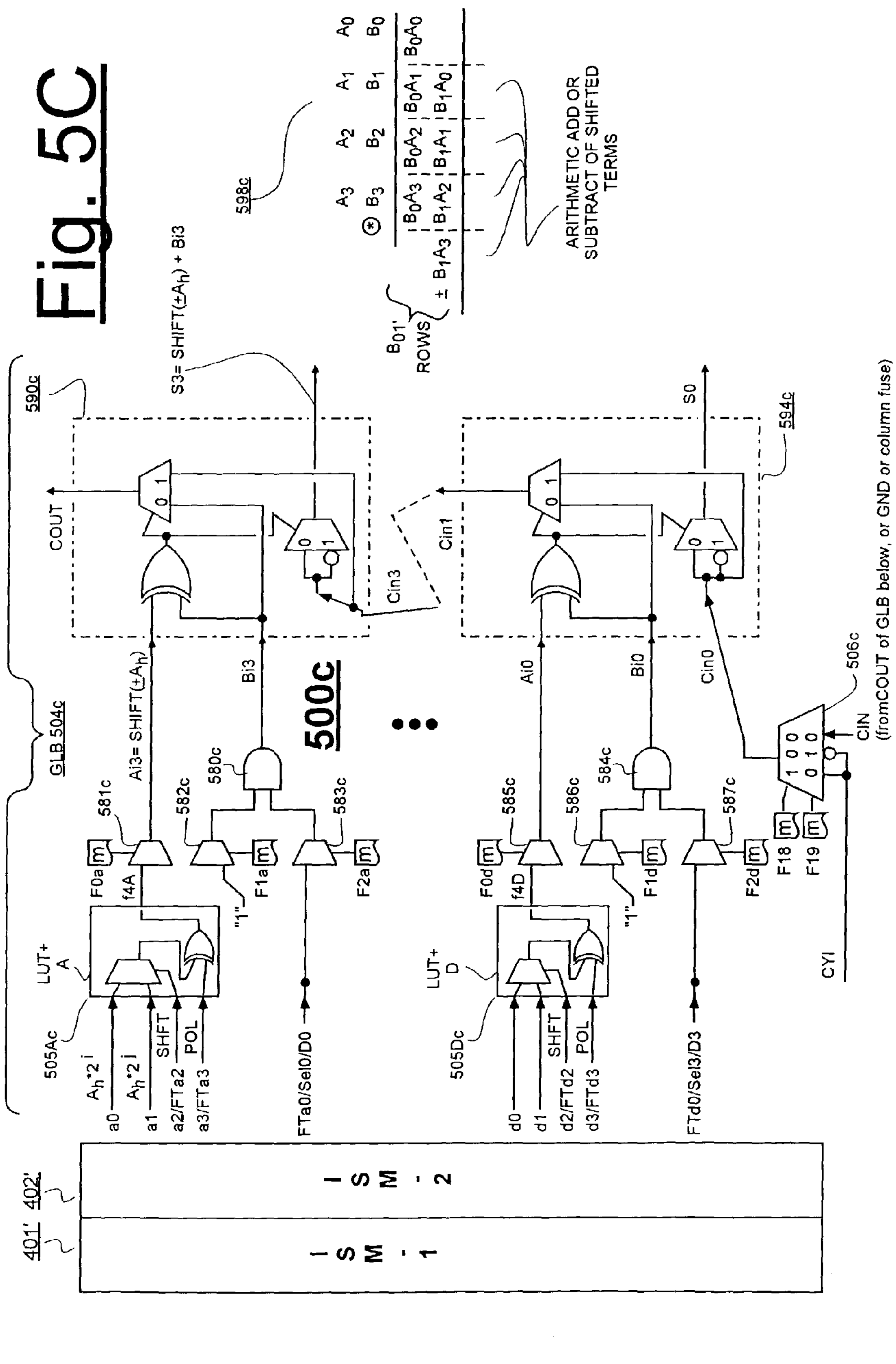
FIG. 5C illustrates a possible configuration of the LUT's and carry-chain of FIG. 5A for realizing an arithmetic sum of variably shifted and/or inverted input terms.

FIG. 5C shows yet another configuration, 500*c* of the base circuit 500 shown in FIG. 5A. Referring to area 598*c* of the drawing, it is indicated there that certain array processing functions may include the arithmetic summation of shifted terms. The shift amount may be a run-time variable. LUT 505Ac of GLB 504*c* is accordingly shown to be programmed to implement a dynamic multiplexer whose inputs represent differently-shifted versions of a same signal (Ah) or different signals (not explicitly shown). In the illustrated example, terminal a0 carries a first shifted-version $A_h*2^i$ of an external signal, Ah where the corresponding first shift amount, i, can be any integer including zero. The first shifted signal, $A_h*2^i$ may be acquired through the ISM stages 401'–402' as appropriate and this routed and selective acquisition may include use of direct-connect lines (DC's) for providing some or all of the desired shift amount, i. Similarly, the a1 terminal of LUT block 505Ac may receives yet another shifted version, $A_h*2^j$ of an external signal, $A_h$ where the corresponding second shift amount, j, can also be any integer as may be appropriate, including zero. The a2 terminal in the illustrated example carries a dynamic shift-amount selecting signal, SHFT which operates the virtual dynamic multiplexer within LUT 505Ac to thereby select either the first shifted signal, $A_h*2^i$ or the second shifted signal, $A_h*2^j$ for submission to the virtual XOR gate shown implemented in LUT 505Ac. Also, in the illustrated example, terminal a3 carries a dynamic polarity-selecting signal POL which is applied to the other input of the virtual XOR gate. The corresponding f4A signal passes through multiplexer 581*c* so that the Ai3 signal represents a variably shifted and optionally inverted version of the $A_h$ signal. The Bi3 addend passes from the primary feedthrough line FTa0 and through multiplexer 583*c* as well as through gate 580*c*. Multiplexer 582*c* is programmed to pass a logic "1" to the other input of AND gate 580*c*. As a result, the summation output S3 of carry-chain block 590*c* may represent the arithmetic sum of a Bi input number with a variably shifted and optionally inverted second number-representing signal, Ai. GLB 504*c* therefore can provide a compact implementation for array processing functions wherein it is desirable to form an arithmetic sum of terms and wherein at least one of the terms is to be variably shifted.

Those skilled in the art will realize from the present disclosure that numerous other programmably-defined configurations for the illustrated LUT blocks 505Ac–505Dc may be used as appropriate. For example, if run-time polarity selection (POL) is not desired, the secondary feedthrough line FTa3 of FIG. 5C may instead be used to convey a binary masking bit through multiplexer 582*c* into AND gate 580*c*. See the routing path used for the FTa3 signal through multiplexer 582' in the example of FIG. 5B.

Figure 5D:
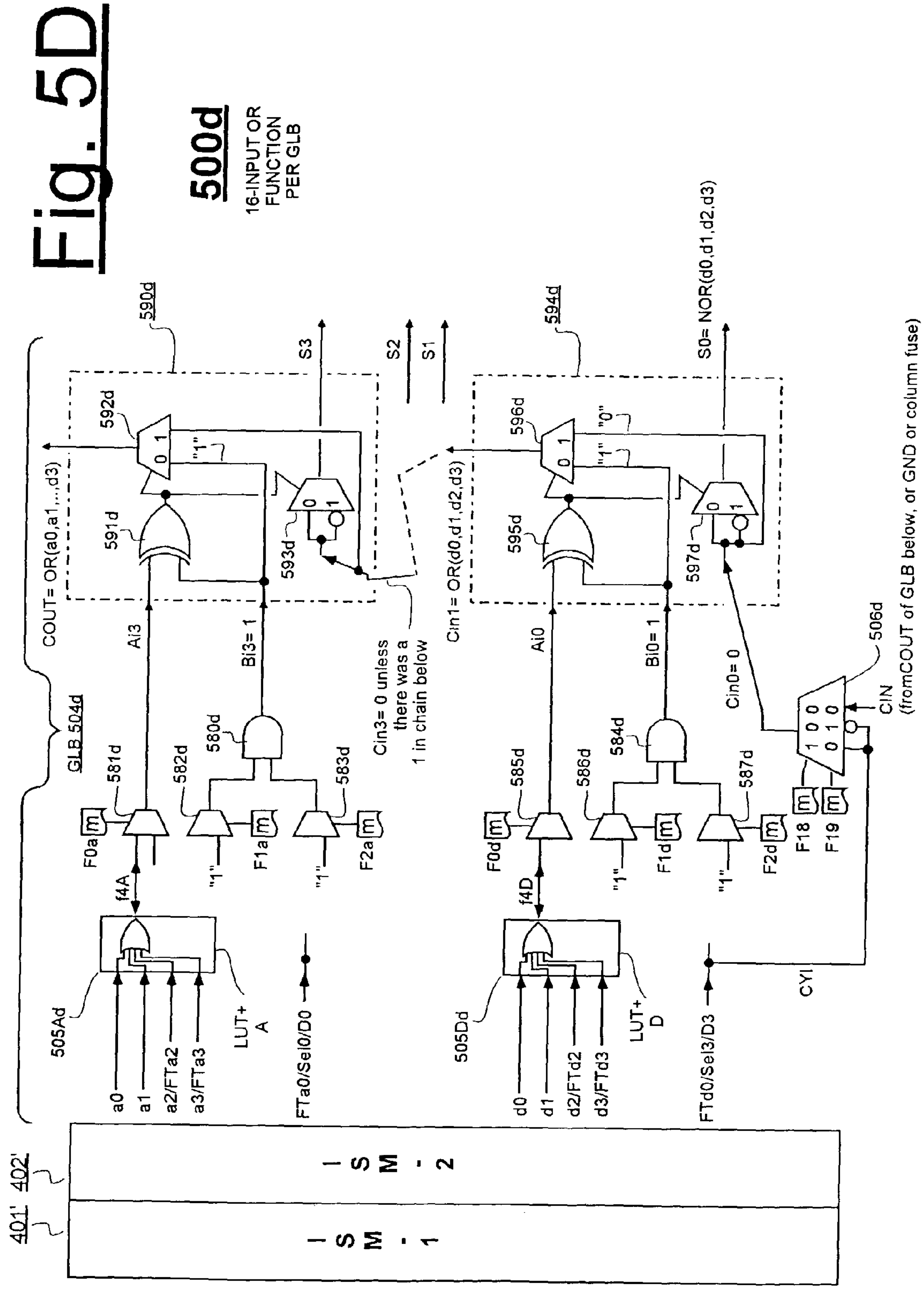
FIG. 5D illustrates a possible configuration of the LUT's and carry-chain of FIG. 5A for realizing a wide-input AND function and/or a high-density compare function.

FIG. 5D shows yet another use for the combination of the carry-chains and LUT blocks of FIG. 5A. In the illustrated configuration 500*d* of GLB 504*d*, each LUT+ block 505Ad–505Dd is configured as a 4-input OR gate whose Boolean output (e.g., f4A) passes through a respective multiplexer such as 581*d* to become an addend bit (e.g., Ai3) of the corresponding carry-chain block (e.g., 590*d*). The other addend bit (e.g., Bi3) is forced to logic "1" by passing corresponding logic "1" signals to the respective AND gate (e.g., 580*d*) from respective multiplexers such as 582*d* and 583*d*. Referring to the least significant block 594*d* in the illustrated GLB, it can be seen that the carry bit input, Cin0 for that block is forced to logic "0". This can be done with any one of the signals passed through multiplexer 506*d* and with appropriate configuration of the source for that signal. Because Bi0=1, the output of XOR gate 595*d* represents the inversion of the 4-input OR result, f4D. A constant "1" level is present at the select-on-zero input of multiplexer 596*d* while a complementary "0" level is present at the select-on-one input of the same multiplexer 596*d*. In this configuration, multiplexer 596*d* operates as if it is inverting the output of XOR gate 595*d* and the resulting carry bit output, Cin1 of multiplexer 596*d* therefore represents the Boolean OR of input signals d0, d1, d2 and d3. Given the select-on-0 and select-on-1 configuration present at the inputs of multiplexer 597*d* and that $Cin_0$ is forced to "0", the inverted OR result output by XOR gate 595*d* is essentially passed out as the S0 signal of block 594*d*. In other words, signal S0 represents the NOR function of the d0, d1, d2 and d3 input signals.

In higher-up blocks of the carry chain (e.g., block 590*d*) the following condition occurs. The select-on-zero input of multiplexer 592*d* is constantly at logic "1". The select-on-one input of multiplexer 592*d* will be at logic "0" as long as a logic "1" carry bit did not develop in the chain below. Thus, if Cin3 equals "1", both inputs of multiplexer 592*d* will be at logic "1" and the final output COUT of GLB 504*d* will be a logic "1". Otherwise, for the same reasons applied to block 594*d*, the COUT output signal will represent the Boolean OR of respective input signals a0, a1, a2, and a3. More generally speaking, the COUT output of this configuration represents the Boolean OR of all 16 input signals, a0, a1, . . . d2, d3 of GLB 504*d*. Accordingly, a 16-input OR function may be compactly implemented with a single GLB. If desired, successive GLB's of a given GLB column may be strung togther along their carry chains to construct even wider OR gates as may be desired. Although not shown, it should be apparent from the present disclosure that some or all of the illustrated LUT+ blocks may be alternatively configured to implement 3-input or 2-input OR gates and/or to alternatively or additionally implement other logic operations before the in-LUT ORring operation takes place (e.g., XORring pairs of the input bits and then ORring the XOR results—see 505E* of FIG. 5E) or in place of the in-LUT ORring operation. A logic "1" to any carry-chain "A" input such as Ai0–Ai3 forces a carry=1 condition into the chain as a result of the consistent B=1 configuration forced along the chain's blocks. That is why the chain in essence performs a Boolean OR operation on it's "A" inputs.

Figure 5E:
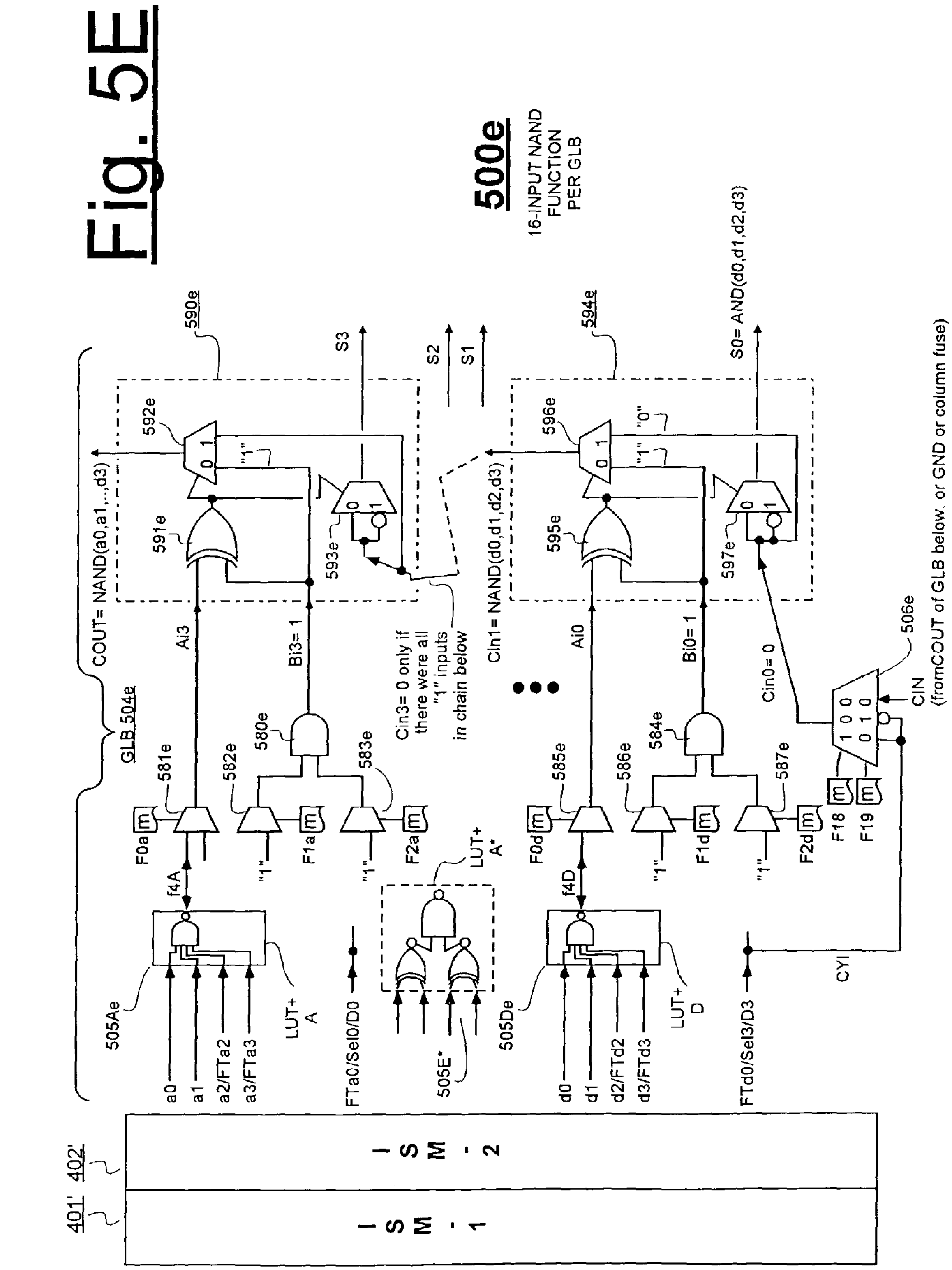
FIG. 5E diagrams a fifth possible design partitioning and implementing operation that seeks to exploit all or parts of the LUT resources and/or in-GLB carry-chain resources of an FPGA that is structured in accordance with the disclosure in order to compactly realize design sections that use arithmetic sums of Boolean-wise combined terms (e.g., Boolean product terms) and/or that can use other carry-chain based functions.

Referring to FIG. 5E, it may be seen that a wide-input NAN D gate may be implemented under this chain-breaking approach with the illustrated configuration 500*e*. Each of LUT blocks 505Ae–505De is configured as a 4-input NAND gate. COUT then represents the ORring of the f4A–f4D individual NAND outputs, which under DeMorgan's theorem is equivalent to the NAND of all 16 input terms, a0, a1, d3 supplied to GLB 504*e* by way of ISM stages 401'–402'. Wider-input NAND gates may be implemented by chaining together the carry chains of like-configured GLB's as may be desired. Although not shown, it should be apparent from the present disclosure that some or all of the illustrated LUT+ blocks may be alternatively configured to implement 3-input or 2-input NAND gates and/or to alternatively or additionally implement other logic operations before the in-LUT NAN Ding operation takes place (e.g., the XNOR-ring of pairs of the input bits such as shown at 505E*) or in place of the in-LUT NANDing operation.

Referring to the one variation on the wide NAN Ding scheme which is shown at 505E*, it is seen that each LUT+ block (e.g., block A*) may be programmed to perform a 2-bits versus 2-bits compare operation, where the illustrated NAND gate which receives inputs from the illustrated XNOR gates, outputs a logic "0" only when the compared bits are equal. Thus COUT will be "0" only if all compared bits are equal. Note that each LUT+ block is comparing 2-bits versus 2-bits rather than 1-bit versus 1-bit. That is double the per-LUT bit-density that would be realized by using a straightforward subtraction to compare two binary strings. Thus, if a given design needs to merely test whether two parallel binary strings are equal or not, rather than also determining which string is larger, smaller, or by how much, the combination of the carry-chain and the 2-bits versus 2-bits compare operation represented by 505E* offers a more compact way for realizing such an operation. LUT's, feedthroughs or other resources that would have otherwise been consumed by the straightforward subtraction approach may be freed to perform other functions. Note that the ISM stages 401'–402' allow for shuffling of bit significance as may be desired. Thus, if desired, the more significant ones of to-be-compared bits may be routed to the lowest carry-chain comparator (e.g., 594*e* of bottom-most GLB in a GLB column) while the lesser significant ones of to-be-compared bits may be ordered closer to the top of the carry-chain column. Such an arrangement may be used to roughly determine the magnitude of difference between compared strings by detecting where along the chain the COUT's flip from being "0" (meaning the compared bits still match) to being "1's".

Figure 5F:
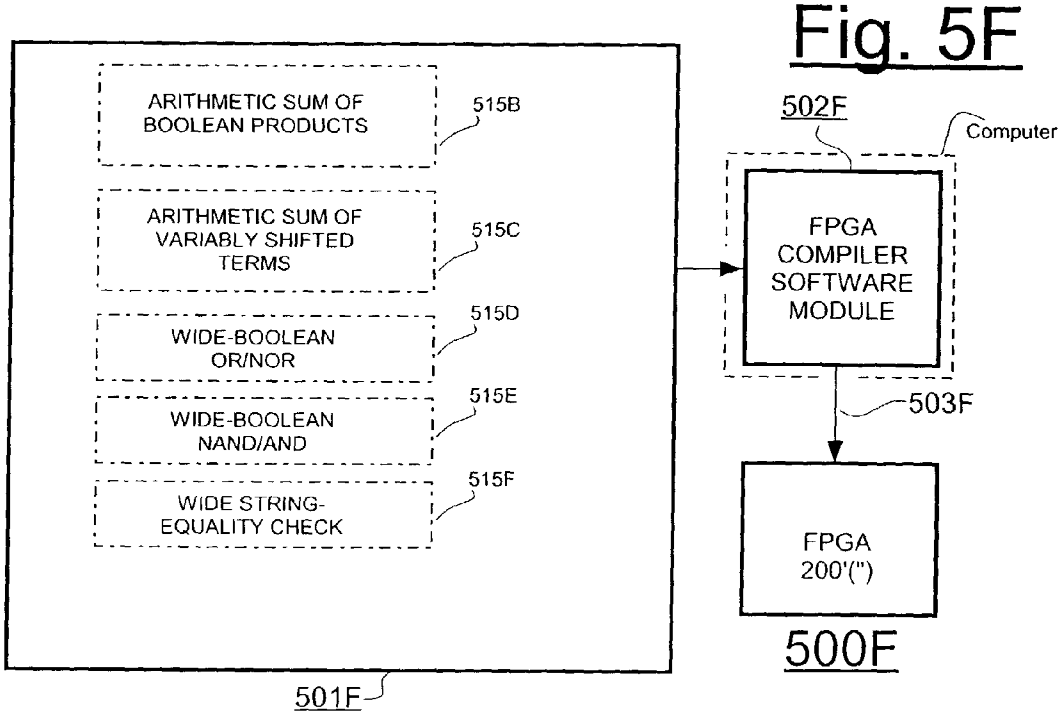
FIG. 5F flow charts a fifth possible set of place-and-route software operations that strive to conform with the implementation suggestions shown in FIG. 5E.

Referring to FIG. 5F, it has been shown that carry-chain resources such as those shown in FIG. 5A may be combined with other GLB resources to provide efficiently-compacted implementations of generating arithmetic sums of Boolean products (FIG. 5B), generating arithmetic sums of variably shifted terms (FIG. 5C), implementing wide-input Boolean sum functions (FIG. 5D), implementing wide-input Boolean multiplication functions (FIG. 5E) and implementing Boolean string comparators (e.g., 505E*). Given this, map-and-pack, place-and-route software may be configured to recognize opportunities for such efficient implementation during one or more of the software's following phases: design-synthesis, primitives mapping, GLB-packing, GLB-{relative and/or absolute} placing, and interconnect routing; and to automatically create urging factors which urge ultimate configuration into using the carry-chain resources in accordance with an appropriate one or more of FIGS. 5B–5D.

Figure 5G:
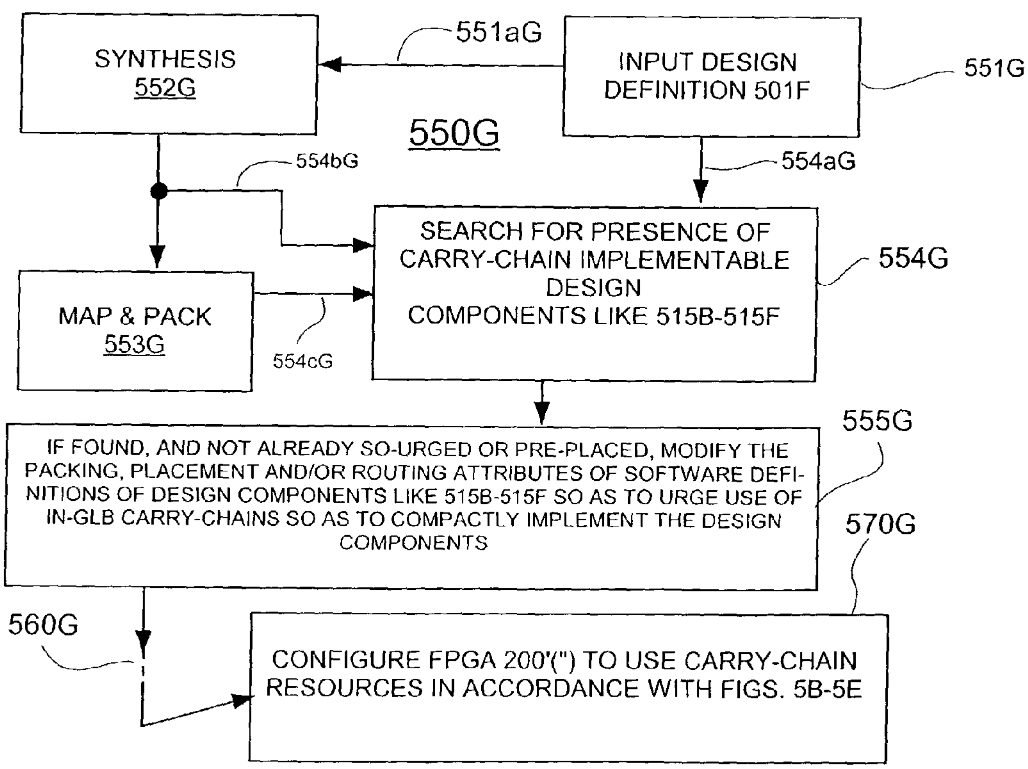
FIG. 5G diagrams a sixth possible design partitioning and implementing operation that seeks to exploit in-GLB carry-chain resources of an FPGA that is structured in accordance with the disclosure.

FIGS. 5F–5G correspond to the above described, design-opportunity and urging actions of respective FIGS. 2F–2G and 3F–3G, 3H–3I and 4D–4E. Like reference symbols in the "500F/G" century series are used where practical in FIGS. 5F–5G so that extensive explanation of the underpinnings will not be needed here again. As in the case of the earlier described map, place-and-route operations, the input design specification 501F of FIG. 5F does not generally include the illustrated suggestions (515B–515F) as to what kinds of design component are to be looked for and how these are to be mapped, packed and/or placed so as to opportunistically take advantage of efficient implementation possibilities offered by the carry-chain and other resources shown in FIG. 5A. We are once more, predicting with optimistic foresight that certain sections of the input design will recognized as implicitly or explicitly calling for one or more of the following: (1) the generation of an arithmetic sum (addition or subtraction) of Boolean products (515B); (2) the generation of an arithmetic sum of variably-shifted input strings (515C); (3) the generation of a relatively wide (e.g., 10 or more inputs) Boolean OR or NOR result (515D); (4) the generation of a relatively wide (e.g., 10 or more inputs) Boolean NAND or AND result (515E); and (5) the implementation of a relatively wide (e.g., 10 or more bits per parallel string) strings-equality checking operation (515F). Given this, the respective strategies of FIGS. 5B–5E may be utilized either as relatively-preplaced IP solutions that are imported into the FPGA-configuring software (502E) or as solutions that are generated by the FPGA-configuring software (502E) so as to efficiently implement the desired results. It is to be understood of course, that if a wide NOR or a wide AND result is desired, the respective wide-OR and wide-NAND signals on the COUT terminals of respective FIGS. 5D–5E can be easily virtually-inverted as such a reverse-polarity signal enters a next LUT for further processing.

FIG. 5G shows a software flow 550G that may be used for urging the realization of the pictorial suggestions of FIG. 5F in much the same manner as was explained for corresponding other ones of the software flow diagrams (e.g., FIGS. 4D–4E). It is understood that the machine-implemented operations of process 550G may encompass any one or more of those of respective FIGS. 3G, 31, 2G and 4E. The input design definition obtained in step 551G is analyzed in step 554G and then operations of the FPGA compiler 502F are responsively urged, if conditions are appropriate, to form carry-chain implementable partitions such as represented by any one or more of boxes 515B–515F. Where possible, the carry-chain should be relatively-placed so as to successively cascade along a given GLB column for as long as practical so that carry-ripple through time is minimized and general interconnect is not consumed for coupling a COUT signal from one GLB to the CYI input of a spaced-away GLB. During or after one or more of synthesis (552G), map-and-pack (553G) or other design-manipulating operations, step 554G may be invoked to automatically search the partially or fully-instantiated design definition for the presence of carry-chain implementable design components such as represented by boxes 515B–515F. In step 555G, if they are found to not already be so-urged for, or pre-packed for, or relatively pre-placed for realizing such optimizations, the mapping, packing, relative and/or absolute placement, and/or relative and/or absolute routing definitions for software-defined design components like 515B-etc. may be re-mapped and/or re-packed and/or otherwise modified by association with appropriate attributes for urging those software objects respectively towards relative or absolute placement within 1+ GLB's so as to take advantage of the in-GLB carry-chain resources per the above-descriptions of FIGS. 5B–5E.

Competing urging factors are understood to be capable of coming into play within the intervening operations represented by program execution steps 560G. If the urging factors developed in step 555G are successful, then in step 570G the blank FPGA 200' will be programmably configured so that the post configuration FPGA (200") uses carry-chain resources within one or more GLB's, such as suggested by corresponding ones of FIGS. 5B–5E and boxes 515B–515F.

Figure 6A:
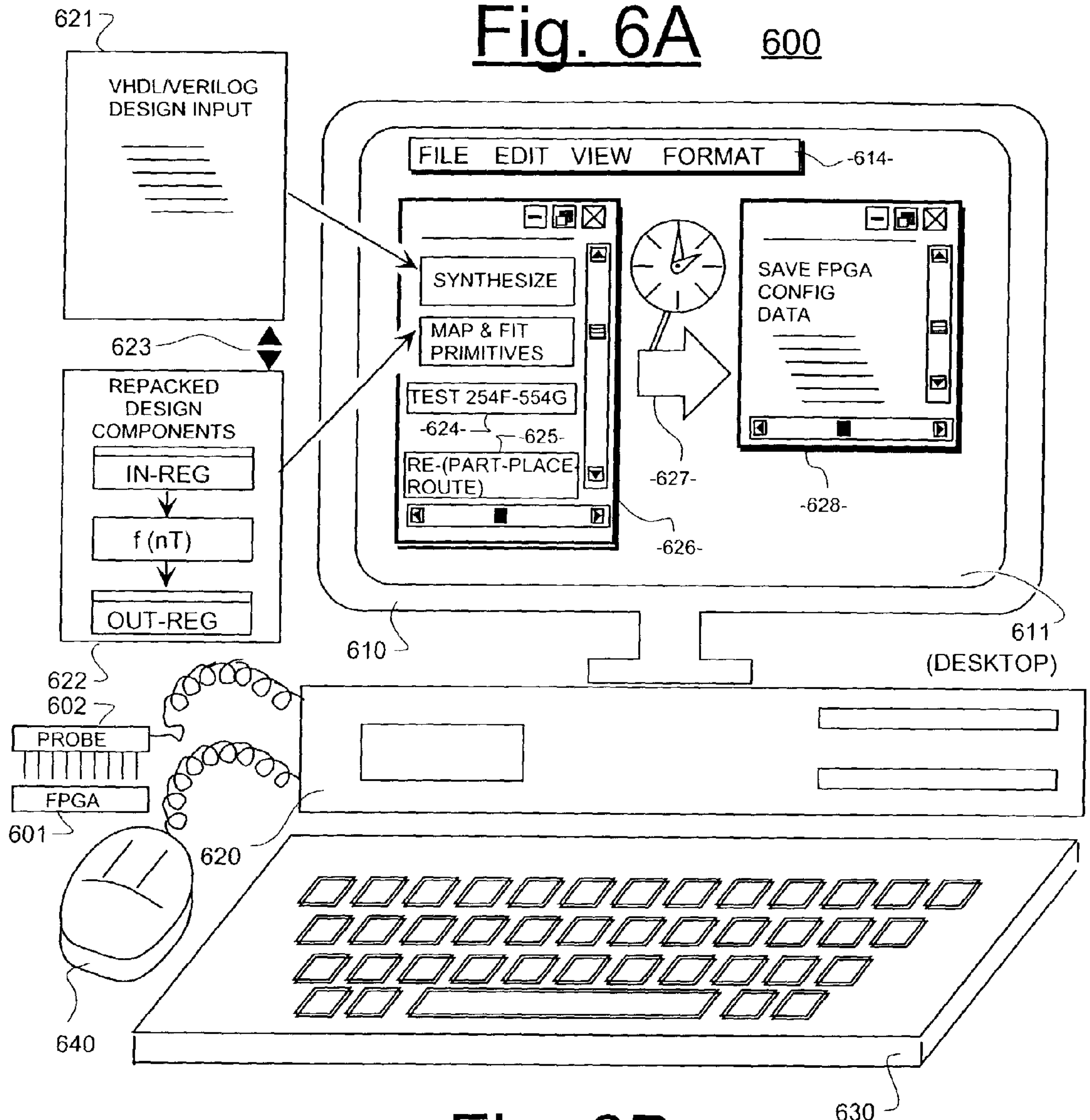
FIG. 6A diagrams a computer system that is organized and/or operated in accordance with the disclosure to take advantage of FPGA's having features in accordance with the present disclosure.
Figure 6B:
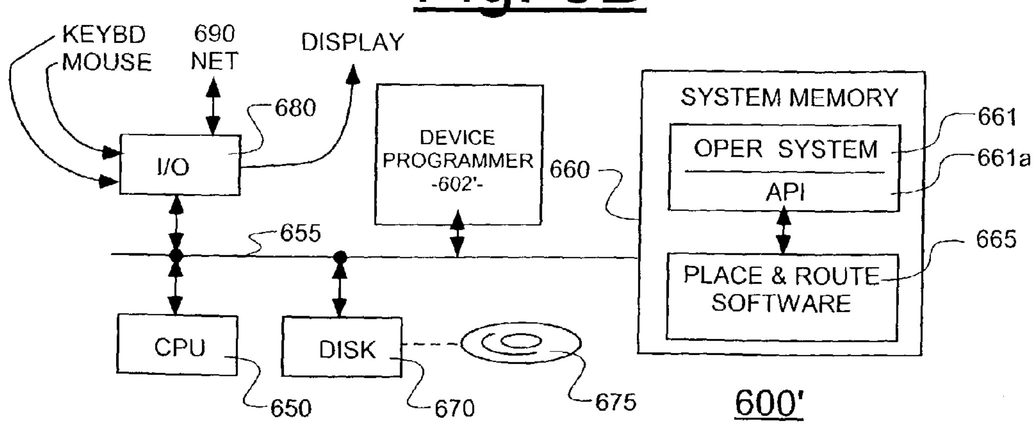
FIG. 6B diagrams a possible structuring for the computer system of FIG. 6A.

FIG. 6A is a block diagram of a computer system 600 which may be used for machine-implemented carrying out of one or more aspects of the present disclosure. Referring first to FIG. 6B, a possible method for interconnecting components of computer system 600 is shown schematically. Computer system 600 may include a central processing unit (CPU) 650 or other data processing means (e.g., plural processors), and a system memory 660 for storing immediately-executable instructions and immediately-accessible data for use by the CPU 650 or other processors. System memory 660 typically takes the form of DRAM (dynamic random access memory) and cache SRAM (static random access memory). Other forms of high-speed memory may be further or alternatively used. A system bus 655 may be used to operatively interconnect the CPU 650 and the system memory 660. The computerized system 600 may further include non-volatile mass storage means 670 such as a magnetic hard disk drive, a floppy drive, a CD-ROM or DVD drive, a re-writeable optical drive, or the like that is operatively coupled to the system bus 655 for transferring instruction and/or data signals over bus 655. Instructions for execution by the CPU 650 (or other processors or instructable execution machines) may be introduced into system 600 by way of computer-readable media 675 such as a floppy diskette or a CD-ROM optical platter or other like, instructing devices adapted for operatively coupling to, and providing instruction signals and/or data signals for operative use by the CPU 650 (or by an equivalent instructable machine). The computer-readable media 675 may define a device for coupling to, and causing system 600 to perform operations in accordance with the present disclosure.

System 600 may further include input/output (I/O) means 680 for providing interfacing between system bus 655 and peripheral devices such as display 610, keyboard 630 and mouse 640. The I/O means 680 may further provide interfacing to a communications network 690 such as an Ethernet network, a SCSI network, a telephone network, a cable system, a wireless link system or the like. Instructions for execution by the CPU 650 and/or data structures for use by the CPU 650 may be introduced into system 600 by way of corresponding instruction and/or data signals that are transferred over communications network 690 or otherwise introduced into the system. Communications network 690 may therefore define a means for coupling to, and causing system 600 to perform one or more operations in accordance with the present disclosure. The instructing signals and/or data signals that are transferred through the communications network 690 for causing system 600 to perform said operations may also be manufactured and structured in accordance with the present disclosure.

System memory 660 may hold executing or quickly-executable portions 661 of an operating system (OS) and of any then-executing parts of application programs 665. The application programs 665 generally communicate with the operating system by way of an API (application program interface) 661*a*. One of the application programs 665 may be an FPGA map-and-pack and/or place-and-route software module which is structured in accordance with the present disclosure for generating an FPGA configuration file 628 that can be used to load a serial configuration or other bit stream via probe 602 into a register-intensive FPGA 601 for causing the FPGA to behave in accordance with one or more of the advantageous aspects described herein. System memory 660 may include various data structures (e.g., primitive synthesizing rules, mapping rules, pattern recognition rules, GLB-fitting rules, GLB-packing rules, relative placement rules, relative routing rules, etc.) for causing computer system 600 to perform various operations in accordance with the present disclosure.

An example of how such data structures may operate is shown in box 622. An input design-descriptor file 621 may represent a design (which design is to be implemented by FPGA 601) in terms of an abstract descriptor language such as Verilog or VHDL. A design processing program such as 626 may compile the input design-descriptor file 621 and convert its abstract representations into primitive circuit instantiations (synthesis). Pre-specified mapping and packing rules may be used to guide the program into reorganizing the converted design-specification into GLB-absorbable registers, GLB-absorbable lookup functions and the like which may be individually packed for implementation within a respective one or more of the GLB's or their subparts (e.g., CBB's). At step 624, tests such as those described above for elements 254F (FIG. 2G) through 554G (FIG. 5G) may be run so as to locate software-defined function primitives (e.g., representing registers, LUT's, etc.) that can be clumped together to take advantage of one or more of the efficiency-enhancing features described herein. Box 622 shows for example, a front and back end registered, pipelining structure. This corresponds to the pipeline implementing options described for example in FIG. 3H. Packing optimization rules may urge a packing of certain registers (pipeline stage IN-REG and OUT-REG) into a same GLB together with a GLB-accommodate-able transform function (f(nT)). The packing optimization rules may further try to reserve various feedthroughs, FB's, 2xRL lines and/or DC's so as to help urge later routing to use those signal lines for implementing the front-end and back-end signal-registration functions per the above explanations. In subsequent step 625, one or more of the partitioning, placement and routing operations may be re-attempted several times in order to try to conform with the urging factors established in step 624 and/or other requirements of the to-be-implemented design 621.

Step 627 represents the ultimate completion of an FPGA solution for various specifications set forth in the input design file 621, where the solution may include one or more compact packings, placements and routings in accordance with the present disclosure. The resultant, FPGA configuration data file 628 may then be used to correspondingly program an FPGA 601 in accordance with the present disclosure. It is within the contemplation of the disclosure to provide within computer-readable media (e.g., floppy diskettes, CD-ROM, DVD-ROM) and/or within manufactured and/or transmitted data signals, FPGA-configuring bit streams in accordance with the above disclosure and/or to provide computer-understandable instructions to computers for causing the computers to perform automated generation of FPGA configuration data (628) in accordance with the present disclosure.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A field programmable gate array (FPGA) comprising:

(a) a plurality of substantially same logic blocks each having plural programmable lookup tables;

(b) for each of said lookup tables, at least two corresponding state-storing registers;

(c) within each logic block and for each of said lookup tables of the logic block, an internal-routing circuit that is programmable to route a result signal of the respective lookup table as a register input signal to at least one of the corresponding state-storing registers so that each of the state-storing registers can output a register-output signal that defines a registered or latched version of the register-input signal; and (c1) a programmable input switch adapted to acquire a multi-bit dynamic write-enable steering signal for dynamically steering a write enable signal to a single-port or multi-port memory array overlapping with two or more of the lookup tables of the corresponding logic block.

2. The FPGA of claim 1 and further comprising:

(d) within each logic block and for each respective state-storing register, a programmable register-bypass multiplexer coupled to selectively output at least one of said register-input signal and register-output signal.

3. The FPGA of claim 2 and further comprising:

(e) for each given logic block, a corresponding programmable input switch adapted to selectively acquire signals from logic-blocks interconnecting lines and/or logic-block intra-connect lines adjacent to the given logic block, where the input switching switch is further operatively coupled to the lookup tables of the given logic block for programmably routing acquired signals to the lookup tables; and (f) within each logic block and for each respective lookup table, a feedthrough line, operatively coupled between the input switch and the corresponding internal-routing circuit for routing at least one of the acquired signals from the input switch directly to the internal-routing circuit.

4. The FPGA of claim 3 and further wherein:

(e.1) for each respective lookup table in a given logic block, the corresponding programmable input switch includes at least one primary matrix output line whose acquired signal propagates directly into the respective feedthrough line without also propagating directly to an input-term signal-receiving terminal of the respective lookup table.

5. The FPGA of claim 4 and further wherein:

(e.2) an acquired signal which propagates directly into the feedthrough line of a corresponding lookup table for selective passage through the internal-routing circuit can also serve as at least one of:

(e.2a) a dynamic selection signal for carrying out at least one of, a 2:1 dynamic selection function; a 4:1 dynamic selection function; and a 5:1 dynamic selection function;

(e.2b) a shift signal which can be shift-wise delayed by a shift-length determinable by input term signals supplied to the corresponding lookup table;

(e.2c) a memory input data signal for application to a write-data input terminal of a single-port or multi-port memory array overlapping with one or more of the lookup tables of the corresponding logic block; and (e.2d) a dynamic write-enable steering signal for dynamically steering a write enable signal to a single-port or multi-port memory array overlapping with one or more of the lookup tables of the corresponding logic block.

6. The FPGA of claim 4 and further wherein:

(e.2) an acquired signal, which respectively propagates directly into the feedthrough lines of respective lookup tables for selective passage through the corresponding internal-routing circuits of those respective lookup tables, can also serve as a multi-bit dynamic selection signal for carrying out within the corresponding logic block at least one of: a 4:1 dynamic selection function and a 5:1 dynamic selection function.

7. The FPGA of claim 3 and further wherein:

(e.1) said corresponding programmable input switch of each given logic block includes a first input switching matrix stage (ISM-1 stage) and a second input switching matrix stage (ISM-2 stage), where the ISM-2 stage is coupled to receive first stage signals that have been selectively transmitted through the ISM-1 stage and to further selectively transmit all or a subset of the first stage signals to the corresponding logic block.

8. The FPGA of claim 7 and further wherein:

(e.2) said second input switching matrix stage (ISM-2 stage) includes selective signal transmission circuit for selectively transmitting a same first stage signal simultaneously to two or more of the lookup tables in the given logic block.

9. The FPGA of claim 7 and further wherein:

(e.2) said second input switching matrix stage (ISM-2 stage) includes selective signal transmission circuit for selectively transmitting a same first stage signal to one, or simultaneously to all of the lookup tables in the given logic block.

10. The FPGA of claim 7 and further wherein:

(e.2) said first input switching matrix stage (ISM-1 stage) includes selective signal transmission circuit for selectively transmitting a same first stage signal to at least four different multiplexer output lines of the ISM-2 stage.

11. A field programmable gate any (FPGA) comprising:

(a) a plurality of logic blocks each having plural programmable lookup table, where each lookup table has me ability to directly implement a truth table for, and output a corresponding result signal representing, any Boolean function of at least 4 input term signals that are programmably routable to the lookup table;

(b) for each of said lookup table, at least two corresponding state-storing registers;

(c) within each logic block and for at least one of said lookup tables of the logic block, an internal-routing circuit that is programmable to route the result signal of a lookup table as a register input signal to at least one of the corresponding state storing registers of the lookup table; and (c1) a programmable input switch adapted to acquire a multi-bit dynamic write-enable steering signal for dynamically steering a write enable signal to a single-port or multi-port memory array overlapping with two or more of the lookup tables of the corresponding logic block.

12. A field programmable gate array (FPGA) comprising:

(a) a plurality of logic blocks each having plural programmable lookup tables;

(b) for each of said lookup tables, at least two corresponding state-storing registers;

(c) within each logic block and for at least one of said lookup tables, an internal-routing circuit that is programmable to route the result signal of a lookup table as a register input signal to at least one of the corresponding state-storing registers of the lookup table;

(d) within each logic block and for each state-storing register, a programmable register-bypass multiplexer coupled to selectively output at least one of said register-input signal and register-output signal;

(e) for each logic block, a corresponding programmable input switch adapted to selectively acquire signals from logic-blocks interconnecting lines and/or logic-block intra-connect lines adjacent to the logic block, where the input switching switch is further operatively coupled to the lookup tables of the logic block;

(f) within each logic block and for each lookup table, a feedthrough line operatively coupled between the input switch and the corresponding internal-routing circuit for routing at least one of the acquired signals from the input switch directly to the internal-routing circuit;

(g) for each lookup table, the corresponding programmable input switch includes at least one primary matrix output line whose acquired signal propagates directly into the respective feedthrough line without also propagating directly to an input-term signal-receiving terminal of the respective lookup tale; and (f) wherein at least two acquired signals which respectively propagate directly into the feedthrough lines of respective lookup tables for selective passage through the corresponding internal-routing circuits of those respective lookup tables, can also serve as respective at least ones of:

a multi-bit dynamic selection signal for carrying out within the corresponding logic block at least one of: a 4:1 dynamic selection function; and a 5:1 dynamic selection function; and a multi-bit dynamic write-enable steering signal for dynamically steering a write enable signal to a single-port or multi-port memory array overlapping with two or more of the lookup tables of the corresponding logic block.

* * * * *